United States Patent

Myron et al.

Patent Number: 5,986,357
Date of Patent: Nov. 16, 1999

[54] OCCUPANCY SENSOR AND METHOD OF OPERATING SAME

[75] Inventors: Douglas D. Myron; Vadim A. Konradi; Bruce G. Williams; John J. Fowler; Timothy W. Woytek; Jonathan D. Williams; Gerard L. Cullen, all of Austin, Tex.

[73] Assignee: Mytech Corporation, Austin, Tex.

[21] Appl. No.: 08/795,327

[22] Filed: Feb. 4, 1997

[51] Int. Cl.⁶ .................................................. H01H 35/00
[52] U.S. Cl. ........................ 307/116; 307/117; 307/139; 340/541; 340/554; 340/565
[58] Field of Search ...................... 340/825.3, 825.31, 340/825.32, 825.34, 825.36, 506, 508, 517, 539, 541, 565, 587, 521, 522, 567, 529, 554, 540; 307/112, 116, 117, 125, 139, 140, 32

[56] References Cited

U.S. PATENT DOCUMENTS

| | | | |
|---|---|---|---|
| 3,074,053 | 1/1963 | McDonough et al. | 340/258 |
| 3,383,678 | 5/1968 | Palmer | 343/5 |
| 3,721,972 | 3/1973 | Hermans | 340/276 |
| 3,725,888 | 4/1973 | Solomon | 340/258 |
| 3,781,859 | 12/1973 | Hermans | 340/258 |
| 3,801,978 | 4/1974 | Gershberg et al. | 340/258 |
| 4,021,679 | 5/1977 | Bolle et al. | 307/117 |
| 4,172,253 | 10/1979 | Hermans | 367/94 |
| 4,207,559 | 6/1980 | Meyer | 340/531 |
| 4,243,979 | 1/1981 | Kleinschmidt | 340/554 |
| 4,275,390 | 6/1981 | Heywang et al. | 340/554 |
| 4,315,596 | 2/1982 | Johnson, Jr. et al. | 236/94 |
| 4,331,952 | 5/1982 | Galvin et al. | 340/508 |
| 4,336,464 | 6/1982 | Weber | 307/141.4 |
| 4,361,767 | 11/1982 | Pelka et al. | 307/117 |
| 4,383,288 | 5/1983 | Hess, II et al. | 362/32 |
| 4,391,406 | 7/1983 | Fried | 236/47 |
| 4,401,976 | 8/1983 | Stadelmayr | 340/522 |
| 4,461,977 | 7/1984 | Pierpoint et al. | 315/159 |
| 4,521,843 | 6/1988 | Pezzolo et al. | . |
| 4,575,659 | 3/1986 | Pezzolo et al. | . |
| 4,593,234 | 6/1986 | Yang | . |
| 4,636,774 | 1/1987 | Galvin et al. | 340/565 |
| 4,660,024 | 4/1987 | McMaster | 340/522 |
| 4,661,720 | 4/1987 | Cameron, Jr. et al. | 307/117 |
| 4,703,171 | 10/1987 | Kahl et al. | 250/221 |
| 4,710,750 | 12/1987 | Johnson | 340/522 |
| 4,713,598 | 12/1987 | Smith | . |
| 4,751,399 | 6/1988 | Koehring et al. | 307/117 |
| 4,769,765 | 9/1988 | Green | . |
| 4,833,450 | 5/1989 | Buccola et al. | 340/506 |

(List continued on next page.)

FOREIGN PATENT DOCUMENTS

| | | |
|---|---|---|
| 4302836 | 7/1994 | Germany . |
| WO 96/25021 | 8/1996 | WIPO . |

OTHER PUBLICATIONS

International Search Report dated May 18, 1998 (PCT/US98/02010)(MYTE:023P).

Imbrecht et al., In: *Building Energy Efficiency Standards,* California Energy Commission, Jul. 1988.

O'Mara, "Dual–technology sensors solve installation problems," *Security Distributing & Marketing,* pp. 81–83, Aug. 1990.

Hubbell, "Mass 1500A and 750A Motion Switching Sustem," 1993.

*Primary Examiner*—Jeffrey Gaffin
*Assistant Examiner*—Jonathan Kaplan
*Attorney, Agent, or Firm*—Arnold, White & Durkee

[57] ABSTRACT

A multiple sensing technology-based occupancy sensor. Ultrasonic and infrared sensors are used to produce first and second occupancy estimator signals that are combined using a fusion based detection algorithm to produce a combined estimator signal. The combined estimator is then used to switch electrical loads when the combined estimator signal is above a predetermined threshold. The result is an occupancy sensor that has a very high probability of occupancy detection and a low probability of false tripping.

83 Claims, 75 Drawing Sheets

U.S. PATENT DOCUMENTS

| | | | |
|---|---|---|---|
| 4,843,283 | 6/1989 | Chen | 315/153 |
| 4,857,912 | 8/1989 | Everett, Jr. et al. | 340/825.3 |
| 4,882,567 | 11/1989 | Johnson | 340/522 |
| 4,890,093 | 12/1989 | Allison et al. | 340/567 |
| 5,015,994 | 5/1991 | Hoberman et al. | 340/567 |
| 5,077,548 | 12/1991 | Dipoala | 340/522 |
| 5,128,654 | 6/1992 | Griffen et al. | 340/567 |
| 5,181,010 | 1/1993 | Chick | 340/426 |
| 5,396,217 | 3/1995 | Proefke et al. | 340/426 |
| 5,406,176 | 4/1995 | Sudgen . | |
| 5,473,202 | 12/1995 | Mudge et al. . | |
| 5,482,314 | 1/1996 | Corrado et al. | 280/735 |
| 5,504,473 | 4/1996 | Cecic et al. | 340/541 |
| 5,543,777 | 8/1996 | Vane et al. | 340/514 |
| 5,578,988 | 11/1996 | Hoseit et al. | 340/522 |
| 5,586,048 | 12/1996 | Coveley | 364/492 |
| 5,640,143 | 6/1997 | Myron et al. | 340/541 |
| 5,673,022 | 9/1997 | Patel | 340/565 |
| 5,701,117 | 12/1997 | Platner et al. | 340/567 |
| 5,793,286 | 8/1998 | Greene | 340/522 |
| 5,814,902 | 9/1998 | Creasy et al. | 307/116 |

|   | A |   |   |   |   |   |   |   |   |   |   |   |   |   |   |   |
|---|---|---|---|---|---|---|---|---|---|---|---|---|---|---|---|---|
|   | 0 | 1 | 2 | 3 | 4 | 5 | 6 | 7 | 8 | 9 | 10 | 11 | 12 | 13 | 14 | 15 |
| 0 | 0 | 1 | 2 | 3 | 4 | 5 | 6 | 7 | 8 | 9 | 10 | 11 | 12 | 13 | 14 | 15 |
| 1 | 1 | 1 | 2 | 3 | 4 | 5 | 6 | 7 | 8 | 9 | 10 | 11 | 12 | 13 | 14 | 15 |
| 2 | 2 | 2 | 2 | 3 | 4 | 5 | 6 | 7 | 8 | 9 | 10 | 11 | 12 | 13 | 14 | 15 |
| 3 | 3 | 3 | 3 | 4 | 5 | 5 | 6 | 7 | 8 | 9 | 10 | 11 | 12 | 13 | 14 | 15 |
| 4 | 4 | 4 | 4 | 5 | 5 | 6 | 7 | 8 | 8 | 9 | 10 | 11 | 12 | 13 | 14 | 15 |
| 5 | 5 | 5 | 5 | 5 | 6 | 7 | 7 | 8 | 9 | 10 | 11 | 12 | 13 | 13 | 14 | 15 |
| 6 | 6 | 6 | 6 | 6 | 7 | 7 | 8 | 9 | 10 | 10 | 11 | 12 | 13 | 14 | 15 | 16 |
| 7 | 7 | 7 | 7 | 7 | 8 | 8 | 9 | 9 | 10 | 11 | 12 | 13 | 13 | 14 | 15 | 16 |
| 8 | 8 | 8 | 8 | 8 | 8 | 9 | 10 | 10 | 11 | 12 | 12 | 13 | 14 | 15 | 16 | 17 |
| 9 | 9 | 9 | 9 | 9 | 9 | 10 | 10 | 11 | 12 | 12 | 13 | 14 | 15 | 15 | 16 | 17 |
| 10 | 10 | 10 | 10 | 10 | 10 | 11 | 11 | 12 | 12 | 13 | 14 | 14 | 15 | 16 | 17 | 18 |
| 11 | 11 | 11 | 11 | 11 | 11 | 12 | 12 | 13 | 13 | 14 | 14 | 15 | 16 | 17 | 17 | 18 |
| 12 | 12 | 12 | 12 | 12 | 12 | 13 | 13 | 13 | 14 | 15 | 15 | 16 | 16 | 17 | 18 | 19 |
| 13 | 13 | 13 | 13 | 13 | 13 | 13 | 14 | 14 | 15 | 15 | 16 | 17 | 17 | 18 | 19 | 19 |
| 14 | 14 | 14 | 14 | 14 | 14 | 14 | 15 | 15 | 16 | 16 | 17 | 17 | 18 | 19 | 19 | 20 |
| 15 | 15 | 15 | 15 | 15 | 15 | 15 | 16 | 16 | 17 | 17 | 18 | 18 | 19 | 19 | 20 | 21 |

B (row label)

FIG. 21

|   | A |   |   |   |   |   |   |   |   |   |   |   |   |   |   |   |
|---|---|---|---|---|---|---|---|---|---|---|---|---|---|---|---|---|
|   | 0 | 1 | 2 | 3 | 4 | 5 | 6 | 7 | 8 | 9 | 10 | 11 | 12 | 13 | 14 | 15 |
| 0 | 0 | 1 | 2 | 3 | 4 | 5 | 6 | 7 | 8 | 9 | 10 | 11 | 12 | 13 | 14 | 15 |
| 1 | 1 | 4 | 5 | 7 | 9 | 10 | 11 | 13 | 14 | 16 | 17 | 18 | 19 | 21 | 22 | 23 |
| 2 | 2 | 5 | 8 | 9 | 11 | 13 | 14 | 16 | 18 | 19 | 20 | 22 | 23 | 25 | 26 | 27 |
| 3 | 3 | 7 | 9 | 12 | 13 | 15 | 17 | 19 | 20 | 22 | 23 | 25 | 27 | 28 | 29 | 31 |
| 4 | 4 | 9 | 11 | 13 | 16 | 17 | 19 | 21 | 23 | 25 | 26 | 28 | 29 | 31 | 32 | 34 |
| 5 | 5 | 10 | 13 | 15 | 17 | 20 | 21 | 23 | 25 | 27 | 29 | 30 | 32 | 34 | 35 | 37 |
| 6 | 6 | 11 | 14 | 17 | 19 | 21 | 24 | 25 | 27 | 29 | 31 | 33 | 34 | 36 | 38 | 39 |
| 7 | 7 | 13 | 16 | 19 | 21 | 23 | 25 | 28 | 29 | 31 | 33 | 35 | 37 | 39 | 40 | 42 |
| 8 | 8 | 14 | 18 | 20 | 23 | 25 | 27 | 29 | 32 | 33 | 35 | 37 | 39 | 41 | 43 | 44 |
| 9 | 9 | 16 | 19 | 22 | 25 | 27 | 29 | 31 | 33 | 36 | 37 | 39 | 41 | 43 | 45 | 47 |
| 10 | 10 | 17 | 20 | 23 | 26 | 29 | 31 | 33 | 35 | 37 | 40 | 41 | 43 | 45 | 47 | 49 |
| 11 | 11 | 18 | 22 | 25 | 28 | 30 | 33 | 35 | 37 | 39 | 41 | 44 | 45 | 47 | 49 | 51 |
| 12 | 12 | 19 | 23 | 27 | 29 | 32 | 34 | 37 | 39 | 41 | 43 | 45 | 48 | 49 | 51 | 53 |
| 13 | 13 | 21 | 25 | 28 | 31 | 34 | 36 | 39 | 41 | 43 | 45 | 47 | 49 | 52 | 53 | 55 |
| 14 | 14 | 22 | 26 | 29 | 32 | 35 | 38 | 40 | 43 | 45 | 47 | 49 | 51 | 53 | 56 | 57 |
| 15 | 15 | 23 | 27 | 31 | 34 | 37 | 39 | 42 | 44 | 47 | 49 | 51 | 53 | 55 | 57 | 60 |

B (row label)

FIG. 22

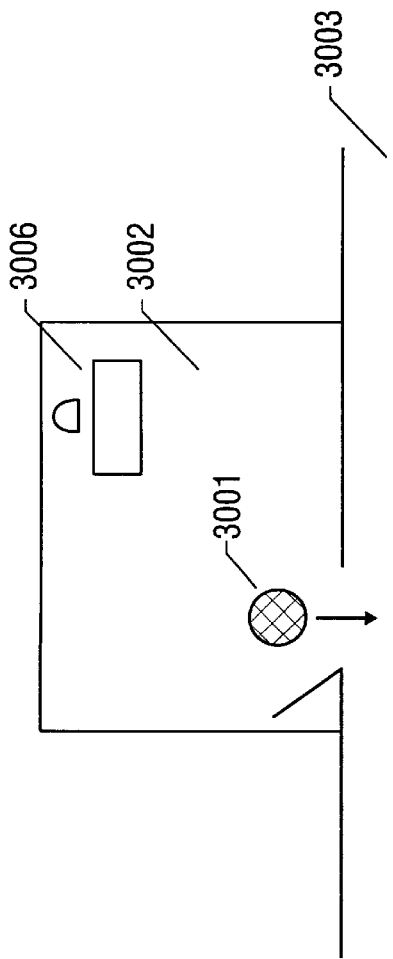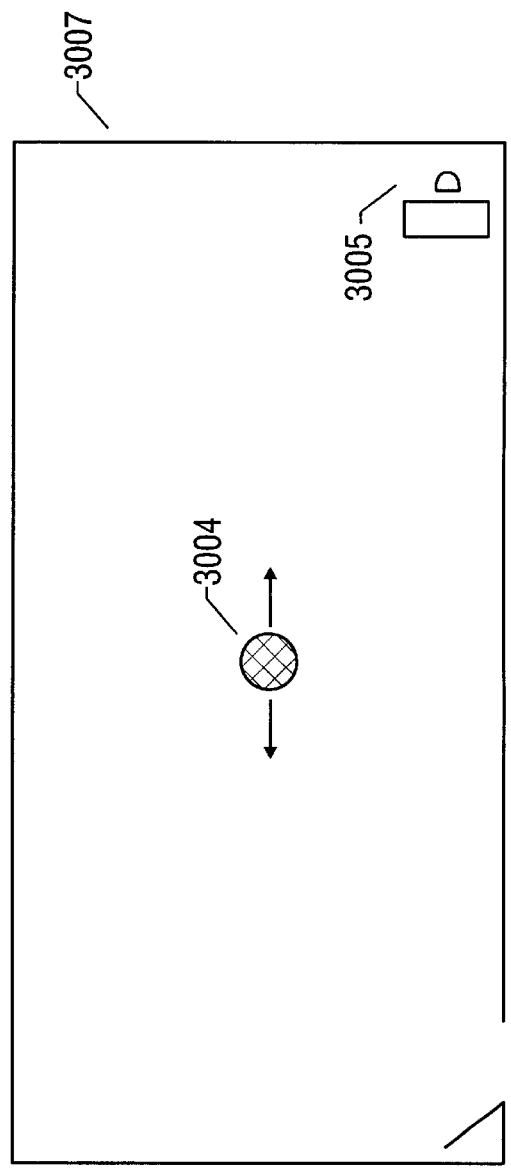

OCCUPANCY SENSOR AND METHOD OF OPERATING SAME

BACKGROUND OF THE INVENTION

The present invention relates to occupancy sensors.

A portion of the disclosure of this patent document contains material that is subject to copyright protection. The copyright owner has no objection to the facsimile reproduction by anyone of the patent document or patent disclosure, as it appears in the Patent and Trademark Office patent file or records, but otherwise reserves all copyright rights whatsoever.

An occupancy sensor is an energy conservation device designed to detect the presence of human occupant(s) in a given area. When occupancy is sensed, the various electrically-powered loads in that area controlled by the sensor (for example, lights, ventilation, and the like) are energized. When that same area has been unoccupied for a predetermined period of time, the sensor de-energizes the electrical loads that it controls. Occupancy sensors may therefore conserve a great deal of energy in areas where the occupants do not exercise diligence in de-energizing those electrical loads when they leave the area.

Over the last few decades, several events have led to the growth of a large consumer market for energy saving devices including occupancy sensors. First, there has been an increase in public awareness of energy conservation and its beneficial environmental consequences. In addition, there has been increased realization by both private and government-controlled power generation industries of the economic and environmental advantages of energy conservation as a means of meeting peak load power demands. Finally, there have been legislative mandates at the federal, state and local levels for the use of energy conserving devices, such as occupancy sensors, in government and other public buildings.

Occupancy sensors have been successfully designed and tested using a variety of technologies. A brief description of the most widely used occupancy sensor technologies along with the strengths and weaknesses of those technologies follows:

Active ultrasonic acoustic Doppler occupancy detection. This technology allows continuous detection of moving objects that reflect ultrasonic acoustic energy. This method of occupancy detection is highly sensitive since it is based on an active source of ultrasonic acoustic energy. An apparatus and method of this type are disclosed in U.S. patent application Ser. No. 08/384,580, filed Feb. 6, 1995, assigned to the same assignee as the present invention and entitled: OCCUPANCY SENSOR AND METHOD FOR OPERATING SAME, the disclosure of which is incorporated herein by reference.

However, this method of occupancy detection has several limitations: first, it is insensitive to motion that is orthogonal to the direction toward the receiver; second it is insensitive to motion generally not in the line of sight of the receiver; third, it is subject to false tripping due to other sources of ultrasonic energy; fourth, it is subject to false tripping due to heating and air conditioning air flow; and finally, it has no means of range discrimination. Since occupancy sensors based on Doppler techniques have no means of range discrimination, a large-distant target moving at approximately the same speed as a smaller, nearby target might have similar target signatures.

Active electromagnetic Doppler occupancy detection. This technology allows continuous detection of moving objects that reflect electromagnetic energy. This method of occupancy detection is highly sensitive since it is based on an active source of electromagnetic energy. However, this method of motion detection also has several limitations: first, it is insensitive to motion that is orthogonal to the direction toward the receiver; second, it is insensitive to motion generally not in the line of sight of the receiver; third, it is subject to false tripping due to other sources of electromagnetic energy; and finally, it has no means of range discrimination.

Passive audio acoustic occupancy detection. This technology allows continuous detection of objects that emit audio acoustic energy. This method of occupancy detection is quite sensitive but is subject to false tripping due to non-occupant sources of audio acoustic energy such as facsimile machine, telephone and security system tones, automobile and emergency vehicle horns, etc.

Passive infrared occupancy detection. This technology allows continuous detection of moving objects that emit infrared energy. This method of occupancy detection is also quite sensitive even though it is based on passive sensing of moving sources of infrared energy. This method of occupancy detection also has several limitations: first, it is insensitive to sources generally not in the line of sight of the receiver; second, it is subject to being blinded by intense, stationary sources of infrared energy; third, it is subject to false tripping due to rapid fluctuations in the intensity of stationary infrared sources; and finally, it is subject to a detection coverage tradeoff involving the number of lens facets versus detection range.

Position sensor based occupancy detection. This technology uses one or more mercury switches to sense changes in the physical position of the sensor. This technology has several limitations: first, it is insensitive to minor motion that may be indicative of occupancy; and second, it is inherently a digital (of/on) device.

Piezoelectric sensor based occupancy detection. This technology senses the changes in the resistance of a piezoelectric sensor to sense occupancy. This technology is subject to false tripping due to changes in temperature.

Significant innovation in the design of occupancy sensors has occurred over the last few decades. The early occupancy sensors utilized primarily analog signal processing techniques. The large area motion sensor described in U.S. Pat. No. 3,967,283 by Clark et. al., issued Jun. 29, 1976, utilized electromagnetic motion detection and was based on analog signal processing techniques. The occupancy sensor described in U.S. Pat. No. 4,661,720 by Cameron, Jr. et. al., issued Apr. 28, 1987, and the low voltage motion sensor for activating a high voltage load described in U.S. Pat. No. 4,820,938 by Mix et. al, issued Apr. 11, 1989, utilized analog signal processing techniques. The variable gain amplifier used in these sensors required manual adjustment. The room occupancy sensor, lens and method of lens fabrication described in U.S. Pat. No. 5,221,919 by Hermans, issued Jun. 22, 1993, utilized passive infrared detection and was based on analog signal processing techniques. The motion detection sensor with computer interface described in U.S. Pat. No. 5,281,961 by Elwell, issued Jan. 25, 1994, utilized active ultrasonic motion detection and was based primarily on analog signal processing techniques. Although easy to design and relatively cheap to implement, the analog filters in these devices had filter response characteristics that drifted with temperature variations and that varied over the lifetime of the various analog filter components. The overall result of using a sensor based on analog signal processing techniques was an occupancy sensor whose performance was unpredictable.

Additionally, the majority of these early occupancy sensors were based on a single sensing technology. Since each technology has its own inherent limitations, these sensors were subject to false tripping due to a variety of sources. For example, ultrasonic Doppler sensors were subject to false trips due to air conditioning and heating system air flow. In addition, since these sensors had no means of range discrimination, they were subject to false trips due to motion outside the desired range of interest. Similarly, passive infrared (PIR) sensors were subject to being blinded by intense, stationary sources of infrared energy. The automatic lighting device described in U.S. Pat. No. 4,751,399 by Koehring et. al. issued Jun. 14, 1988 utilized only acoustic motion detection. This sensor was subject to false tripping due to non-occupant sources of audio acoustic energy such as facsimile machine, telephone and security system controller tones, emergency vehicle and automobile horns, etc. The selective illumination technique described in U.S. Pat. No. 4,225,808 by Saraceni issued Sep. 30, 1980 allowed the use of pressure, ultrasonic motion, microwave, photoelectric and audible sound sensors but failed to combine these technologies to achieve a more reliable sensor with a reduced probability of false tripping. In order to lessen the probability of false trips, the user was often forced to reduce the sensor's sensitivity. The overall result of using a sensor based on a single technology was an occupancy sensor with reduced sensitivity and reliability.

The next generation of occupancy sensors used two or more sensing technologies. These sensors typically required the user to specify a separate activation threshold for each detector technology in the sensor. The digital detector output of each sensor technology was then combined using classical digital logic to detect occupancy. The preset light controller including infrared sensor operable in multiple modes described in U.S. Pat. No. 5,128,654 by Griffin et. al., issued Jul. 7, 1992, used infrared and visible light sensors. The dual technology motion sensor described in U.S. Pat. No. 5,189,393 by Hu, issued Feb. 23, 1993, combined the outputs of its ultrasonic and infrared sensors using classical Boolean AND and OR hardware logic. In general, these multiple sensing technology sensors had better performance than their predecessors but still exhibited a sensitivity-false alarm tradeoff. For example, if the various detector signals were combined using the logical OR function, the overall sensitivity of the sensor increased at the expense of an increased incidence of false trips. On the other hand, if the various detector signals were combined using the logical AND function, the overall incidence of false trips decreased at the expense of decreased sensor sensitivity. Since each sensing technology has its own separate activation threshold, these sensors were often unable to reliably detect motion in marginal cases where one or more sensing technologies observed signal levels just below the user-defined threshold level. The overall result of using these early multiple sensing technology-based occupancy sensors was an improved performance occupancy sensor that was unable to sense occupancy in the more complex marginal sensor signal level situations.

In general, prior art occupancy sensors heretofore known suffer from a number of disadvantages, including:

1. Lack of a sophisticated multiple sensing technology sensor signal conditioning to more completely exploit the advantages of sensing technologies while minimizing disadvantages. The prior art failed to combine the various occupancy sensor detection technologies in a sophisticated fashion to increase the overall probability of occupancy detection while simultaneously lowering the overall probability of false tripping.
2. Lack of adaptive sensor behavior. The prior art failed to produce an occupancy sensor whose performance adapted over time to optimize the sensor's performance.
3. Lack of digital signal processing techniques. The prior art used analog signal processing techniques. The analog filters used in these sensors required manual tuning that was a costly, time consuming process. In addition, the performance of these analog filters was temperature dependent and drifted with time.
4. Lack of means to simply and efficiently communicate the status of the sensor to installation and maintenance personnel. An occupancy sensor, typically has a number of settings that determine its mode of operation, and that the person who installs or maintains the sensor may wish to review. The sensor is typically installed out of reach on a ceiling or wall such that its adjustment knobs or dials are not readily visible. The prior art does not incorporate a system to make such settings readily available and apparent to a person who wishes to query them.
5. Lack of means to check status of the controlled signal to determine if a load device is connected, or if the controlled output is misconnected or shorted.
6. Lack of permanent storage of sensor variables. The prior art failed to permanently store various sensor settings. In the event of a power failure, these sensors had no means of recovering their previous settings.
7. Lack of no means to recognize an excessively reverberant controlled space with excessive ultrasonic return signal amplitude, and lack of means to compensate by adjusting the ultrasonic transmitter amplitude.
8. Lack of ultrasonic receiver preamplifier and demodulator performance monitoring means. The prior art did not monitor ultrasonic receiver preamplifier and demodulator performance and did not have means for making adjustments to accommodate a poorly executed installation or highly acoustically reflective space. A sophisticated ultrasonic sensor incorporates a high gain receiver preamplifier that may become saturated due to excessive acoustic reflections from room walls and other hard structures within the space. Furthermore, the sensor may be installed incorrectly too close to a fixed acoustic reflector such as a wall, exit sign, or other architectural feature. Saturation of the receiver preamplifier causes the motion signal to be lost, and the sensor to be effectively blinded by the excessive signal level. It is desirable that the sensor may be installed by unskilled personnel, and that the sensor be able to accommodate non-ideal situations created either by improper installation or difficult acoustic environments. The prior art has no means to determine saturation of the receiver preamplifier, nor any means to correct for such saturation.
9. Lack of occupancy cycle detection and utilization. The prior art did not detect the typical daily and weekly occupancy cycle of the sensor's environment and use that information to make occupancy decisions. A workspace is typically occupied according to a cycle that varies predictably throughout the day, and also according to a set pattern through the work week. Heretofore, sensors have not taken into account this pattern, and the prior art has no means to survey and record the typical daily and weekly occupancy patterns, nor to store that information, nor to act on the basis of that information.

SUMMARY OF THE INVENTION

The present invention solves the above-noted failings in the prior art by providing an occupancy based load controller, comprising a plurality of occupancy sensors for producing a respective plurality of occupancy estimator signals, each indicative of motion within a space; a programmable microprocessor, connected to the plurality of occupancy sensors, for calculating a composite occupancy estimator from the plurality of occupancy estimator signals, and for comparing the composite occupancy estimator to a composite activation threshold; and a controllable load energizing device responsive to the programmable microprocessor, operable to automatically energize an electrical load when the microprocessor determines that the composite occupancy estimator is greater than the composite activation threshold. The programmable microprocessor can also operate to compare the composite occupancy estimator to a composite maintenance threshold, and the controllable load energizing device is then operable to continue energizing the electrical load when the microprocessor determines that the composite occupancy estimator is greater than the composite maintenance threshold.

The plurality of occupancy estimator signals are preferably digital representations based on signal levels detected at the plurality of occupancy sensors. The invention contemplates the use of any type of occupancy sensor technology, in any combination, including, for example, an ultrasonic transmitter and sensor, a passive infrared (PIR) detector, a passive audio acoustic detector, and a microwave transmitter and sensor, or any combination of two or more of these sensor technologies.

The composite occupancy estimator may be calculated by any useful mathematical combination of the plurality of individual occupancy estimator signals, for example, arithmetic sum, weighted arithmetic sum, or Yager Union function of the plurality of occupancy estimator signals. In addition, the composite occupancy estimator can be created by performing a table look-up based on the plurality of occupancy estimator signals.

The composite activation and maintenance thresholds can be programmable.

The sensitivity of at least one of the plurality of occupancy sensors may be adjusted in accordance with the present invention, for example based upon an historical usage patterns of the space, based upon detection of false-on events, or based upon detection of false-off events.

The invention may also include an environmental sensor, connected to the microprocessor, for sensing an environmental condition of the space, including, for example, an ambient temperature sensor or an ambient light sensor.

An additional feature of the invention is the storing of a status of the load controller; and visually reporting the status of the load controller. Status may be reported at predetermined time intervals, or upon user interrogation, for example upon detecting a predetermined motion pattern.

When incorporating an ultrasonic transmitter and sensor, the ultrasonic transmitter may operate to transmit continuous wave ultrasonic signals; and the ultrasonic sensor may include an ultrasonic signal receiver, and a controllable gain preamplifier circuit having an input connected to receive a Doppler-shifted ultrasonic signal produced by the ultrasonic receiver, and an output providing a Doppler-shifted ultrasonic signal with controllable amplitude. The ultrasonic sensor further comprising a zero crossing phase lock loop sampling point circuit having an input connected to receive a sampling point control signal; and an output providing a sample of the Doppler-shifted ultrasonic signal near a zero crossing point of the Doppler shifted ultrasonic signal.

The invention also contemplates a method for controlling an electrical load as a function of occupancy of a space, comprising generating a plurality of occupancy estimator signals indicative of motion within a space; calculating a composite occupancy estimator from the plurality of occupancy estimator signals; comparing the composite occupancy estimator to a composite activation threshold; and energizing the electrical load when the composite occupancy estimator is greater than the composite activation threshold. Further, the method may compare the composite occupancy estimator to a composite maintenance threshold; and continue to energize an electrical load when the composite occupancy estimator is greater than the composite maintenance threshold.

The calculating step may be accomplished by any useful mathematical function, including, for example, calculating the composite occupancy estimator by performing an arithmetic sum of the plurality of occupancy estimator signals, by performing a weighted arithmetic sum of the plurality of occupancy estimator signals, or by performing a Yager Union function of the plurality of occupancy estimator signals. The method may also be accomplished by performing a table look-up based on the plurality of occupancy estimator signals.

The method also programmably adjusts the composite activation and composite maintenance thresholds.

The invention also contemplates a method for controlling an electrical load as a function of occupancy of a space, comprising transmitting continuous wave ultrasonic signals into the space; receiving a Doppler-shifted ultrasonic signal reflected from the space; sampling the Doppler shifted ultrasonic signal near a zero crossing point of the Doppler shifted ultrasonic signal to provide a sampled Doppler-shifted ultrasonic signal; detecting occupancy of the space as a function of the sampled Doppler-shifted ultrasonic signal; and energizing the electrical load when the sampled Doppler-shifted ultrasonic signal indicates that the space is occupied. The sampling step may be performed by sampling the Doppler-shifted ultrasonic signal as a function of continuous wave ultrasonic signals transmitted into the space.

The invention also contemplates a method of operating an occupancy based load controller, including: at least one occupancy sensor for producing at least one occupancy estimator signal indicative of motion within a space, a programmable microprocessor, connected to the at least one occupancy sensor, for comparing the occupancy estimator signal to a predetermined threshold; and a controllable load energizing device responsive to the programmable microprocessor, operable to automatically energize an electrical load when the microprocessor determines that the occupancy estimator signal is greater than the predetermined threshold; the method comprising maintaining a status of the occupancy based load controller; detecting a predetermined motion pattern within the space; and reporting the status upon detection of the predetermined motion pattern.

Accordingly, some exemplary features and advantages of embodiments of the present invention include the use of a sophisticated multiple sensing technology based sensor fusion detection algorithm. This algorithm combines the outputs of a plurality of occupancy sensors, including, for example, ultrasonic, PIR, microwave and acoustic sensors, to produce a composite occupancy estimator signal that is compared to a composite threshold to determine occupancy. This produces a highly sensitive yet highly reliable occupancy sensor.

The present invention also contemplates a variety of self-adaptive features. These adaptive features may be individually enabled or disabled by proper setting of the sensor's user-controlled option switches. In general, the longer the sensor is allowed to adapt within a given environment, the better its occupancy detection performance will be.

The invention also provides a means to simply and efficiently communicate the status of the sensor to installation and maintenance personnel. In accordance with the present invention, a visual indication of the sensor's internal settings and variables is reported in the form of a sequence of light flashes, encoded to represent the numerical values. It also emits character descriptors of its state of operation, for instance, satisfactory, failed, or otherwise non-optimal, in the form of a sequence of light flashes. Thus it is possible for the sensor to communicate key portions of its internal state information to installers or maintenance personnel. This communication takes place from a distance, without a need to physically access the sensor.

A portion of the sensor's status information may be emitted automatically at periodic intervals. One embodiment of the present invention is also able to recognize a choreographed sequence of hand movements that instruct the sensor to output a detailed sequence of status descriptors and variable information upon command. Upon receipt of this sequence of movements, the sensor enters an information retrieval mode, and detailed internal state information is emitted in a predetermined sequence. Thus it is possible for installation or maintenance personnel to query the sensor for status and receive a detailed report. Both the query and receipt of the report occur from a distance by using the occupancy sensing function of the sensor, without a need to physically access the sensor and without the need to provide dedicated hardware to shift the sensor from a normal mode of operation to a status reporting mode.

The present invention also may incorporate means to store adapted sensor variables such that they are maintained if power to the sensor is disconnected. It is generally preferred that an occupancy sensor be powered continuously. In numerous applications, however, the power supply to the sensor is connected in series with a wall switch that controls the lighting. This often occurs in retrofit situations where the sensor power supply and relay are connected into existing lighting circuits in the most expedient way, near the lighting fixture, and in the portion of the circuit already switched at the wall. In such situations, the sensor will periodically loose power, and it is essential that it maintain its previously adapted settings.

The present invention also incorporates means to determine if the ultrasonic receiver preamplifier is saturated, and means to adjust the phase of the sample point of the synchronous demodulator circuit relative to the outgoing carrier signal by searching for the zero crossing of the preamplifier signal. This ensures that the synchronous demodulation sample is taken at the optimum point, and that the performance of the receiver is not adversely affected by preamplifier saturation that occurs between the zero crossings of the signal. Furthermore, if due to extreme preamplifier saturation the sample point search algorithm is unable to find a sample point that has sufficient saturation margin, the algorithm then decreases the transmitter drive amplitude in order to reduce the excessive signal return to the preamplifier. The search algorithm is reinitiated, and the entire process repeated until a satisfactory sample point is achieved without excessive signal saturation.

Another feature of the present invention is the detection of the typical daily and weekly occupancy cycles of the controlled space, and use of that information to improve the accuracy of the sensor's occupancy decisions. This is accomplished by maintaining a clock, and dividing the seven days of the week and the 24 hours of each day into multiple time slots. Associated with each of these time slots is a stored data value that indicates the likelihood that the workspace is occupied during that particular time on that particular day of the week thus forming a histogram. This occupancy probability histogram is formed over a period of days and weeks during which the sensor records and averages the detected occupancy of the space for that particular time slot. When a marginal motion signal is received, the sensor applies a correction to it based on the probability of occupancy that has been determined for that particular time slot. If the time slot is one that is typically occupied, the occupancy decision is biased in favor of declaring occupancy and the electrical loads are turned on. Conversely, if the time slot is one that is typically not occupied, the occupancy decision is biased in favor of determining non-occupancy, and the electrical loads are kept off. The result of this algorithm is a sensor that knows when people are typically around, and energizes the electrical loads quickly for them, and knows when the space is typically vacant, and keeps the electrical loads de-energized unless an unmistakable motion signal is received.

The present invention also includes active ultrasonic continuous wave Doppler motion occupancy detection. The duty cycle of the ultrasonic transmitter waveform may be varied to achieve automatic output level adjustment. The present invention may also include PIR motion occupancy detection, acoustic sound detection, microwave detection, or any combination of ultrasonic, PIR, acoustic, and microwave detection methods.

The present invention may also include energy-conserving daylight control operation. This feature is used to turn off electrical lighting loads in an occupied area that has a sufficient amount of natural lighting or to control dimmable or multi-level lighting systems to provide only the required amount of additional (electrical) lighting.

The present invention is also able to recognize saturation of the ultrasonic receiver preamplifier due to excessive ultrasonic return signal amplitude. It is able to vary the duty cycle of the waveform applied to the ultrasonic transmitter away from 50 percent (maximum amplitude) duty cycle, and to decrease the amplitude by changing to a lower duty cycle.

The present invention also includes easy selection of operating mode and adjustment of sensitivity and timer delay. This feature allows the user to easily adjust the sensor's mode of operation, the sensor's sensitivity and delay timer settings for the desired operation of the sensor. A user of the present invention also has a variety of sophisticated dual-technology selection settings, including a HIGH CONFIDENCE mode and a HIGH SENSITIVITY mode.

Other features and advantages of the invention will become apparent from a consideration of the drawings and ensuing detailed description.

BRIEF DESCRIPTION OF THE DRAWINGS

FIG. 21 is a decision surface for a table look-up version of the Yager Union function in FIG. 19.

FIG. 22 is a decision surface for a table look-up version of the Yager Union function in FIG. 20.

FIG. 30 is a diagram showing sensor installations that may result in adaptation of sensor sensitivity.

FIG. 62(*b*) is an example of a status report according to the present invention.

DESCRIPTION OF ILLUSTRATIVE EMBODIMENTS

Figure 1:
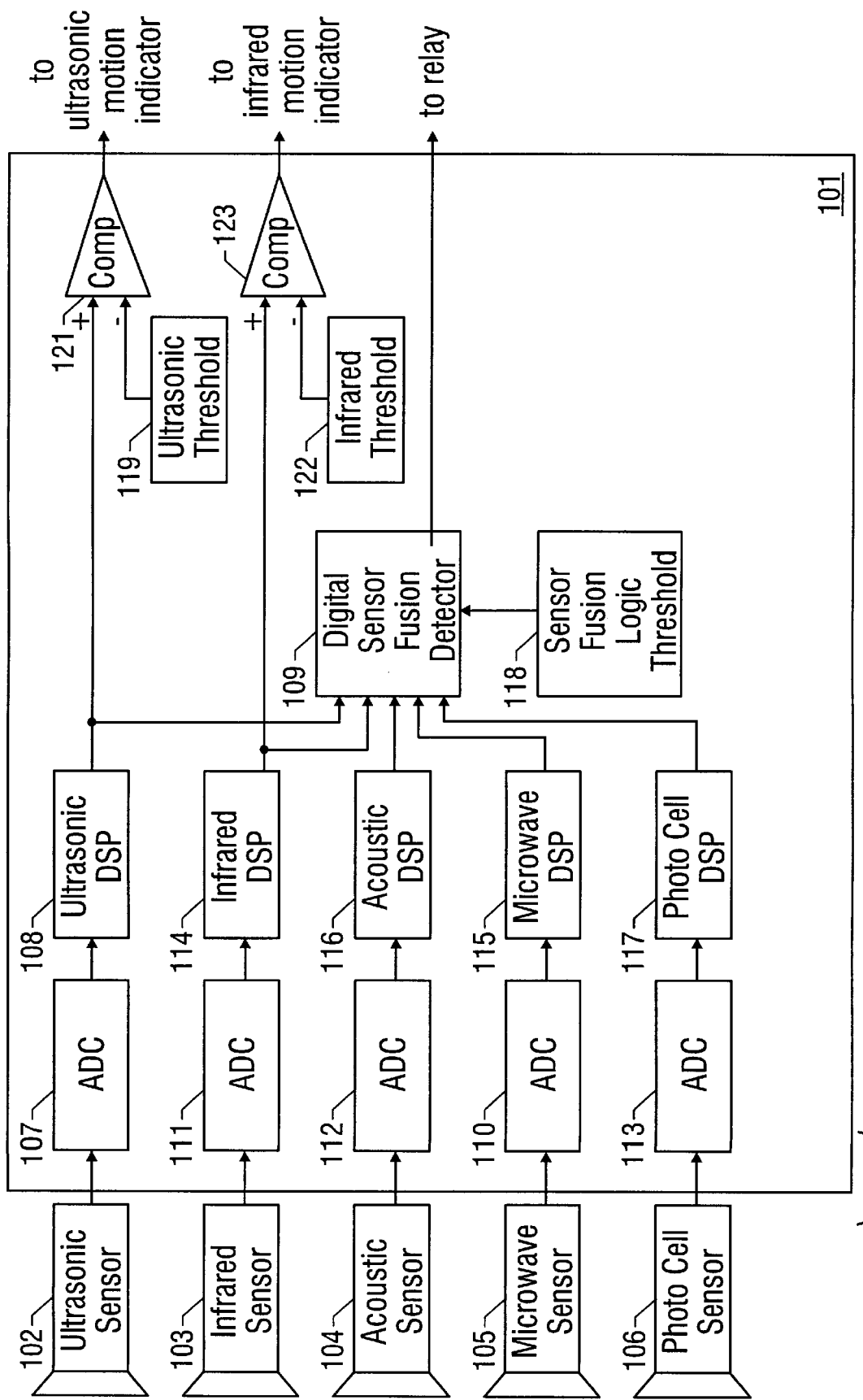
FIG. 1 is a simplified functional block diagram of the present invention.

Glossary of Acronyms
A/D analog-to-digital converter
ASA automatic sensitivity adjustment
ATA automatic timer adjustment
CCP capture/compare/PWM
CMOS complimentary metal oxide semiconductor
DSP digital signal processing
EEPROM electrically erasable programmable read only memory
GSB gain setback
HVAC heating, ventilation, air conditioning
I/O input/output
LED light emitting diode
MUX multiplexer
OP AMP operational amplifier
PIR passive infrared
PWM pulse width modulation
RAM random access memory
ROM read only memory
TTL transistor-transistor logic
VDC volts direct current A simplified, functional block diagram of the multi-technology-based occupancy sensor 100 of the present invention is shown in FIG. 1. The occupancy sensor inputs are on the left side of FIG. 1. The digital microcontroller 101 and various signal conditioning blocks are in the center of FIG. 1. The various outputs are on the right hand side of FIG. 1. FIG. 1 illustrates the use of five different sensor technologies: ultrasonic 102, infrared 103, acoustic 104, microwave 105 and visible light 106. The analog output signal of the ultrasonic sensor 102 is digitized using an analog-to-digital converter (A/D) 107. The digital ultrasonic sensor signal is then processed using an ultrasonic DSP algorithm 108 on the digital microcontroller. The resulting ultrasonic output signal, referred to as an occupancy estimator signal, is then fed to a digital sensor fusion detector 109. In a similar fashion, occupancy estimator signals are generated for the analog signals from the infrared, acoustic, microwave and visible light sensors 103, 104, 105, 106 by digitizing the analog signal using A/Ds 110, 111, 112, 113 and processing the signal using the appropriate DSP algorithms 114, 115, 116, 117. The resulting occupancy estimator signals are fed to the digital sensor fusion detector 109. The digital sensor fusion occupancy detector 109 then combines the different processed sensor signals to produce a composite occupancy estimator that is compared to a composite sensor fusion threshold 118 (either a composite activation or composite maintenance threshold) to determine occupancy. The output of the sensor fusion detector 109 is used to actuate a relay that energizes the electrical load(s) controlled by the occupancy sensor.

If the ultrasonic DSP 108 output signal exceeds the user-defined ultrasonic activation threshold 119 as determined by comparator 121, the ultrasonic motion indicators will be turned on. Similarly, if the infrared DSP 114 output signal exceeds the user-defined infrared activation threshold 122 as determined by comparator 123, the infrared motion indicators will be turned on. is It should be noted that the individual sensor technology activation thresholds 119 and 122 are preferably used only to drive the various sensor technology motion indicators and are not used alone to sense occupancy.

Figure 2:
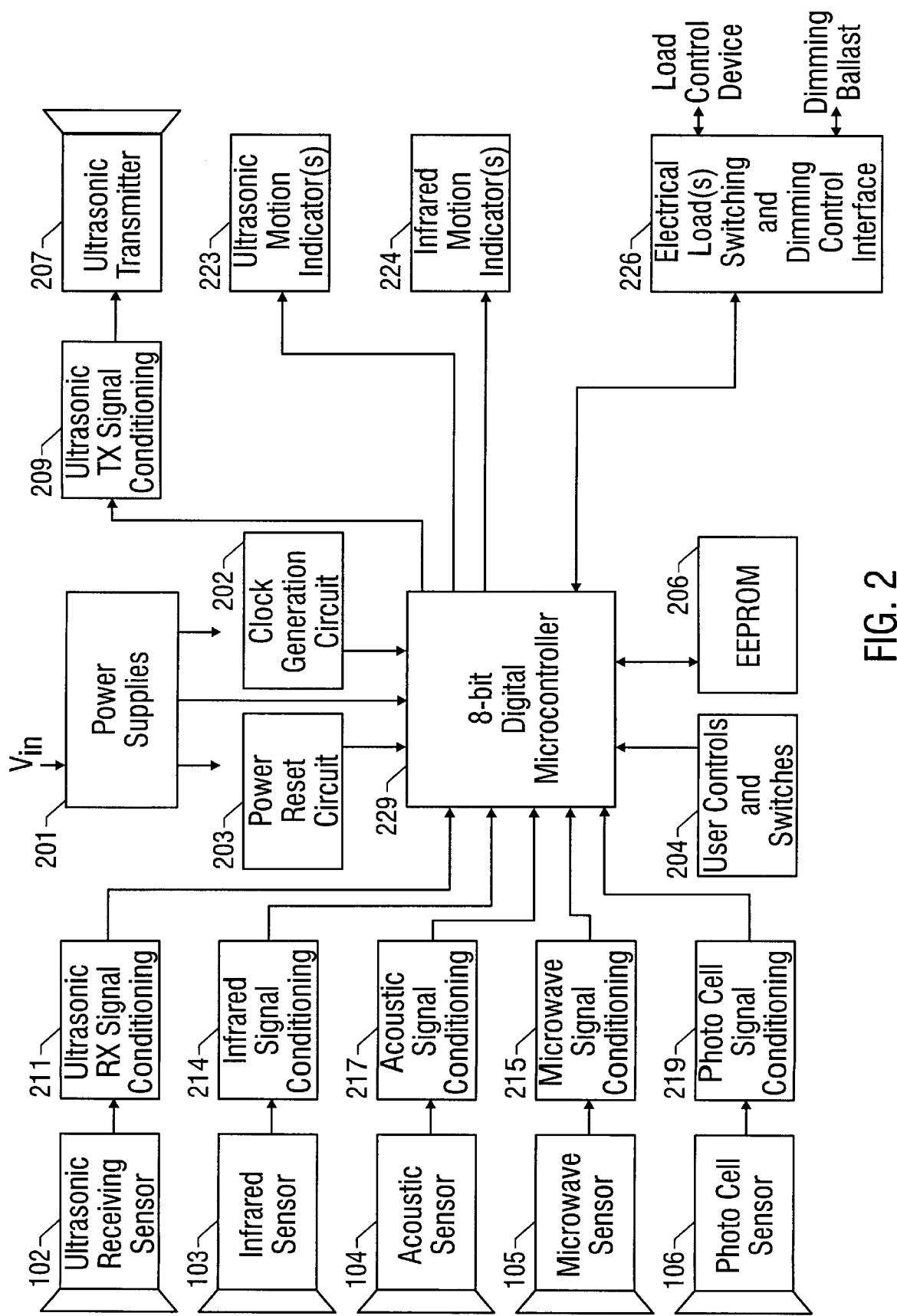
FIG. 2 is a detailed functional block diagram of the present invention.

A more detailed functional block diagram of the present invention is shown in FIG. 2. The occupancy sensor inputs are on the left hand side of the diagram. The digital microcontroller and its related blocks are in the center of the diagram. The various outputs are on the right hand side of the diagram. The occupancy sensor has the following major functional blocks: power supplies circuit 201; clock generator circuit 202; power reset circuit 203; user controls and switches 204; EEPROM circuit 206; ultrasonic transmitter circuit 207; ultrasonic receiver circuit 102; ultrasonic transmitter signal conditioning circuit 209; ultrasonic receiver signal conditioning circuit 211; infrared sensor circuit 103; infrared signal conditioning circuit 214; acoustic sensor circuit 104; acoustic signal conditioning circuit 217; microwave sensor circuit 105, microwave signal conditioning circuit 215, microwave transmitter circuit 225, microwave transmitter signal conditioning circuit 210, photo cell sensor circuit 106; photo cell signal conditioning circuit 219; ultrasonic motion indicator circuit 223; infrared motion indicator circuit 224; electrical load(s) switching and dimming control interface 226; and digital microcontroller circuit 229.

Each of these electrical hardware blocks is now described in detail. An exemplary embodiment of the power supplies circuit 201 accepts an unregulated input voltage, Vin, and produces one or more regulated out voltages that are used to power the various components shown in FIG. 2. An exemplary embodiment has an input voltage is 24 VDC and produces nominal regulated output voltages of 13.1, 5.1 and 2.5 VDC, although other input and output voltages would also be acceptable. The 2.5 VDC supply is also referred to as VREF.

Clock generator circuit 202 may be of conventional crystal oscillator design, and in the exemplary embodiment, includes a crystal and a clock driver circuit internal to the digital microcontroller 229. The clock generator circuit 202 has no input and the output of the clock generator circuit is the digital oscillator clock signal for the digital microcontroller 229. An 8.0 MHz or 9.8 MHz parallel cut crystal is used depending on the desired ultrasonic transmitter frequency.

Power reset circuit 203 is of conventional design. The input to power reset circuit 203 is the 5.1 VDC power supply. The output of power reset circuit 203 is an exponentially rising analog signal used to reset the digital microcontroller 229 upon application of power.

Figure 3:
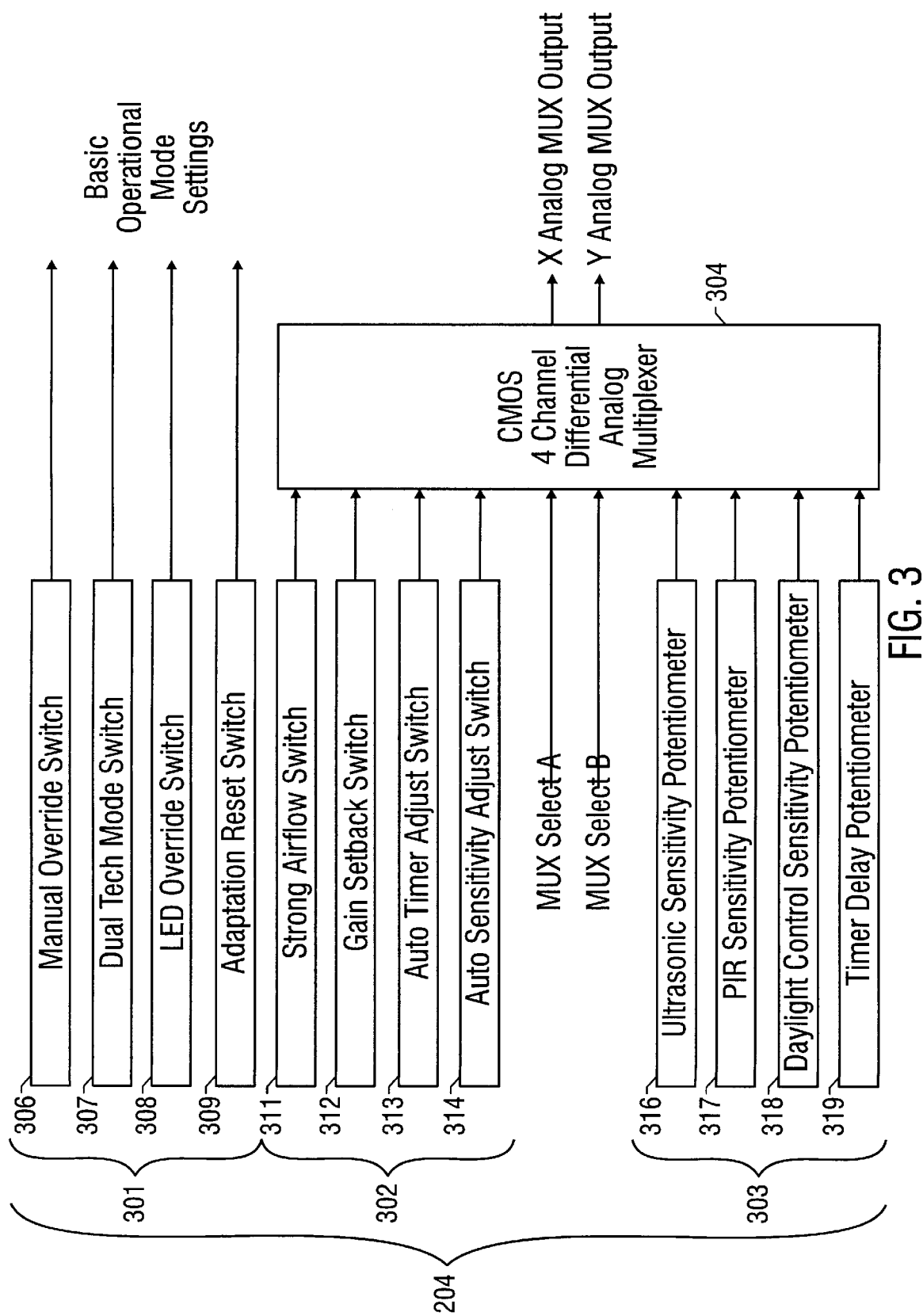
FIG. 3 is the user controls and switches circuit of the present invention.

An exemplary embodiment of the user controls and switches block 204 is shown in FIG. 3 and comprises two banks of switches 301, 302, four potentiometers 303 and a CMOS 4 channel differential analog multiplexer 304. The inputs to the user controls and switches block 204 are the user-specified settings of these switches and potentiometers. The outputs of the user controls and switches block 204 are the analog voltages corresponding to the user-specified settings.

The first bank of switches 301 includes four switches 306, 307, 308, 309 that determine the basic operational mode of the sensor. Specifically, these switches include manual override switch 306, dual technology mode switch 307, LED override switch 308 and adaptation reset switch 309.

Manual override switch 306 is used to override the normal operation of the sensor. In the ON state, the electrical load switched by the sensor will be energized at all times. In the OFF state, the electrical load switched by the sensor will be energized whenever occupancy is sensed.

Dual technology mode switch 307 determines the thresholds to be used for comparing to the composite occupancy estimator. The system can be configured with any combination of ultrasonic, PIR and acoustic detection technologies. In the OFF state (referred to as the HIGH CONFIDENCE THRESHOLD mode), the sensor's composite activation threshold is set at a high level. In this mode, the sensor is less likely to false trigger, but the sensor is not as sensitive and therefore less likely to detect marginal detection cases. In the ON state (referred to as the HIGH SENSITIVITY THRESHOLD mode), the sensor's composite activation threshold is set at a lower level than the HIGH CONFIDENCE THRESHOLD mode. In this mode, the sensor is more sensitive and will more accurately detect marginal cases at the risk of a greater likelihood of false triggering.

LED override switch 308 is used to override the normal operation of the sensor's LEDs. In the OFF state, all sensor LEDs will be disabled. In the ON state, all sensor LEDs will be enabled.

Adaptation reset switch 309 is used to reset the sensor's adaptive variables. If the sensor's environment changes significantly a long time after the power on reset condition, the sensor's adaptive variables may need to be reset so that the sensor can begin adapting to its new environment. In the OFF state, the sensor's adaptive variables will not be reset. In the ON state, the sensor's adaptive variables will be reset.

The second bank of switches 302 comprises four switches 311, 312, 313, 314 that select the more advanced features of the sensor. Specifically, these switches include: strong airflow algorithm switch 311, gain setback switch 312, automatic timer adjustment switch 313, and automatic sensitivity adjustment switch 314.

Strong airflow algorithm switch 311 is used to modify the ultrasonic sensor's response in order to better compensate for the presence of air flow. In the OFF state, the sensor uses its standard airflow ultrasonic DSP algorithm. In the ON state, the sensor uses its strong airflow ultrasonic DSP algorithm.

Gain setback switch 312 is used to determine the sensor's gain as a function of time since motion was last sensed. In the OFF state, the sensor's gain does not vary as a function of time. In the ON state, the sensor's gain will vary as a function of time.

Automatic timer adjustment switch 313 is used to determine the sensor's timer delay setting as a function of time. In the OFF state, the sensor's timer delay setting does not automatically vary as a function of time. In the ON state, the sensor's timer delay setting varies automatically as a function of time.

Automatic sensitivity adjustment switch 314 is used to determine the sensor's sensitivity setting as a function of time. In the OFF state, the sensor's sensitivity setting does not automatically vary as a function of time. In the ON state, the sensor's sensitivity setting varies automatically as a function of time.

The user controls and switches block 204 also contains four potentiometers: ultrasonic sensitivity potentiometer 316, PIR sensitivity potentiometer 317, daylight control sensitivity potentiometer 318, and timer delay potentiometer 319.

Ultrasonic sensitivity potentiometer 316 is used to increase or decrease the sensor's ultrasonic sensitivity. The ultrasonic sensitivity potentiometer setting maps linearly to sensor range. PIR sensitivity potentiometer 317 is used to increase or decrease the sensor's PIR sensitivity. Daylight control sensitivity potentiometer 318 is used to adjust the sensor's daylight control sensitivity by increasing or decreasing the daylight control ambient light threshold. Timer delay potentiometer 319 is used to adjust the sensor's timer delay by increasing or decreasing the length of time the sensor's electrical load(s) are energized following occupancy detection. The timer delay potentiometer setting maps linearly to sensor time delay.

The user controls and switches block 204 also contains a CMOS 4 channel differential analog multiplexer 304. Multiplexer 304 may be a 4052 type multiplexer, available from National Semiconductor. Multiplexer 304 allows the user to simultaneously read two analog input signals. The inputs to multiplexer 304 are two banks of four analog signals 302, 303 and two digital logic control signals A and B generated by digital microcontroller 229 (FIG. 2). The outputs of multiplexer 304 are the two analog signals selected using the multiplexer 304 for application to digital microcontroller 229.

In the exemplary embodiment, EEPROM circuit 206 comprises a CMOS 256×8 serial EEPROM for non-volatile storage of the various occupancy sensor registers although other memories may be used. EEPROM circuit 206 has two inputs, a serial clock and serial data line. The output of the EEPROM circuit is a serial data line. In the exemplary embodiment, EEPROM 206 uses a standard serial bus protocol for saving and retrieving the various occupancy sensor register values.

Figure 4:
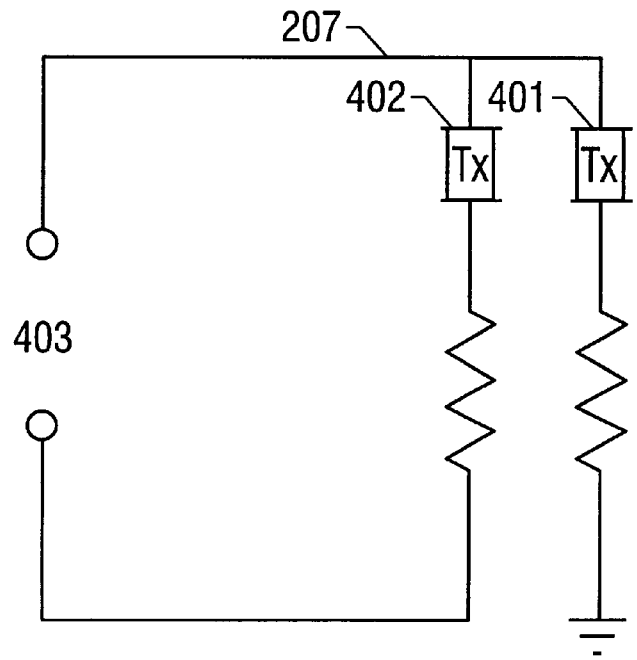
FIG. 4 is the ultrasonic transmitter circuit of the present invention.

An exemplary embodiment of the ultrasonic transmitter circuit 207 is shown in FIG. 4 and is comprised of one or two 16 mm narrowband air ultrasonic ceramic transducers 401, 402. The input 403 to these transducers 401, 402 is either a 0 to 15 volt or −15 to 15 volt variable duty cycle square wave, although other driving signal may also be acceptable. The output of transducers 401, 402 is an ultrasonic continuous-wave tone at the desired frequency of interest.

An exemplary embodiment supports ultrasonic transmitter frequencies of 25 KHz, 32 KHz and 40 KHz, but other frequencies would also be acceptable. A variety of commercial ultrasonic transmitting transducers are available. For example, acceptable 16 mm transmitting transducers available from S-Square are shown in Table 1.

TABLE 1

Exemplary S-Square Ultrasonic Transmitting Transducers

| Frequency (KHz) | Model Number | Sound Level (dB) | Bandwidth (KHz) | Capacitance (pF) | Input Power (watts) |
|---|---|---|---|---|---|
| 25 | 250ST160 | 112 | 2 | 2400 | 0.2 |
| 32 | 328ST160 | 115 | 2 | 2400 | 0.2 |
| 40 | 400ST160 | 119 | 2 | 2400 | 0.2 |

Figure 5:
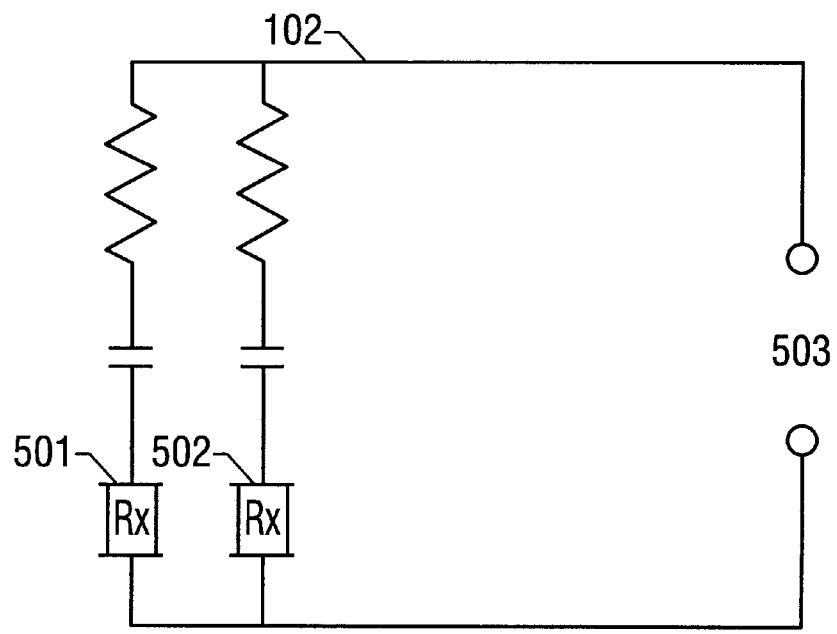
FIG. 5 is the ultrasonic receiver circuit of the present invention.

An exemplary embodiment of ultrasonic receiver circuit 102 is shown in FIG. 5 and includes one or two 16 mm narrowband air ultrasonic ceramic transducers 501, 502. The input to these transducers 501, 502 is an ultrasonic continuous-wave tone centered at the desired frequency of interest with an additional Doppler-shifted signal corresponding to motion in the is sensor's field of view. The output 503 of ultrasonic receiver circuit 102 is an electrical signal corresponding to the received acoustic signal. An exemplary embodiment of the present invention supports ultrasonic receiver frequencies of 25 KHz, 32 KHz and 40 KHz, and variety of commercial ultrasonic receiving transducers are available. For example, acceptable 16 mm receiving transducers available from S-Square are shown in Table 2.

TABLE 2

Exemplary S-Square Ultrasonic Receiving Transducers

| Frequency (KHz) | Model Number | Sensitivity (dB) | Bandwidth (KHz) | Capacitance (pF) | Input Power (watts) |
|---|---|---|---|---|---|
| 25 | 250SR160 | −65 | 2 | 2400 | 0.2 |
| 32 | 328SR160 | −67 | 2.5 | 2400 | 0.2 |
| 40 | 400SR160 | −65 | 2.5 | 2400 | 0.2 |

Figure 6:
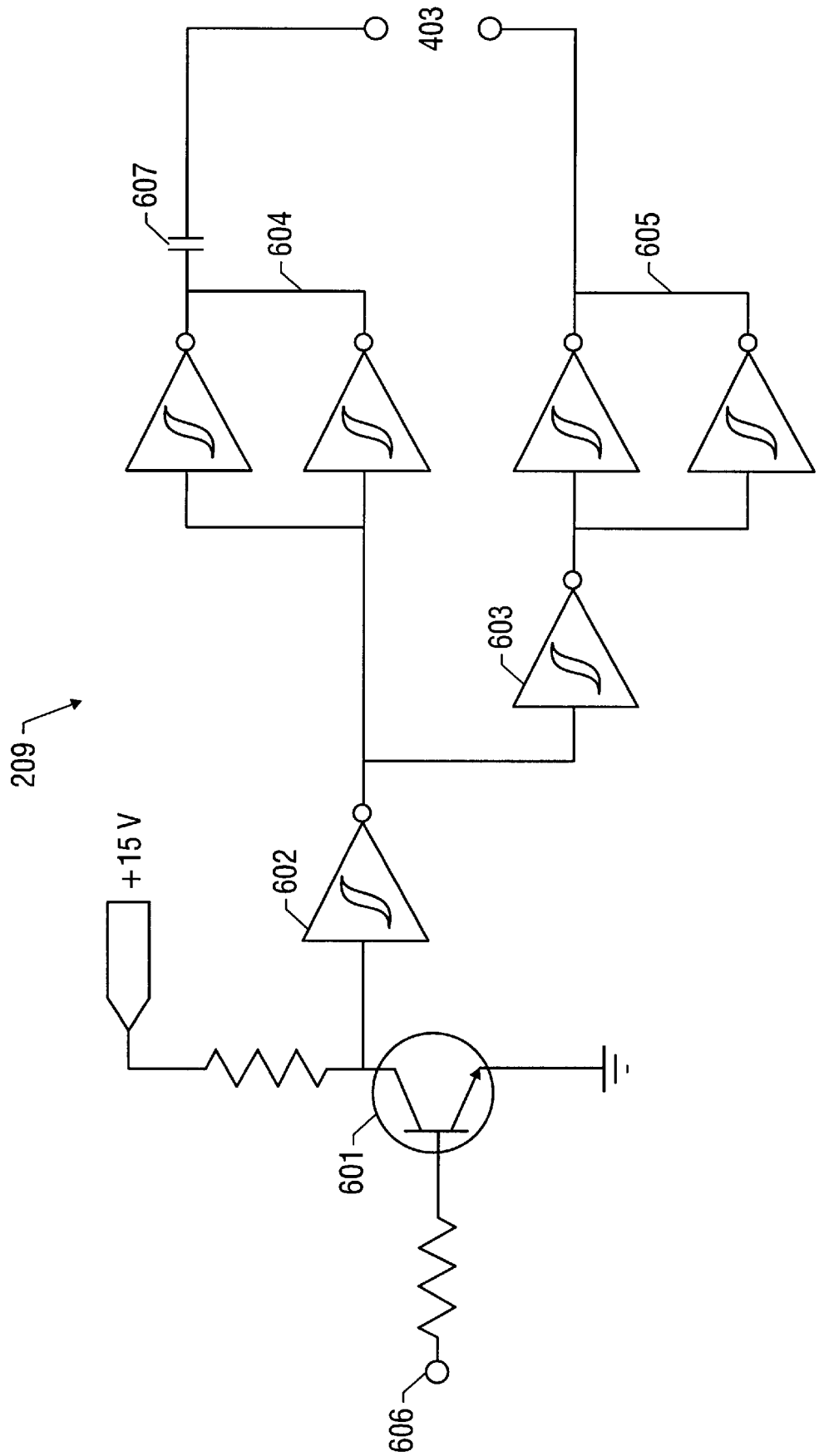
FIG. 6 is the ultrasonic transmitter signal conditioning circuit of the present invention.

An exemplary ultrasonic transmitter signal conditioning circuit 209 is shown in FIG. 6 and includes an NPN transistor circuit 601, a CMOS buffer circuit 602, a CMOS inverter circuit 603 and two CMOS driver circuits 604, 605. Input 606 to circuit 209 is a variable duty cycle TTL-level square wave generated by the digital microcontroller 229. Output 403 of circuit 209 is applied to ultrasonic transmitter circuit 207 (FIG. 4) and is either a single-ended or double-ended ultrasonic transmitter signal at the desired frequency of interest.

The variable duty cycle TTL-level square wave input signal 606 generated by the digital microcontroller 229 is generated by a latch (not shown) that is set at a rate determined by a carrier period counter value, and that is cleared within each carrier period at a point determined by the carrier pulse width counter value. Unequal turn-on and turn-off times of the transmitter signal conditioning circuit 209 that drives the carrier send transducer may result in an asymmetric signal at the amplifier output, and thus less than full power being dissipated in transmitter. The sensor algorithm may compensate for the unequal turn-on and turn-off times by setting the carrier pulse width counter to a predetermined value intended to yield a symmetric square wave at the amplifier output. In the event that it is desired to decrease the transmitter output power level, the carrier pulse width counter may be varied to deviate from a 50% duty cycle square wave, lowering the effective AC drive level to the transmitting transducer, and thus the output level.

NPN transistor circuit 601 is used as a level shifter. The input to NPN transistor circuit 601 is a TTL-level square wave. The output of NPN transistor circuit 601 is a 0 to 15 volt level square wave. CMOS buffer circuit 602 is composed of a single CMOS inverter with Schmitt trigger. This CMOS inverter 602 is used to increase the output drive capability of the NPN transistor circuit 601. The input to the CMOS buffer 602 is a 0 to 15 volt level square wave. The output of the CMOS buffer 602 is a 0 to 15 volt level square wave. CMOS inverter circuit 603 is comprised of a single CMOS inverter with Schmitt trigger. CMOS inverter circuit 603 inverts the ultrasonic transmitter signal to allow double-ended transmitter drive capability. The two CMOS driver circuits 604, 605 are each comprised of two CMOS inverters with Schmitt triggers, in parallel. These two driver circuits 604, 605 allow the ultrasonic transducer(s) to be driven in either single ended or differential mode. For single ended mode the transducer(s) is connected between driver circuit 604 via capacitor 607, and the effective drive applied to the transducer(s) is a square wave with amplitude +7.5 V to −7.5 V. For differential drive, the transducer(s) is connected between driver circuit 604, coupled via capacitor 607, and driver circuit 605, and the effective drive applied to the transducer(s) is a square wave of amplitude +15 V to −15 V.

Figure 7A:
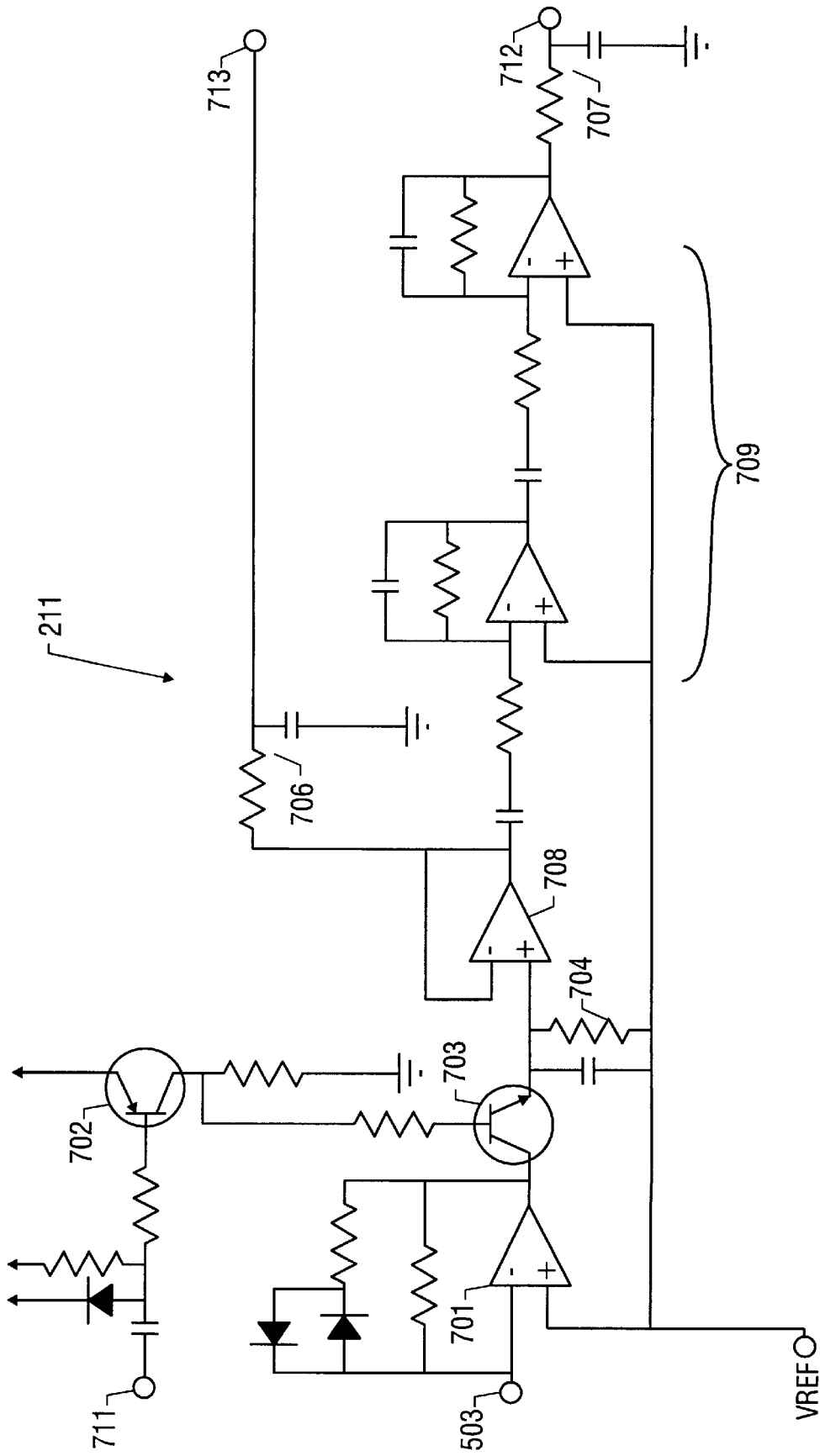
FIG. 7(a) is the ultrasonic receiver signal conditioning circuit of the present invention.

The ultrasonic receiver signal conditioning circuit 211 is shown in FIG. 7(a) and includes a variable gain op amp circuit 701, a PNP transistor circuit 702, an NPN transistor circuit 703, three RC circuits 704, 706, 707, an op amp buffer circuit 708 and a two stage op amp circuit 709. The inputs to ultrasonic receiver signal conditioning circuit 211 are the Doppler-shifted analog ultrasonic receiver signal 503 and a digital sampling point signal 711. The outputs of ultrasonic receiver signal conditioning circuit 211 are the demodulated, filtered analog ultrasonic receiver signal 712 and an analog ultrasonic sampling point signal 713.

Variable gain op amp circuit 701 is an ultrasonic receiver preamplifier circuit. The input to this circuit is the modulated analog ultrasonic receiver signal 503. The output of this circuit is an amplified, modulated analog ultrasonic receiver signal. Circuit 701 uses diodes in the 4. negative feedback path to switch in parallel with a resistor, thus decreasing the overall gain for large signal excursions, and preventing hard-limiting of the amplifier in the event of excessive continuous wave receiver signals. The resulting nonlinear transfer characteristic is advantageous when the sensor is installed in a confined space where wall reflections cause a large amount of acoustic energy to be directed into the ultrasonic receiver.

PNP transistor circuit 702 is a zero crossing phase lock loop sampling point circuit. The input to circuit 702 is a digital sampling point signal 711 generated by the digital microcontroller 229. The output of circuit 702 is an analog sampling signal used to drive the synchronous demodulator circuit 703. Circuit 702 varies the position (or phase) of the sampling point on the ultrasonic receiver waveform under control of digital microcontroller 229. This prevents the loss of motion information due to large signal levels. For optimum sensitivity, the synchronous sample point on the ultrasonic receiver waveform should lie as close to the zero crossing as possible.

NPN transistor circuit 703 is a synchronous demodulator circuit. The two inputs to circuit 703 are the amplified modulated analog ultrasonic receiver signal and the analog sampling point signal. The output of circuit 703 is the demodulated Doppler-shifted analog ultrasonic receiver signal. The NPN transistor in circuit 703 is arranged in a series pass configuration and is driven by the analog sampling point signal generated by PNP transistor circuit 702.

RC circuit 704 is an envelope detector circuit. The input to RC circuit 704 is the Doppler-shifted analog ultrasonic receiver signal. The output of RC circuit 704 is the filtered, demodulated Doppler-shifted analog ultrasonic receiver signal. RC circuit 704 acts as an envelope detector and filters out the ultrasonic carrier while preserving the low frequency Doppler shift signal information.

Op amp buffer circuit 708 serves to increase the drive capability of the synchronous demodulator circuit 703. The input to circuit 708 is the filtered, demodulated Doppler-shifted analog ultrasonic receiver signal. The output of circuit 708 is the increased drive, filtered, demodulated Doppler-shifted analog ultrasonic receiver signal.

RC circuit 706 is a lowpass filter circuit. The input to RC circuit 706 is the increased drive, filtered, demodulated Doppler-shifted analog ultrasonic receiver signal. The output of RC circuit 706 is the increased drive, lowpass filtered, demodulated Doppler-shifted analog ultrasonic receiver signal. The output of circuit 708 is lowpass filtered to remove contributions due to motion in the environment, leaving a DC signal that represents the receiver carrier amplitude at the ultrasonic sample point. This signal is sampled by the digital microcontroller 229 through signal 711 to yield the analog ultrasonic sampling point signal 713.

Two stage op amp circuit 709 is a bandpass filter circuit. The input to circuit 709 is the increased drive, filtered, demodulated Doppler-shifted analog ultrasonic receiver signal. The output of circuit 709 is the increased drive, bandpass filtered, demodulated Doppler-shifted analog ultrasonic receiver signal. The pass band of circuit 709 is designed to pass the Doppler-shifted signal for motions of interest.

RC circuit 707 is an anti-aliasing filter circuit. The input to RC circuit 707 is the increased drive, bandpass filtered, demodulated Doppler-shifted analog ultrasonic receiver signal. The output of RC circuit 707 is the anti-aliased, increased drive, bandpass filtered, demodulated Doppler-shifted analog ultrasonic receiver signal. The output signal 712 is sampled by the digital microcontroller 229 A/D circuitry and processed using a variety of digital signal processing techniques as discussed in detail below.

Figure 7B:
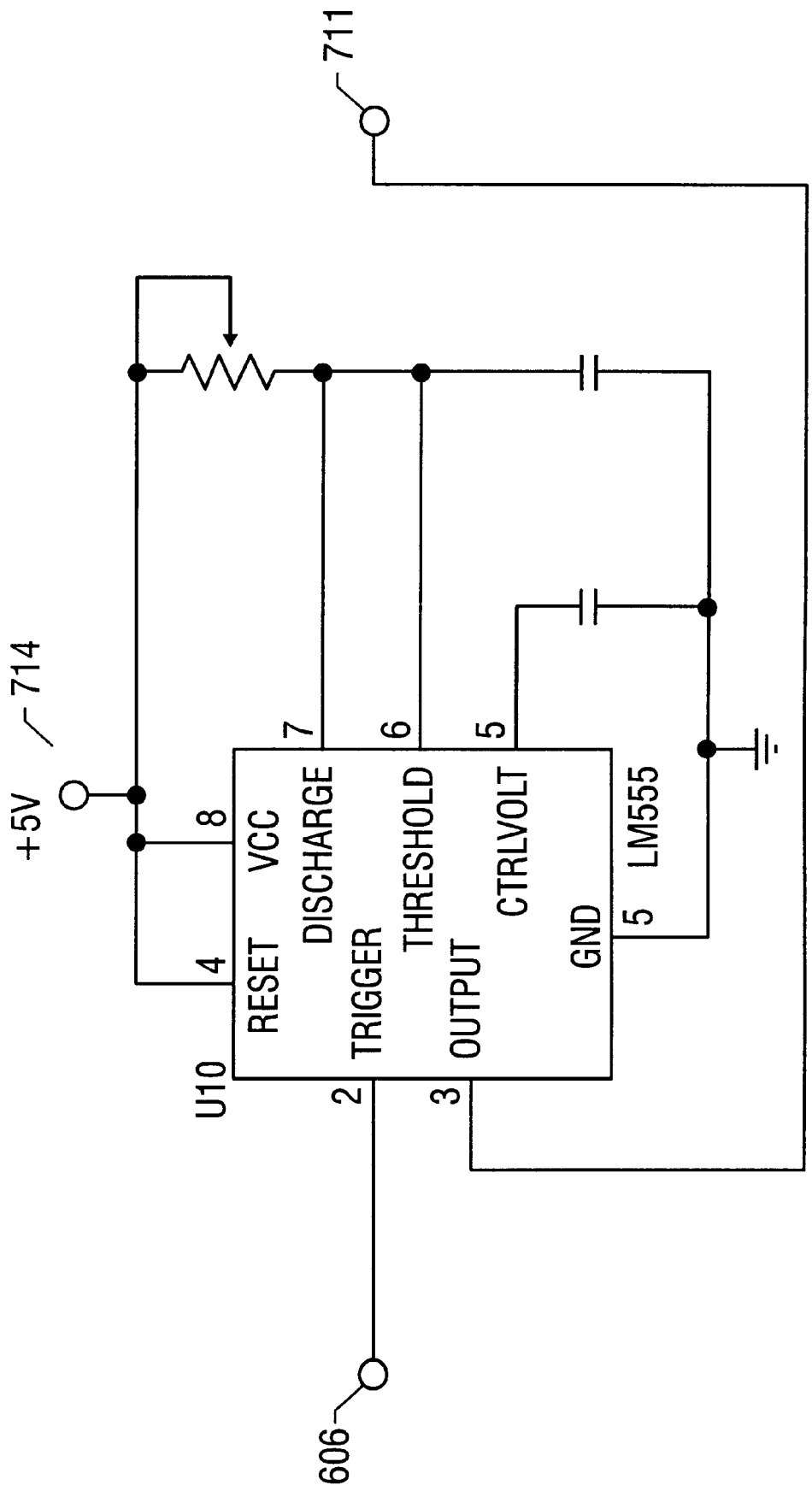
FIG. 7(b) is an alternative sampling control circuit useable in the circuit of FIG. 7(a)

FIG. 7(*b*) is an exemplary embodiment of a circuit that may be used in combination with the circuit of FIG. 7(*a*) to affect sampling of the Doppler shifted ultrasonic signal without the use of microcontroller 229 to generate the sampling signal. The circuit of FIG. 7(*b*) is based on a commercially available 555 timer circuit 714 and peripheral circuitry. The input to the timer circuit 714 is the same as the input 606 to the transmitter signal conditioning circuit shown in FIG. 6, and the output of the timer circuit 714 is connected to the sampling point signal input 711 to the ultrasonic receiver signal conditioning circuit of FIG. 7(*a*).

Figure 8:
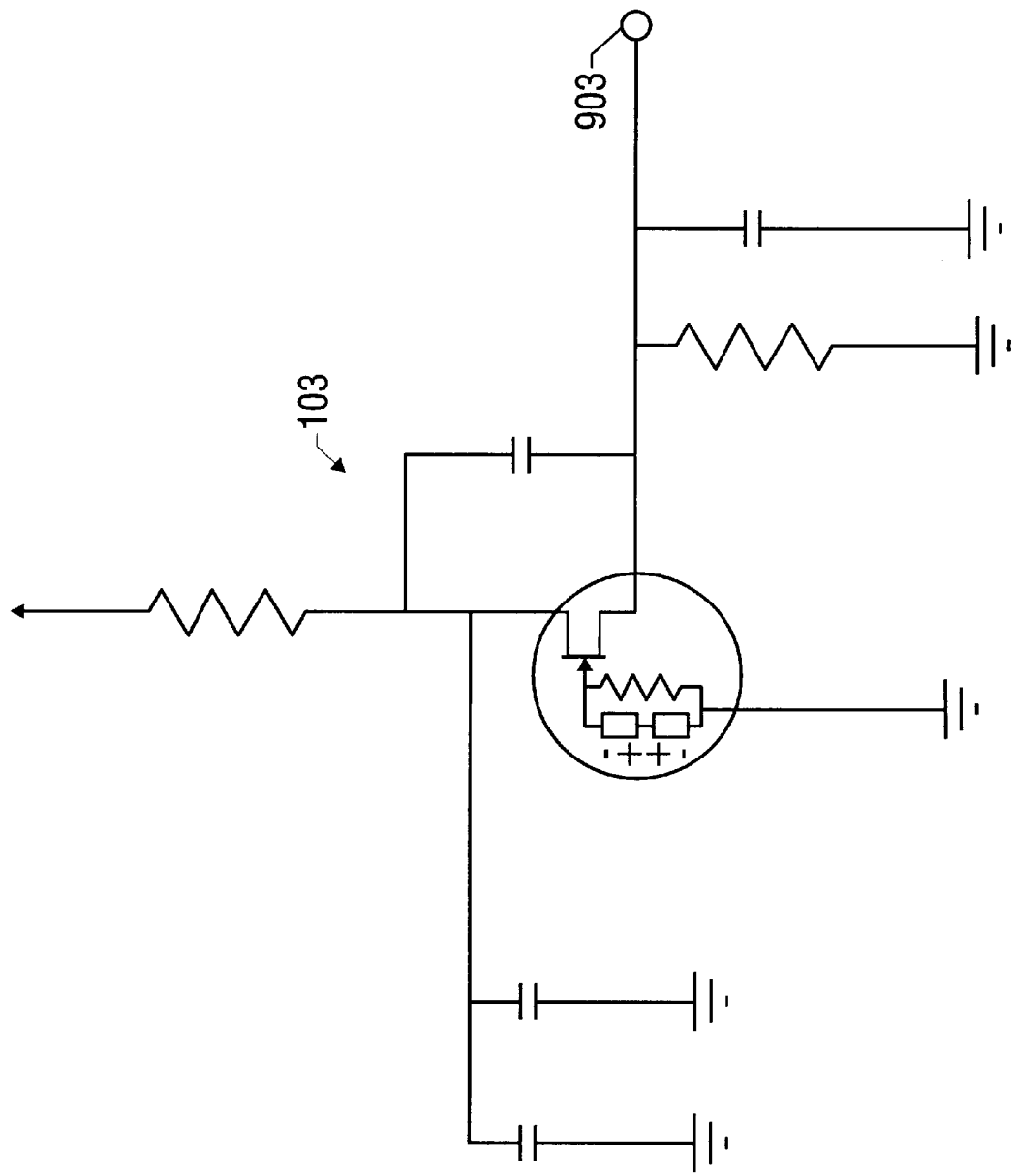
FIG. 8 is the infrared sensor circuit of the present invention.

An exemplary embodiment of the infrared sensor circuit 103 is shown in FIG. 8 and includes a dual element pyroelectric infrared motion sensor circuit. The input to infrared sensor circuit 103 is infrared electromagnetic radiation. The output of infrared sensor circuit 103 is an electrical signal indicative of motion.

A variety of commercial infrared motion sensors are available. An acceptable example is the Heimann LHi 878 dual element pyroelectric infrared motion sensor. This sensor is designed to detect motion of human body radiation in the range of electromagnetic wavelengths of 5 to 14 micrometers. Other infrared sensors would also be acceptable.

Figure 9:
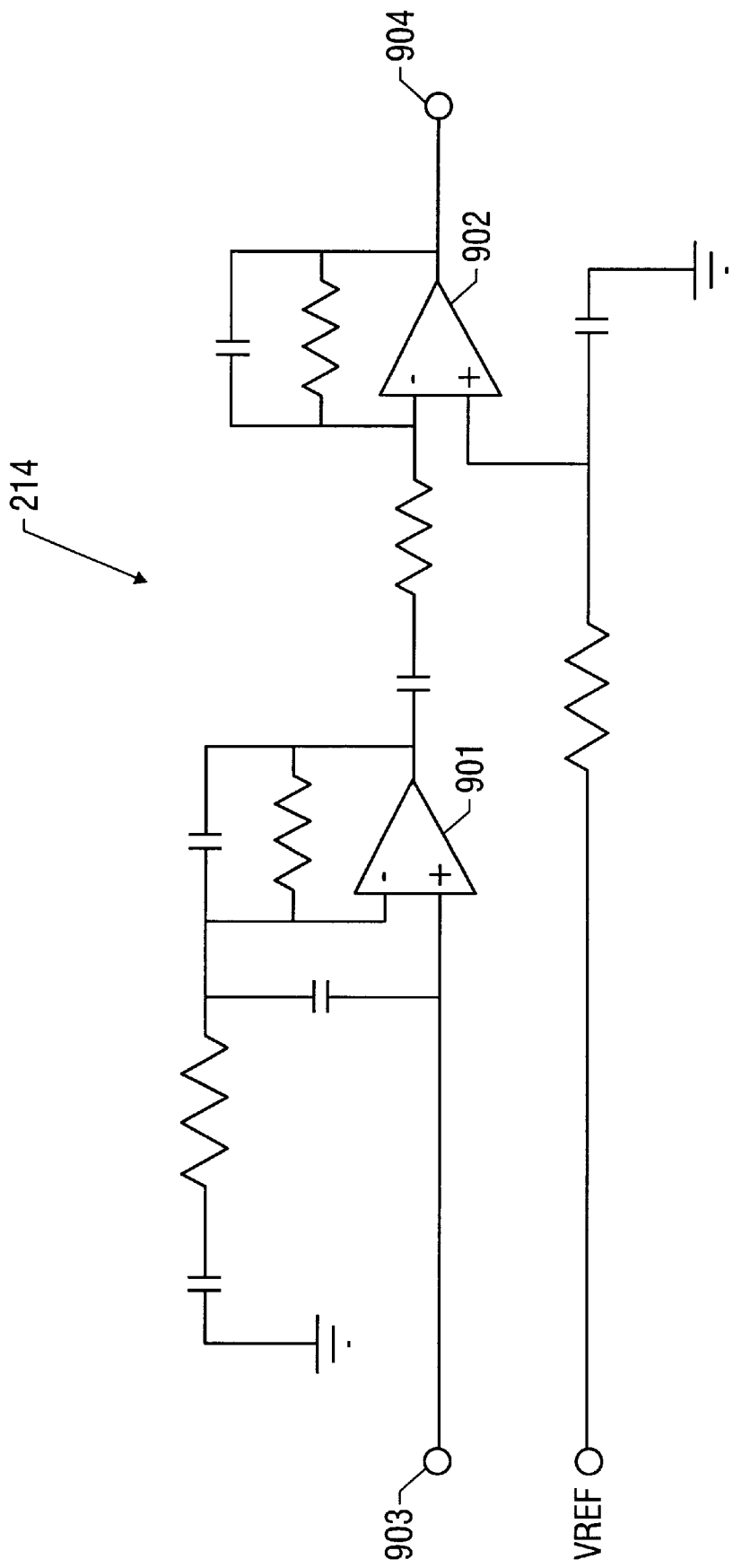
FIG. 9 is the infrared signal conditioning circuit of the present invention.

An exemplary embodiment of the infrared signal conditioning circuit 214 is shown in FIG. 9 and includes two cascaded op amp bandpass circuits 901, 902. The input 903 to infrared signal conditioning circuit 214 is the electrical PIR sensor signal indicative of motion. The output 904 of infrared signal conditioning circuit 214 is a bandpass filtered infrared sensor signal indicative of motion. The output signal 904 of this circuit is sampled by A/D circuitry within the digital microcontroller 229 and processed using a variety of digital signal processing techniques discussed below.

Figure 10:
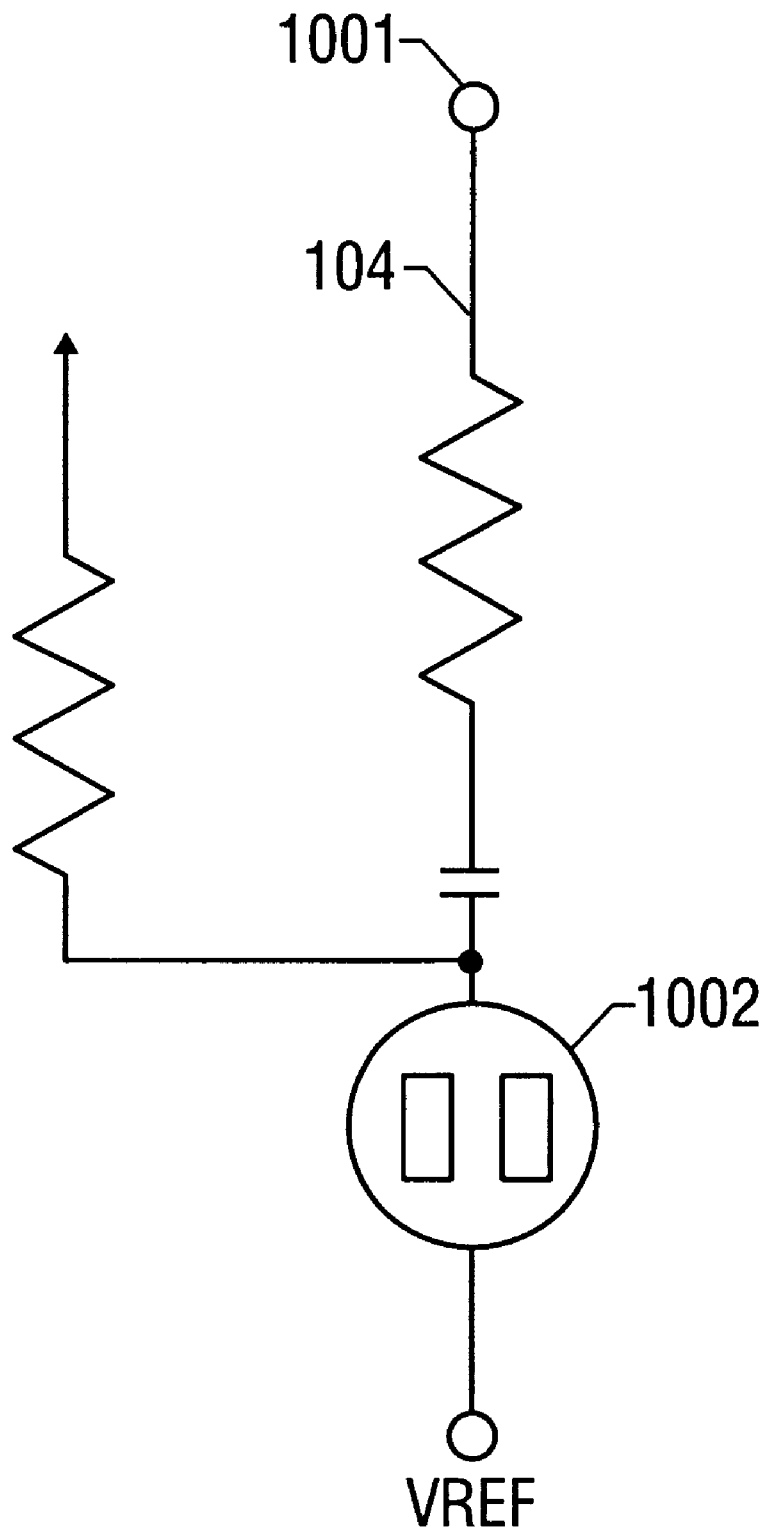
FIG. 10 is the acoustic sensor circuit of the present invention.

An exemplary embodiment of the acoustic sensor circuit 104 is shown in FIG. 10 and includes an audio acoustic sensor 1002 and surrounding circuitry. The input to acoustic sensor circuit 104 is sound energy. The output 1001 is an electrical signal indicative of occupancy such as human speech and sounds generated by human occupants.

A variety of commercial acoustic sensors 1002 are available. An acceptable example is the Panasonic WM-52BM electret condenser microphone cartridge. It includes a high voltage internal electret membrane, metal electrode and a field effect transistor (FET). Frequency range extends from 20–16,000 Hz.

Figure 11:
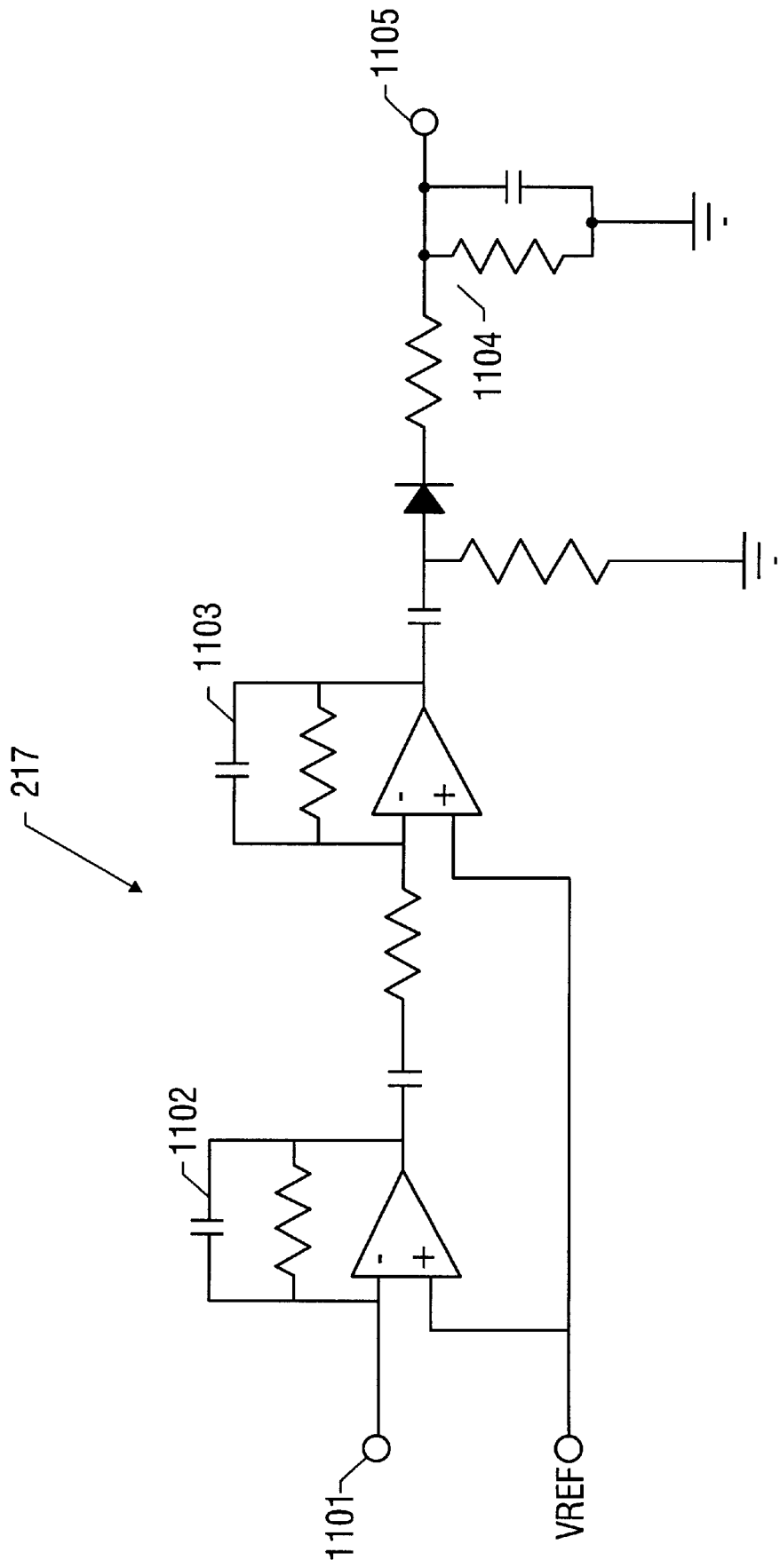
FIG. 11 is the acoustic signal conditioning circuit of the present invention.

An exemplary embodiment of the acoustic signal conditioning circuit 217 is shown in FIG. 11 and includes two cascaded op amp band pass circuits 1102 and 1103 followed by a fast attack, slow decay peak detector 1104. The input 1101 to acoustic signal conditioning circuit 217 is the electrical acoustic sensor signal indicative of occupancy 1001. The output 1105 of the acoustic signal conditioning circuit 217 represents the magnitude of acoustic energy. The output signal of this circuit is sampled by A/D circuitry within the digital micro controller 229 and processed using a variety of digital signal processing techniques discussed in detail below.

Figure 12:
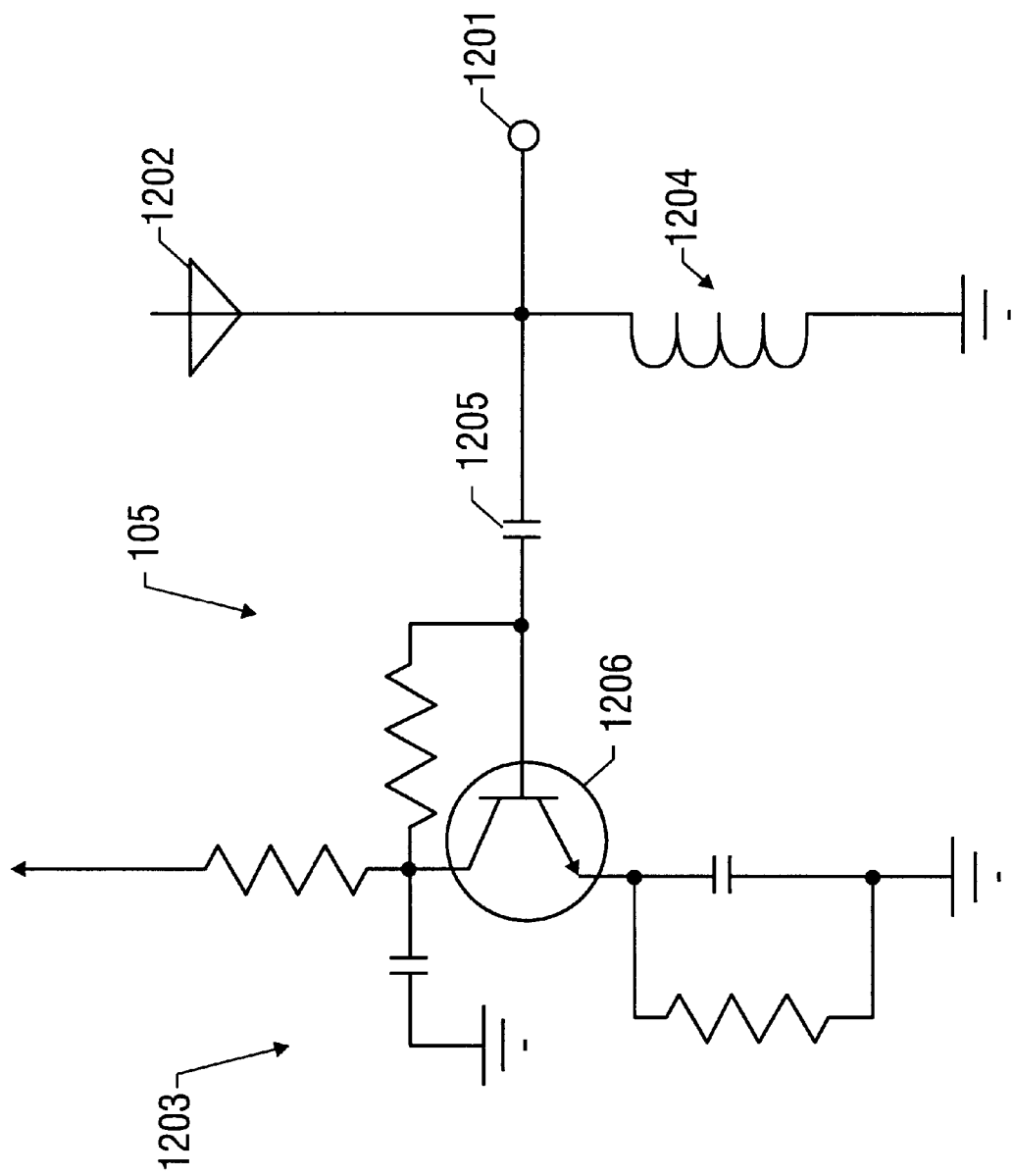
FIG. 12 is the microwave transmitter/receiver circuit of the present invention.

An exemplary embodiment of the microwave sensor circuit 105 is shown in FIG. 12, and includes a microwave antenna 1202 and an oscillator circuit 1203. Circuit 105 combines the transmitting and receiving elements into one antenna 1202. The antenna 1202, inductor 1204, capacitor 1205 determine oscillator frequency and with NPN transistor circuit 1206 form the oscillator and transmitter. The output impedance of the transmitter is high enough not to significantly reduce reflected signal reception. The input to microwave sensor circuit 105 is electromagnetic energy reflected from the observed space. The output 1201 is an amplitude modulated radio frequency signal indicative of motion. A variety of constructions for antenna 1202 are available from wave guides to simple wire.

Figure 13:
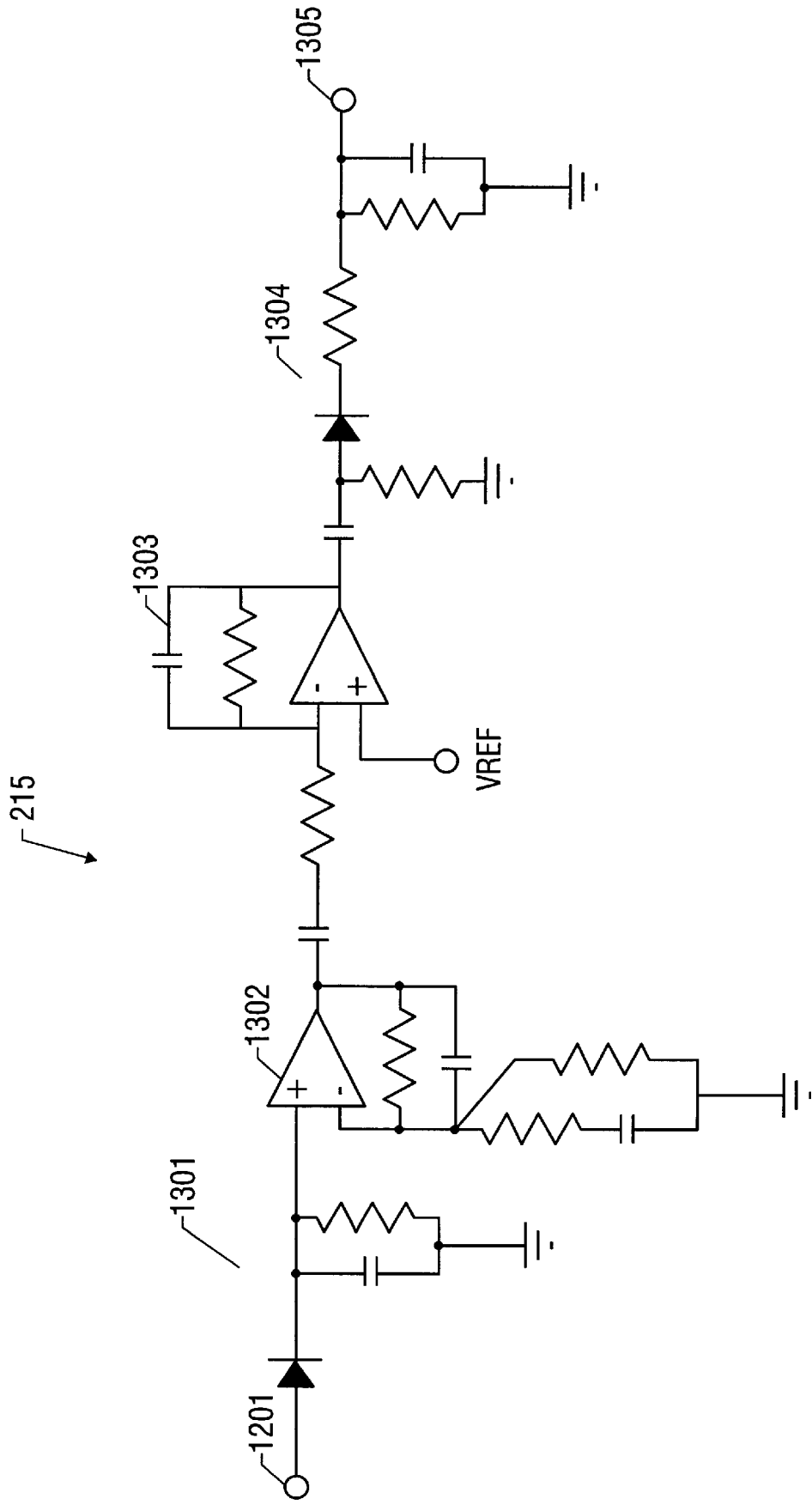
FIG. 13 is the microwave signal conditioning circuit of the present invention.

An exemplary embodiment of the microwave signal conditioning circuit 215 is shown in FIG. 13 and includes two cascaded op amp band pass circuits 1302 and 1303, followed by a fast attack, slow decay peak detector 1304. The input 1201 to microwave signal conditioning circuit 215 is the electrical microwave sensor signal indicative of motion. The output 1305 of microwave signal conditioning circuit 215 represents the magnitude of received Doppler microwave energy. The output signal 1305 is sampled by A/D circuitry within the digital micro controller 229 and processed using a variety of digital signal processing techniques discussed in detail below.

Figure 14:
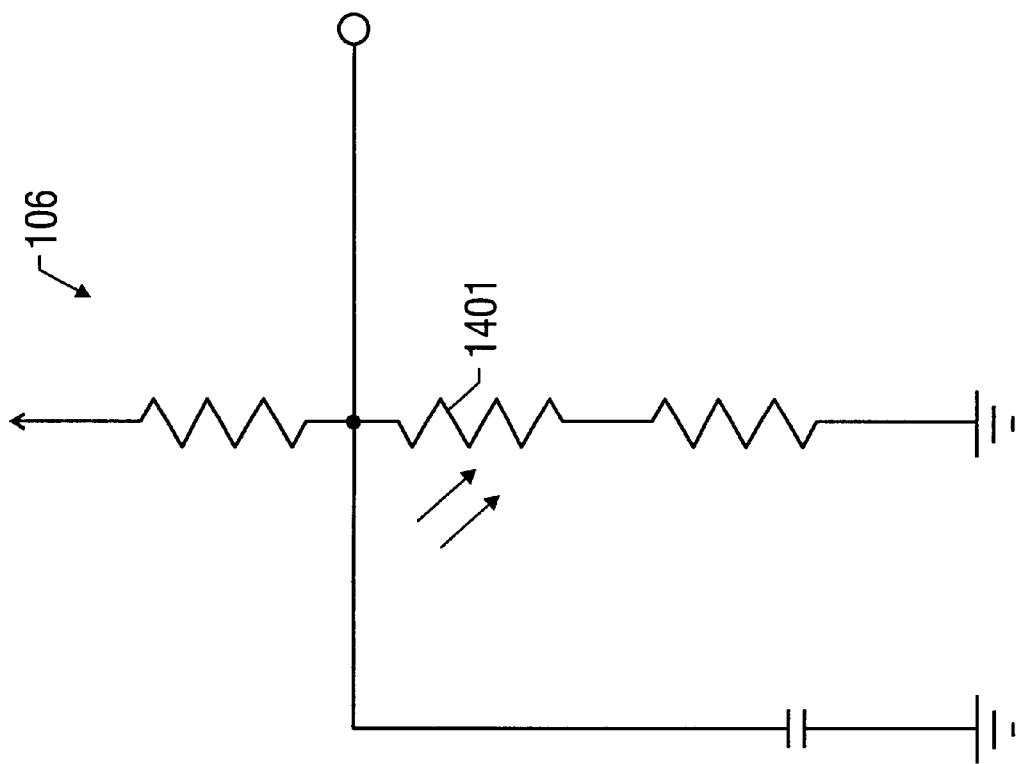
FIG. 14 is the photo cell sensor circuit of the present invention.

An exemplary embodiment of the photo cell sensor circuit 106 is shown in FIG. 14 and is comprised of a visible light photo sensor 1401 and supporting circuitry. The input to photo cell sensor circuit 106 is visible electromagnetic radiation. The output of photo cell sensor circuit 106 is an electrical signal indicative of ambient light. A variety of commercially available photo cells are available for use as light photo sensor 1401, including, for example, the Vactec VT90N4 photoconductive cell sensor.

Photo cell signal conditioning circuit 219 may be, for example, an RC lowpass filter. The input to this RC lowpass filter is the electrical photo cell sensor signal indicative of ambient light. The output of this RC lowpass filter is a lowpass filtered photo cell sensor signal indicative of ambient light. The output signal of photo cell signal conditioning circuit 219 is sampled by A/D circuitry within the digital microcontroller 229 and processed using a variety of digital signal processing techniques as described in detail below.

Ultrasonic motion indicator circuit 223 and infrared motion indicator circuit 224 may each be comprised of LEDs driven by digital microcontroller 229. The outputs of these indicators 223 and 224 are lights indicating that the ultrasonic or infrared portion of the sensor has detected motion above user-specified thresholds. In the preferred embodiment, the ultrasonic activation threshold and the infrared activation threshold are used only for the purpose of driving the ultrasonic motion indicator and infrared motion indicator and are not used by the digital sensor fusion detection algorithm to determine occupancy.

The electrical load switching and dimming control interface circuit 226 may take many forms and typically includes a conventional transistor-based relay driver circuit and relay that interfaces digital microcontroller 229 with an electrical load that is operated at a higher voltage than the power supplied to microcontroller 229. Provisions may be made to control any number of electrical loads. Incandescent light loads may be controlled by a simple relay, while fluorescent lighting may be controlled using dimming ballasts or other electrical load dimming devices in a known manner.

In accordance with one embodiment of the present invention, the digital microcontroller circuit 229 may be an 8-bit CMOS microcontroller with A/D converter for sophisticated communication and control of the sensor. An acceptable commercially available microcontroller is an 8-bit low-cost, high-performance Microchip PIC 16C73A fully-static, EEPROM-based 28-pin CMOS microcontroller, however, other microcontrollers or microprocessors may also be acceptable. The microcontroller clock frequency in an exemplary embodiment is either 8.0 MHz or 9.83 MHz depending on the desired ultrasonic frequency. The preferred device has an advanced RISC-like Harvard architecture and includes a large register set, an eight-level deep hardware stack and supports multiple internal and external interrupt sources. The device has 192 bytes of RAM and 22 I/O pins. It also has a variety of on-chip peripherals including five 8-bit A/D channels, three timer/counters modules, two capture/compare/pulse width modulation (PWM) modules and two serial ports. The synchronous serial port of the device can be configured as either a 3-wire serial peripheral interface device or a two-wire Inter-Integrated Circuit (I²C) bus device. The serial communications interface can be configured as either a synchronous or an asynchronous device. The device offers four oscillator options and includes a highly reliable watchdog timer to provide protection against software malfunctions.

Although the hardware aspects of the present invention have been described with reference to a particular exemplary embodiment, it will be understood that addition, deletions and changes may be made to the exemplary embodiment without departing from the scope of the present invention The software used to control the operation of digital microcontroller 229 in accordance with one embodiment of the invention includes two primary routines, the main (foreground) routine and the interrupt (background) routine.

The main foreground routine initializes the sensor and then enters the main loop that periodically displays the status of the sensor and resets the microcontroller's watch dog timer. The background interrupt routine is executed on a regular, periodic basis and performs most of the sensor's major functions.

The various operational functions of the sensor are separated into tasks such as the sensor task, MUX task, LED task, etc. Each of these high-level tasks may be further broken down into is a sequence of smaller tasks. For example, the sensor task may be broken down into the ultrasonic sensor task, the PIR sensor task, the acoustic sensor task, and the photo sensor task Each task may be enabled by setting that task's enable flag. Similarly, each task may be disabled by clearing that task's enable flag.

Figure 15:
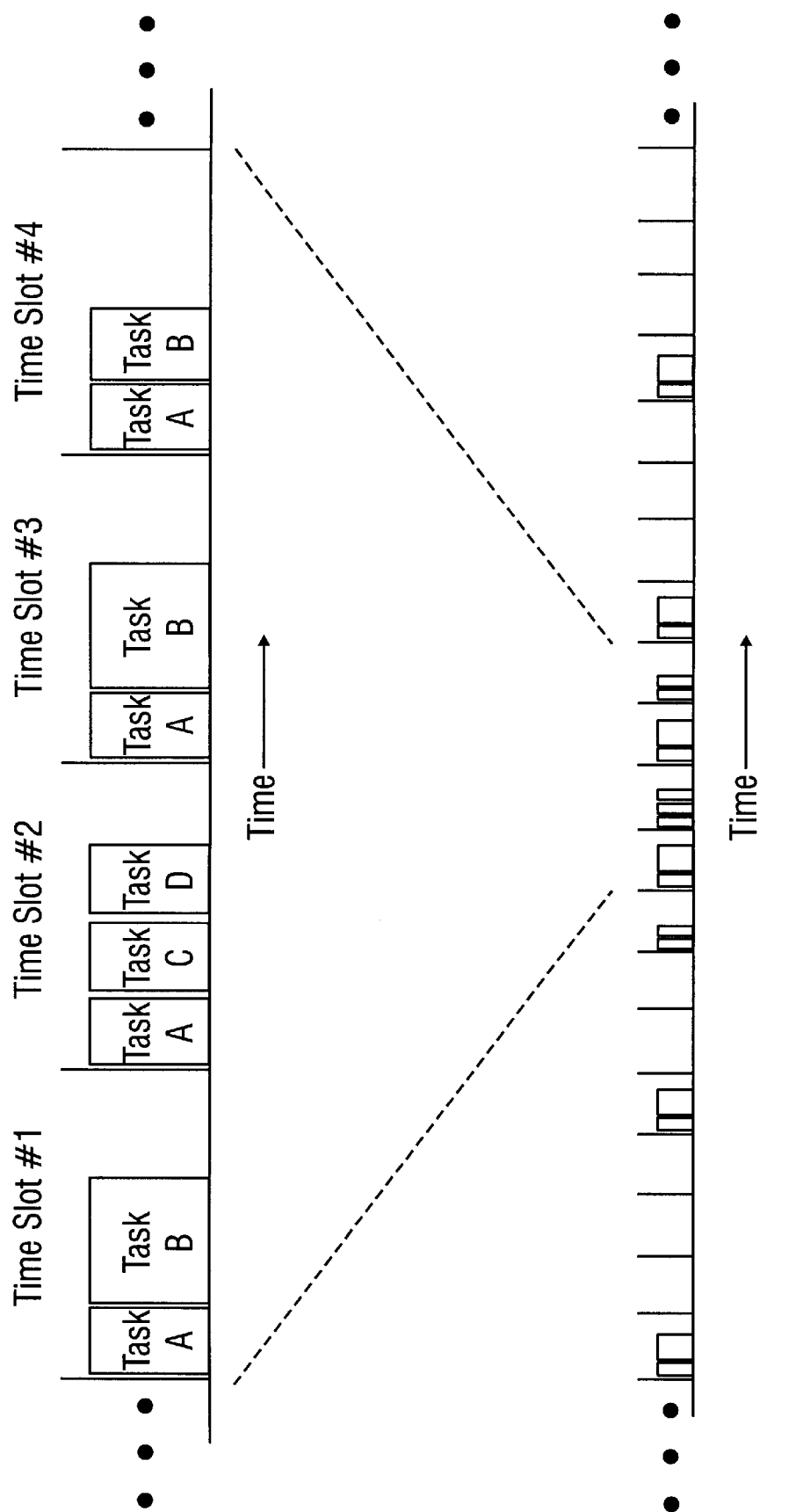
FIG. 15 is the software time division multiplexing scheme used for task allocation of the present invention.
Figure 16A:
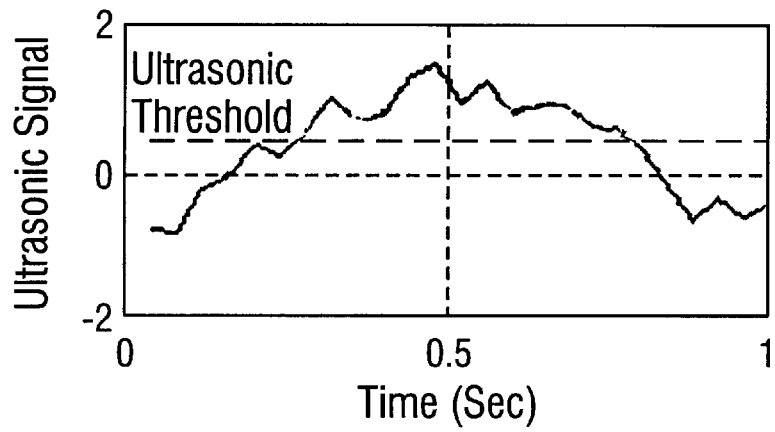
FIGS. 16(a)–(f) are graphs illustrating prior art dual technology occupancy detection using the Boolean AND function.
Figure 16B:
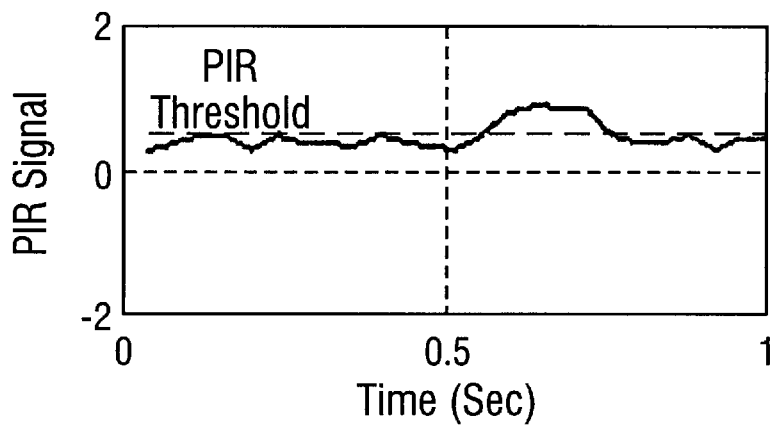
Figure 16C:
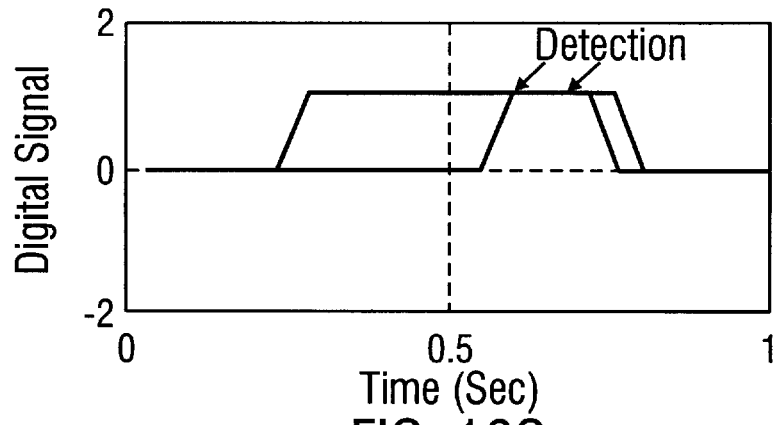
Figure 16D:
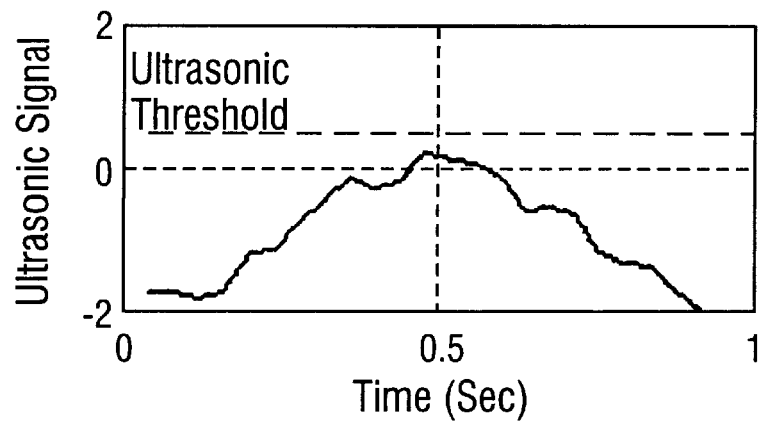
Figure 16E:
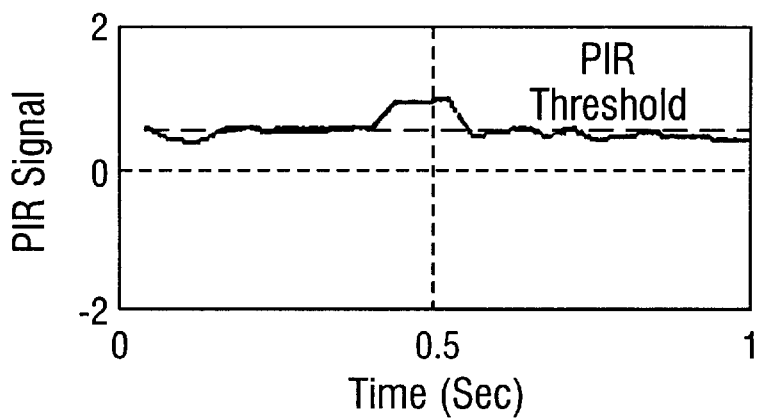
Figure 16F:
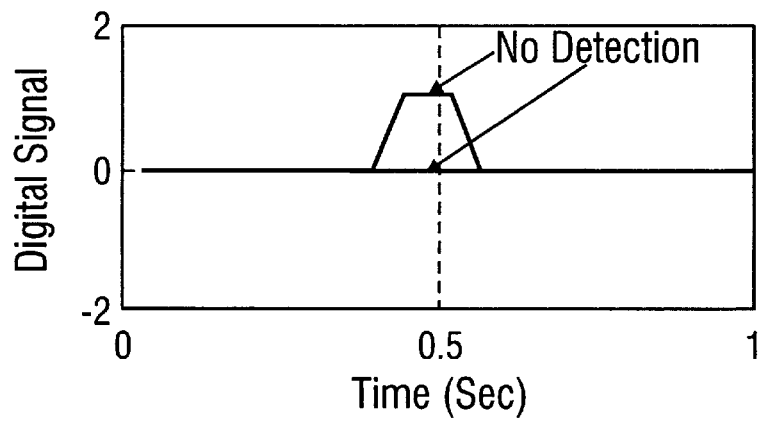

One of the timer/counter peripherals within digital microcontroller 229 is used to interrupt microcontroller 229 on a regular, periodic basis. This scheme allows the instruction bandwidth of microcontroller 229 to be evenly divided into a number of execution time slots as shown in FIG. 15. This time-division multiplexing scheme is used to run the various sensor tasks at different periodic intervals. For example, the sensor's display status task is run once every two minutes while the sensor's second task is run once a second. By counting interrupts (time slots) and balancing the load of each task, the various sensor tasks can be multiplexed in time to keep the microcontroller evenly loaded. For simplicity, the present implementation uses 256 time slots, each time slot having a duration of 1 millisecond.

The early multi-technology occupancy sensors utilized a separate activation threshold for each sensor technology in order to generate a separate digital occupancy signal for each sensor technology. Typically, whenever a given sensor signal was greater than or equal to the activation threshold value for that technology, the digital occupancy estimator signal for that sensor technology was a logical one. Whenever that sensor signal was below the activation threshold value for that technology, the sensor's digital occupancy estimator signal for that sensor technology was a logical zero. The various digital occupancy estimator signals of each sensor technology were then combined using classical Boolean (digital) logic in order to generate a digital composite occupancy estimator signal.

For example, consider a dual technology sensor that used ultrasonic and infrared sensors and combined their digital outputs using the AND logic function. Expressed symbolically, the digital output of each of the sensors and the overall digital output of the dual technology occupancy sensor would be:

ultrasonic sensor digital output =

$$\begin{cases} 0 \text{ if ultrasonic sensor output level} < \text{ultrasonic threshold} \\ 1 \text{ if ultrasonic sensor output level} \geq \text{ultrasonic threshold} \end{cases}$$

infrared sensor digital output =

$$\begin{cases} 0 \text{ if infrared sensor output level} < \text{infrared threshold} \\ 1 \text{ if infrared sensor output level} \geq \text{infrared threshold} \end{cases}$$

occupancy sensor digital output =

$$AND(\text{ultrasonic digital output, infrared digital output})$$

In general, these early multi-technology sensors exhibited a sensitivity-false alarm tradeoff depending on which Boolean logic fiction was used to combine the individual digital occupancy estimator signals. If the various individual digital occupancy estimator signals were combined using the Boolean OR function, the overall sensitivity of the sensor increased at the expense of an increased incidence of false trips. If the various individual digital occupancy estimator signals were combined using the Boolean AND fiction, the overall incidence of false trips decreased at the expense of decreased sensor sensitivity. Since each technology had its own separate activation threshold, these prior art sensors were often unable to reliably detect motion in complex marginal cases where one or more technologies observed signal levels just below the user-defined threshold level.

An example of this situation for a prior art dual technology sensor is shown in FIGS. 16 (a)–(f). FIG. 16(a) depicts a typical ultrasonic sensor signal that occasionally exceeds the ultrasonic activation level threshold. FIG. 16(b) depicts a typical passive infrared sensor signal that also occasionally exceeds the passive infrared activation level threshold. FIG. 16(c) depicts the corresponding individual digital occupancy estimator signals. When the two individual digital occupancy estimator signals are combined using the Boolean AND function, the sensor's digital composite occupancy estimator signal (not shown) indicates that occupancy has been detected. In contrast, FIGS. 16(d)–(f) depict a more complex situation. FIG. 16(d) depicts an ultrasonic sensor signal that is close to the ultrasonic activation level threshold but never exceeds the ultrasonic activation level threshold. FIG. 16(e) depicts a typical passive infrared sensor signal that occasionally exceeds the passive infrared activation level threshold. FIG. 16(f) depicts the corresponding individual digital occupancy estimator signals. When the two individual digital occupancy estimator signals are combined using the Boolean AND function, the sensor's digital composite occupancy estimator signal (not shown) indicates that occupancy has not been detected.

While these prior art multi-technology-based occupancy sensors showed improved performance over single technology occupancy sensors, they were still unable to sense occupancy in the more complex marginal sensor signal level situations.

In contrast, the multi-technology sensor-fusion-based occupancy sensor of the present invention does not generate a separate digital occupancy signal for each sensor technology. Instead, the multi-technology sensor-fusion method of the present invention takes the various sensor output signals and forms a composite occupancy estimator signal. This composite occupancy estimator signal is then compared with a composite activation threshold value. Whenever the composite occupancy estimator signal is greater than or equal to the composite activation threshold value, the sensor's digital composite occupancy signal is a logical one. Whenever the composite occupancy estimator signal is below the composite activation threshold value, the sensor's digital composite occupancy signal is a logical zero.

For example, consider a dual technology sensor-fusion-based occupancy sensor in accordance with the present invention that uses ultrasonic and infrared sensors and combines their outputs using an arbitrary generalized non-linear function. Expressed symbolically, the composite occupancy estimator signal and the overall digital composite occupancy signal of the dual technology sensor-fusion-based occupancy sensor is:

$$\text{composite output} = f(\text{ultrasonic output}, \text{infrared output})$$

occupancy sensor digital output =

-continued $$\begin{cases} 0 \text{ if composite output level} < \text{composite threshold} \\ 1 \text{ if composite output level} \geq \text{composite threshold} \end{cases}$$

where, f( . . . , . . . ,) denotes an arbitrary generalized function of N variables (i.e., one variable for each sensor technology). Note that for the dual technology sensor of the present invention with N=2), the function f(.,.) may be an arithmetic sum, a weighted arithmetic sums, or an arbitrary non-linear function of the variables expressed either algorithmically or in tabulated form. The algorithmic form is more amenable to mathematical analysis whereas the tabulated form has distinct advantages from a microprocessor implementation point of view.

One embodiment of the present invention utilizes an arithmetic sum based occupancy detection algorithm to implement a sophisticated multi-technology sensor fusion detection scheme. This algorithm increases the overall probability of occupancy detection while simultaneously lowering the overall probability of false tripping. In a dual technology sensor using ultrasonic and PIR sensors, the invention combines the outputs of the ultrasonic and PIR sensors to produce a composite occupancy estimator that is compared to a composite threshold to is determine occupancy. This produces a highly sensitive yet highly reliable occupancy sensor that can detect minor motion in more complex marginal sensor signal level situations.

Figure 17:
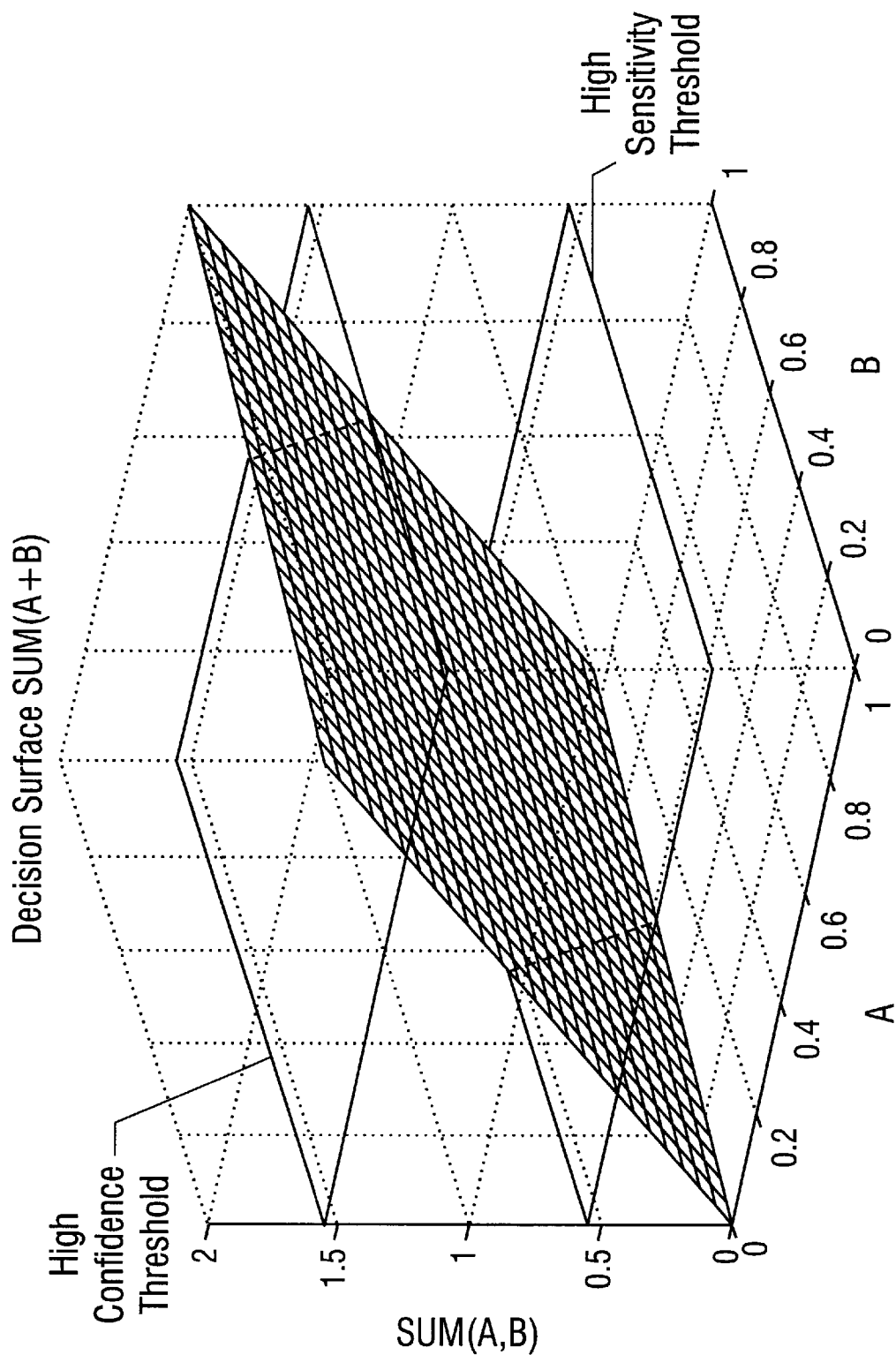
FIG. 17 is a decision surface for the arithmetic sum formula in accordance with the present invention.

A plot of the two-dimensional arithmetic sum surface is shown in FIG. 17. When the arithmetic sum is greater than the activation threshold shown in FIG. 17, a load is activated.

Once activated, the load remains activated when the arithmetic sum is greater than the maintenance threshold shown in FIG. 17. By combining these signals prior to thresholding, sub-threshold signal levels are able to contribute useful information to the decision process. This allows the sensor to effectively utilize sensor signal values that are high enough to be indicative of occupancy but too low to indicate certain occupancy according to a given single sensing technology. In an exemplary embodiment of the invention, the computation and evaluation of the composite occupancy estimator signal is performed separately for HIGH CONFIDENCE and HIGH SENSITIVITY modes using fixed-point arithmetic.

Figure 18A:
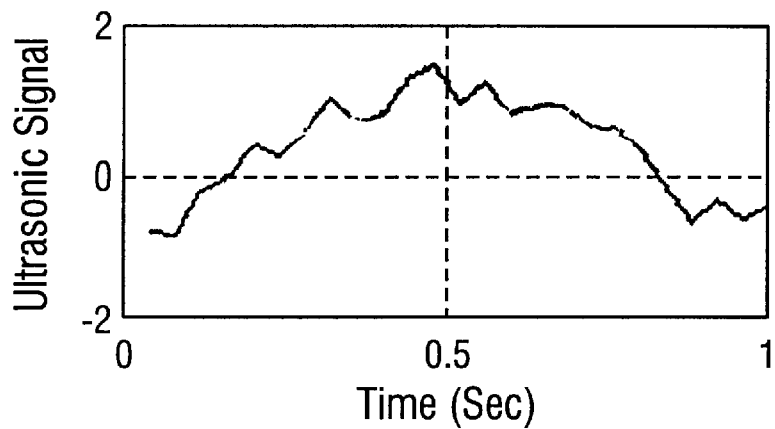
FIGS. 18(a)–(f) are graphs illustrating dual technology occupancy detection in accordance with the present invention.
Figure 18B:
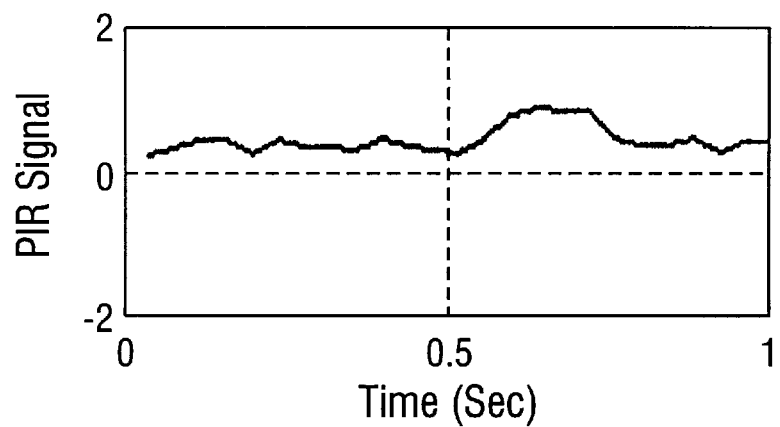
Figure 18C:
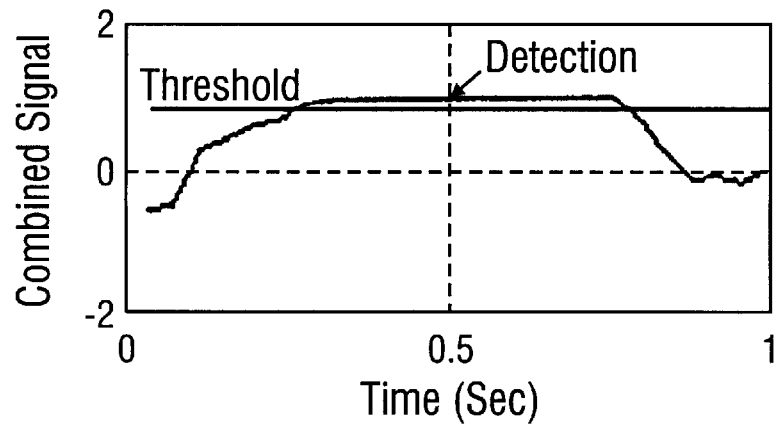
Figure 18D:
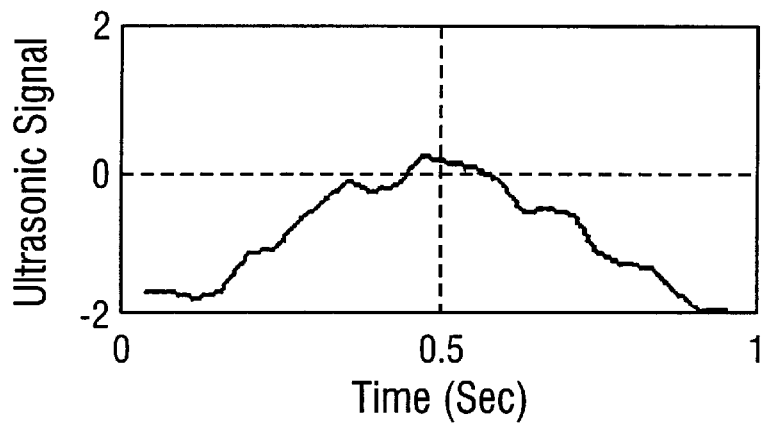
Figure 18E:
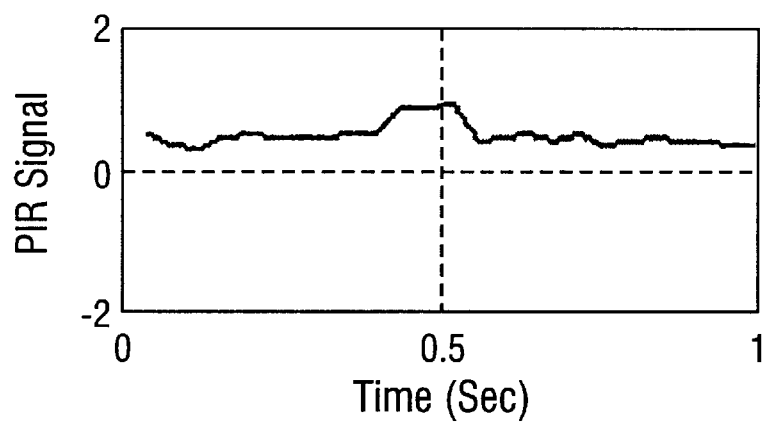
Figure 18F:
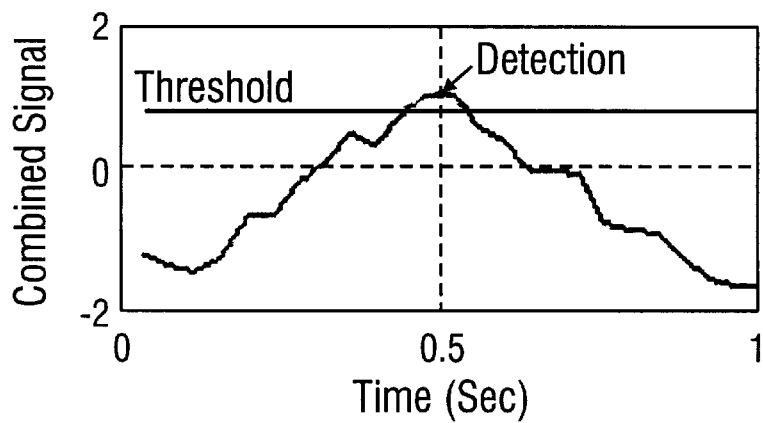

An example of this situation for a dual technology occupancy sensor according to the present invention is shown in FIGS. 18(a)–(f). FIG. 18(a) depicts a typical ultrasonic sensor signal. FIG. 18(b) depicts a typical passive infrared sensor signal. Note that neither of the individual sensor technologies have a separate activation threshold. FIG. 18(c) depicts the sensor's composite occupancy estimator signal and the sensor's composite activation threshold level. When the two individual sensor signals are combined using an arithmetic sum function, the sensor's composite occupancy estimator signal suggests that occupancy has been detected whenever its value exceeds the sensor's composite activation threshold level. FIGS. 18(d)–(f) depict a more complex situation. FIG. 18(d) depicts a weak ultrasonic sensor signal. FIG. 18(e) depicts a typical passive infrared sensor signal. FIG. 18(f) depicts the sensor's composite occupancy estimator signal and the sensor's composite activation threshold level. When the two individual sensor signals are combined using an arithmetic sum function, the sensor's composite occupancy estimator signal suggests that occupancy has again been detected. It should be noted that the prior art multi-technology occupancy sensor was unable to detect occupancy in this situation (FIGS. 16(d)–(f).

An example of a more complex occupancy function of two variables is the function $$f(x,y)=\min(1,(K_x^* xP+K_y^* yP)1/P)$$

Figure 19:
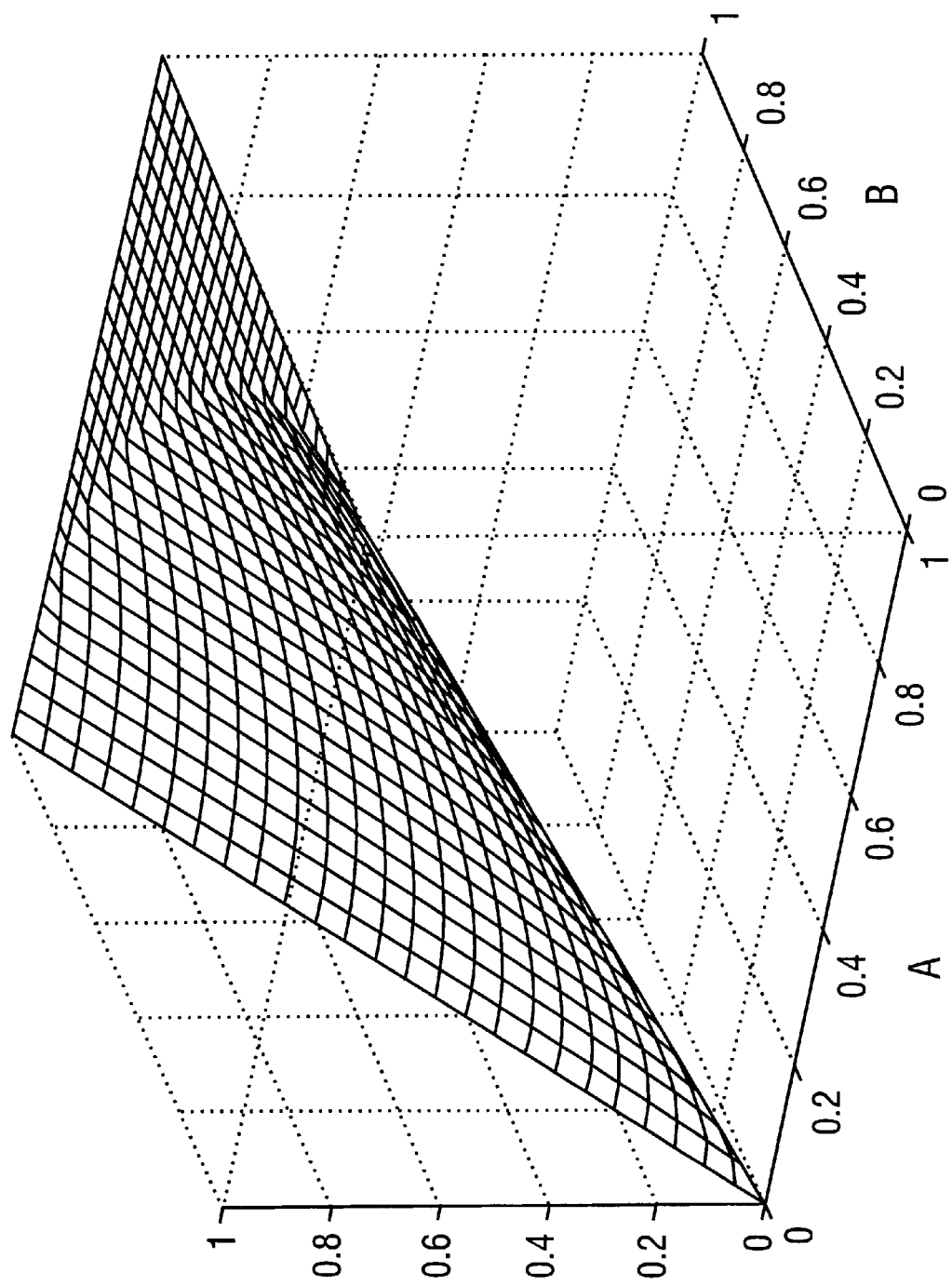
FIG. 19 is a decision surface for the Yager Union function (K=1, p=2) in accordance with the present invention.

This function produces what is known as the Yager Union decision surface. A condition may occur where either sensing technology alone assures reliable detection of occupancy when its associated occupancy estimator signal occurs at a relatively high level. Additionally, the occurrence of moderate levels of both the occupancy estimators together may be a reliable indication of occupancy. In this case, a composite occupancy estimator is required that indicates occupancy when the component occupancy estimators occur together at relatively low levels, or individually at relatively high levels. An example of the given function with $K_x=K_y=1$ and p=2 is shown in FIG. 19. This function combines the component occupancy estimators to form a composite occupancy estimator as desired.

Figure 20:
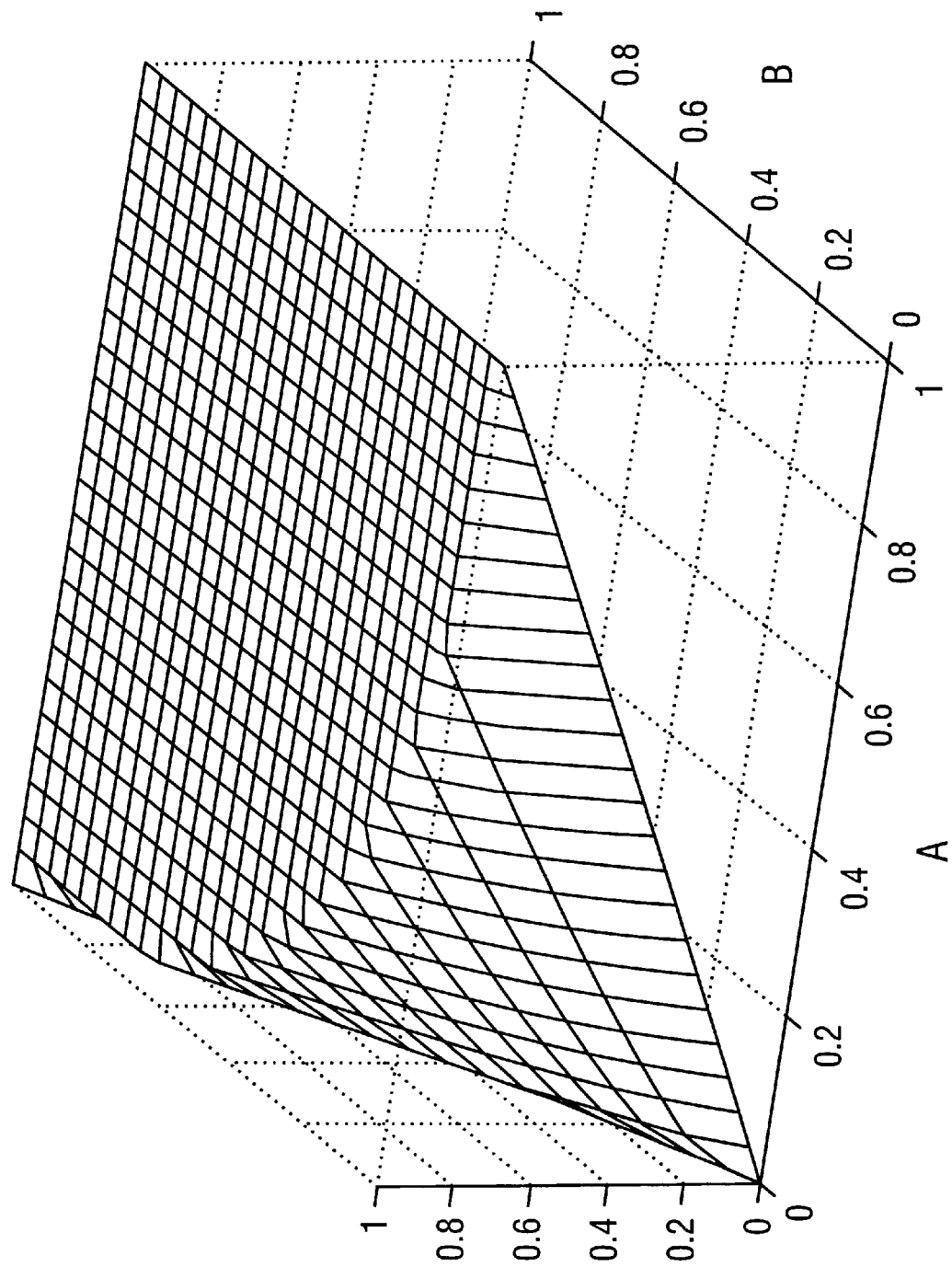
FIG. 20 is a decision surface for the Yager Union function (K=1, p=0.5) in accordance with the present invention.

A condition may occur that requires a relatively high degree of confidence in the occupancy estimate, and where the component occupancy estimators are generally reliable when taken together, but where the component occupancy estimators are generally unreliable taken alone. In this case, a composite occupancy estimator is required that indicates occupancy with a moderate level of indication from both component occupancy estimators, but rejects even large signals from the component occupancy estimators individually. An example of the given function with $K_x=K_y=1$ and p=0.5 is shown in FIG. 20. This function combines the component occupancy estimators to form the desired composite occupancy estimator.

Other functions may also be acceptable to combine the individual component occupancy estimators to produce a composite estimator signal, and the specification of theses exemplary functions does not limit the scope of the invention. In addition, although the exemplary functions are described using two occupancy estimators produced by two occupancy sensing technologies, this is due primarily to the ease of illustration using two estimators. However, it will be understood that a composite occupancy estimator may be derived from any number of individual occupancy estimators. For example, PIR, ultrasonic and microwave sensing technologies may be used to produce three individual component occupancy estimators that are then combined using a desired function (for example, algebraic sum, weighted sum, Yager Union, and the like) to produce a composite occupancy estimator.

The Yager Union function requires a significant computational resource to evaluate analytically, more than may be available in real time from a cost effective microprocessor. FIGS. 21 and 22 depict the same functional relationships as in FIGS. 19 and 20, but expressed in a discrete tabular form for fast efficient table lookup. In order to achieve different functional characteristics, the microprocessor may have multiple such tables to choose from, corresponding to different occupancy environment situations. These tables may then be selected adaptively or before hand. Additionally, the tables may be dynamic, and periodically recalculated according to the adaptation rules of the sensor automatic adjustment algorithm. This is possible, even with a limited computational resource, because the adaptation is an occasional low speed process, unlike the function evaluation, that must be executed at a high repetition rate in order to achieve fast response to occupancy signals. The Yager Union function is offered as an exemplary embodiment of the table look up aspect of the present invention, it will be understood that other mathematical functions used to calculate the composite signal may also be stored as a table.

The present invention may also include a number of adaptive features. When enabled, the following sensor variables are adapted as a function of time: ultrasonic sensor lights ON sensitivity setting; ultrasonic sensor lights OFF sensitivity setting; infrared sensor sensitivity setting; timer delay setting, infrared noise level estimate, smallest ultrasonic motion level estimate and a time between motion estimate.

The adaptation of the sensor's various sensitivity settings is generally referred to automatic sensitivity adjustment (ASA). The adaptation of the sensor's timer delay setting is generally referred to as automatic timer adjustment (ATA).

At power on reset, the various ultrasonic and infrared sensitivity settings and the timer delay setting are initialized according to the user-specified potentiometer settings (FIGS. 3, 316, 317, 319). Automatic adjustments to the ultrasonic and infrared sensitivity settings and the sensor's timer delay setting are implemented as deviations from the user-specified potentiometer settings. As a result, any change to a potentiometer value results in an immediate change to the sensor adapted characteristic. The sensor continues to adapt based on both the potentiometer setting and the adapted adjustment value.

To accomplish ASA, a variety of situations automatically modify the sensor's ultrasonic, PIR and acoustic sensitivity settings, including: false-on event, false-on-stay-on event, false-off event, lights stay on-with no major occupancy event, lights stay on-with major occupancy event, occupancy cycle detection and utilization adjustment, infrared noise level adjustment, acoustic background noise level adjustment and smallest ultrasonic motion level adjustment. ASA can be accomplished in single technology or multiple technology sensors.

Figure 23:
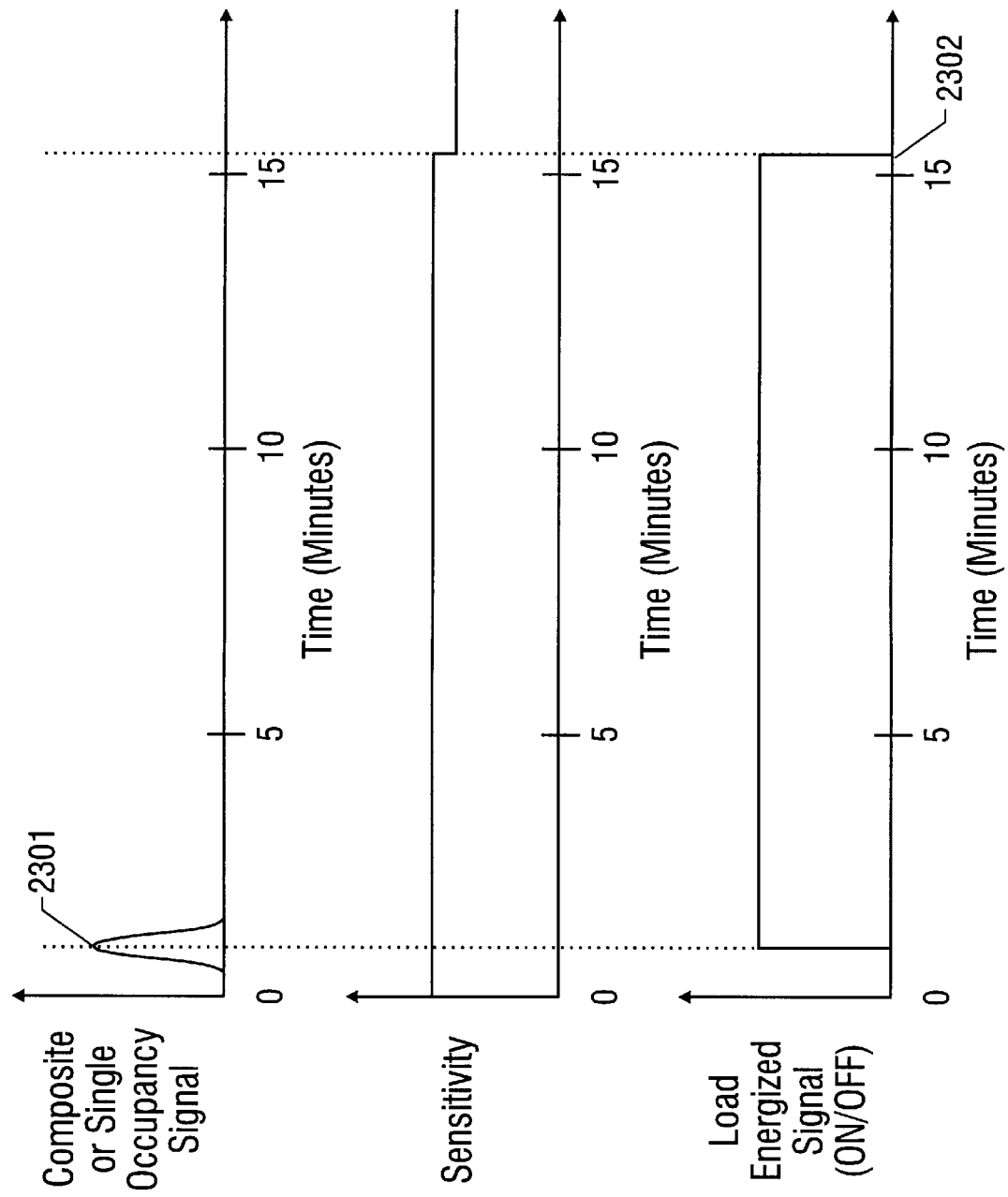
FIG. 23 is a time line depicting the adaptation of sensor sensitivity for a false-on event in accordance with the present invention.

A false-on event occurs when the sensor's load(s) are initially de-energized, energized for a short period of time (for example, 0–8 seconds longer than timer delay setting), and then de-energized again. FIG. 23 describes a false-on adaptation event. The timer setting in this example is 15 minutes, occupancy is detected at 2301 only for a very short period of time (less than 15 seconds) and the load is energized. Because occupancy was not detected for 15 minutes after load was initially energized, lights turn off at 2302 and sensitivity is reduced (2303). A false-on event causes the sensor's ultrasonic, PIR, microwave, or acoustic sensitivity to be reduced.

Figure 24:
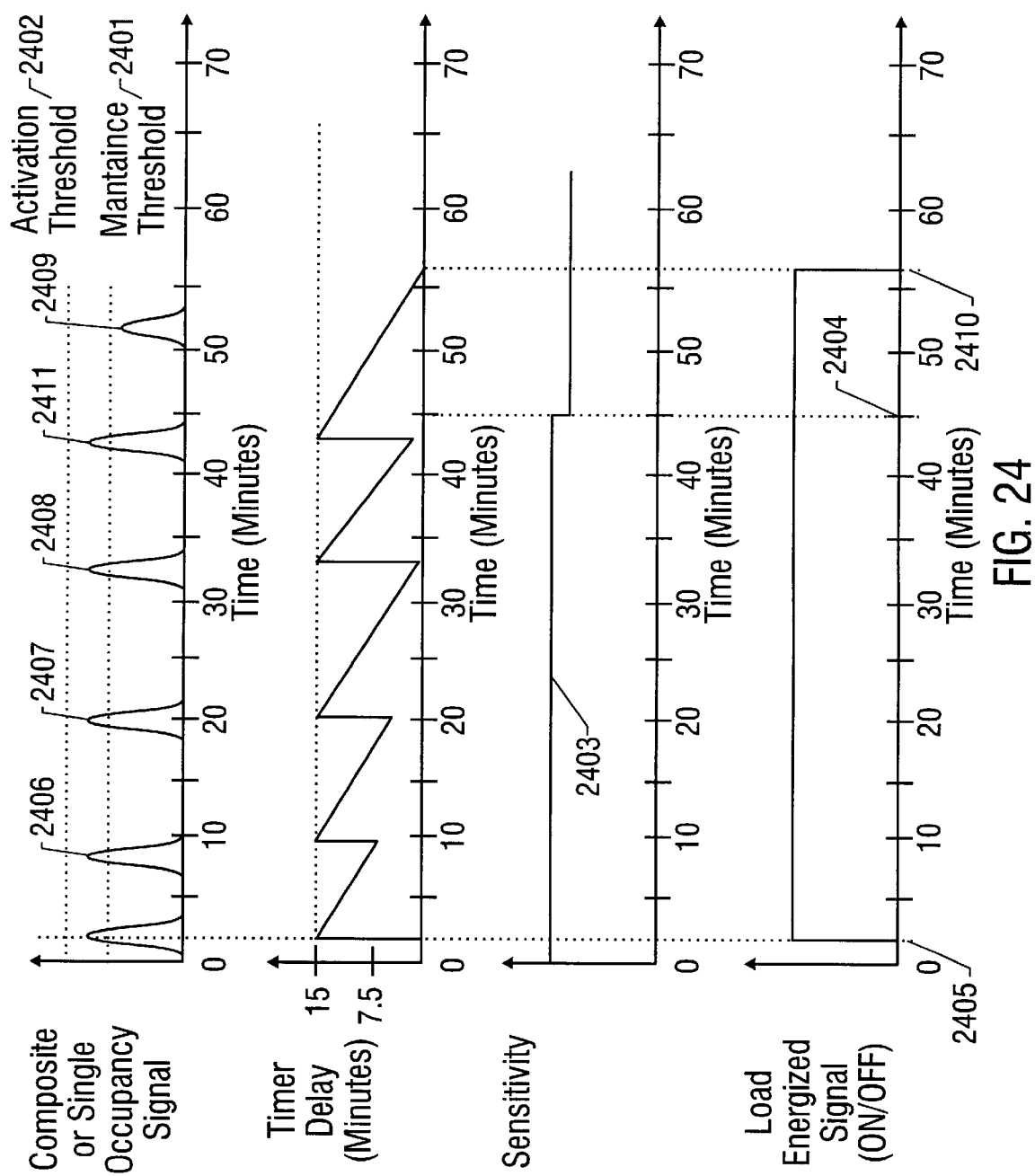
FIG. 24 is a time line depicting the adaptation of sensor sensitivity for a hallway strike false-on-stay-on event in accordance with the present invention.

A false-on-stay-on event occurs when sensor's load(s) are initially de-energized then energized for multiple timer settings without the occupancy signal ever exceeding activation threshold. FIG. 24 describes a false-on-stay-on adaptation event for a sensor that is sensing occupancy incorrectly through an open door into a hallway. Every time someone passes by the door, occupancy is detected. In this example, the timer is set at 15 minutes, occupancy is detected 2405, timer is reset and the load energized. Before the timer expires, occupancy is again detected 2406, 2407, 2408 and 2411 as someone passes by the door. After each occurrence, the timer is reset. This pattern of detecting occupancy without the signal exceeding the activation threshold 2402 continues for more than three timeout periods or 45 minutes 2404 and the sensitivity 2403 is reduced. Now when persons pass by the open door 2409 the sensor does not detect occupancy and the load is then de-energized 2410, 15 minutes after occupancy was last detected.

Figure 25:
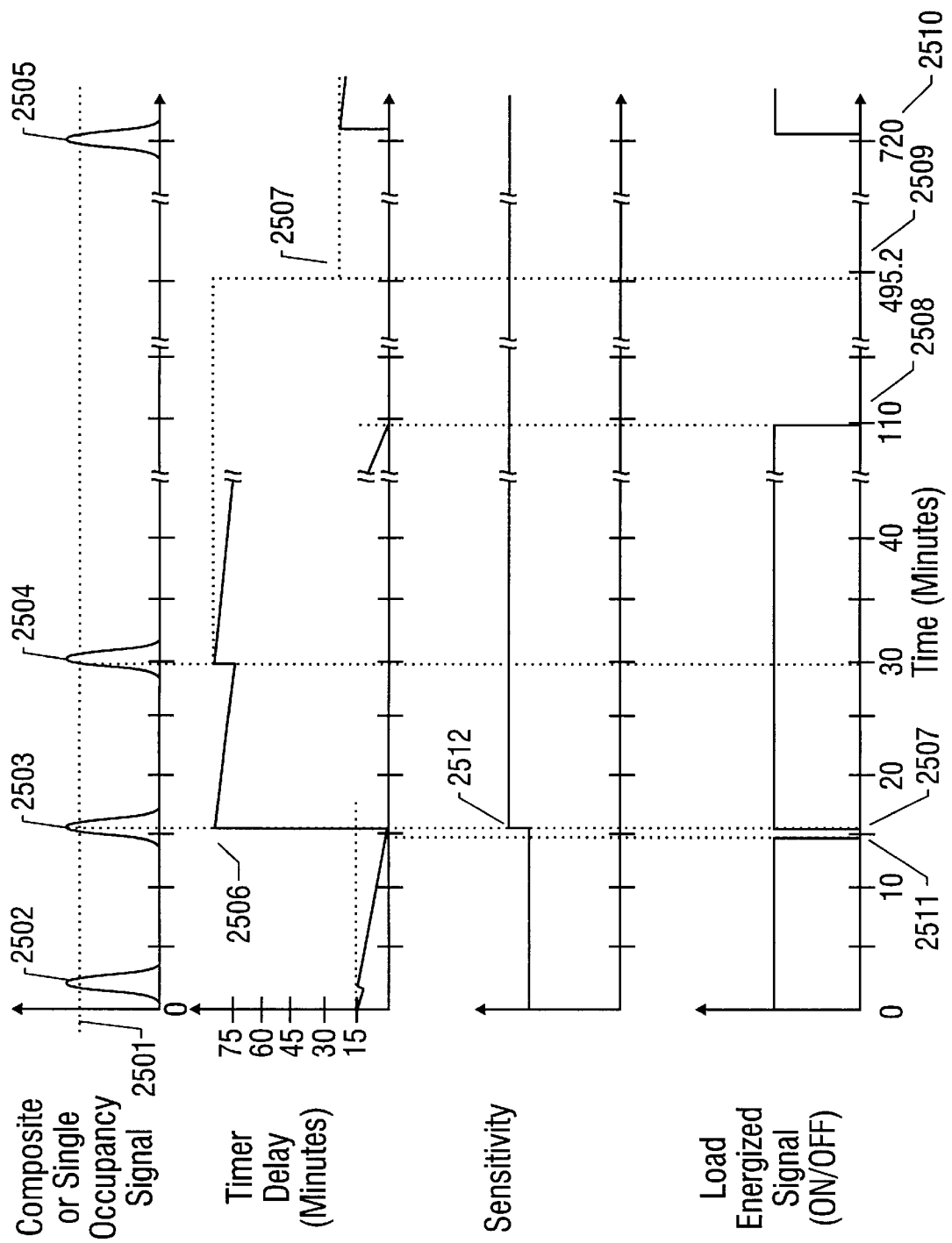
FIG. 25 is a time line depicting the adaptation of sensor sensitivity for a false-off event in accordance with the present invention.

A false-off event occurs when the sensor's load(s) are initially energized when the occupancy signal is greater than the activation threshold 2801, then de-energized for a short period of time (for example, 0 to 15 seconds), and then energized again. FIG. 25 describes a false-off adaptation event for a sensor controlling room lights. The sensor detects occupancy at 2502 and the is timer is reset to 15 minutes. At 2511, the timer expires and load is de-energized. The occupant then reactivates the lights 2507 with occupancy signal 2503 within 15 seconds of load(s) de-energizing. At 2507, the sensitivity and timer are increased to 2512 and 2506 respectively. The timer is temporarily increased to 80 (5+60+15=80) minutes at 2506 (for example, 5 is the increase in timer value after false-off event, 60 is the temporary additional increase in timer value for the next eight hours and 15 minutes was the timer value before false-off event ). Occupancy detection 2504 resets the timer and after 80 minutes, the load(s) de-energize at 2508. Eight hours after false-off event occurred 2509, the timer is reduced to 20 minutes 2513. When occupancy 2505 is next detected at 2510, the timer is reset to 20 minutes and load(s) energized.

Figure 26:
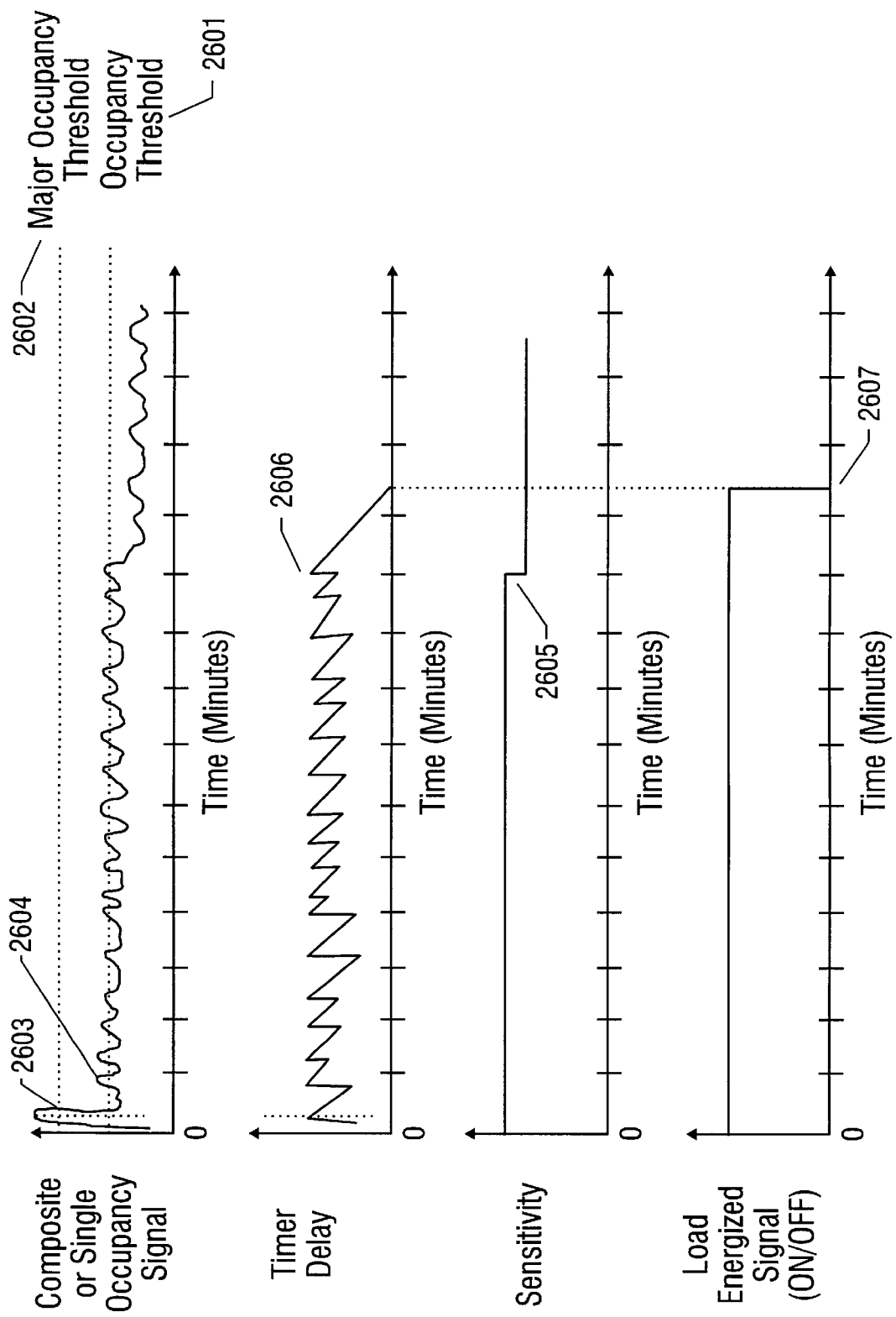
FIG. 26 is a time line depicting a stay on with no major activity.

Lights stay on-no activation event occurs when load(s) are energized constantly for multiple timer settings and occupancy signals never exceed activation threshold. FIG. 26 describes a lights stay on-no activation adaptation event. The sensor detects major occupancy 2603 when the occupancy signal exceeds the activation threshold 2602 (for example, a person just stood up and left the area), the timer is reset and the load(s) remain energized. The occupancy threshold is constantly exceeded for the next 120 minutes by small disturbances 2604 (for example, air noise, sensor electrical noise, etc . . . ) with no signals exceeding 2602 activation threshold. Sensitivity 2605 is reduced and now these small disturbances don't reset the timer and the load de-energizes at 2607.

Figure 27:
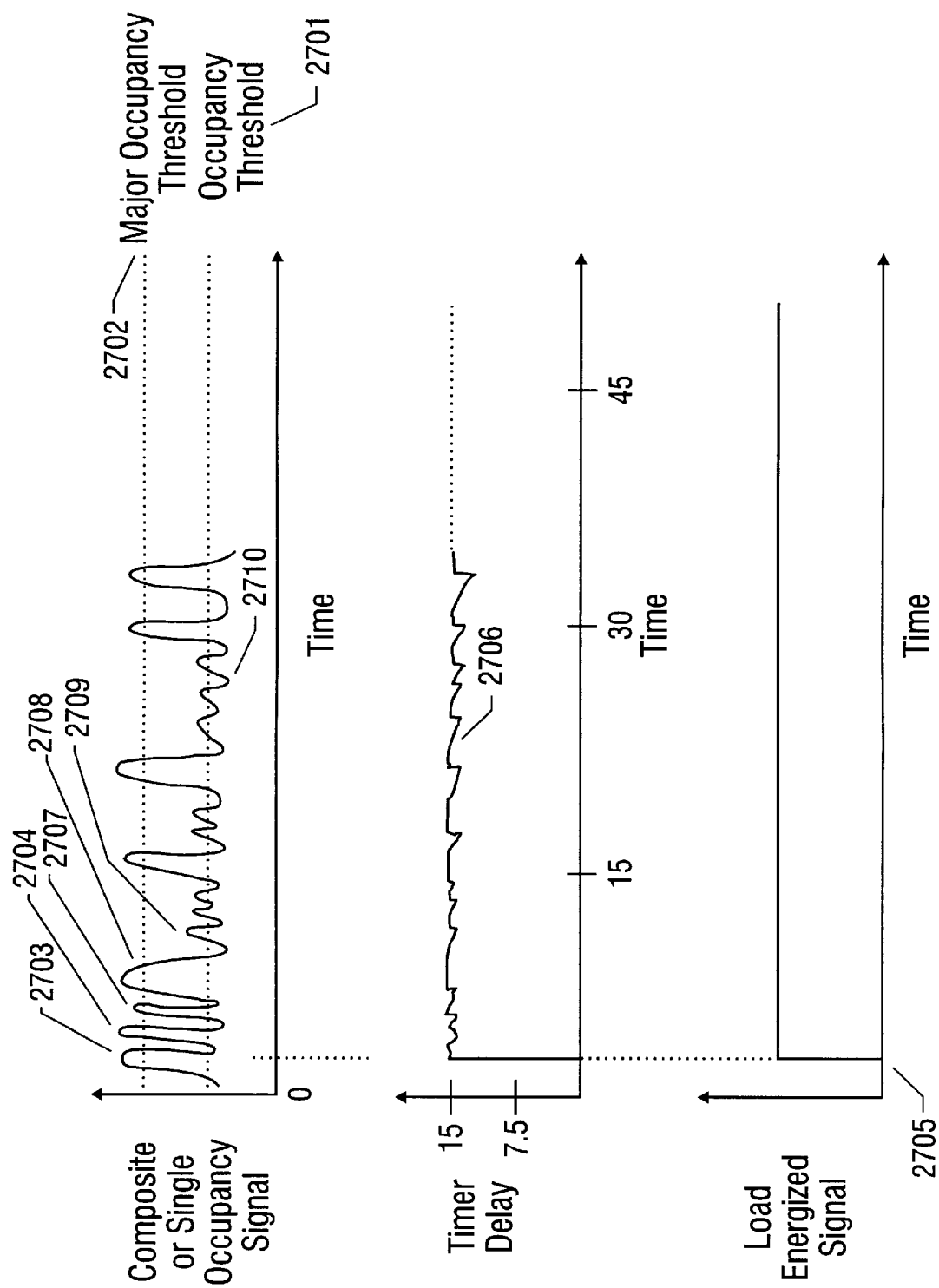
FIG. 27 is a time line depicting a stay-on-multiple-activation event.

Lights stay on-with major occupancy event occurs when load(s) are energized constantly for multiple timer settings and occupancy signal exceeds activation threshold. Several conditions can cause this event for example, the sensor is mounted close to a powerful air register, sensor mounted close to door and sensor pointed in the wrong direction and sensor mounted in correct application but sensitivity is way out of adjustment. FIG. 27 describes a lights stay on- with major occupancy adaptation event. Occupancy signal 2703 exceeds occupancy threshold 2701 and load(s) are energized at 2705. In quick succession, occupancy signals 2704, 2707, 2708 and 2709 occur with 2704, 2707 and 2708 crossing the activation threshold 2702. Quick succession of occupancy signals constantly reset timer 2706. Even in very active occupancy areas where sensor is adjusted and applied correctly, signal 2710 will settle down for short periods of time.

Using only a single technology sensor, for example ultrasonic, it is difficult to differentiate a very active room with lots of people verses a sensor mounted close to a powerful air register. However if multiple technologies are used, a much better opportunity is provided to adapt correctly, identify if the sensor is mounted close to a powerful air register or identify incorrect sensor application. Two examples are presented showing a dual technology ultrasonic and PIR sensors. In both cases the room is unoccupied. One sensor is mounted correctly with a very high initial ultrasonic sensitivity setting and in the other example the sensor is mounted close to a powerful air register.

Figure 28:
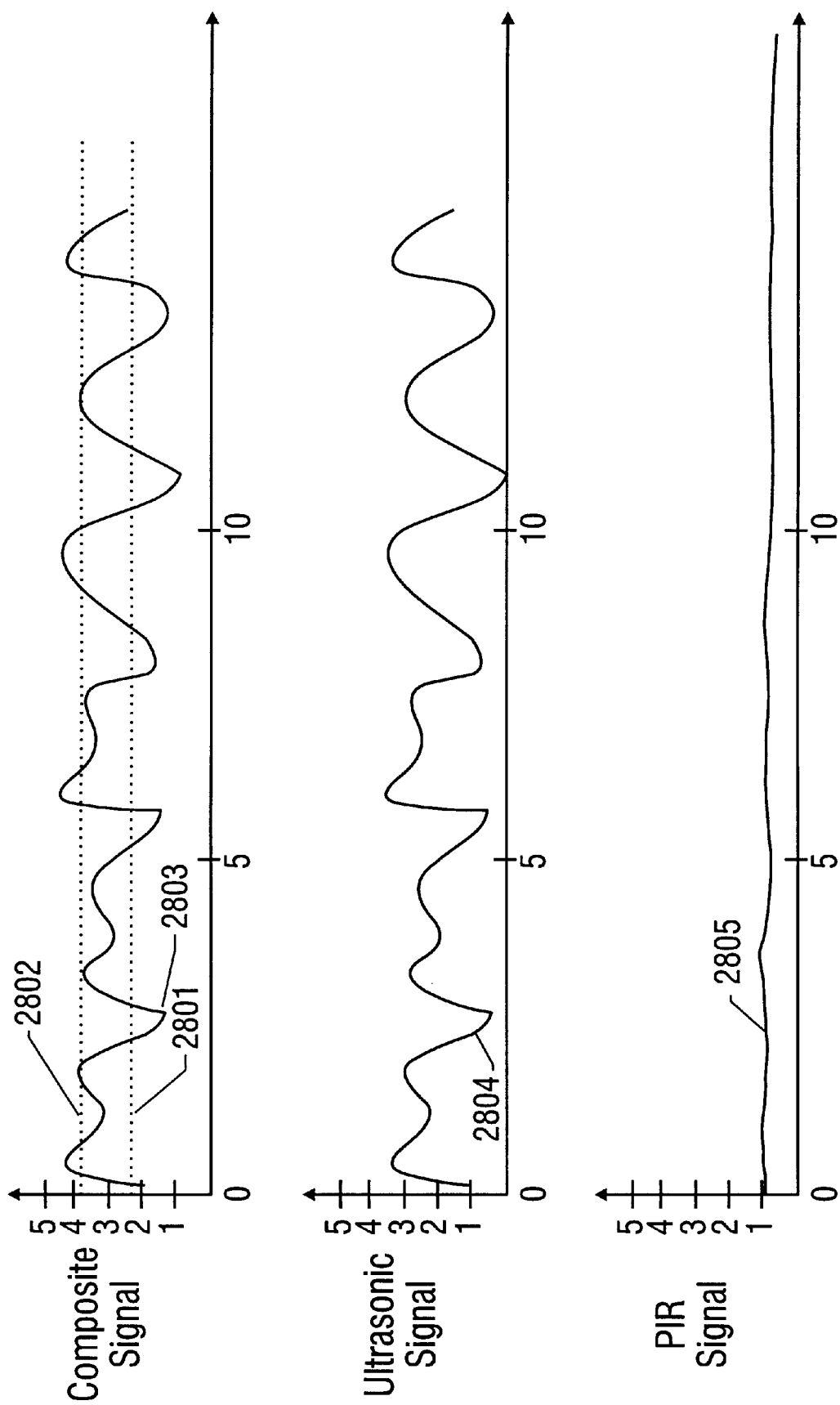
FIG. 28 is a time line depicting an expanded occupancy estimator signal for a stay-on-multiple-activation event.

FIG. 28 shows an expanded composite occupancy signal 2803 for ultrasonic and PIR detectors. Ultrasonic signal 2804 is very large and provides most of the signal contribution if an algebraic sum is used to combine the two signals. PIR signal 2805 is very quiet with very little signal variance. Since PIR is much more immune to air turbulence than ultrasonic it can be concluded that either the sensor is mounted close to an air register or the ultrasonic sensitivity is adjusted very high.

Figure 29:
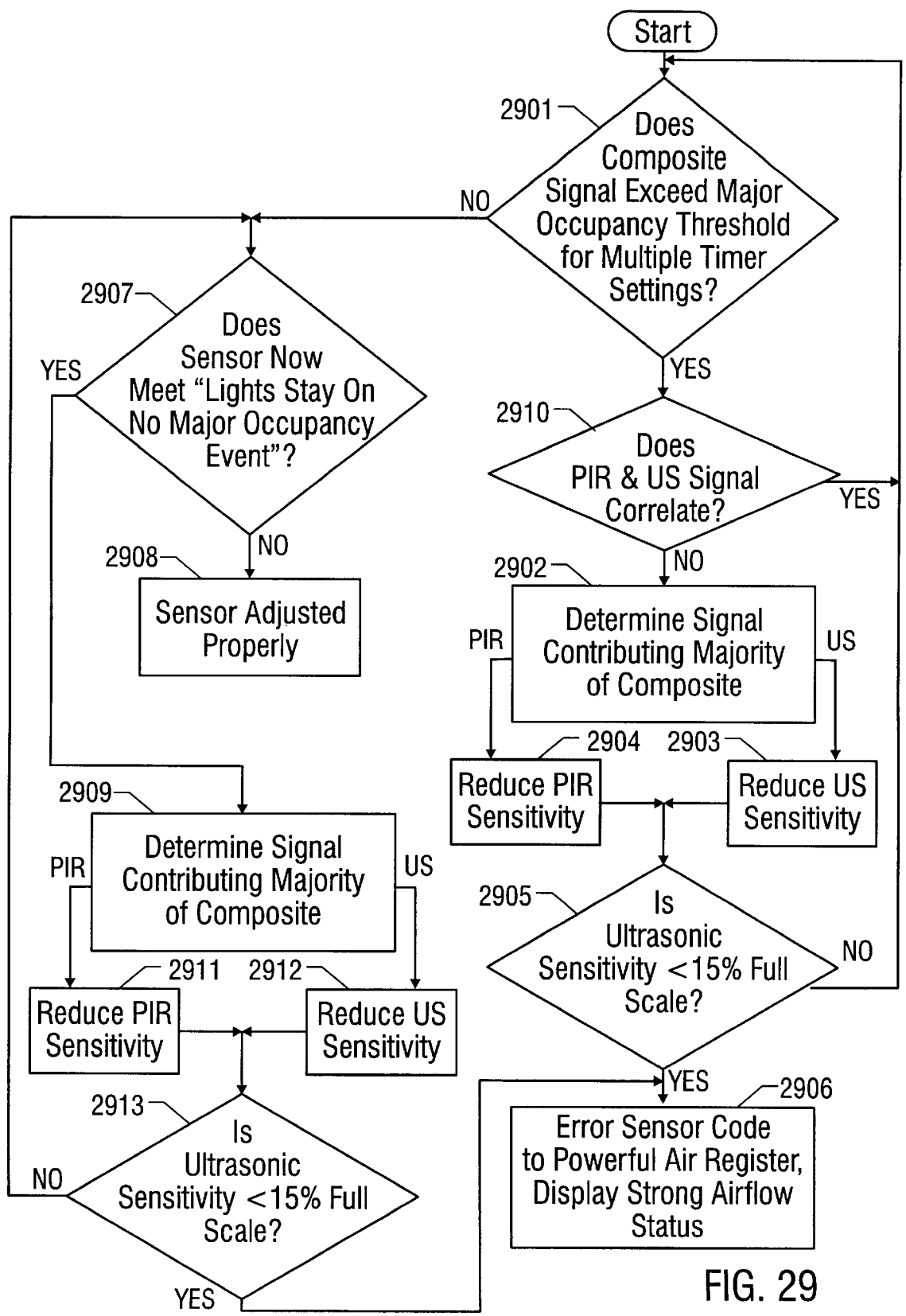
FIG. 29 is the stay-on-multiple-activation event and strong airflow analysis task flowchart for the present invention.

FIG. 29 shows an example algorithm to reduce the sensitivity of either PIR or ultrasonic signals. In 2901 it is determined if the composite signal exceeds the activation threshold for multiple timer settings. If this condition is satisfied, it is determined if the PIR and US signals are occasionally correlated (2910). If the sensor detects strong occupancy by both technologies at the same time, the area could be occupied. If signals do not correlate, it is determined which signal contributes most to composite occupancy signal (2902). In this example, ultrasonic sensitivity is reduced (2903). If ultrasonic sensitivity is reduced by more than 15% full scale (2905), the sensor is too close to a powerful air register and the sensor sends strong air flow status (2906). This is true because at low ultrasonic sensitivity levels it's coverage pattern is much smaller than the PIR pattern. Also, the PIR pattern is very dense and strong PIR occupancy signals would be received if the ultrasonic pattern area was occupied.

In situations where air flow is moderate or non-existent, after a couple of ultrasonic sensitivity reductions the composite signal fails (2901). The first time decision block 2907 is entered, the sensor is most likely in a "Lights stay on-no major motion detected" event. In block 2909, it is determined that ultrasonics are the major signal contributor and ultrasonic sensitivity is reduced in 2912. If ultrasonic sensitivity is less than 15% full scale (2913), the sensor is close to a powerful air register and the sensor sends strong air flow status 2906. If ultrasonics sensitivity is greater than 15% of full scale (2913), the loop is resumed until an error occurs (2906) or the sensor is properly adapted (2908).

It can also be determined if the sensor is mounted incorrectly or put into an unacceptable application and flash the appropriate status information. FIGS. 30(a) and (b) show two applications where sensors 3001 and 3004 are improperly applied.

Sensor 3001 is mounted looking out the door in room 3002. As people walk past the door in hallway 3003 the lights will be tripped on. A variety of sensitivity reduction techniques, as previously discussed with reference to FIGS. 23–29, will significantly reduce sensitivity. Working at desk 3006 will not maintain electrical load(s) and will periodically de-energized. The sensitivity will increase from "false-off" adaptation event. When the space is unoccupied, the sensitivity will decrease. This cycling will be detected and an application error status message will be displayed.

Sensor 3004 is mounted in a very large room 3007. This room is much larger than the coverage pattern sensor 3004 can provide. Working at desk 3005 will increase sensitivity from "false-off" adaptation events. Eventually, sensor 3004 sensitivity will be increased through a variety of sensitivity reduction techniques previously discussed for example some of these could be "false-on", "false-on-stay-on" or "lights stay on-no major motion" adaptation events will significantly reduce sensitivity. This cycling will be detected and an application error status message will be displayed.

Figure 31:
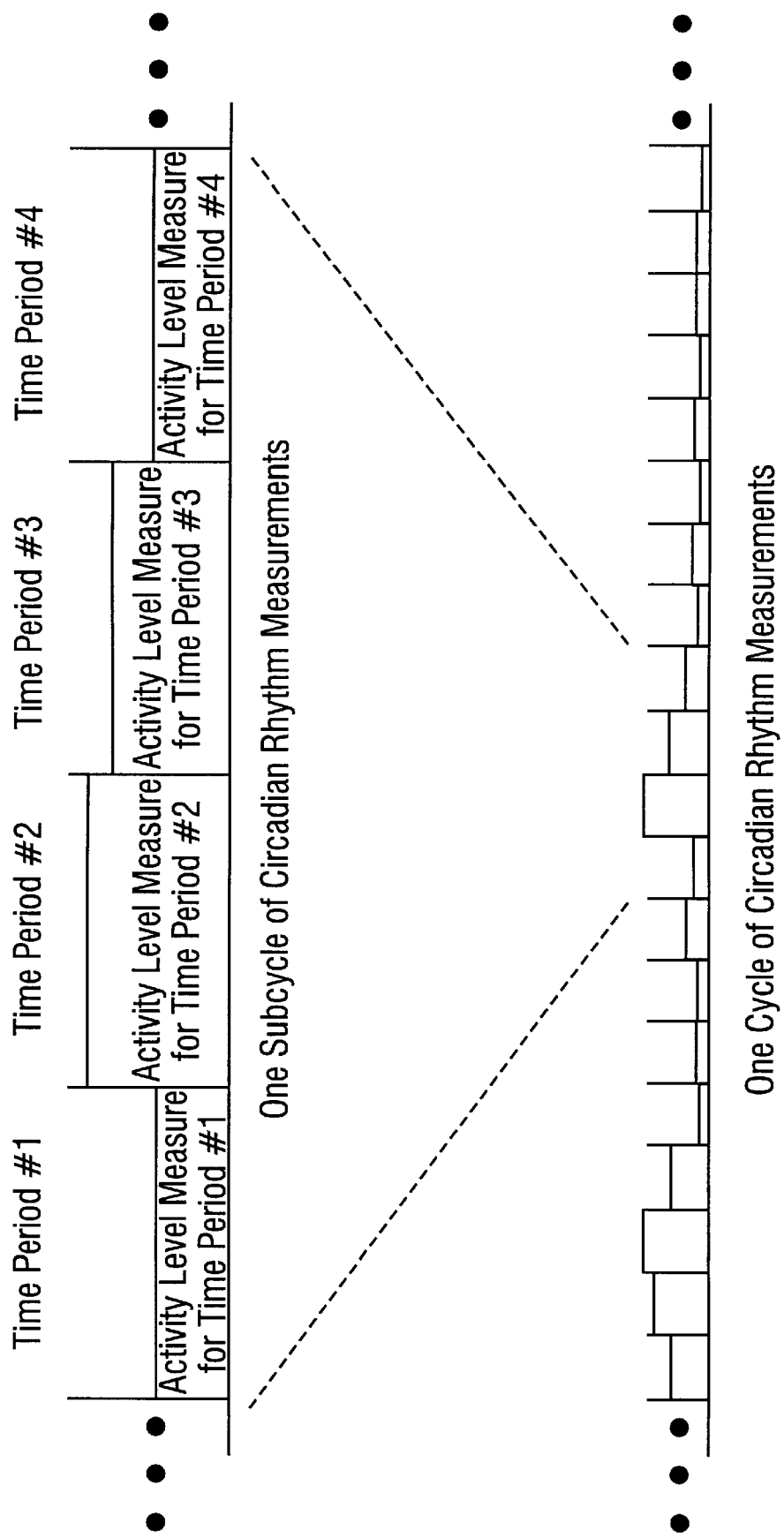
FIG. 31 is the occupancy cycle detection and utilization measurement method for the present invention.
Figure 32:
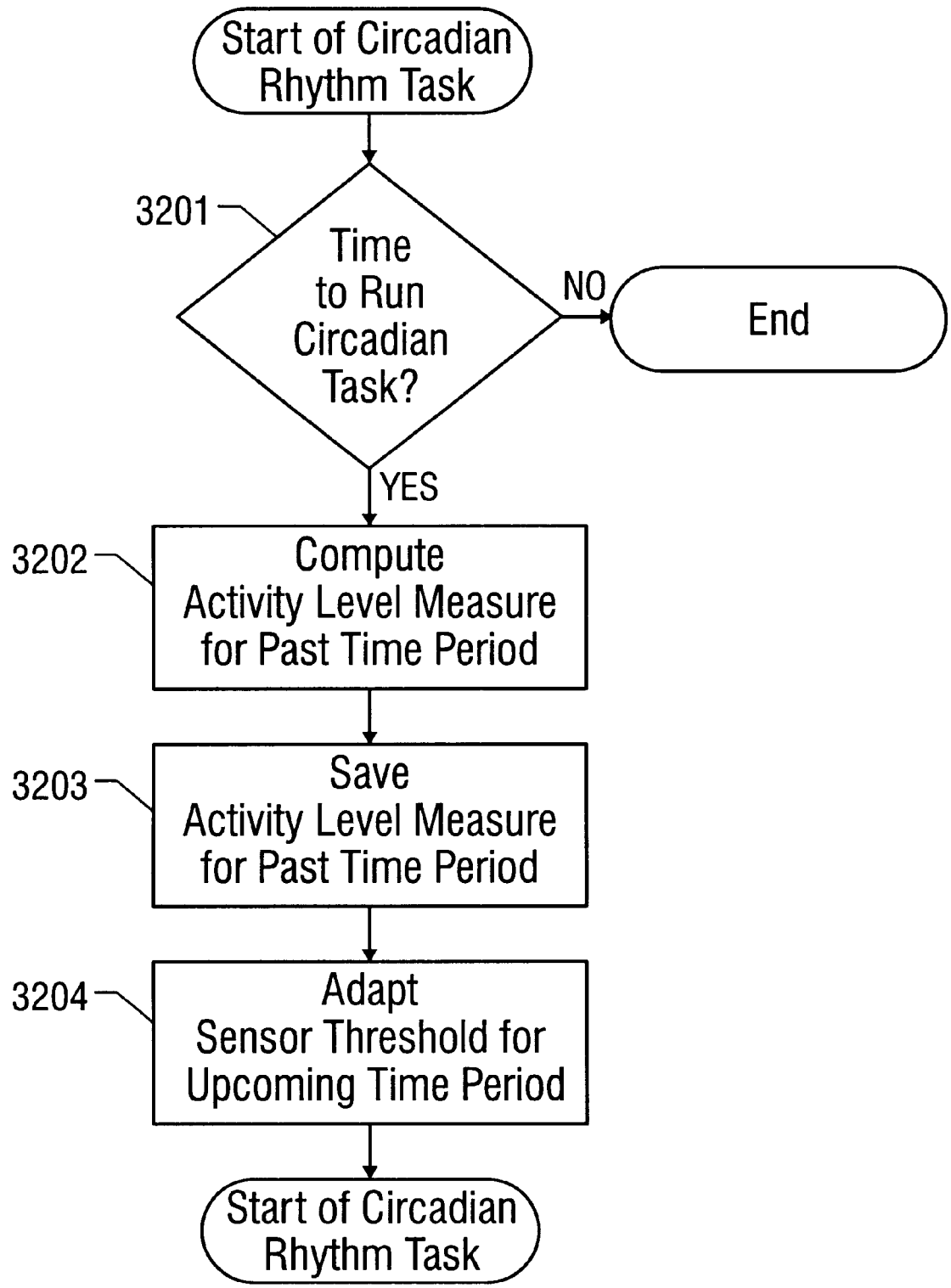
FIG. 32 is the occupancy cycle detection and utilization task flowchart for the present invention.

The occupancy cycle detection and utilization adjustment modifies the sensor's ultrasonic and infrared sensitivity settings based on the historical usage patterns of the area controlled by the sensor. FIG. 31 is a histogram that depicts the occupancy cycle detection and utilization measurement scheme of the present invention. The various sensitivity settings are slightly increased during time periods when the area is normally occupied. Similarly, the various sensitivity settings are slightly decreased during time periods when the area is normally unoccupied. FIG. 32 is a simplified occupancy cycle detection and utilization task for the present invention in flowchart form. In operation, when it is time to run the task (3201), the activity level for the immediately preceding time period is computed (3202). Then, the activity level is saved (3203). This preferably takes the form of an accumulation of newly computed activity with activity that has been computed and accumulated previously for the same time period. Thus, a histogram like that shown in FIG. 31 is built. Then, the sensor sensitivity is adjusted (3204) for the upcoming time period based upon the level of activity stored in the histogram for the next time period.

Figure 33:
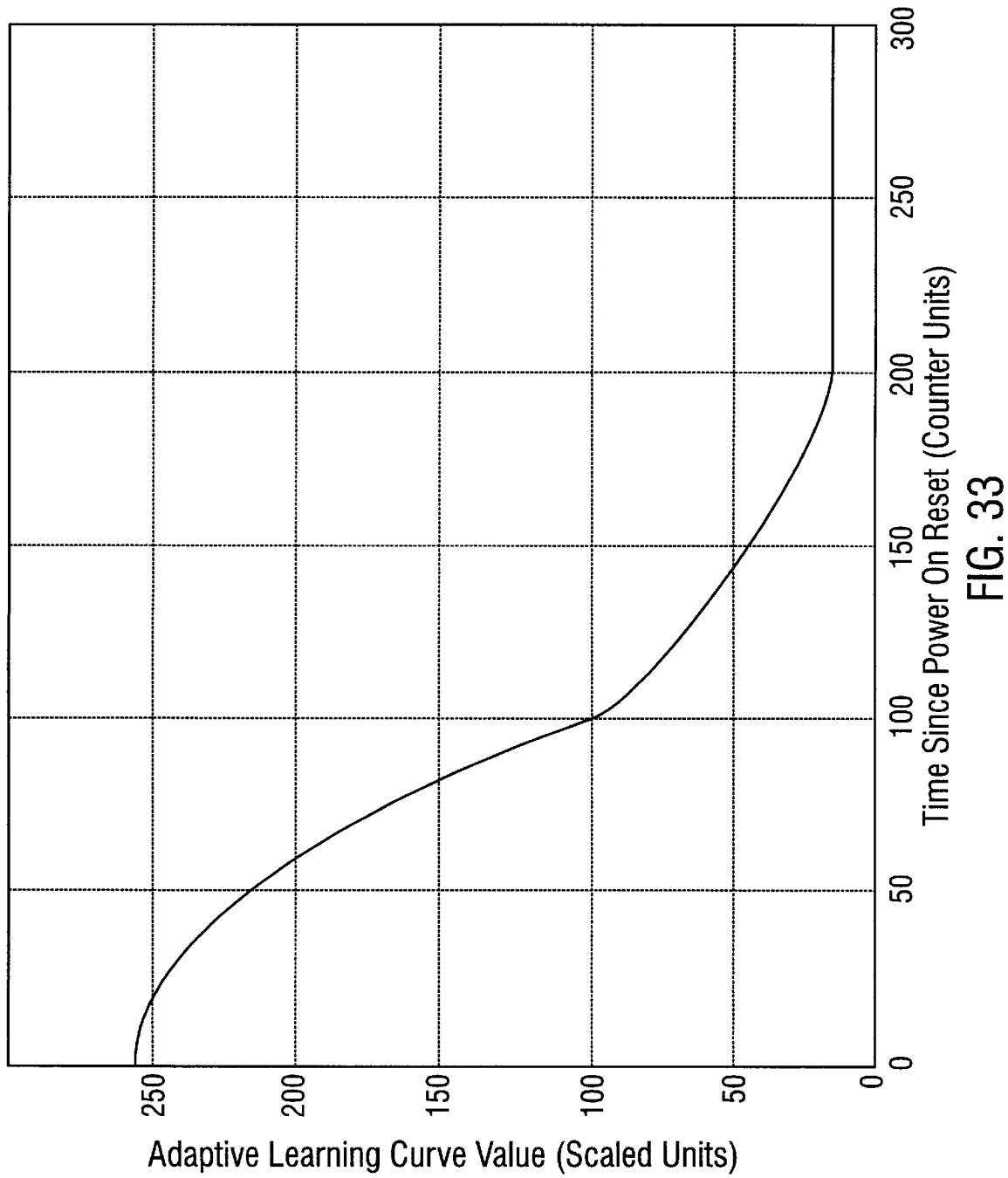
FIG. 33 is a typical learning curve describing the adaptive behavior of the present invention.

In accordance with one aspect of the present invention, a learning curve is used to adapt the sensor sensitivity and timer settings as a function of the elapsed time since the initial power on reset state, toggling of the sensor's Adaptation Reset switch 309 (FIG. 3) or continuous cycling in one of the previously discussed adaptation events. In general, each sensor technology has its own separate (and potentially different) learning curve. A typical learning curve plot is shown in FIG. 33. The shape of the learning curve implies that greatest incremental sensitivity and timer changes occur at the beginning of the learning curve cycle. As the elapsed time increases in the learning curve cycle, the adaptive behavior will gradually decrease until very small changes in sensitivity and timer settings will occur.

If the sensor's environment experiences a significant change long after power on reset state, the sensor may require some adjustment to operate properly in its new environment. In this unusual situation, the use may toggle the sensor's Adaptation Reset switch 309 (FIG. 3). This will reset all of the sensor's adaptive algorithms and reset to the beginning of the learning curve plot in FIG. 24. The sensor will then begin to adapt to its new environment according to its various learning curves.

Figure 34:
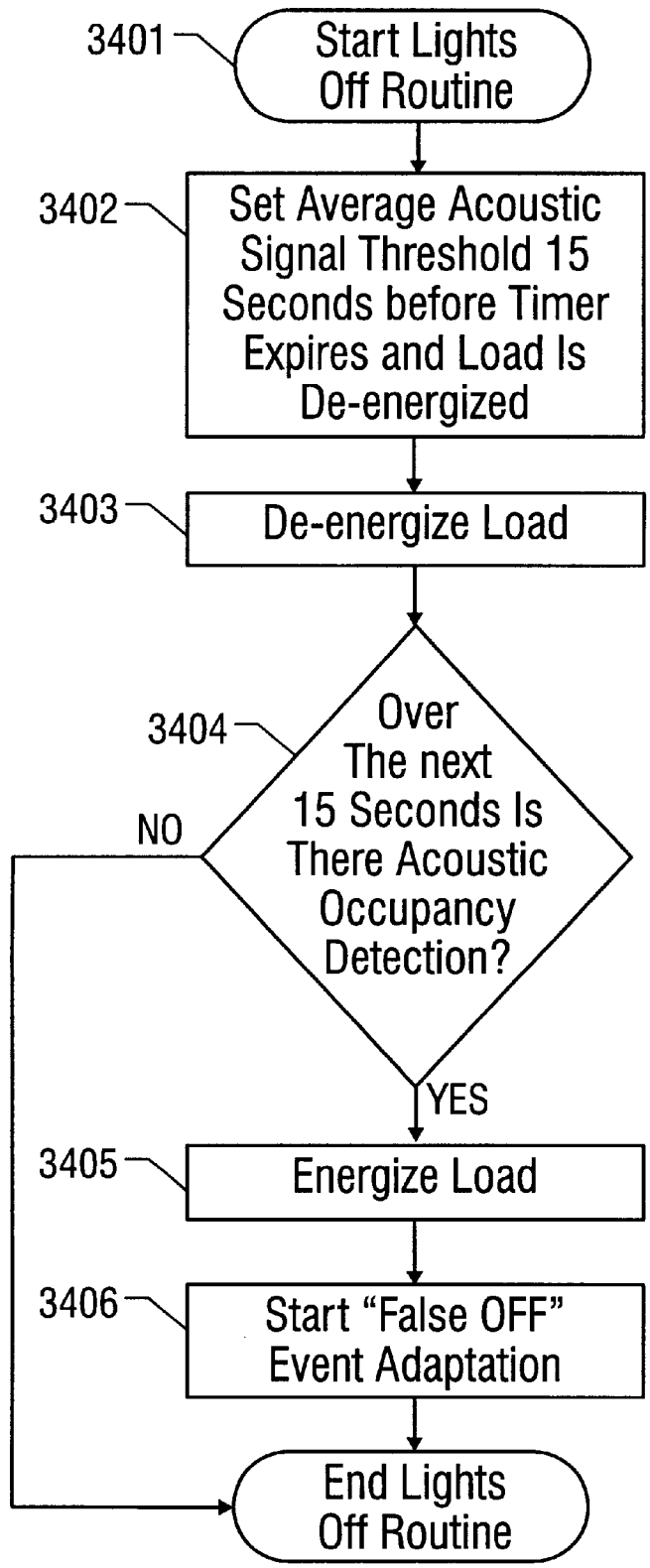
FIG. 34 is a "lights off" task flowchart when using an acoustic sensor to prevent "false off" for the present invention.

Controlling very large spaces with a minimum number of sensors or controlling areas that have unusual shapes can easily be accomplished by adding an acoustic detector. This new application method only enables the acoustic detector just before and after the load(s) are de-energized. This eliminates many of the disadvantages that dual technology PIR/Acoustic and Ultrasonic/Acoustic sensors have. When acoustic occupancy detectors are used alone or in dual technology configurations, load(s) are energized for much longer time periods because of incorrect occupancy detection due to external noises such as radios, fans, passing automobiles etc. In these devices, the acoustic detector is enabled continuously. In accordance with the present invention, as illustrated in, FIG. 34, the acoustic detector is only enabled 15 seconds before load(s) are de-energized 3402 and 15 seconds after. During the first 15 seconds, the acoustic sensor establishes an average acoustic occupancy threshold. After the load(s) are de-energized 3403 the acoustic detector is enabled for an additional 15 seconds 3404 and listens for acoustic occupancy such as human speech. If the acoustic occupancy threshold is exceeded, the load(s) are energized 3405 and start "false off" event adaptation timer begins 3406. The preferred embodiment of this acoustic detection method is to complement a single technology ultrasonic or PIR sensor or dual technology ultrasonic and PIR sensor.

Figure 35:
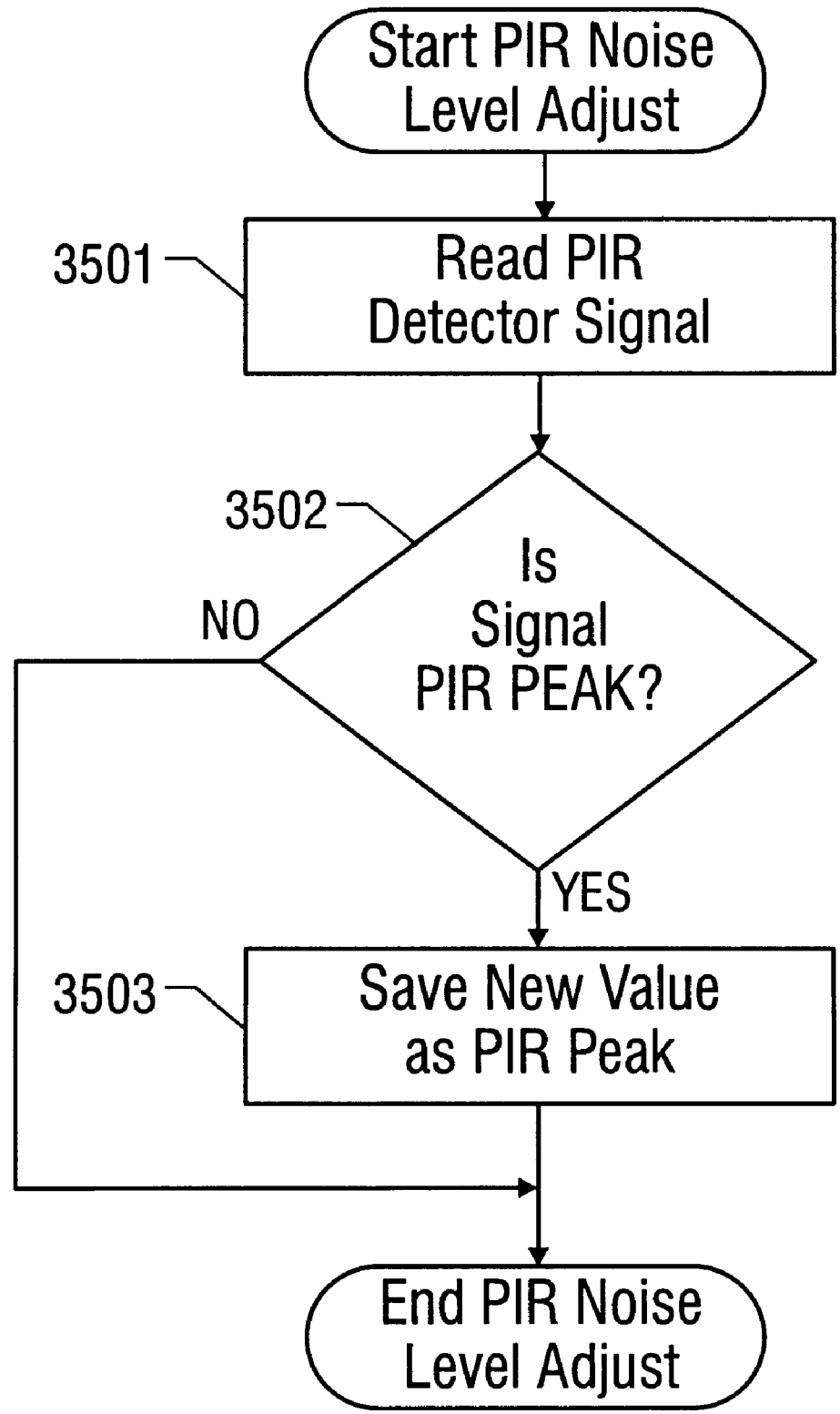
FIG. 35 is a PIR noise level adjustment task flowchart for the present invention.

Traditional analog PIR sensor manufactures provide a manual PIR gain adjustment or fix the gain during the manufacturing process. Providing a manual adjustment may lead to misadjustment. For example, the gain may be erroneously set so large that the sensor occasionally false trips on internally generated noise. Manufactures that provide fixed gain are not utilizing fall detector sensitivity to allow for device tolerances in the PIR detector, filter and amplifier stages. FIG. 35 provides a method of recording PIR signal levels 3501 when load(s) are de-energized and areas unoccupied. New peak PIR values are stored 3503 and a new occupancy threshold offset can be calculated. Using this method, maximum PIR sensitivity settings can be calculated.

Ultrasonic detection technologies are most susceptible to strong air flow when turning loads on, as compared to steady state (maintaining loads on) or turning lights off. Overcoming false occupancy detection when air flow turns on or creating a "Air Puff" detector would be a major improvement in ultrasonic sensing technology. The most common way of improving ultrasonic performance is adding PIR or microwave detectors. While use of these additional sensing technologies improved overall sensor performance, they did not eliminate the deleterious effects of air flow is on the ultrasonic detector.

Sensors mounted next to an HVAC register can acoustically detect several things when air flow begins. First, the compressor turns on, second the air flow will typically exhibit a unique sound signature during startup and continuous operation. This unique sound signature may be a function of the building configuration, and the structures of the air diffuser and air duct.

Figure 36:
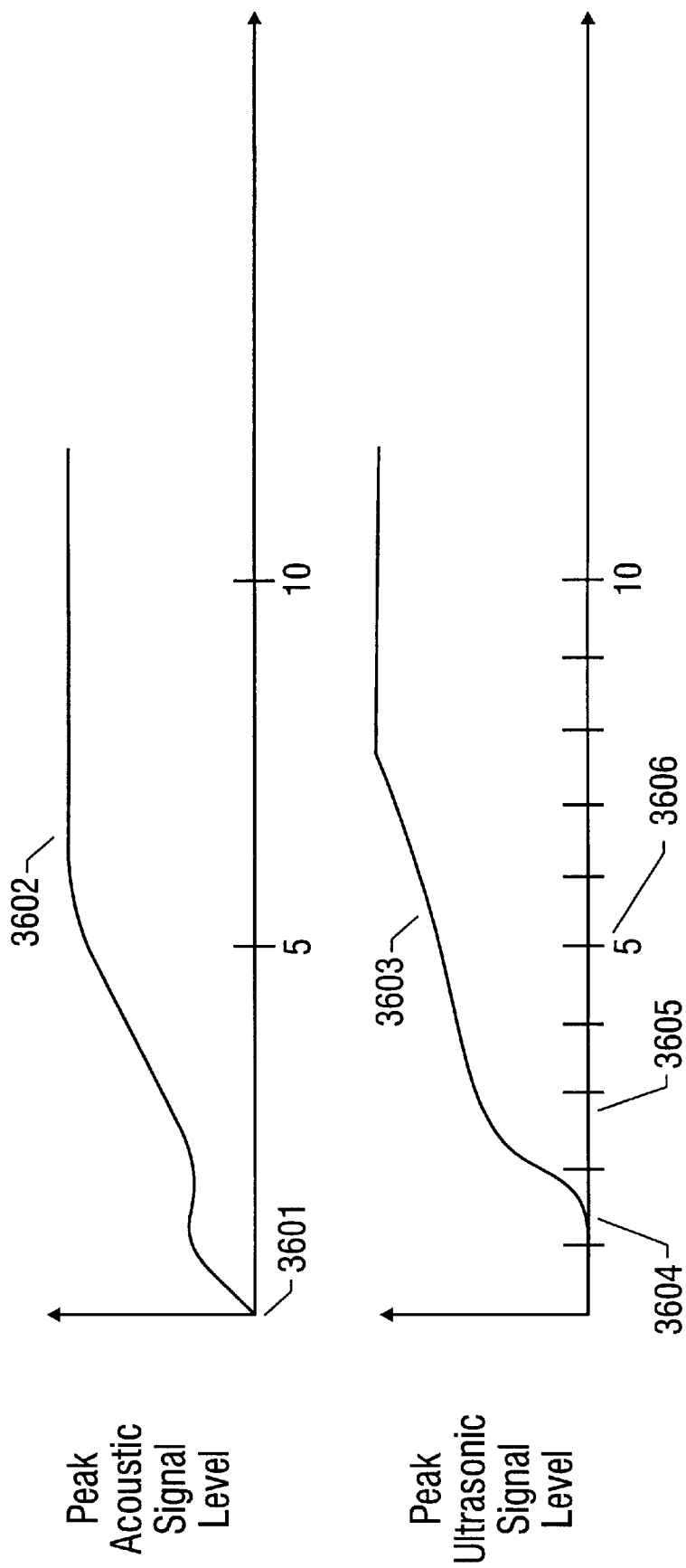
FIG. 36 is a time line illustrating the adjustment of ultrasonic sensitivity based on acoustic signal detection.
Figure 37:
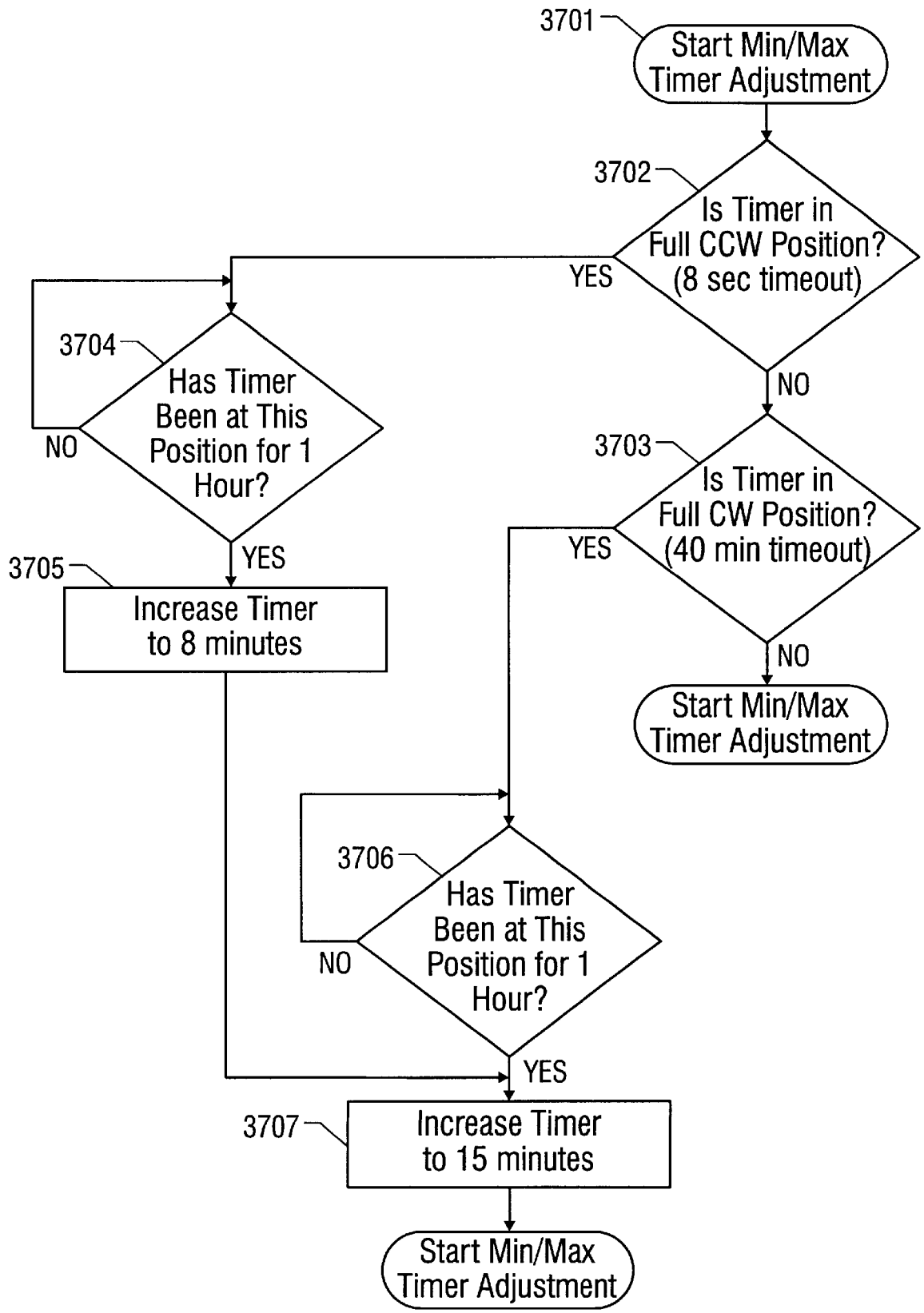
FIG. 37 is a timer adjustment task flowchart for the present invention.

The closer the sensor is to the HVAC register, the greater the affect of air flow. An acoustic detector designed to monitor air flow sounds can be used to complement ultrasonic detector systems. FIG. 36 illustrates signal levels for a room that is empty, quiet and unoccupied when air flow turns on 3601, the acoustic sound energy 3602 is detected by the acoustic detector before the ultrasonic detector is affected. The ultrasonic detector detects signal 3603 at 3604. This air flow on transition from 3604 to 3605 is difficult for ultrasonic detectors to reject. The Doppler shift spectrum in this region is broad and robust. Using the acoustic detector to temporarily inhibit or reduce ultrasonic sensitivity from 3601 to 3606 eliminates the ultrasonic detector from creating a "false-on" event The sensor's timer supports a number of special modes intended to address a variety of user needs such as to allow the sensor's installer to force a short time-out period for purposes of sensitivity adjustment, to avoid short timer settings in normal operation, and to avoid a long load-energized period with no motion if the sensor's circuit breaker is cycled. If the sensor is powered up with the timer adjustment potentiometer (319, FIG. 3) in the fully-CCW position, or if the timer adjustment potentiometer is adjusted to the fully CCW position after being at another setting, the sensor enters an 8-second timeout test mode. If the timer is adjusted from the fully-CCW position to another setting, the timer exits the 8-second timeout test mode and returns to normal operation. As an aid to the installer, the flowchart of FIG. 37 illustrates what happens if the sensor's timer is left in minimum timeout (8-second) or maximum timeout (32 minutes) setting for more than an hour. If the timer is at minimum (full CCW) the timer is set at 7 minutes (3702, 3704 and 3705). If the timer is at maximum (full CW) the timer is set at 15 minutes (3703, 3706 and 3707).

To accomplish ATA, a variety of situations modify the sensor's timer delay setting.

Figure 38:
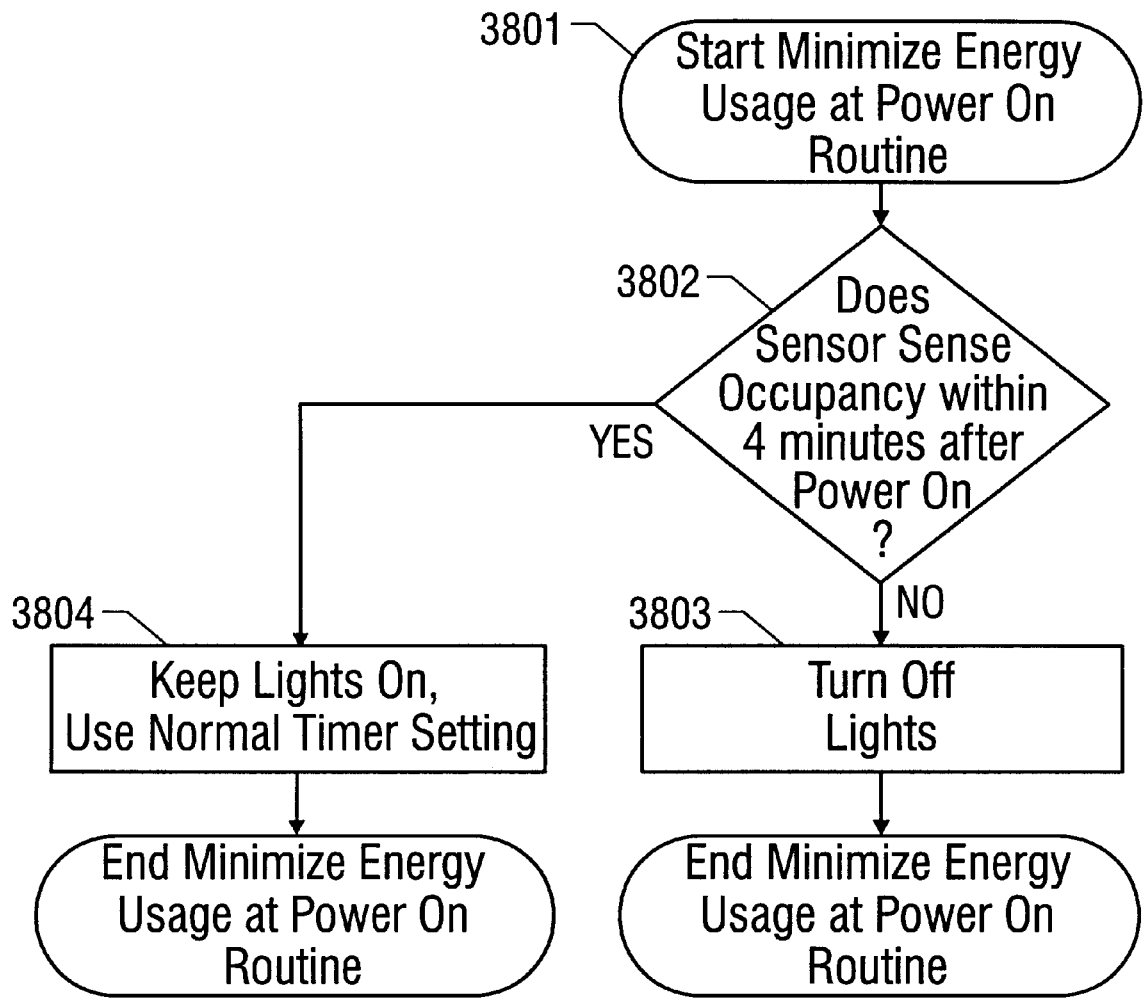
FIG. 38 is a minimize energy usage at power-up task flowchart for the present invention.

A false off event shown, for example, in FIG. 25, will slightly increase the timer delay setting. In addition, as shown in FIG. 38, the sensor also incorporates a minimize energy usage algorithm that checks for occupancy within the first two minutes after power up 3802. If motion is detected, keep lights on and use normal timer setting 3804. If motion is not detected, turn lights off 3803. This feature solves the problem if power is interrupted by utility failure or a general area shut down during the evening and power is subsequently restored. Conventional sensors power on and begin a complete time-out cycle, typically leaving the lights on needlessly for twenty minutes.

Figure 39:
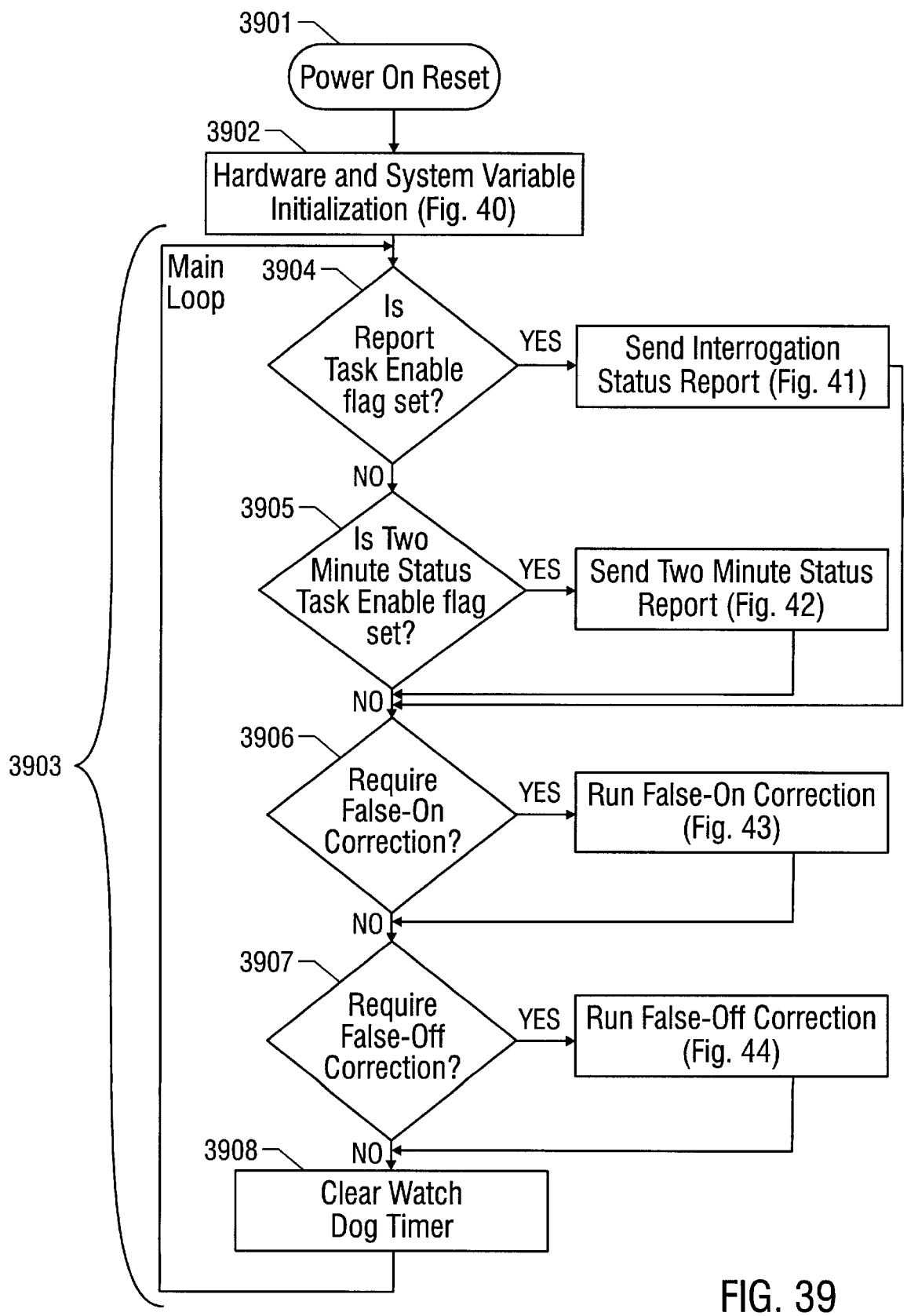
FIG. 39 is the main (foreground) routine flowchart of the present invention.

A flowchart of the main software routine of an exemplary embodiment of the present invention is shown in FIG. 39. In practice, the flowcharts depicted in FIGS. 32 and 39–69 are encoded in an appropriate programming language and loaded into the program memory of digital microcontroller 229 (FIG. 2), to cause digital microcontroller to control the operation of the apparatus of the present invention to perform the methods of the present invention.

Referring to FIG. 39, upon power on reset (3901), the digital microcontroller's various timer, counter, serial port and high speed 8-bit A/D converter peripherals are set up and the various sensor variables are initialized (3902). The microcontroller 229 then enters the occupancy sensor's main loop (3903). The sensor's main loop initially checks to see if either the manual interrogate status flag or the two minute status flag is enabled (3904, 3905). If so, the appropriate status report task is executed. The sensor then checks to see if a sensor false-on event or false-off event has occurred (3906, 3907). If either event has occurred, the appropriate correction task is executed. Finally, at the bottom of the main loop, the microcontroller's watch dog timer (WDT) is reset (3908). This timer is used to reset the microcontroller 229 to the power on reset state in the event of a software malfunction.

Figure 43:
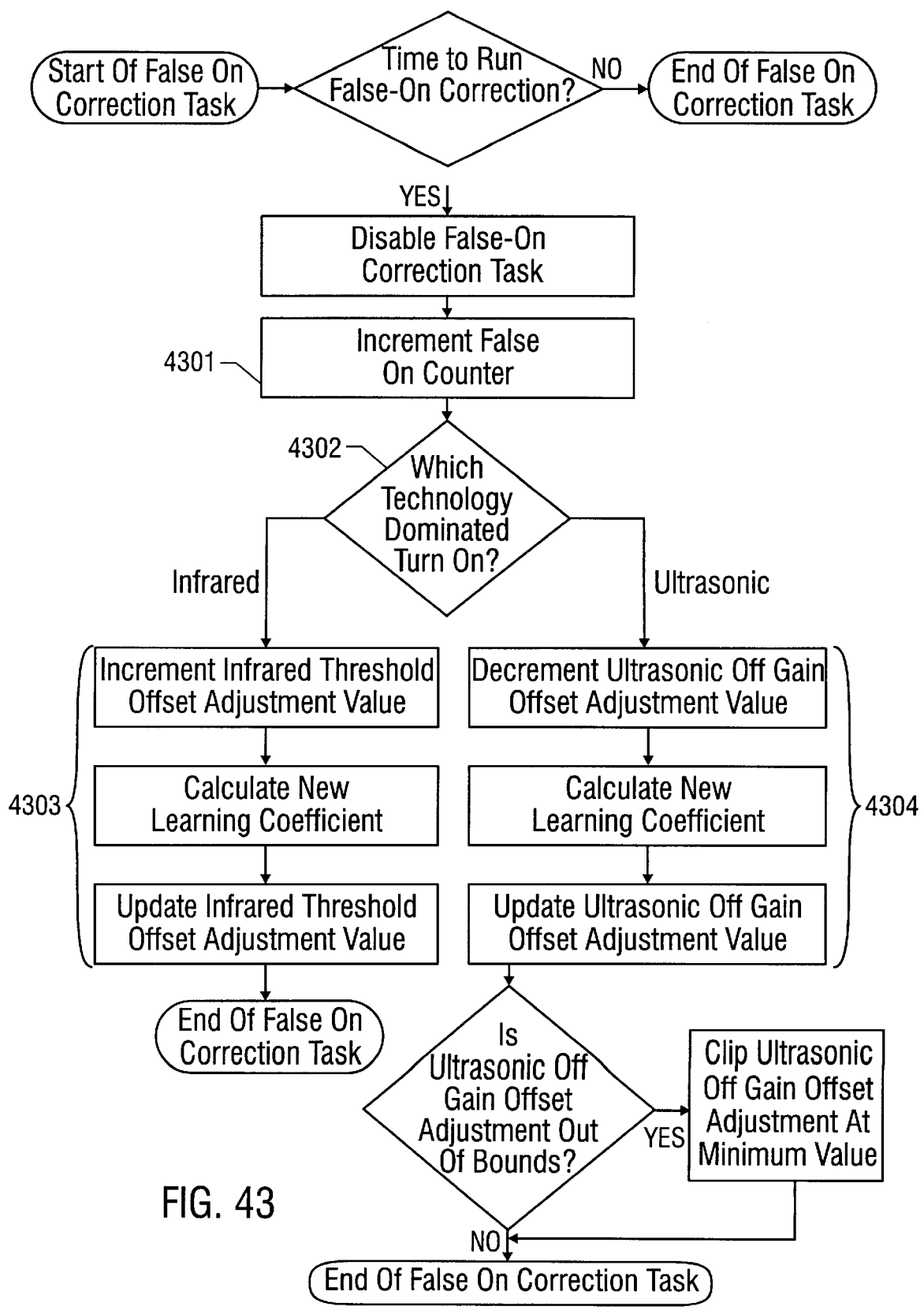
FIG. 43 is the false-on correction task flowchart of the present invention.
Figure 44:
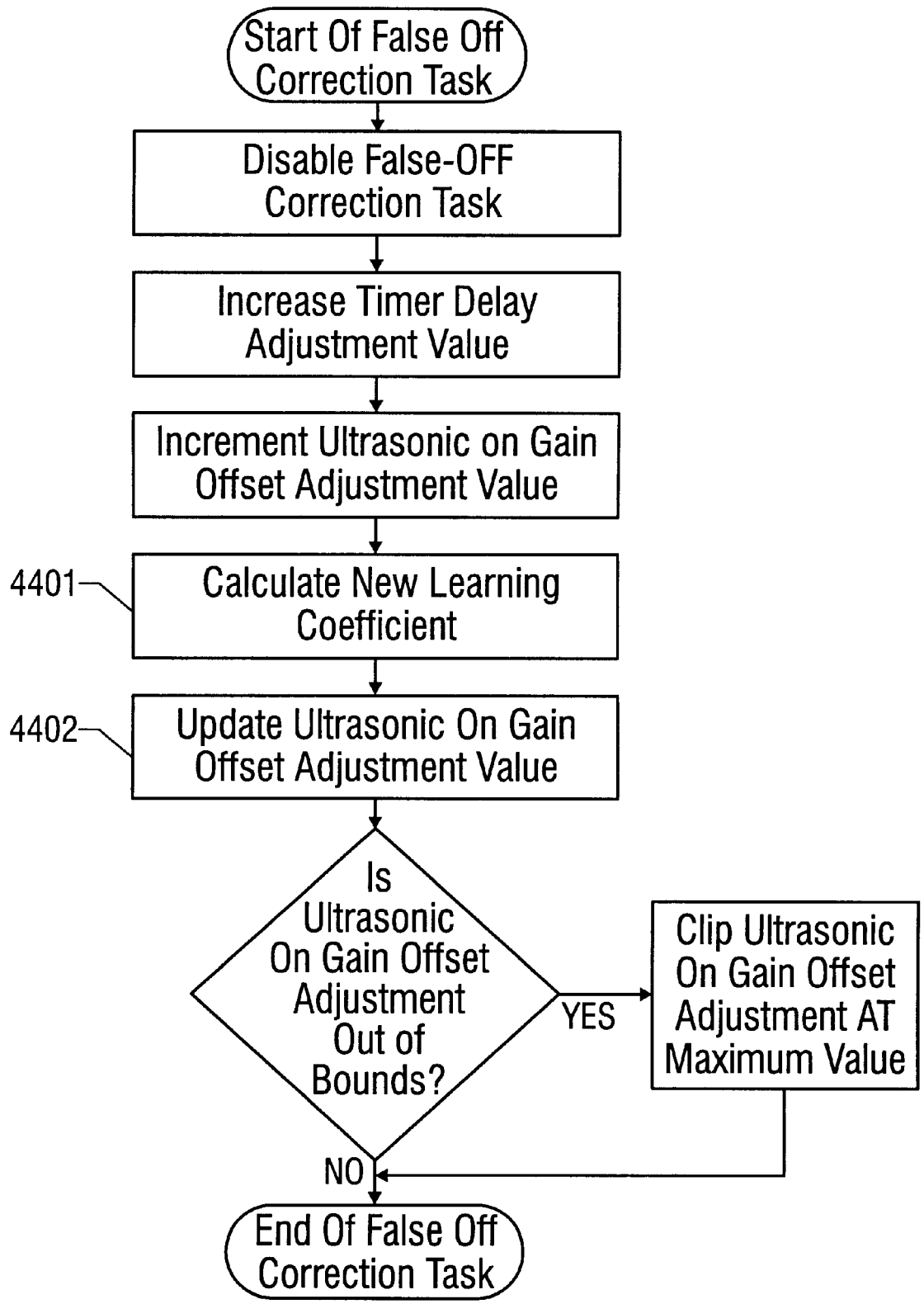
FIG. 44 is the false-off correction task flowchart of the present invention.

Thus, the main routine shown in FIG. 39 includes the following major software tasks that are described in detail in the figures indicated: hardware and system variable initialization task (FIG. 40); interrogation status report task (FIG. 41); two minute status report task (FIG. 42); false-on correction task (FIG. 43); and false-off correction task (FIG. 44).

Figure 40:
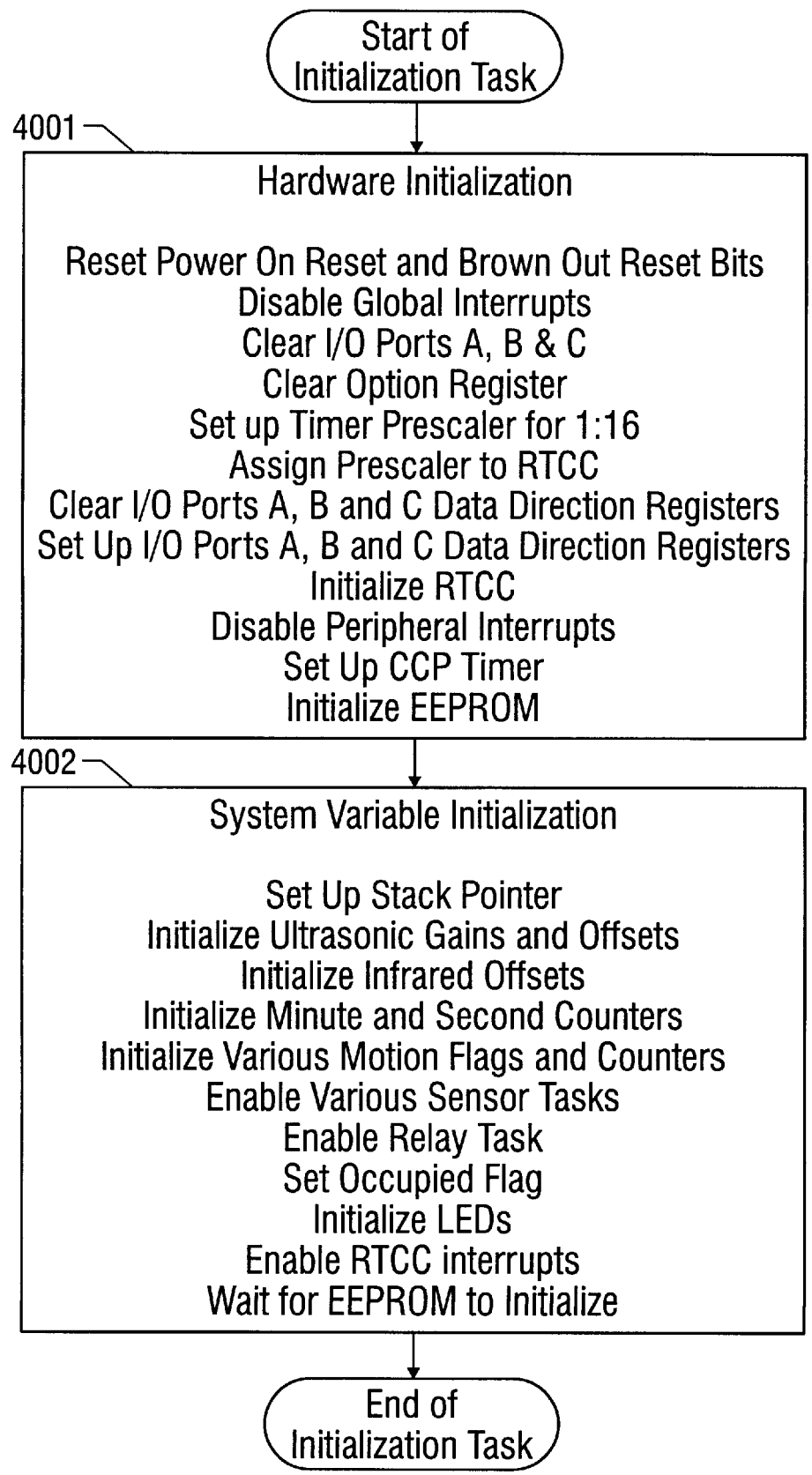
FIG. 40 is the hardware and system variable initialization routine flowchart of the present invention.

A flowchart of the hardware and system variable initialization task for the present invention is shown in FIG. 40. The hardware and system variable initialization task is executed on power up to configure the sensor for normal operation.

Initially the system on-chip and off-chip hardware is configured (4001). Specifically, the power on reset and brown out reset bits are reset. Global interrupts are disabled. The A, B and C I/O ports are cleared. The option register is cleared. The timer prescalar is set for 1:16 and is then assigned to the real time clock/counter (RTCC) peripheral. The various I/O port data direction registers are cleared and then set as required for normal operation. The RTCC timer count down value is set. All peripheral interrupts are disabled. The second CCP timer is set up. Finally, the serial EEPROM is initialized.

Next, the system variables of the occupancy sensor are initialized (4002). Specifically, a stack pointer is set up. The various ultrasonic gains, thresholds and offset values are initialized. The various infrared offset values are initialized. The minute and second counters are initialized. The various motion flags and motion counters are initialized. The primary sensor tasks are enabled except for the sensor task. The occupied bit is set. The various sensor LED registers are initialized. The RTCC interrupts are enabled. A variable delay is executed until the serial EEPROM initialization has been completed. A single EEPROM location is read to determine if the EEPROM has had sensor information previously stored in it. If it has, the contents of the EEPROM are read and the various sensor variables are restored. If the EEPROM has not had sensor information previously stored in it, the current sensor variables are stored in the EEPROM. Finally, the sensor task is enabled.

Figure 41:
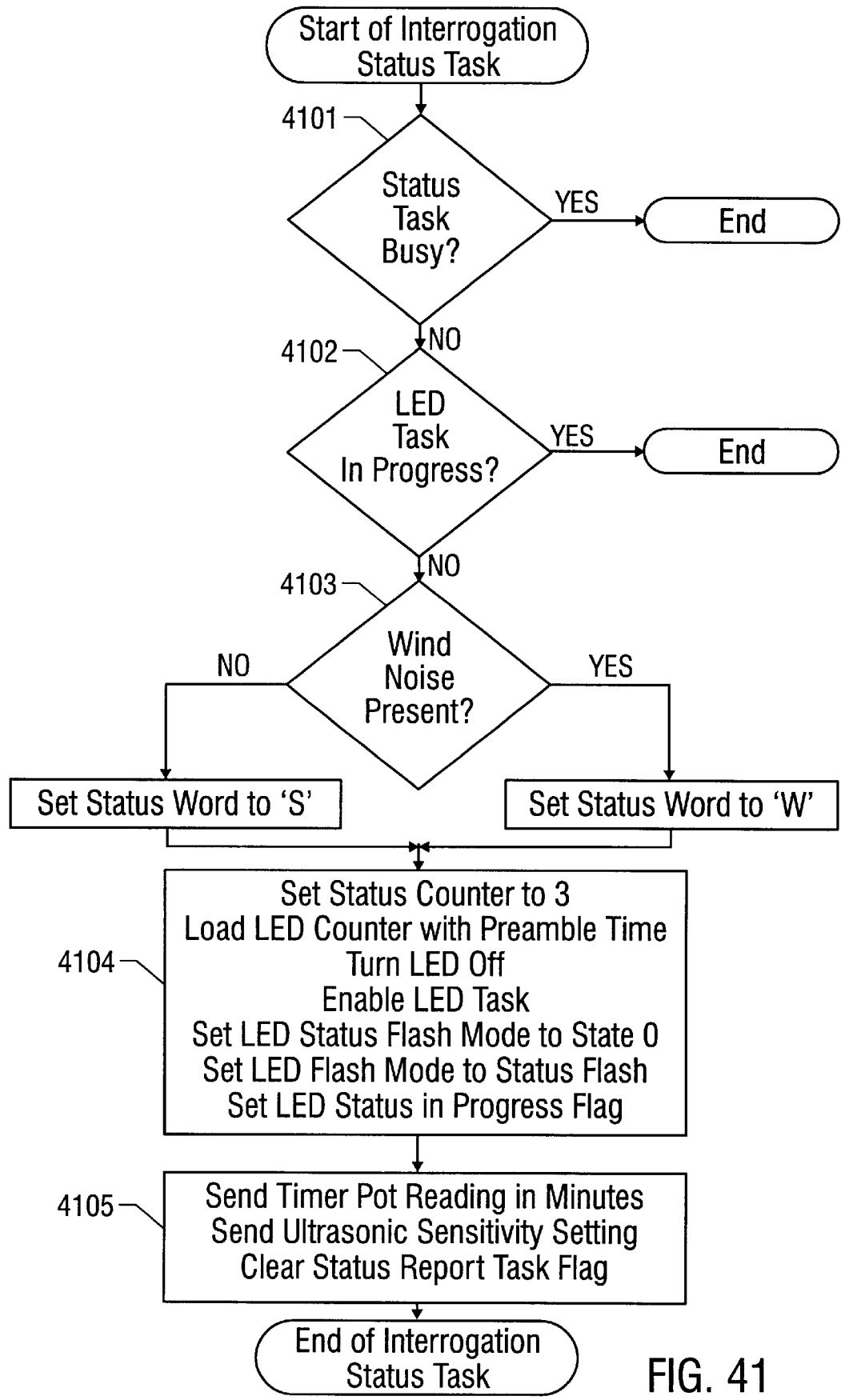
FIG. 41 is the interrogation status report routine flowchart of the present invention.

A flowchart of the interrogation status report task for the present invention is shown in FIG. 41. The interrogation status report task displays the status of the sensor in response to a user's interrogation of the sensor. If a status task is not currently in progress (4101), and if the LED task is not busy (4102), ultrasonic sensor 102 (FIG. 2) is checked to determine if wind noise is present (4103). Control then passes to block 4104, and then on to block 4105.

Figure 42:
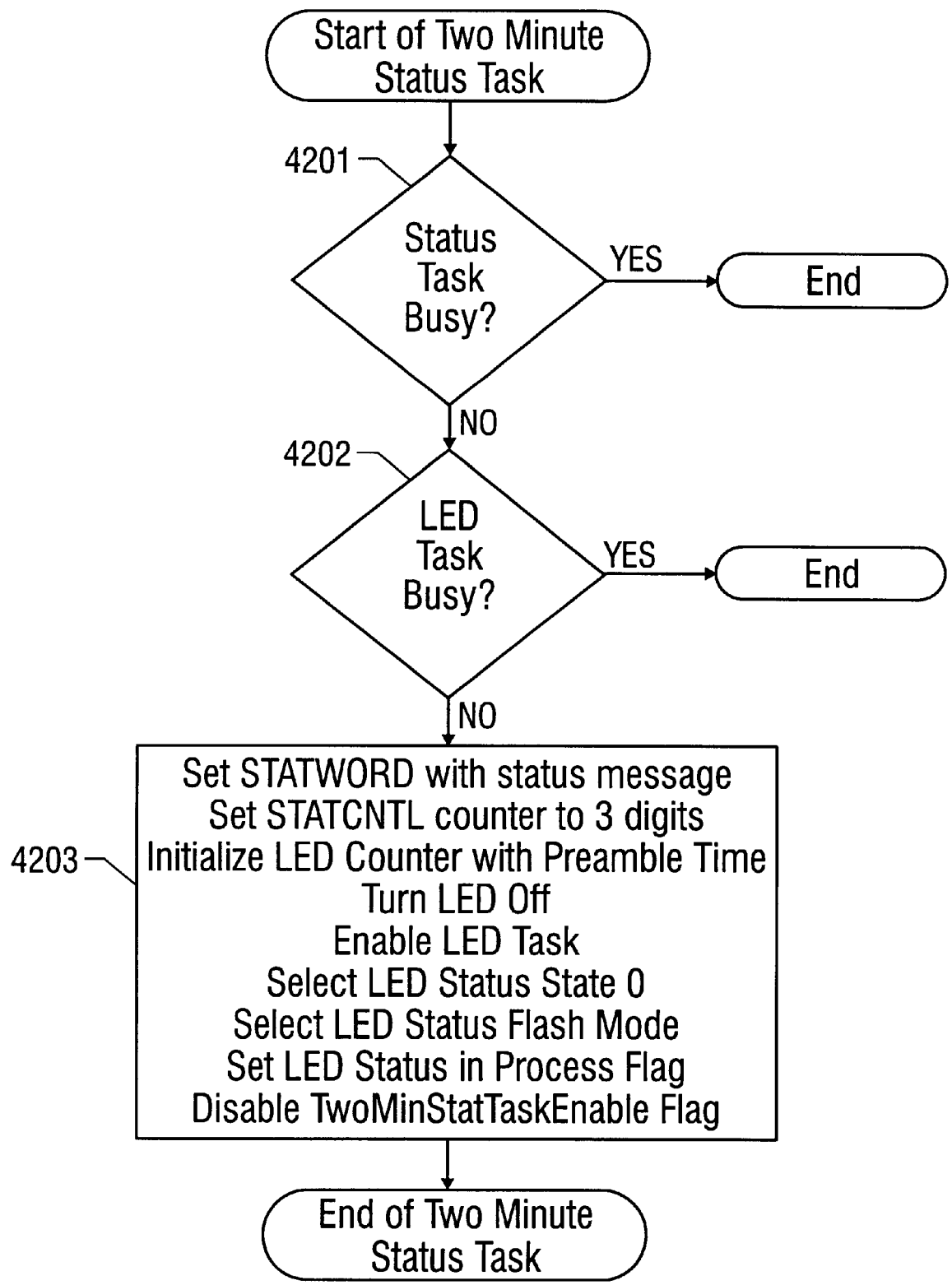
FIG. 42 is the two minute status report routine flowchart of the present invention.

A flowchart of the two minute status report task for the present invention is shown in FIG. 42. The two minute status report task displays the status of the sensor at periodic two minute intervals. If a status task is not currently in progress 4201), and if the LED task is not busy (4202), control passes to block 4203 where the sensor's status is stored in the sensor status message word and the sensor's status digit counter is initialized. The LED blink preamble time is stored in the LED counter and the LED is turned off. The LED task is enabled and the LED status state initialized. The LED status flash mode is set and the LED status in process flag is set. Finally, the TwoMinStatTaskEnable flag is set.

A flowchart of the false-on correction task for the present invention is shown in FIG. 43. The false-on correction task attempts to correct sensor false-on events by increasing the threshold required for the detection of motion. Initially a false-on event counter is incremented (4301). Then the sensor determines which technology dominated the false-on event (4302). A new adaptive learning coefficient is computed and the appropriate threshold offset is adjusted (4303, 4304).

A flowchart of the false-off correction task for the present invention is shown in FIG. 44. The false-off correction task attempts to correct sensor false-off events by decreasing the ultrasonic threshold required for the detection of motion. A new adaptive learning coefficient is computed and the appropriate threshold offset is adjusted.

Figure 45:
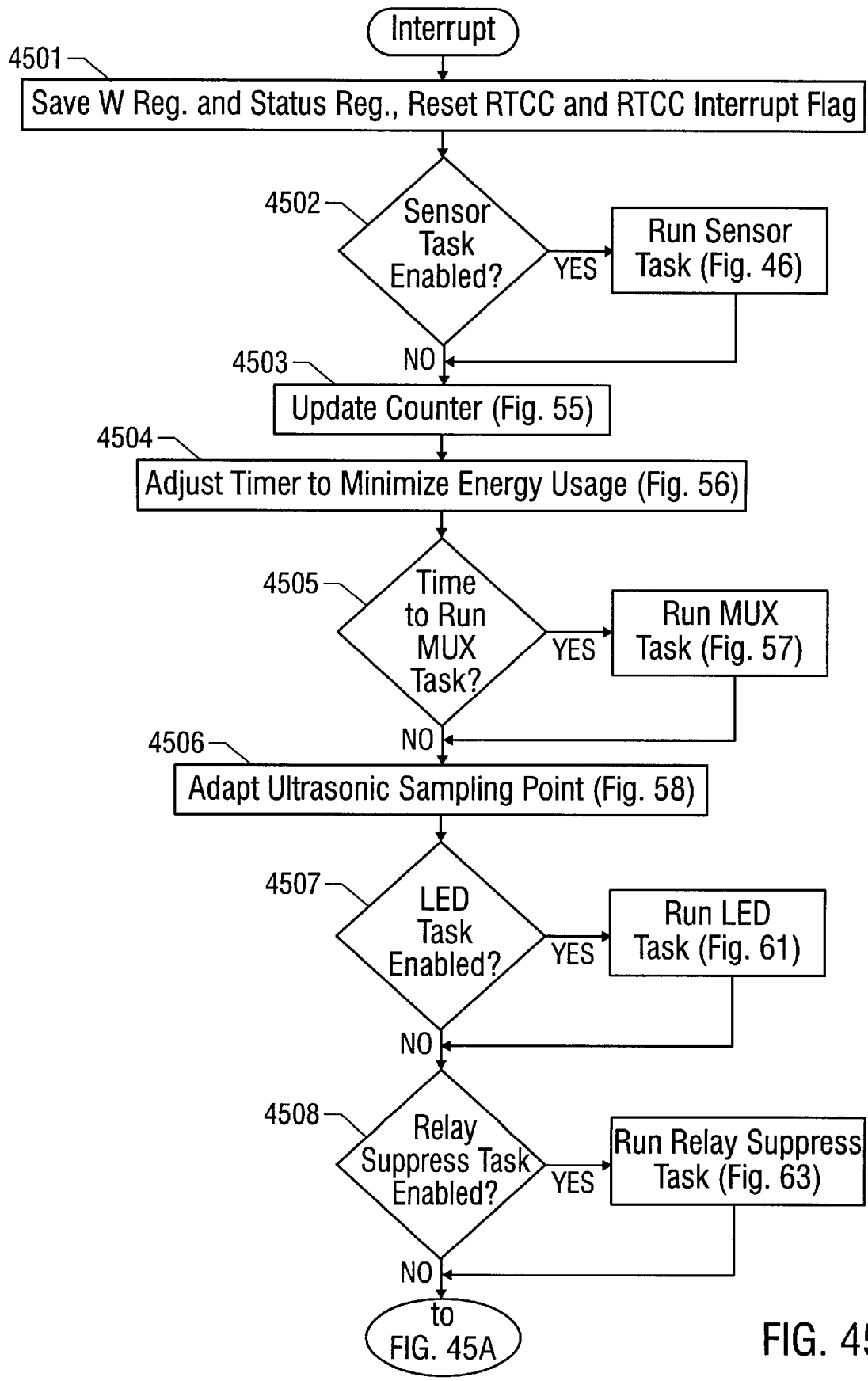
FIG. 45 is the interrupt (background) routine flowchart for the present invention.
Figure 45A:
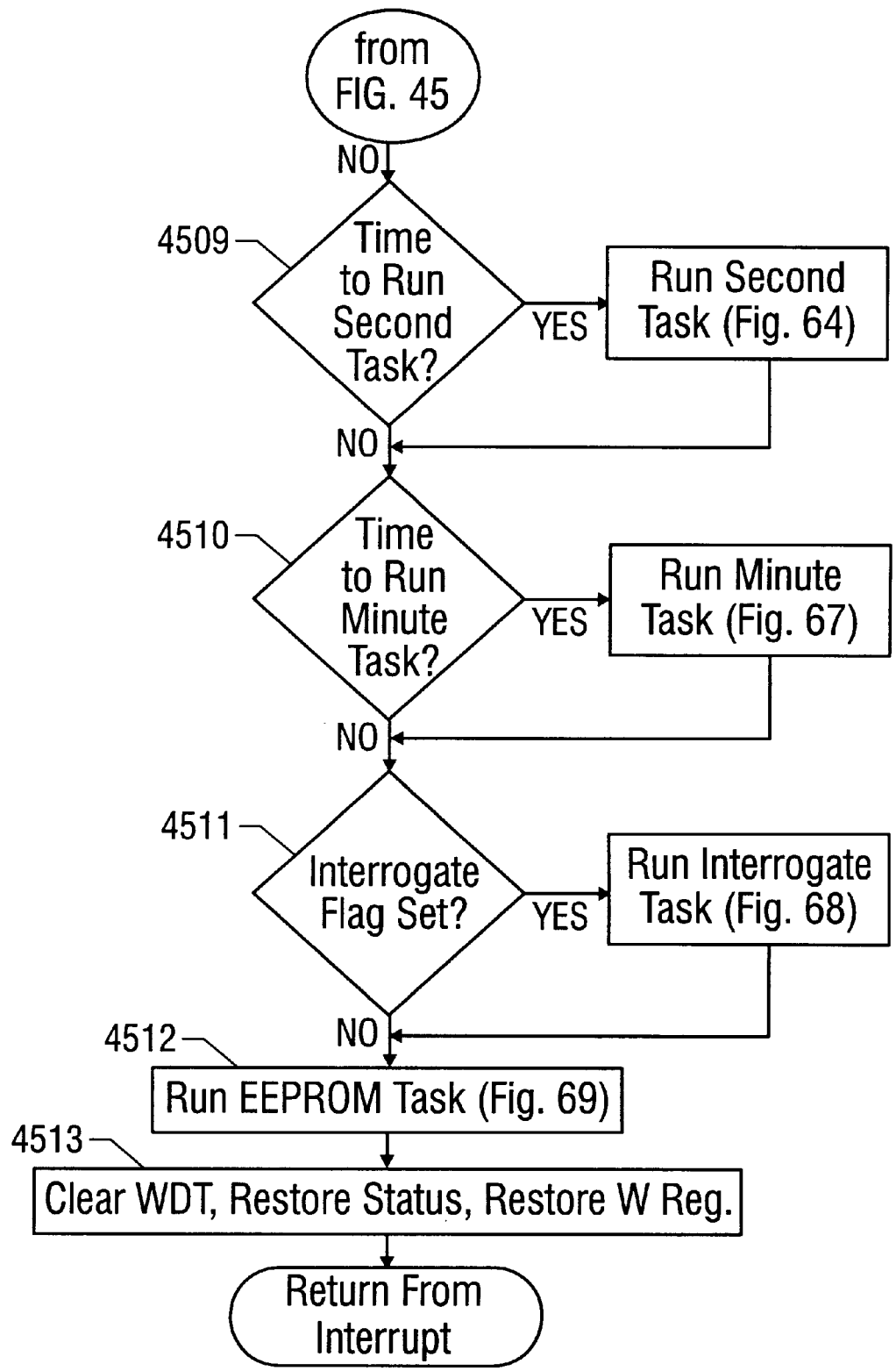

A flowchart of the occupancy sensor's interrupt software routine for the present invention is shown in FIG. 45. Upon interrupt, the contents of the 8-bit W accumulator register and Status register in microcontroller 229 are saved (4501). The timer/counter peripheral that generated the interrupt is reset and the microcontroller's interrupt flag is cleared (4501). The sensor task is executed if it is enabled (4502). The various occupancy sensor counters are updated (4503). The sensor's timer delay is adjusted to minimize energy consumption (4504). The multiplexer (MUX) task is run if it is enabled (4505). The ultrasonic sensor's sampling point is adapted (4506). Next, the LED task is run if it is enabled (4507). The relay suppress task is then run if it is enabled (4508). The second and minute tasks are then executed if enabled (4509, 4510). If the Th3 interrogate task is enabled it is executed (4511). The sensor's EEPROM task is then executed (4512). Finally, the microcontroller's watch dog timer (WDT) is cleared and the W register and the status register contents are restored (4513).

Figure 55:
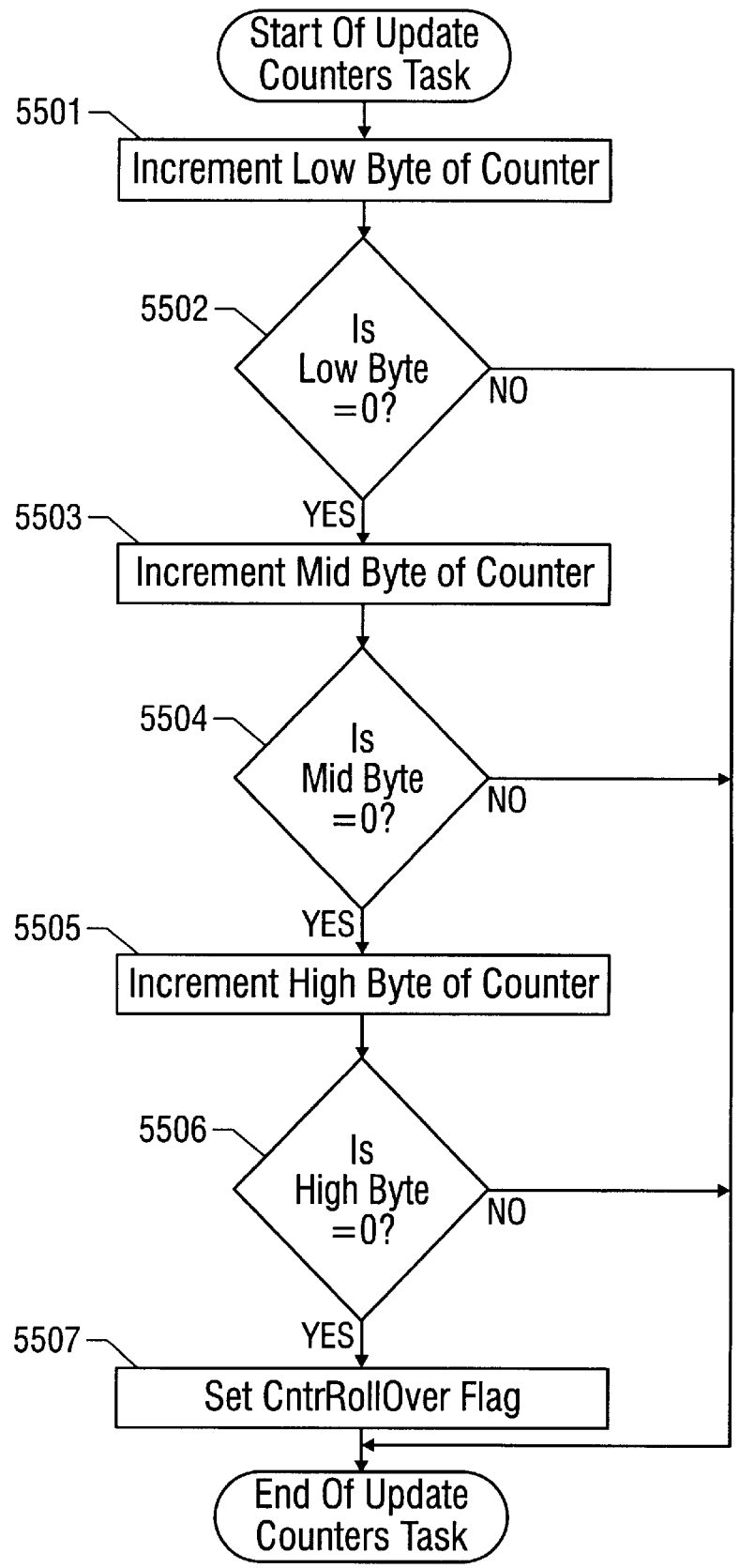
FIG. 55 is the update counters task flowchart for the present invention.
Figure 56:
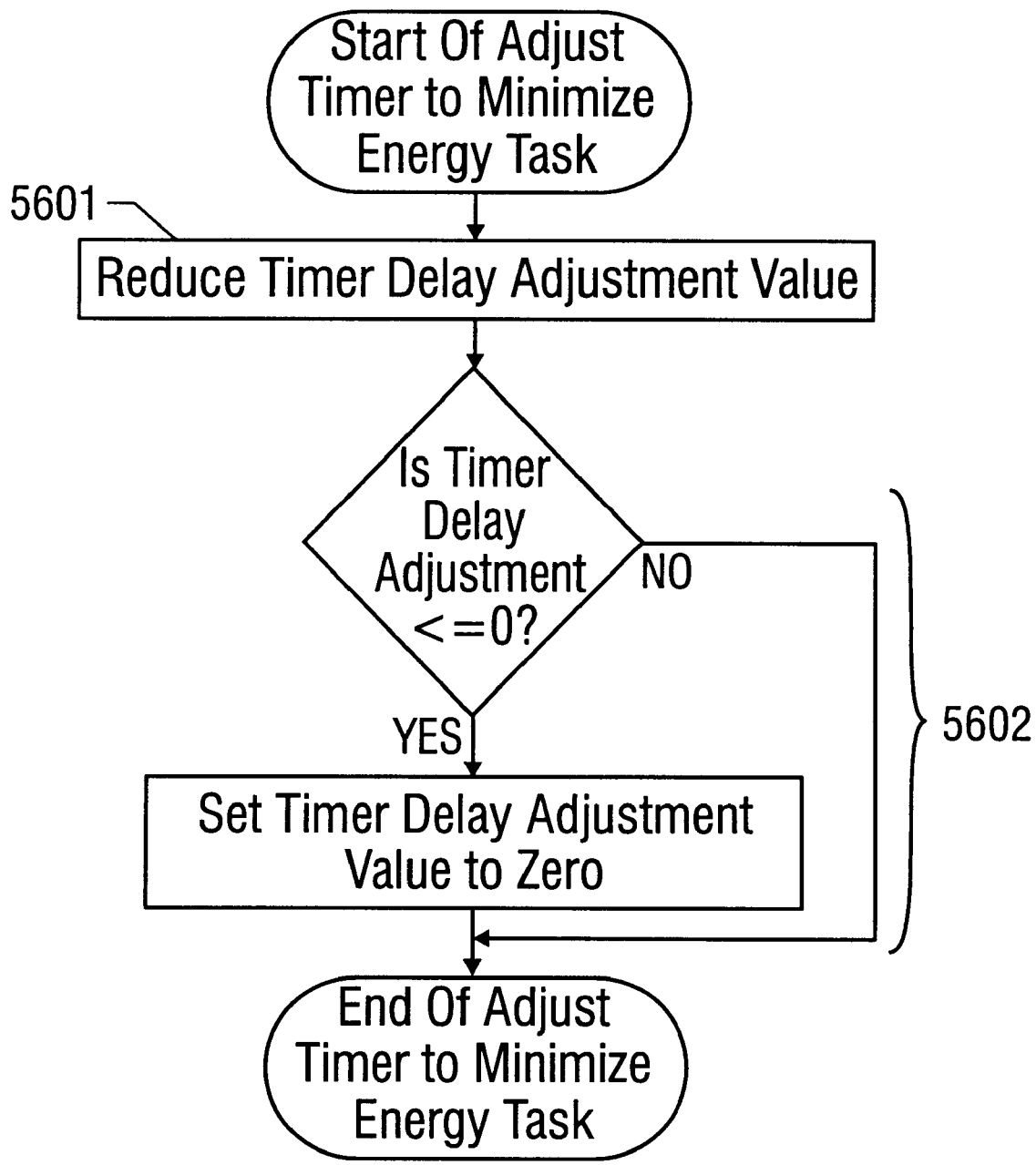
FIG. 56 is the adjust timer to minimize energy usage task flowchart for the present invention.
Figure 57:
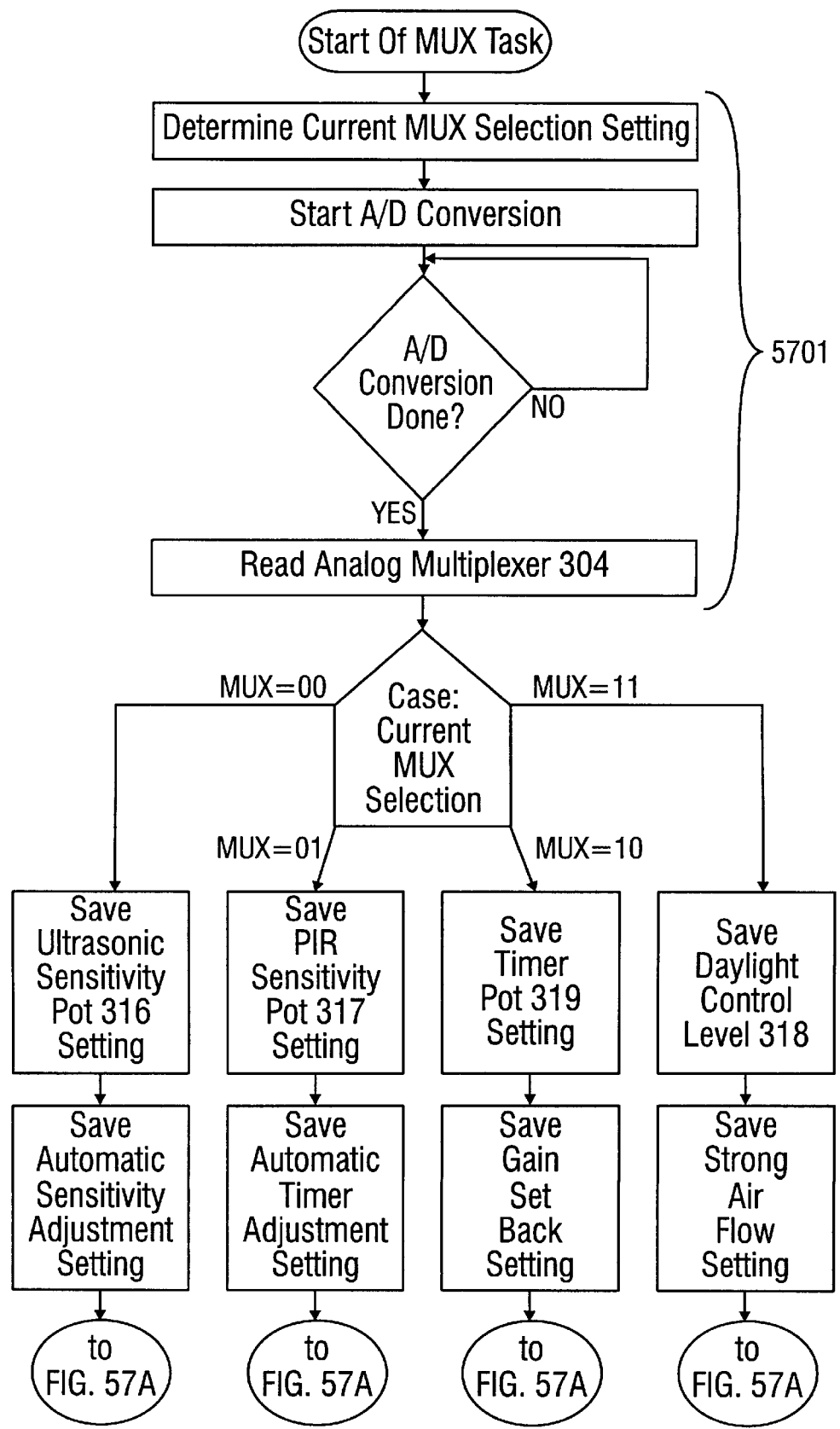
FIG. 57 is the MUX task flowchart for the present invention.
Figure 57A:
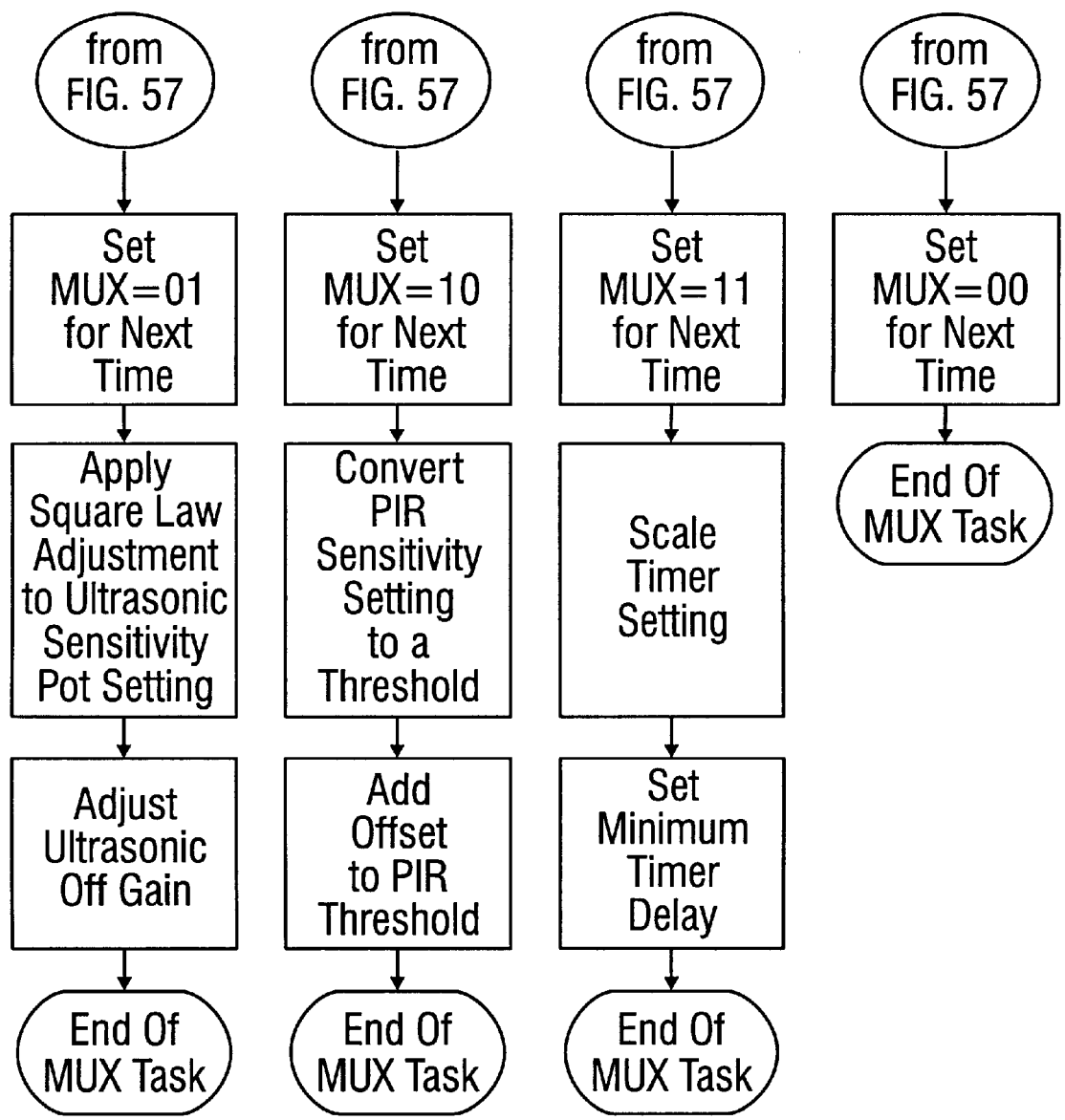
Figure 58:
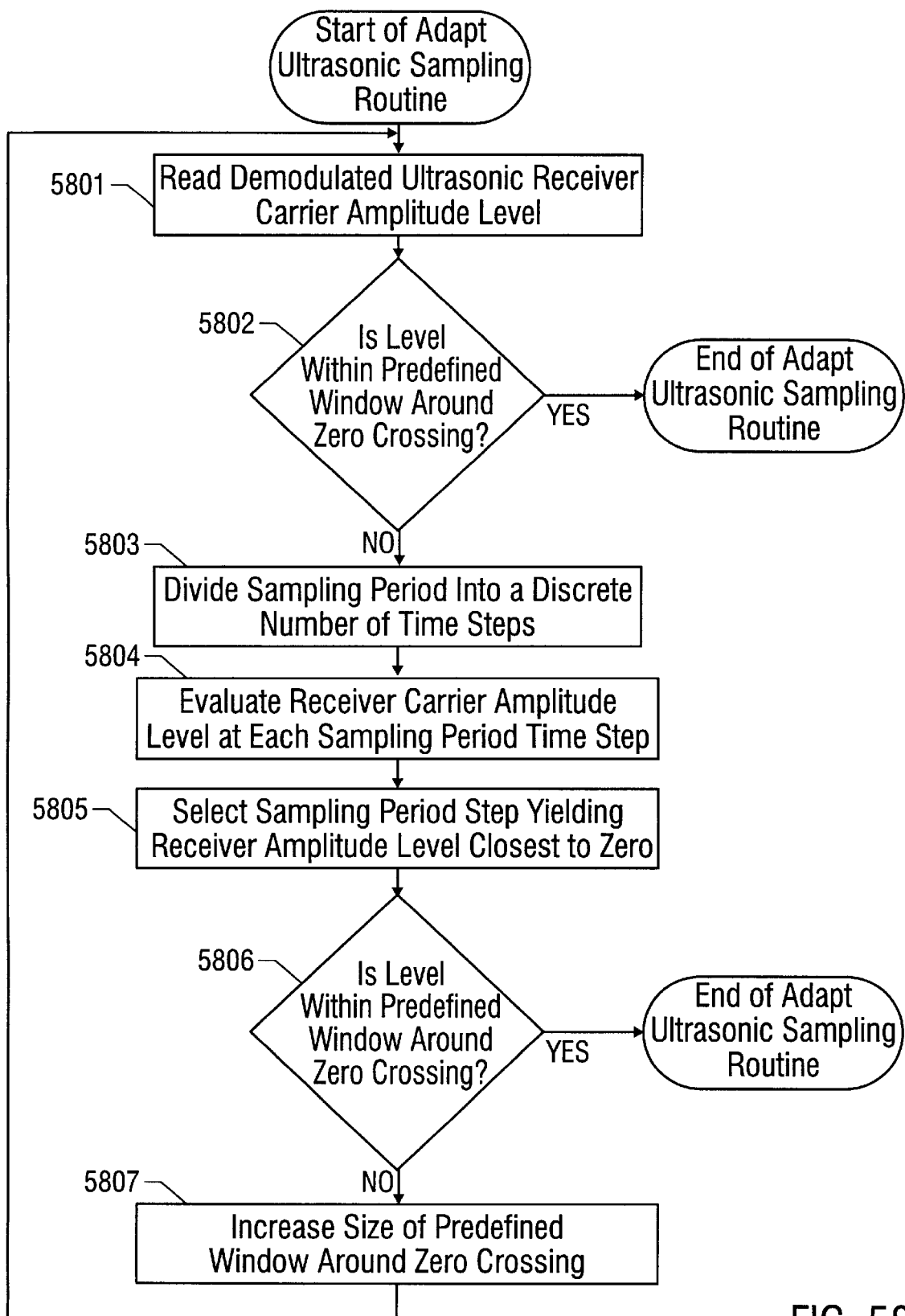
FIG. 58 is the adapt ultrasonic sampling routine flowchart for the present invention.
Figure 59:
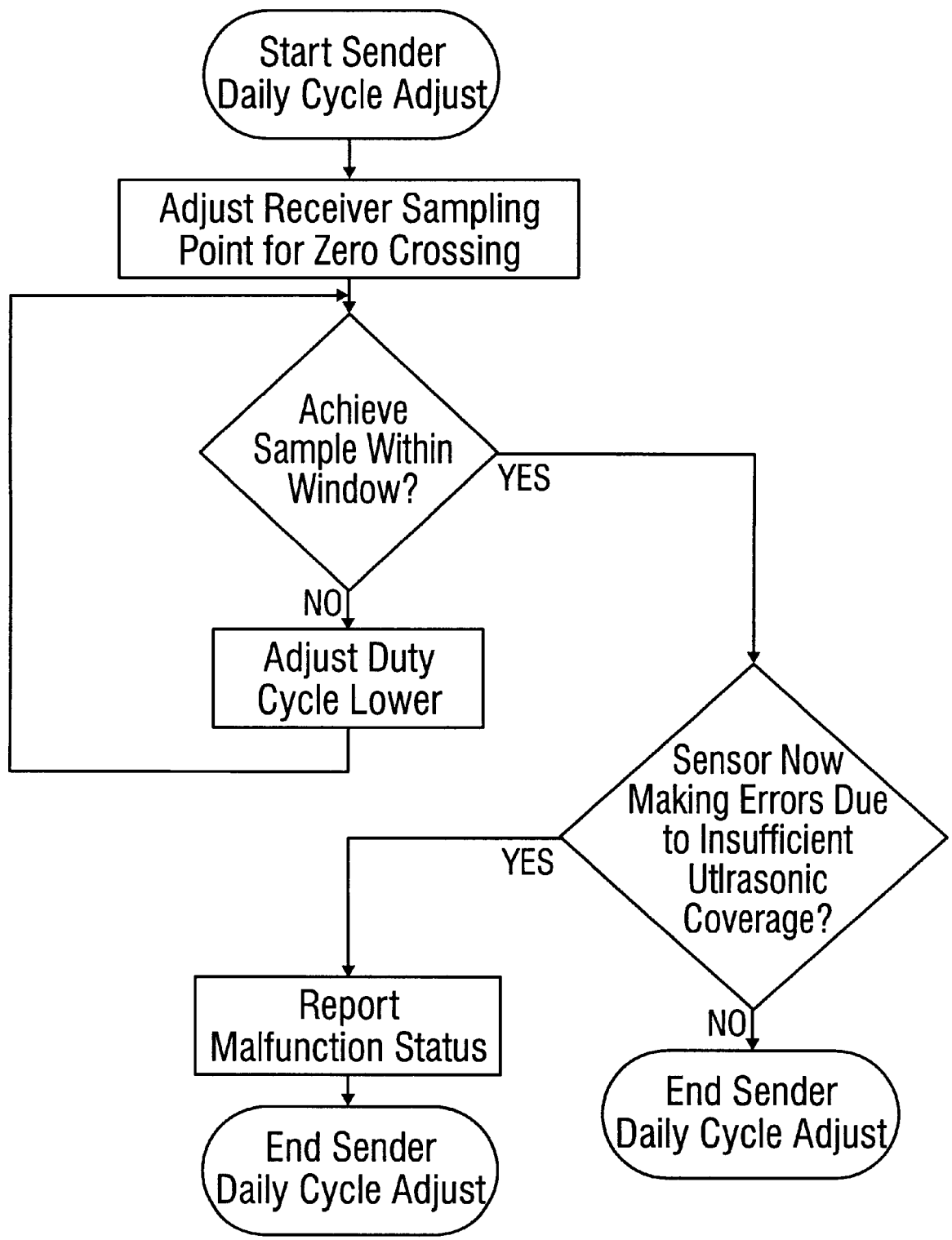
FIG. 59 is a flowchart of the ultrasonic transmitter duty cycle adjustment method of the present invention.
Figure 68:
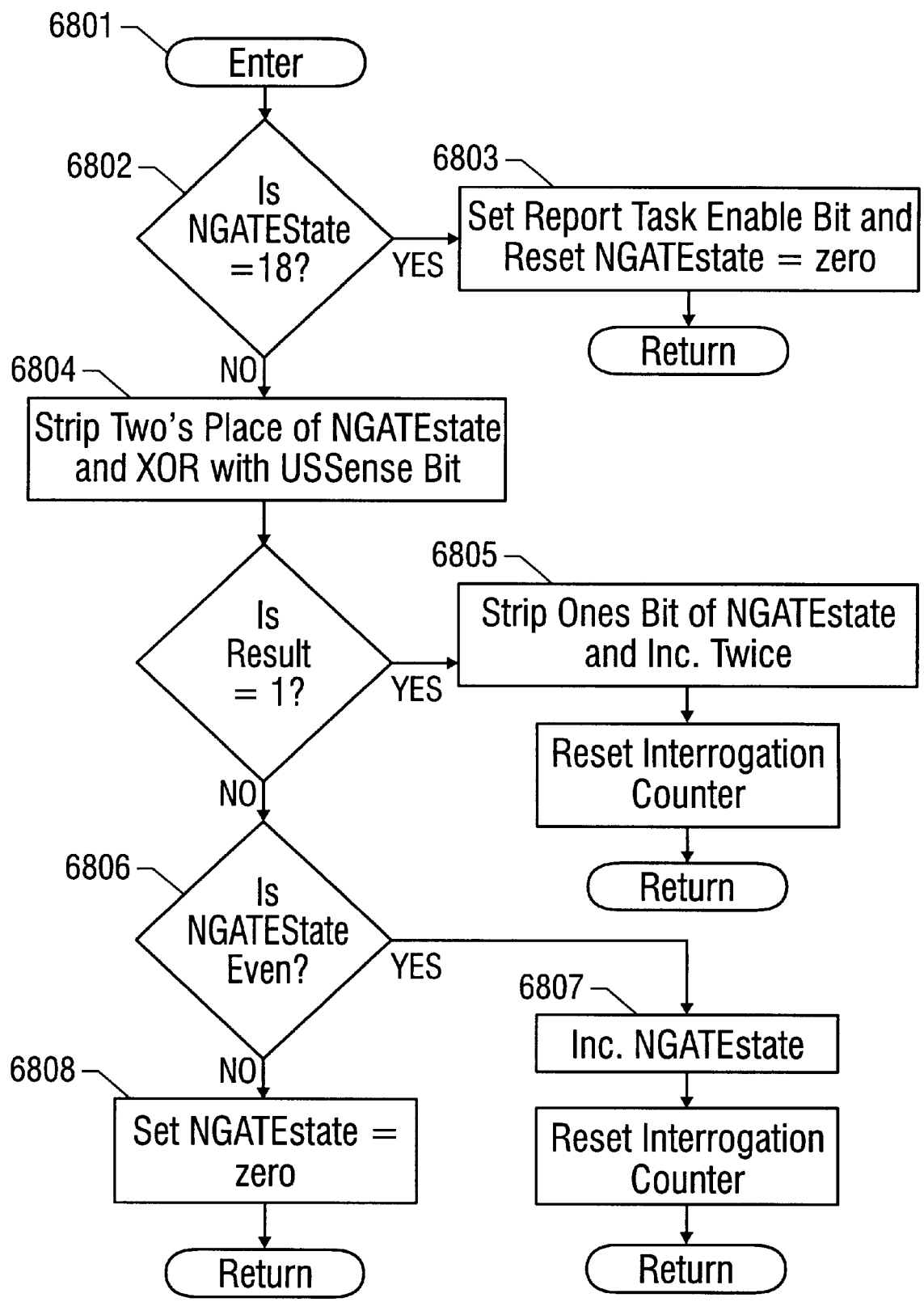
FIG. 68 is the interrogate task flowchart for the present invention.
Figure 69:
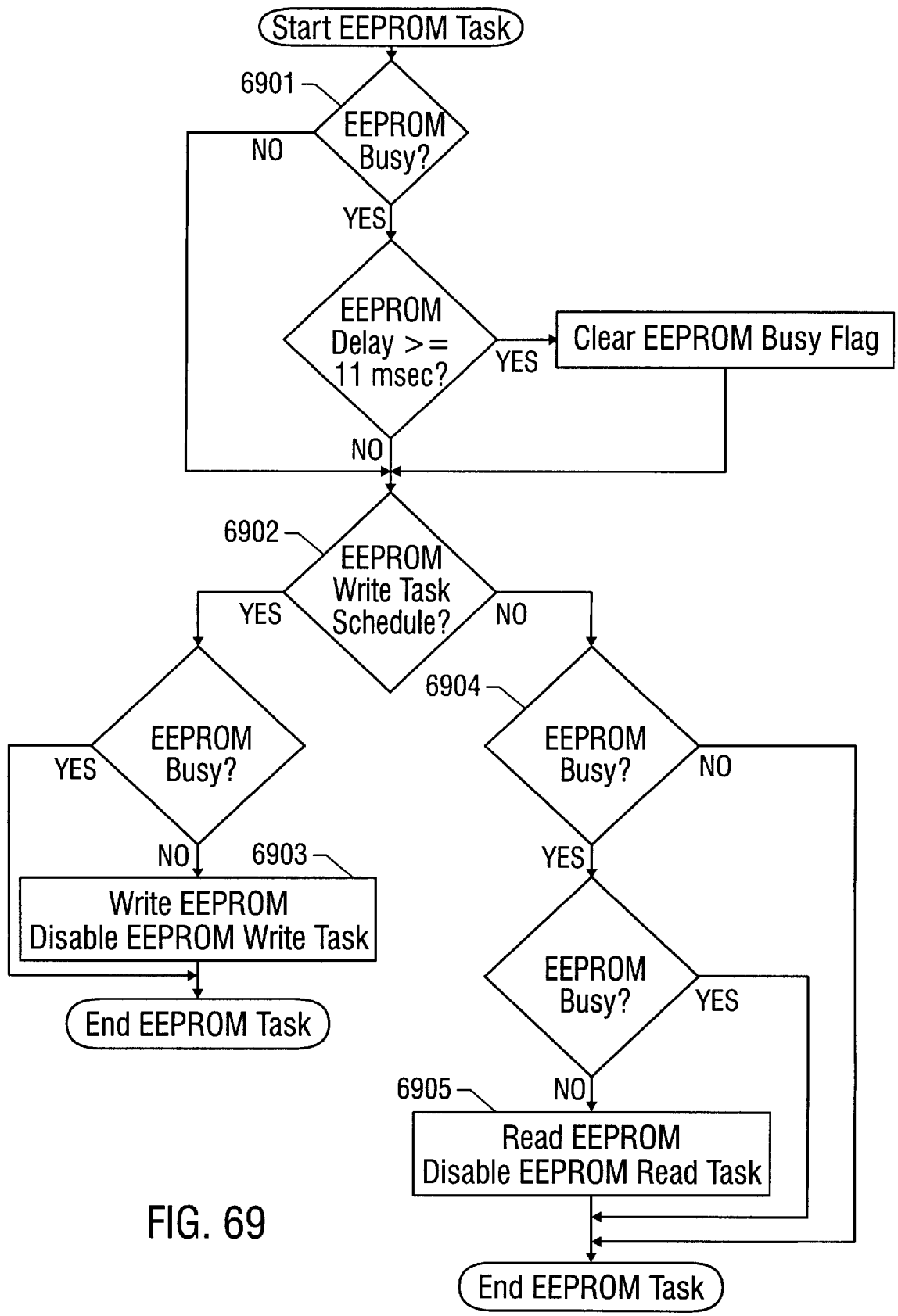
FIG. 69 is the EEPROM task flowchart for the present invention.

Thus, the interrupt routine shown in FIG. 45 includes the following major software tasks that are described in detail in the figures indicated: sensor task (FIGS. 46–54); update counters task (FIG. 55); adjust timer to minimize energy usage task (FIG. 56); MUX task (FIG. 57); adapt ultrasonic sampling point task (FIG. 58); LED task (FIG. 61); relay suppress task (FIG. 63); second task (FIG. 64); minute task (FIG. 66); interrogate task (FIG. 68); and EEPROM task (FIG. 69). Each of these interrupt routine software tasks is described in detail below.

Figure 46:
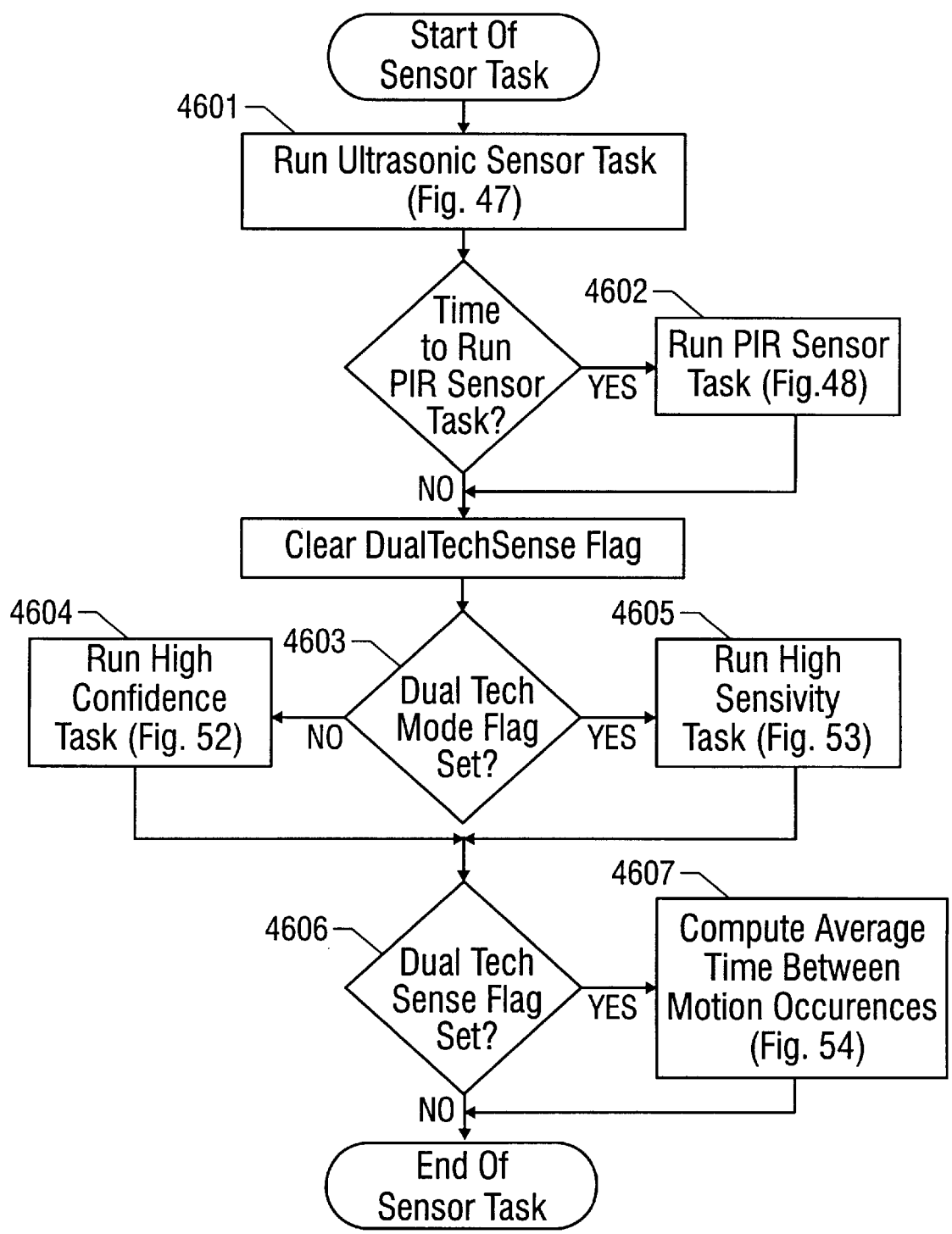
FIG. 46 is the sensor task flowchart for the present invention.

The sensor task inputs and processes data from each of the various sensor technologies. A flowchart of the sensor task of the present invention is shown in FIG. 46. First the ultrasonic task is executed (4601, shown in detail in FIG. 47). Next, the PIR task is executed if it is the proper time to run it (4602, shown in detail in FIG. 48). If the dual tech mode flag is set (4603) according to the state of user switch 307 (FIG. 3), the dual technology HIGH CONFIDENCE task is run (4604, shown in detail in FIG. 52). Otherwise, the dual technology HIGH SENSITIVITY task is run (4605, shown in detail in FIG. 53). Finally if the dual technology sense flag is set (4606), the average time between motion task is executed (4607, shown in detail in FIG. 54).

Figure 47:
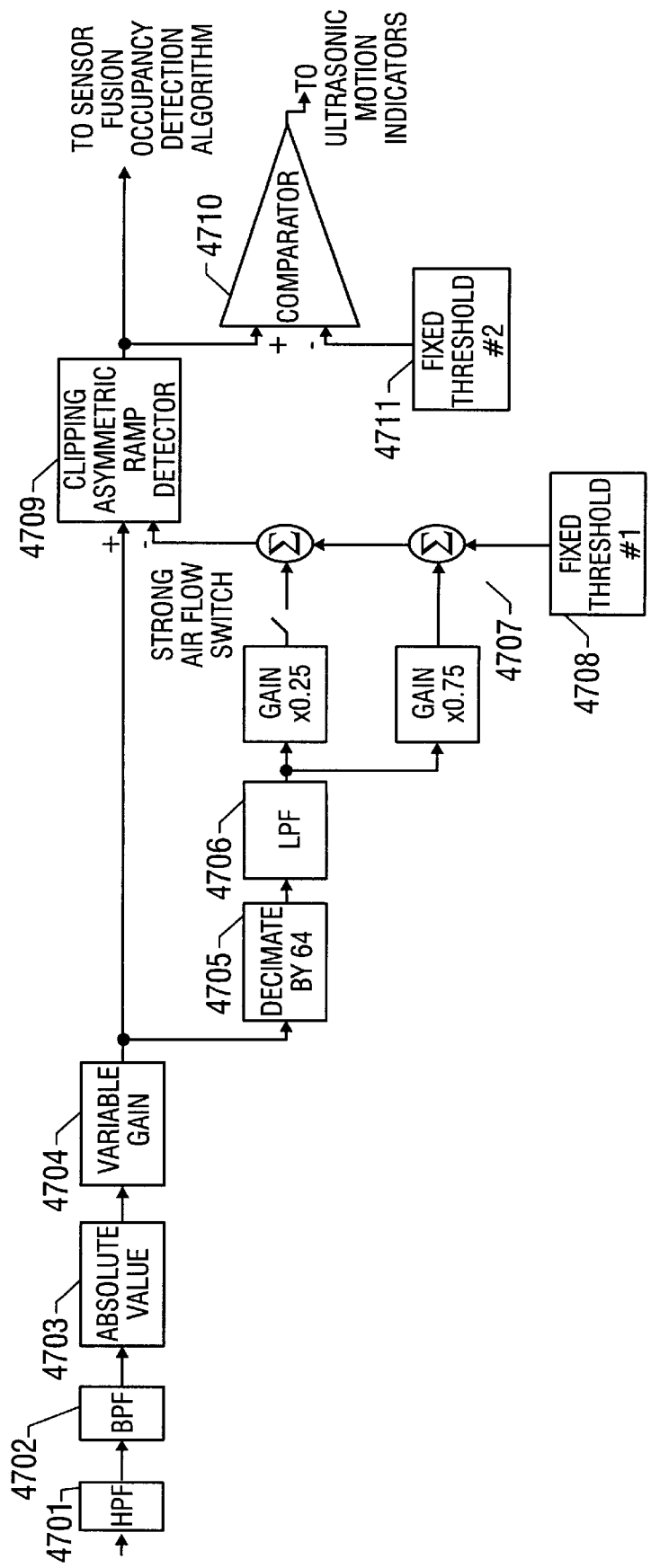
FIG. 47 is the ultrasonic DSP task block diagram for the present invention.

The ultrasonic task inputs data from the ultrasonic sensor and processes that data using an ultrasonic DSP algorithm. An exemplary ultrasonic DSP algorithm is shown schematically in FIG. 47. Although the ultrasonic DSP algorithm is represented as hardware components in FIG. 47, the algorithm is actually embodied in software. Referring to FIG. 47, first, the ultrasonic data is sampled using a sampling frequency $f_s$ of approximately 1,000 Hz. The ultrasonic data is initially passed through a low order digital highpass filter 4701. The digital ultrasonic data is then passed through a low order digital bandpass filter 4702. Next, the absolute value of the ultrasonic data signal is computed (4703) and passed through a variable gain stage 4704. The gain of stage 4704 is derived from the setting of user-specified ultrasonic sensitivity potentiometer 316 (FIG. 3). The output of the variable gain stage 4704 is then decimated by factor of 64 ($f_s$=~16 Hz) 4705, and passed through a low order digital lowpass filter 4706. Low pass filter 4706 has a cutoff frequency of approximately 2.5 Hz. The output of Low pass filter 4706 is multiplied by a variable factor, 4707, depending on the presence of strong air flow. If the strong air flow option switch 311 (FIG. 3) is ON indicating the presence of strong air flow, the signal is multiplied by a factor of 1.0. Otherwise the signal is multiplied by a factor of 0.75. A fixed offset value 4708 is added to the result that is then fed into the negative (−) input of a clipping asymmetric ramp detector 4709. The positive (+) input of ramp detector 4709 is connected to the output of the variable gain stage 4704. Whenever the positive input of ramp detector 4709 is greater than the negative input, the output of ramp detector 4709 increases by 512. Conversely, whenever the negative input of ramp detector 4709 is greater than the positive input, the output of ramp detector 4709 decreases by 128. The output of the ultrasonic DSP block is passed through a digital pulse stretcher to increase the time duration of the peaks in the ultrasonic signal. This technique slightly increases the probability of detection of small time duration events by stretching the ultrasonic signal peaks in time until the infrared sensor responds to the corresponding event, and is described in detail below with reference to FIGS. 49, 50 and 51. After pulse stretching, the output of ramp detector 4709 is passed to the sensor's fusion detection occupancy algorithm, as shown in more detail in the flow chart of FIG. 52 and 53. Finally, the output of ramp detector 4709 is compared (4710) to a user-specified ultrasonic sensor activation threshold (4711). If the signal is above that threshold, the ultrasonic motion indicator(s) will be activated.

Figure 48:
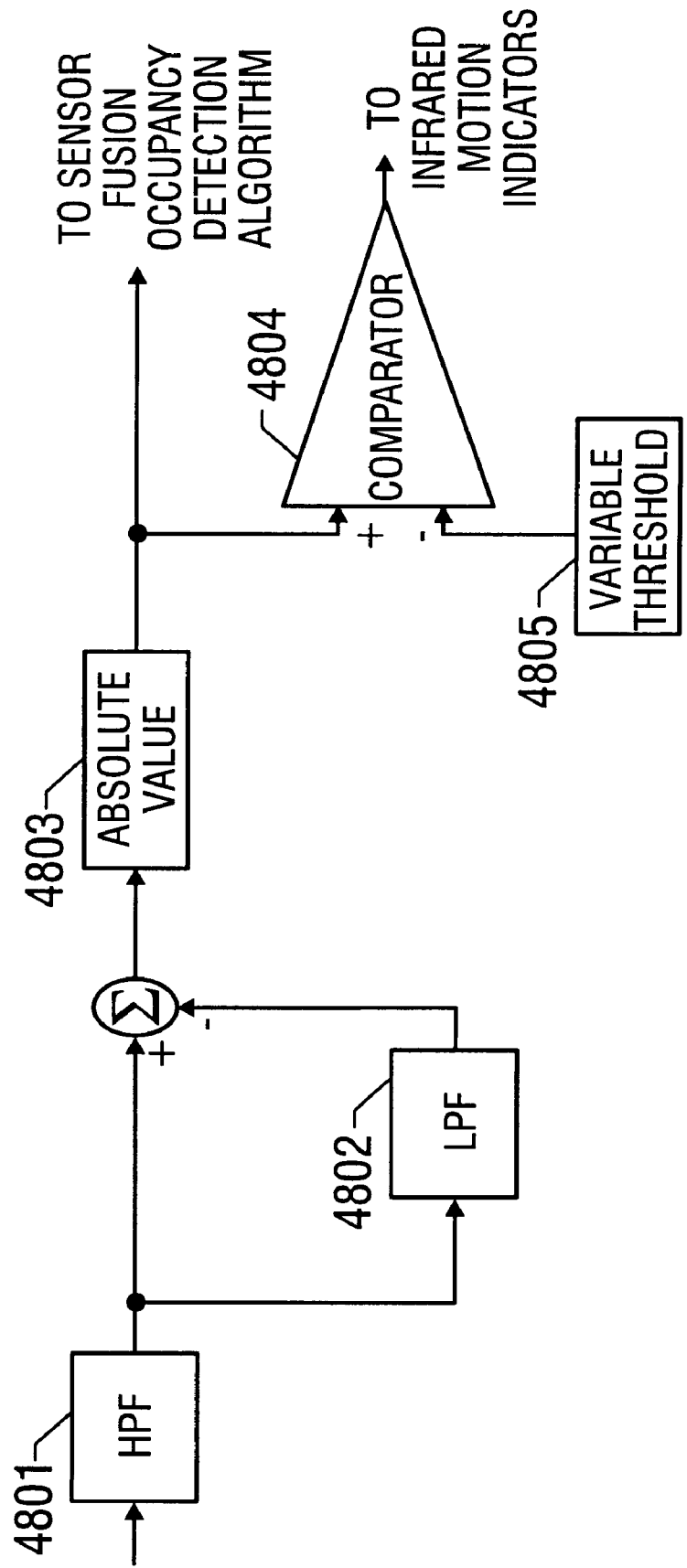
FIG. 48 is the infrared DSP task block diagram for the present invention.

The PIR task inputs data from the infrared sensor and processes that data using a passive infrared DSP algorithm. An exemplary PIR DSP algorithm is shown schematically in FIG. 48. Although the PIR DSP algorithm is represented as hardware components in FIG. 48, the algorithm is actually embodied in software. Referring to FIG. 48. The PIR data is sampled using a sampling frequency $f_s$ of approximately 32 Hz. The PIR data is initially passed through a low order digital highpass filter 4801. The digital PIR data is then passed through a low order digital lowpass filter 4802. Next, the PIR difference signal is computed by subtracting the output of the PIR low pass filter 4802 from the output of the PIR high pass filter 4801. Next, the absolute value of the PIR difference signal is computed 4803. The absolute value of the PIR difference signal is then pulse stretched in a manner similar to that done with the ultrasonic signal, and passed to the sensor's multi-technology sensor fusion detector (FIG. 52 and 53) to determine occupancy. Finally, the absolute value of the PIR difference signal is compared 4804) to a user-specified PIR activation threshold (4805). If this signal is above the threshold, the infrared motion indicator(s) will be activated.

As mentioned above with reference to FIGS. 47 and 48, pulse stretching is applied in both the ultrasonic and PIR DSP algorithms. This is desirable because valid occupancy signals from multiple technologies may occur nearly, but not exactly simultaneously. For instance, ultrasonic motion detectors are preferentially sensitive to motion along the direction to the sensor, while infrared are more sensitive to motion perpendicular to the direction to the sensor. Under normal circumstances, the movements of an occupant of the controlled space may vary between the directions toward and perpendicular to the sensor, resulting in occupancy estimator signals that peak at different times.

Figure 49:
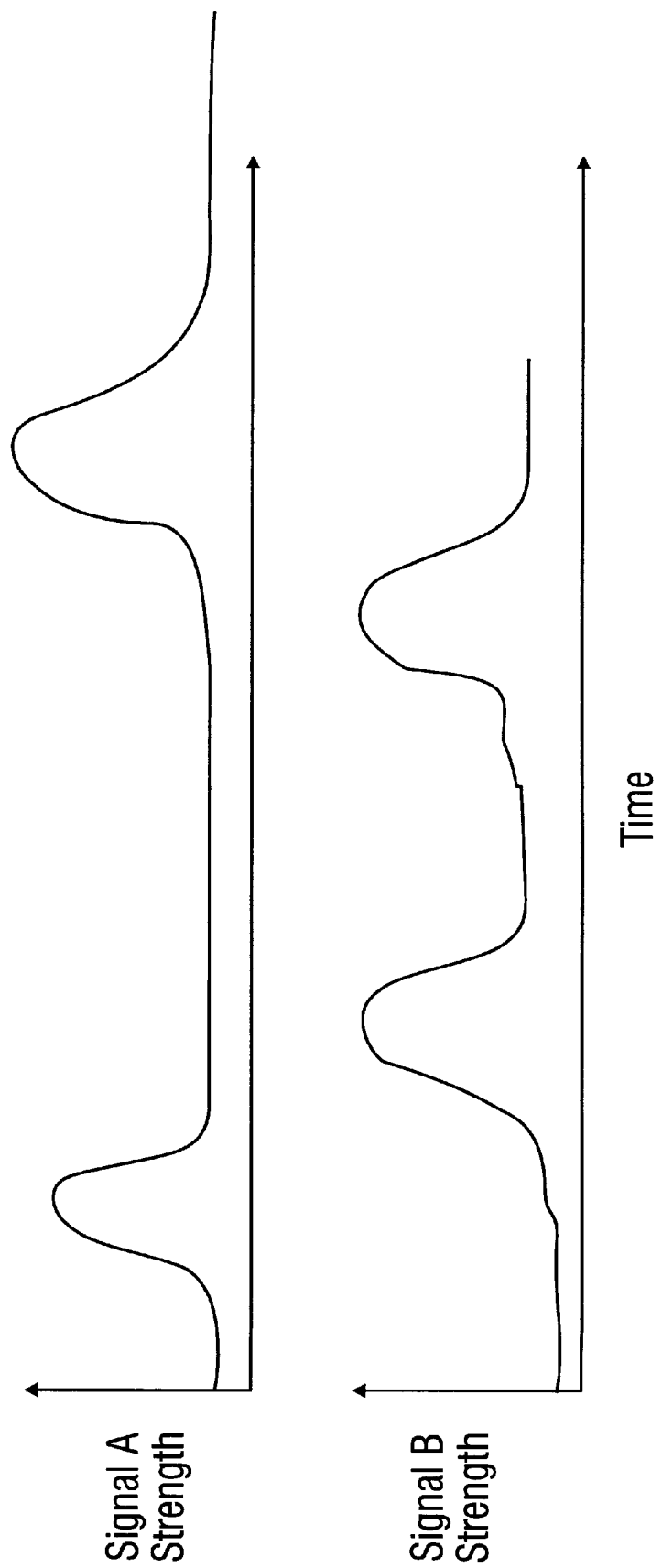
FIG. 49 is a time line of two unstretched occupancy signals
Figure 50:
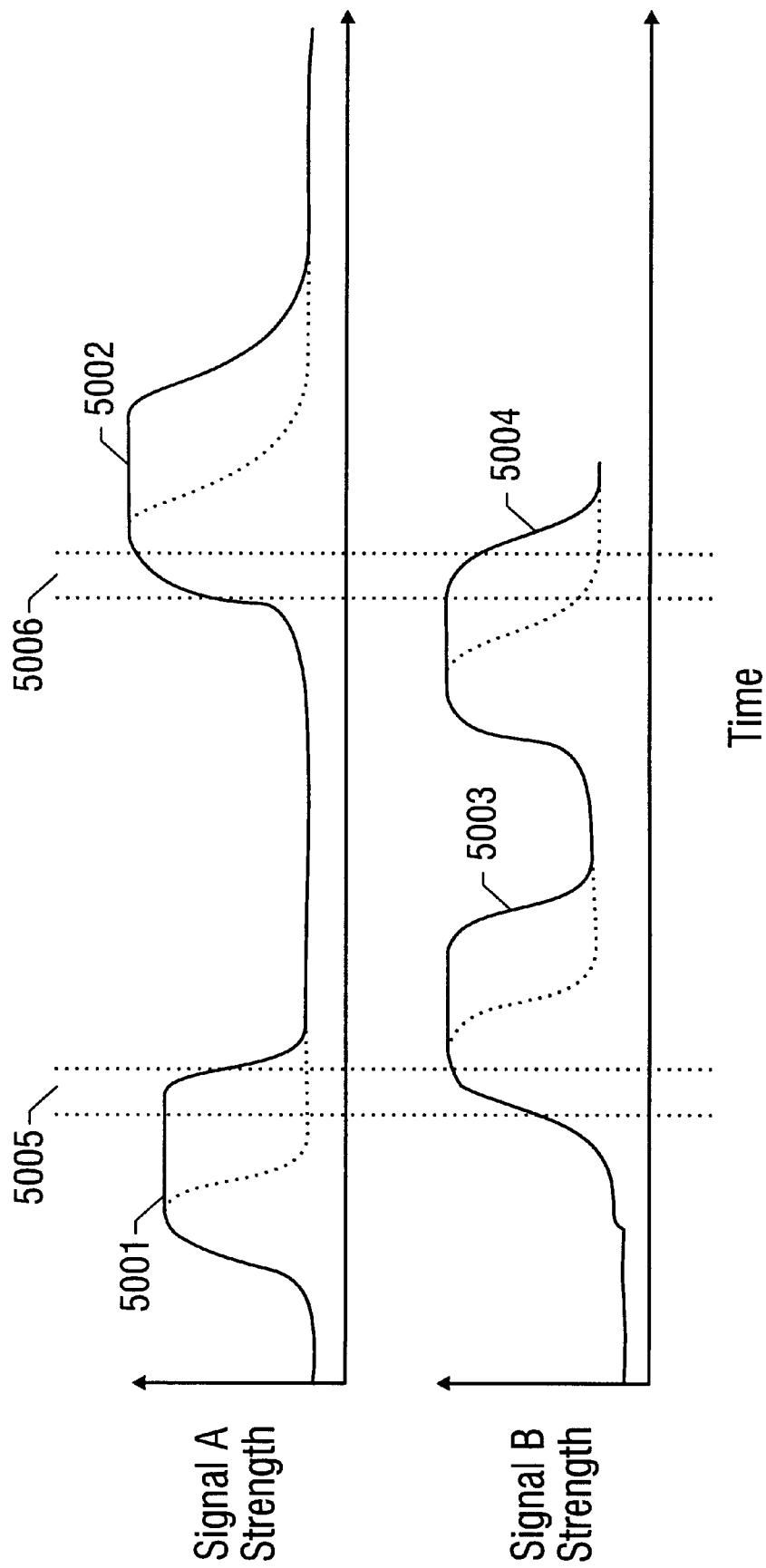
FIG. 50 is a time line of two stretched occupancy signals

The need for pulse stretching is illustrated in FIG. 49. Without pulse stretching, motion signals from detection technology 1 and 2 occur at different times and are generally not coincident in time. In this case a composite occupancy estimator will not indicate occupancy, despite the near coincidence of signals from the individual detection technologies. The result of stretching these signals is shown in FIG. 50. In this case the stretch of signal 1 (5001) brings it into temporal coincidence (5005) with signal 2 in the first case, and the stretch of signal 2 (5002) brings it into temporal coincidence (5006) with signal 1 in the following case. Now the signals overlap, and a composite occupancy estimator will indicate occupancy.

Figure 51:
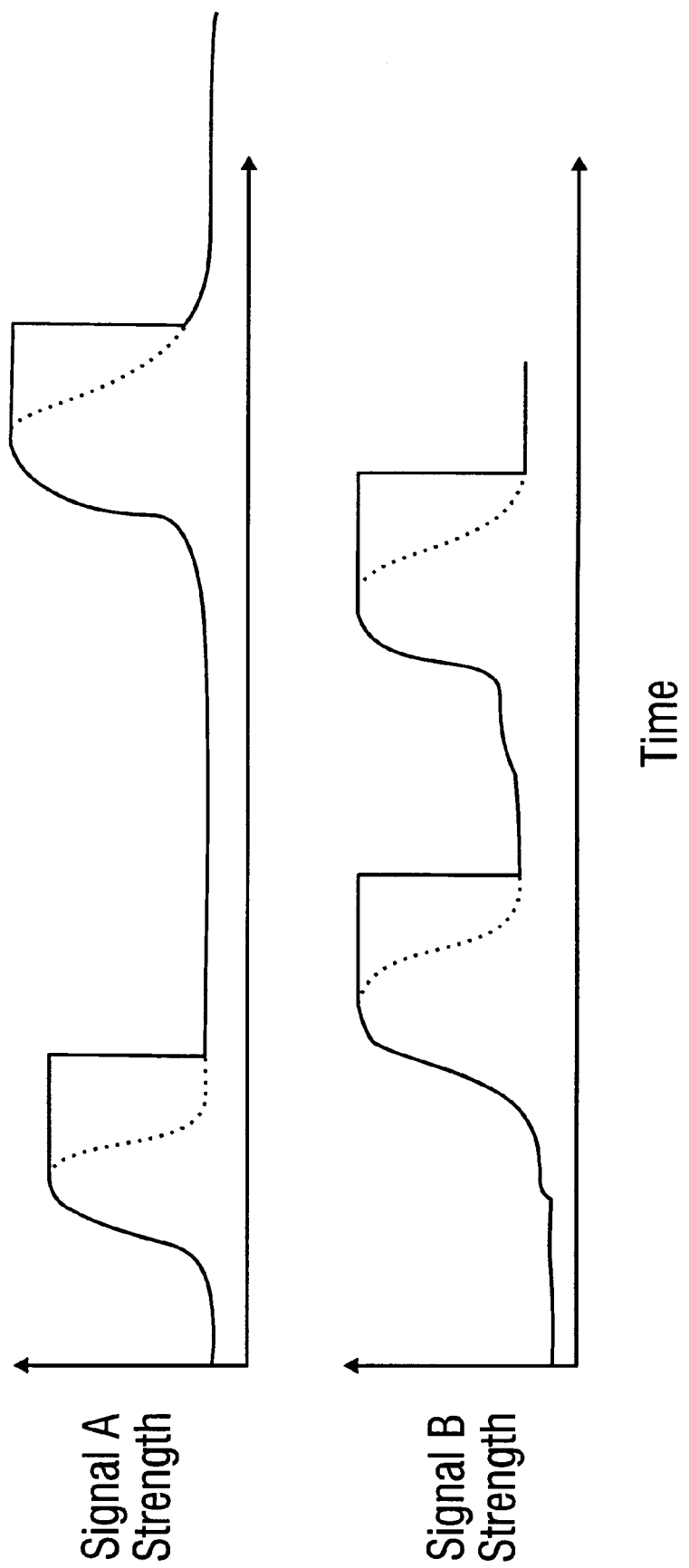
FIG. 51 is a time line of two peak stretched occupancy signals

Pulse stretching as shown in FIG. 50 generally requires a circular buffer large enough to store a number of samples equal to the stretch time period divided by the sample rate. It also requires a search algorithm to find the maximum value within the buffer, that becomes the current stretched signal value. An alternative implementation is to recognize the local maximum of a signal, and stretch only the maximum value. This implementation requires a lesser computational resource, and the storage of only two values, the signal maximum value, and its stretch ending time. The result of this pulse stretching implementation is shown in FIG. 51.

Figure 52:
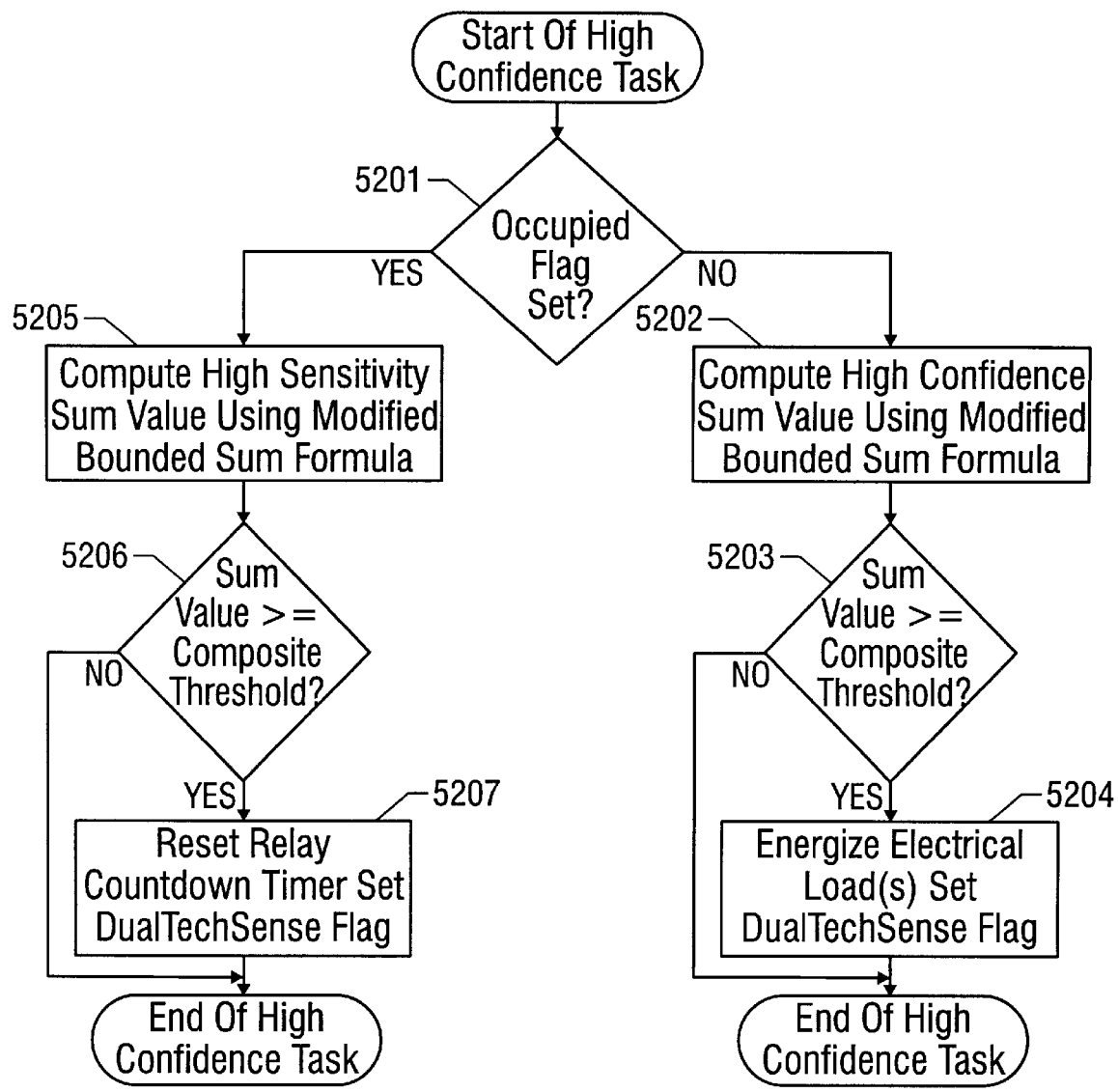
FIG. 52 is the HIGH CONFIDENCE task flowchart for the present invention.

The HIGH CONFIDENCE task implements the sensor's HIGH CONFIDENCE occupancy detection mode. A flowchart of the sensor's HIGH CONFIDENCE task is shown in FIG. 52. If the area covered by the occupancy sensor is not currently occupied (5201), a composite occupancy estimator is computed using an arithmetic sum formula (5202). If the resulting value is above the predetermined composite activation threshold (5203), the sensor's electrical load(s) are energized and the DualTechSense flag is set (5204).

If the area covered by the occupancy sensor is currently occupied, a composite occupancy estimator is computed using an arithmetic sum formula (5205). If the resulting composite occupancy estimator value is above the predetermined composite maintenance threshold (5206), the sensor's relay countdown timer is reset and the DualTechSense flag is set (5207).

Figure 53:
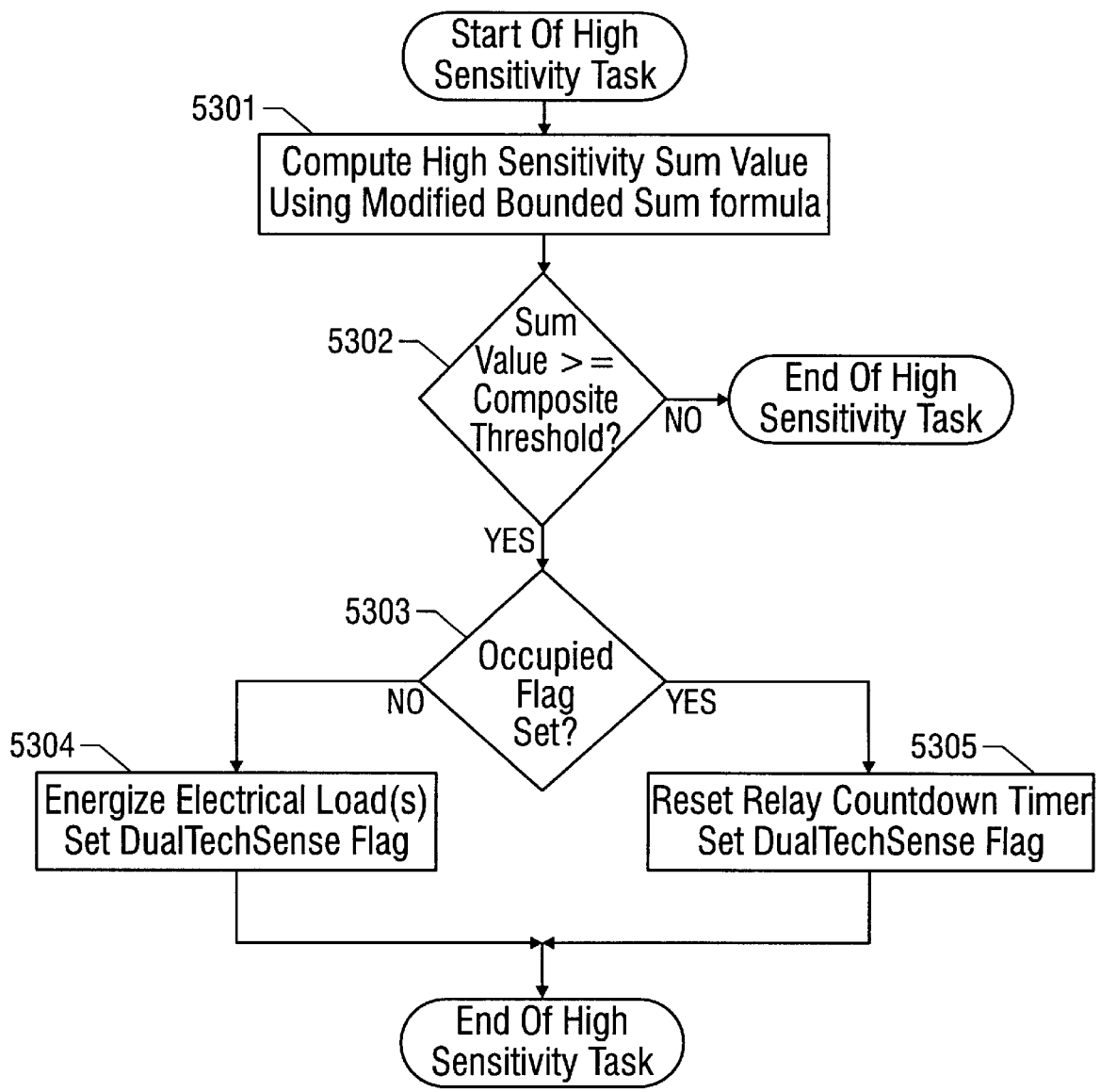
FIG. 53 is the HIGH SENSITIVITY task flowchart for the present invention.

The HIGH SENSITIVITY task implements the sensor's HIGH SENSITIVITY occupancy detection mode. A flowchart of the sensor's HIGH SENSITIVITY task is shown in FIG. 53. Initially, an composite occupancy estimator is computed using an arithmetic sum formula (5301). If the resulting value is above the predetermined composite maintenance threshold (5302), the sensor checks to see if the area covered by the sensor is currently occupied (5303). If the area covered by the occupancy sensor a=t currently occupied, the sensor's electrical load(s) are energized and the DualTechSense flag is set (5304). If the area covered by the occupancy sensor is currently occupied, the sensor's relay countdown timer is reset and the DualTechSense flag is set (5305).

Figure 54:
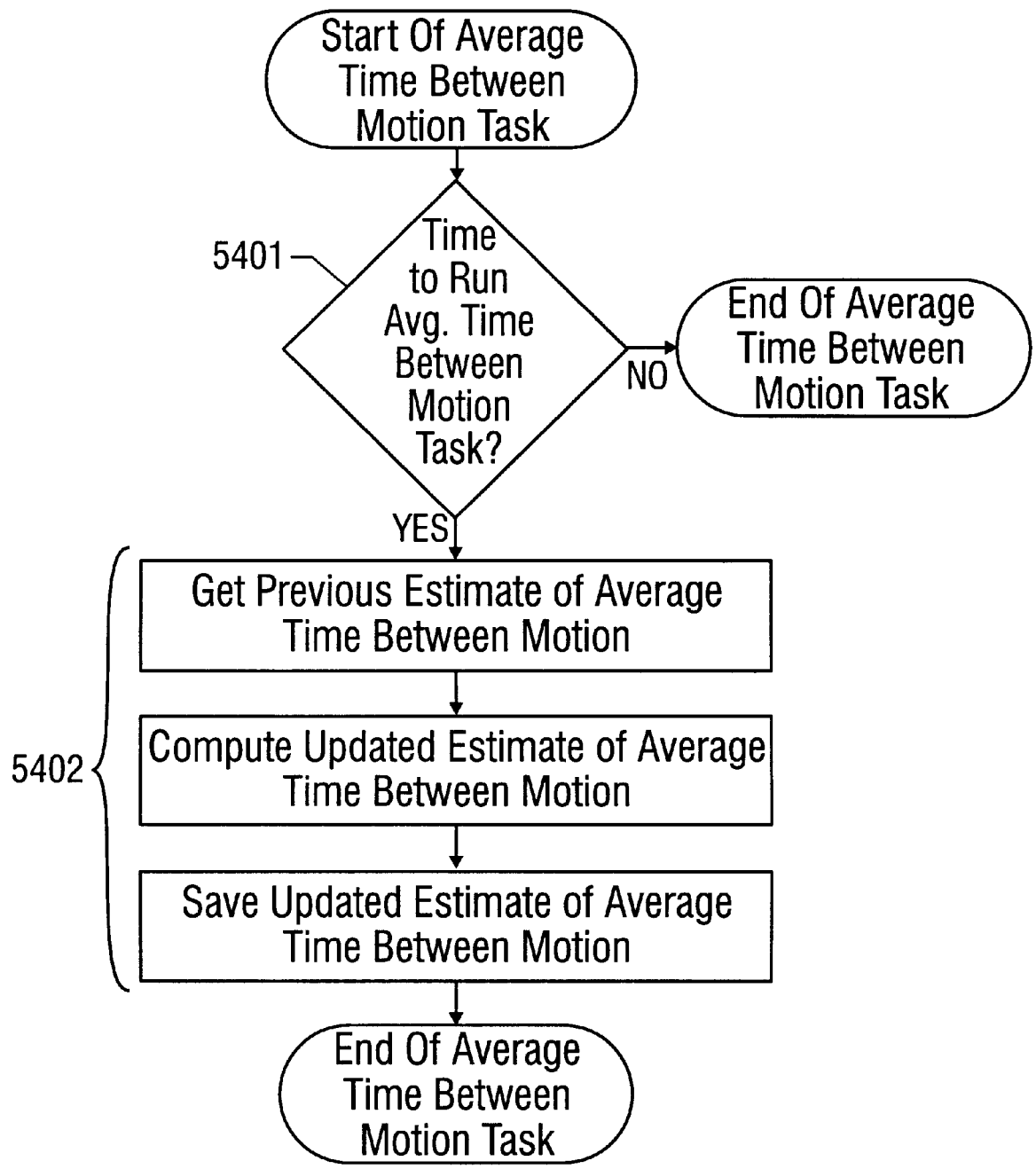
FIG. 54 is the average time between motion routine flowchart for the present invention.

The average time between motion task estimates the average time between motion. A flowchart of the average time between motion task of the present invention is shown in FIG. 54. If it is time to run this task (5401), the previous estimate of the average time between motion is updated and saved (5402). This information is used as a cue for the various adaptive sensor algorithms.

The update counters task updates the primary three byte interrupt counter used in the occupancy sensor. A flowchart of the update counters task of the present invention is shown in FIG. 55. The low byte of the counter is first incremented (5501). If zero (5502), the middle counter byte is incremented (5503). If zero (5504), the high byte of the counter is incremented (5505). If the high byte is zero (5506), a counter roll over flag is set (5507).

The adjust timer to minimize energy usage task implements the power up timer adjust algorithm. A flowchart of the adjust timer to minimize energy usage task of the present invention is shown in FIG. 56. The adjust timer to minimize energy usage task acts to reduce the time out on an ongoing basis. The amount of reduction depends upon the current value of the time delay potentiometer 319 (FIG. 3). In the illustrated embodiment, the amount of timer reduction is done according to the following formulas:

If time out $\geq 60$ minutes, reduce by 30 minutes/4.66 hours,

If time out $\geq 30$ minutes, reduce by 5 minutes/4.66 hours,

If time out $\geq 15$ minutes, reduce by 1 minutes/4.66 hours,

If time out $\geq 10$ minutes, reduce by 30 seconds/4.66 hours,

Otherwise, reduce timer by 2 seconds/4.66 hours

Initially, the timer delay adjustment value is reduced (5601). The timer delay adjustment is value is then clipped at zero (5602).

The MUX task reads the status of the various user-selected mode option switches (discussed in detail above with reference to FIG. 3), and saves the results in the various sensor variables and flags. A flowchart of the MUX task is shown in FIG. 57. The MUX task initially sets the A and B MUX controls to cause MUX 304 (FIG. 3) to read the ultrasonic sensitivity potentiometer setting and the ASA switch setting (MUX=00). On the next pass, the MUX 304 reads the PIR sensitivity potentiometer setting and the ATA switch setting (MUX=01). On the next pass, the MUX 304 reads the timer pot setting and GSB switch setting (MUX=10). Finally, on the fourth pass, the MUX 304 reads the photo cell potentiometer setting and the strong air flow switch setting (MTX=11). This sequence of four MUX states is then sequentially repeated on a periodic basis.

The adapt ultrasonic sampling point task adjusts the ultrasonic sampling point to prevent the loss of motion information due to ultrasonic analog front end receiver signal saturation. A flowchart of the adapt ultrasonic sampling point task of the present invention is shown in FIG. 58. The sample point setting algorithm adjusts the sample point to achieve a receive carrier amplitude level at the sample point that is as close to zero crossing (VREF voltage) as possible. The sample point is adjusted by varying the timer value that sets the sample point within the carrier period.

When the sensor is initially powered, the sample point is adjusted to a default initialization value that is correct for the sensor in a nominal situation. The receive carrier sample point value is tested (5801), and if found to lie within a window about zero crossing (5802), no change to the sample point is made. If the receive carrier sample point value is found to be outside the desired window (5802), the sample point is precessed in discrete steps (5803), until the receive carrier sample point value is within the window(5804). The sample point is further perturbed to search out the value that is closest to zero crossing (5805). This becomes the synchronous demodulator sample point.

If it is impossible to find a sample point that results in a carrier value within the window (5806), the allowable window size is increased (5807), and the sample point search is made again. This process is repeated until the window has been increased to the point of receiver preamplifier saturation. In the event that the sensor is installed so close to a reflecting wall that there is no sample point that may be found that does not saturate the receiver preamplifier, the sample point search has failed, and the sensor reports this via the status reporting feature. Alternatively, the sensor may adjust the carrier send output level.

Specifically, when an ultrasonic sensor is installed within a small space, reverberant energy from the close walls may cause the sensor receive preamplifier to saturate. This saturation may be extreme beyond the ability of the sample point search algorithm FIG. 58 to find a satisfactory sample point within the granularity of the sample point timer adjustment. The correct response to this situation is to decrease the transmitter power, since the small space will be adequately covered. In another situation an ultrasonic sensor may be installed in a large space, but too close to an acoustic reflecting surface, resulting in receiver preamplifier saturation extreme beyond the ability of the sample point search algorithm to find a satisfactory sample point. The correct response in this situation is to decrease the transmitter power, unless this causes the sensor to emit insufficient acoustical energy to effectively survey the space. If this is the case, the sensor is unable to achieve a satisfactory drive level that both avoids preamplifier saturation and effectively surveys the space, so the sensor signals its inability to perform in a satisfactory manner by reporting a malfunction. This prompts service personnel to review the sensor installation and move it away from the acoustic reflector that is causing the saturation problem. This process is detailed in FIG. 59.

The receive carrier sample point value is periodically retested while the sensor is in operation. In the event that the sample point is recognized to be outside the window, and is found to lie consistently outside the window, indicating a change in the sensor mounting, the sample point search is reinitiated. The search results in a new sample point.

Figure 60:
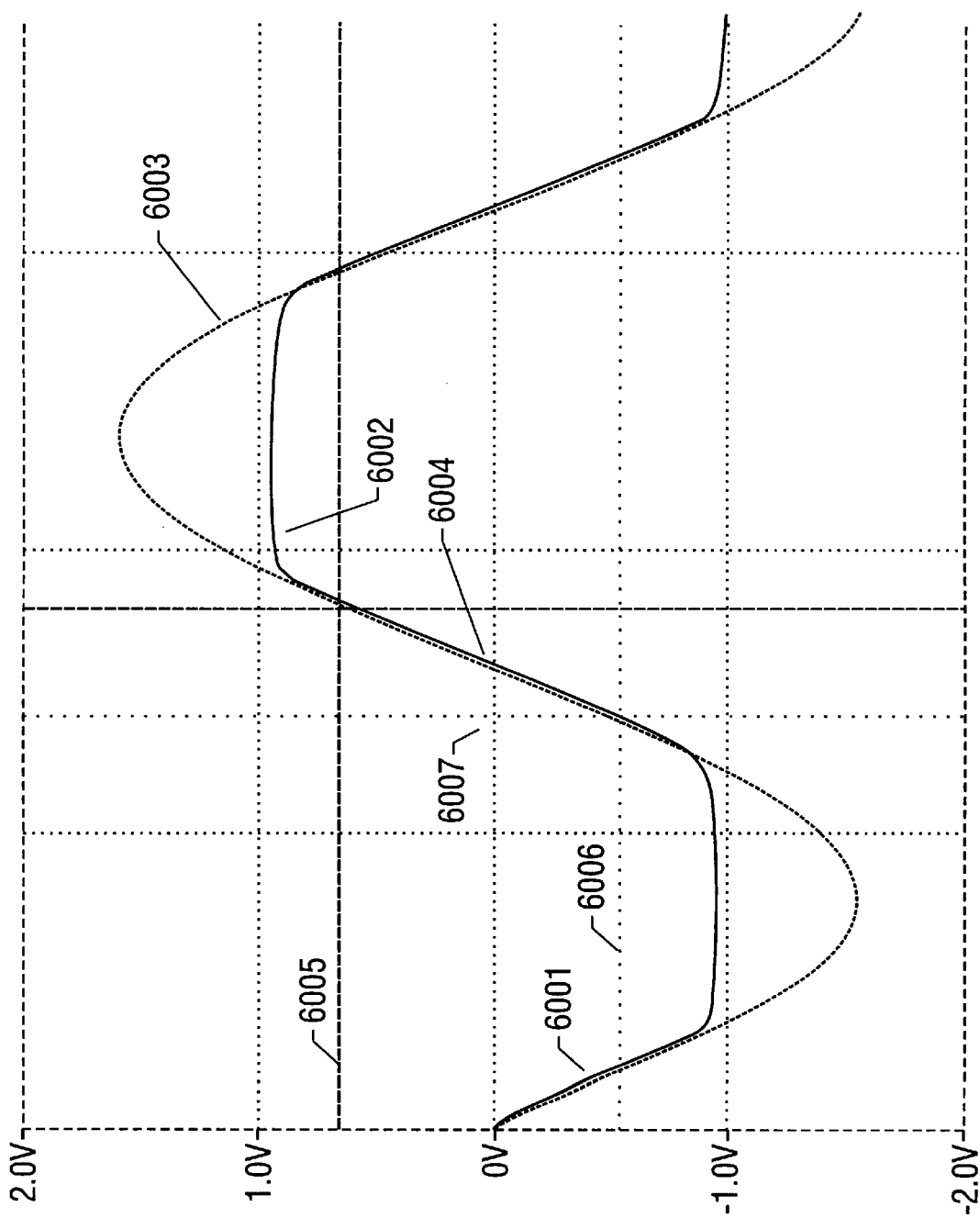
FIG. 60 is s time line of input receiver saturation

FIG. 60 depicts the situation of waveform saturation. Time is shown on horizontal axis, and the waveform at the preamplifier output is shown as a function of time. Point 6001 on the waveform indicates the preamplifier output at a voltage below the positive saturation limit. Point 6002 is the preamplifier output in saturation, where it cannot achieve the ideal waveform value of point 6003. Point 6004 is the ideal sample point at the zero crossing of the preamplifier signal. The region bounded by 6005 and 6006 is a voltage window around zero crossing within which the sample point should ideally lie to avoid the preamplifier saturation characteristic. The region bounded by 6007 and 6008 is the corresponding window in time within which the sample point must lie in order to achieve a sample point voltage within region 6005.

Figure 61:
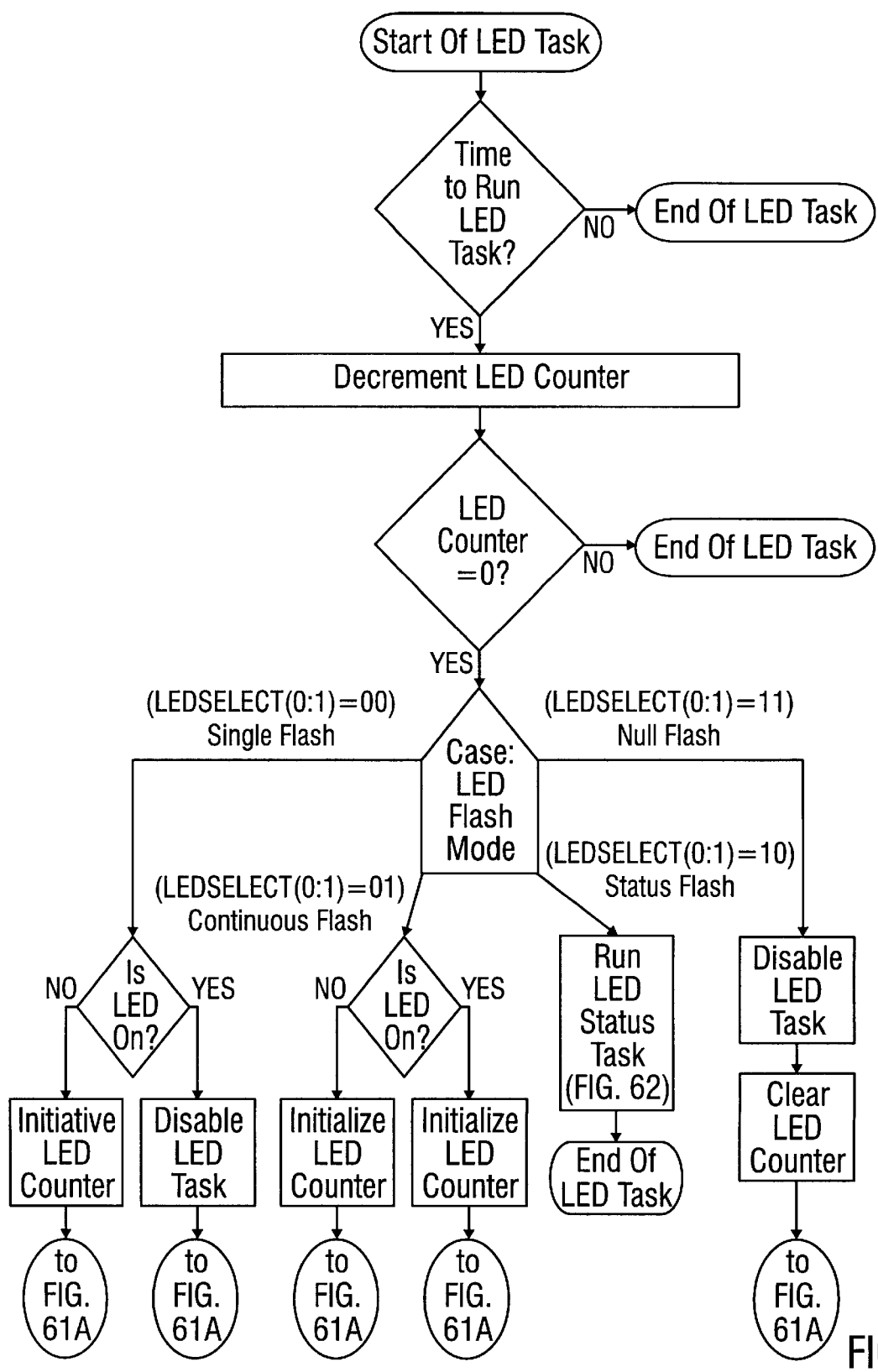
FIG. 61 is the LED task flowchart for the present invention.
Figure 61A:
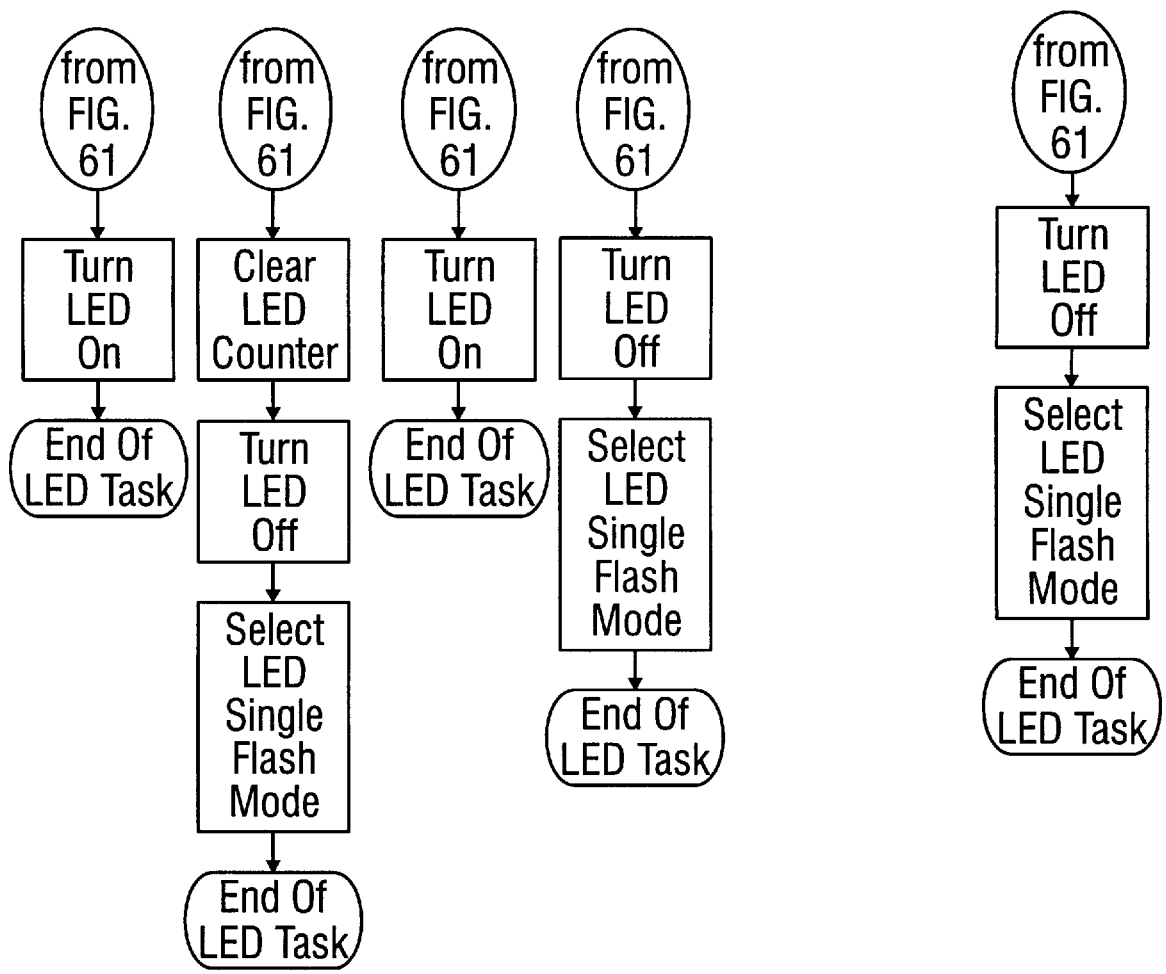

The LED task determines the LED flash mode and then flashes the various sensor LEDs in the appropriate fashion. A flowchart of the LED task is shown in FIG. 61. In the exemplary embodiment there are four different LED flash modes: single flash mode, continuous flash mode, status flash mode, and null flash mode. The LED single flash mode flashes the LED on and off a single time. The LED continuous flash mode flashes the LED on and off continuously. The LED status flash mode flashes the current status of the sensor, and is discussed in more detail with reference to FIG. 62(*a*). The LED null flash mode may be used for testing.

Figure 62A:
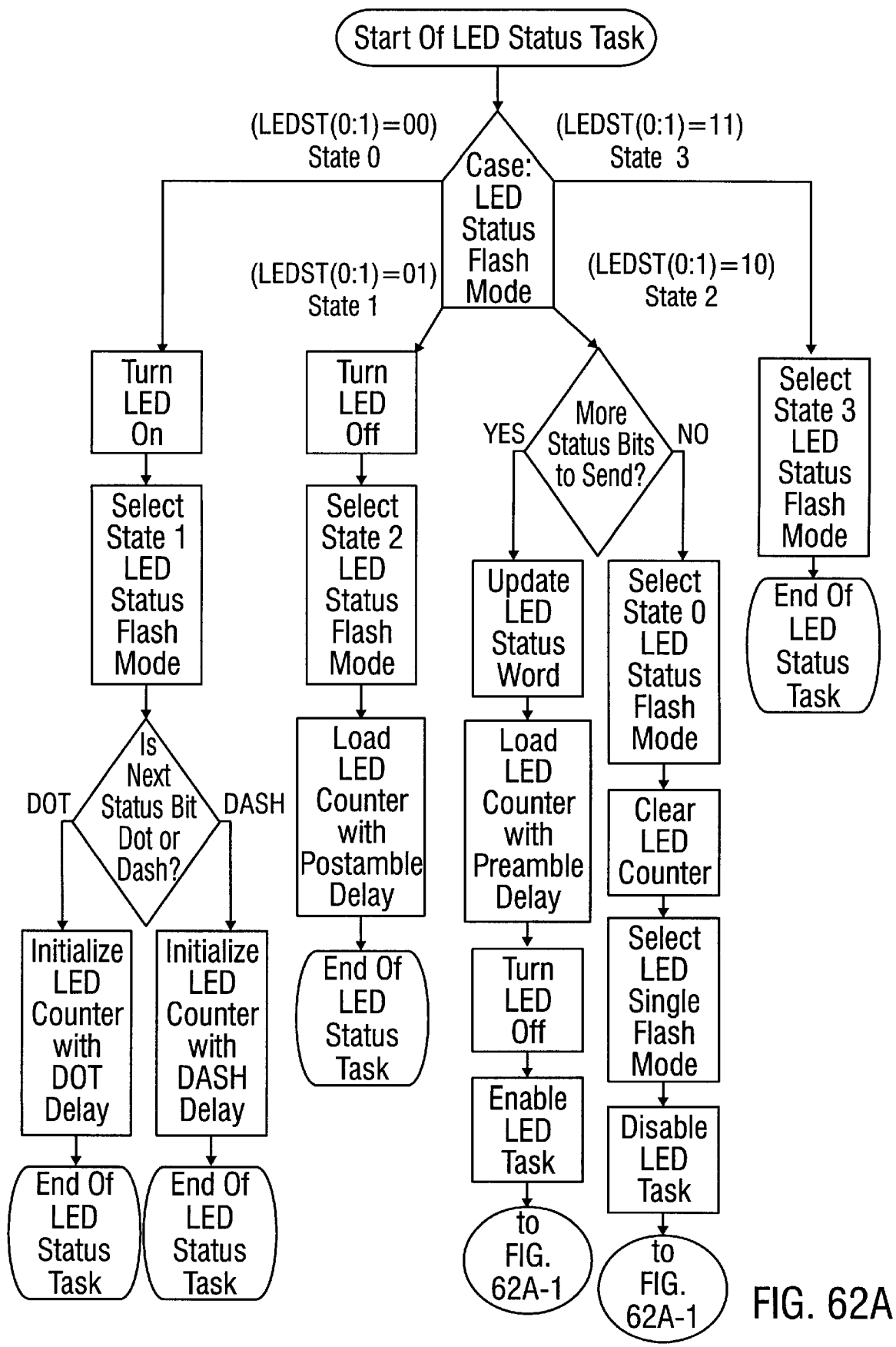
FIG. 62(*a*) is the LED status task flowchart for the present invention.
Figures 1, 62A:
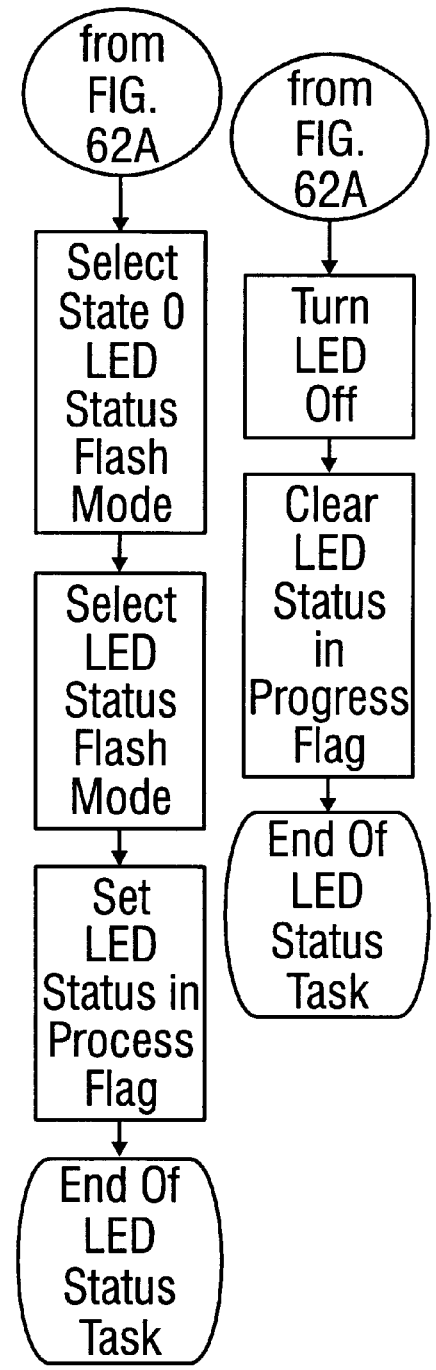
Figure 62B:

The LED status task manages the overall operation of the LEDs in order to output the status of the various sensor registers and its overall status. A flowchart of the LED status task of an example of the present invention is shown in FIG. 62(*a*).

Each status register value and the overall status of the sensor are converted into a sequence of Morse code dots and dashes, or other coding scheme. The LED status routine keeps track of the various dot and dash characters and makes sure the complete status information is sent. An exemplary status report is shown with reference to FIG. 62(*b*). The status report takes the form of a series of short and long LED flashes that, in the exemplary embodiment are in Morse code. The report is preceded by a preamble 6201 and then by one or more data fields. For example, after the preamble, the general status (6202) of the sensor may be reported. General status my be, for example, normal, windy (for a windy installation), failed or any other status that is useful. In the example of FIG. 62(*b*), the general status is followed by the delay timer setting in minutes (6203) and the ultrasonic sensitivity setting (6204). Thus, in the example given, the status of the sensor is normal ("S"), the delay timer is set for 16 minutes, the ultrasonic sensitivity setting is 10 and the PIR sensitivity is set to 8. Other types of information may also be displayed, including by way of example, PIR sensitivity setting and microwave sensitivity setting.

Figure 66:
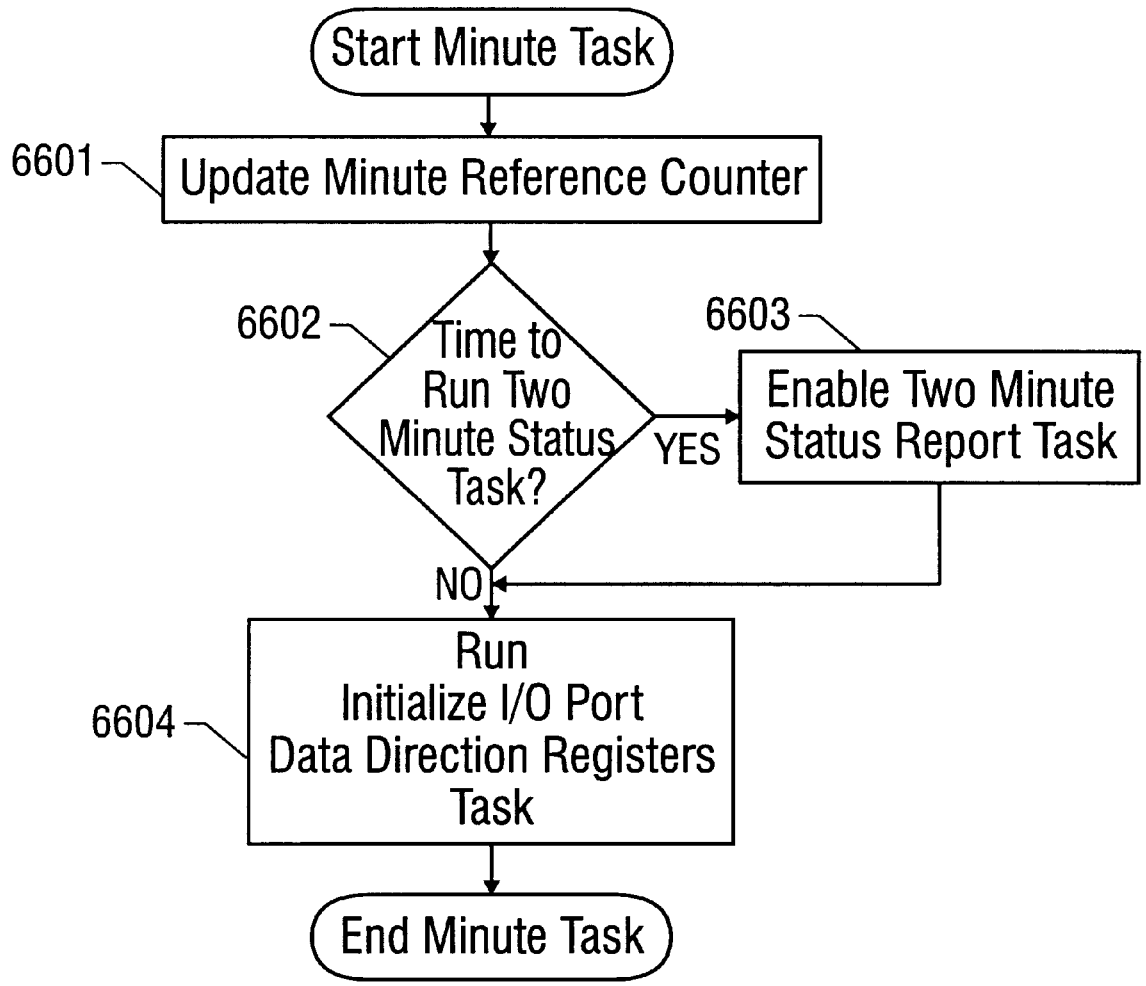
FIG. 66 is the minute task flowchart for the present invention.

As described below in detail with reference to FIGS. 66 and 68, status may be reported periodically, without user intervention, or it may be reported in response to user interrogation. In the former case, a shorted status report may be given (for example, only the general sensor status), whereas a more complete status report may be given in response to user interrogation. FIGS. 61 and 62(*a*) and (*b*) illustrate various possibilities for using LEDs to provide status information on the sensor. The specific information provided may be of any useful nature, and is not limited to any specific type of sensor status information.

Figure 63:
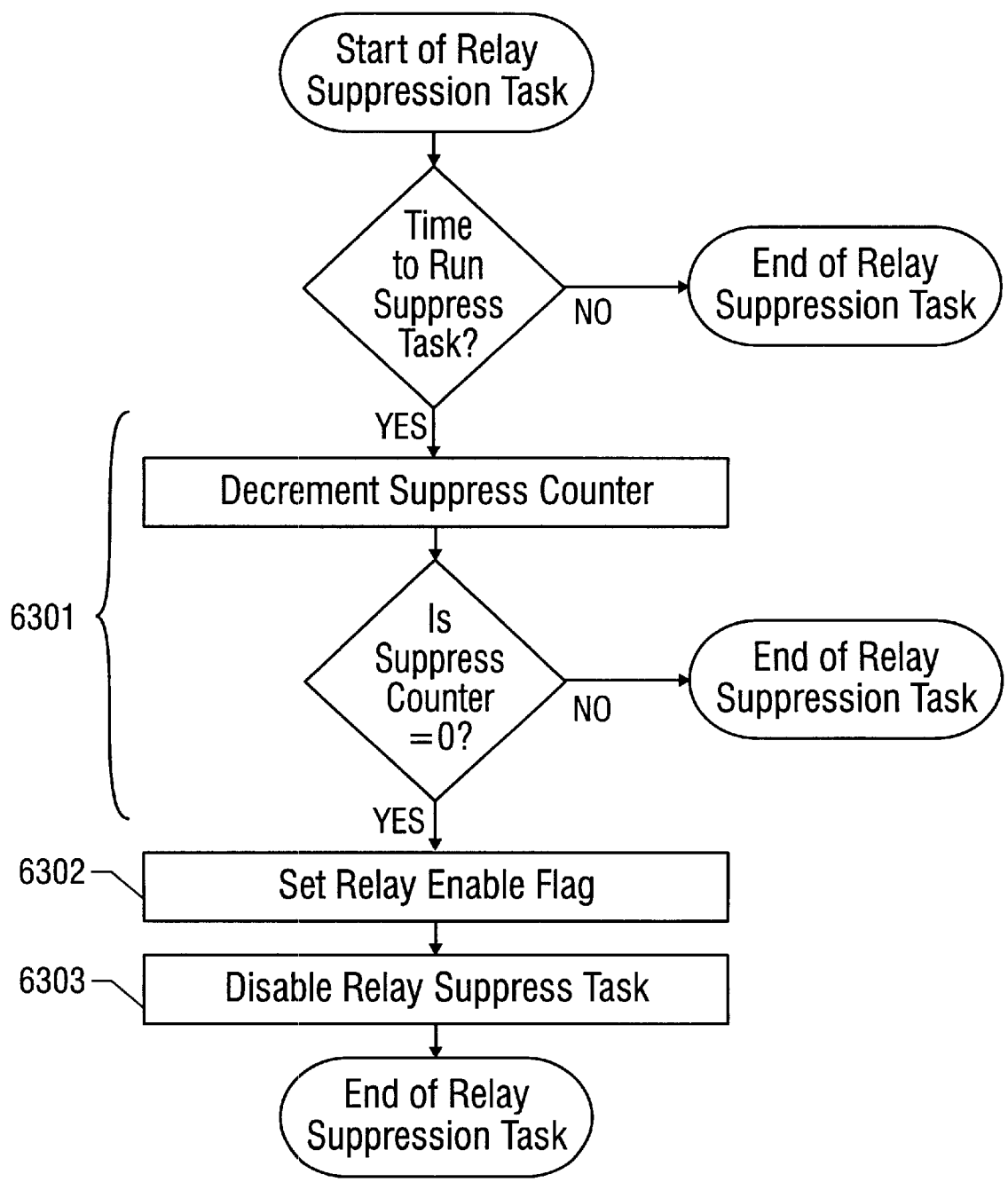
FIG. 63 is the relay suppress task flowchart for the present invention.

The sensor's relay suppress task disables the sensor's relay for a predetermined period of time. A flowchart of the relay suppress task of the present invention is shown in FIG. 63. This routine is used to prevent sensor false triggering by large voltage spikes from the sensor's relay. Once the relay's predetermined suppression time has elapsed (6301), the relay task enable flag is set (6302),and the relay suppress task enable flag is cleared (6303).

Figure 64:
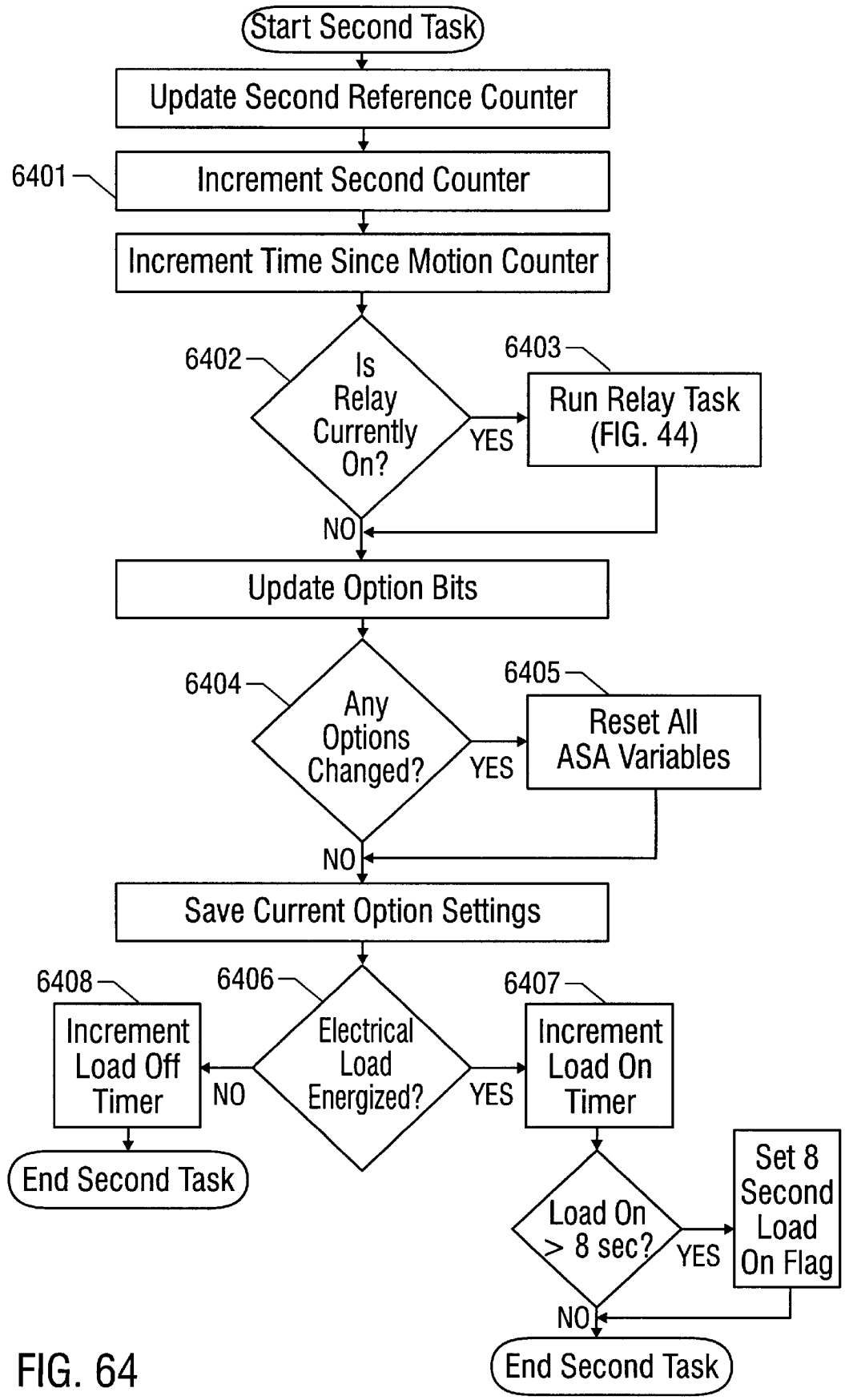
FIG. 64 is the second task flowchart for the present invention.

The sensor's second task is run once a second. A flowchart of the sensor's second task is shown in FIG. 64. This task initially increments the seconds counter (6401). If the relay is currently on (6402), the relay task is executed (6403). If any user-specified mode options have changed (6404), the various auto-sensitivity adjust (ASA) variables are reset (6405). Finally, if the sensor's electrical load(s) are energized (6406), the energized load counter is incremented (6407). If the sensor's electrical load(s) are off, the de-energized load counter is incremented (6408).

Figure 65:
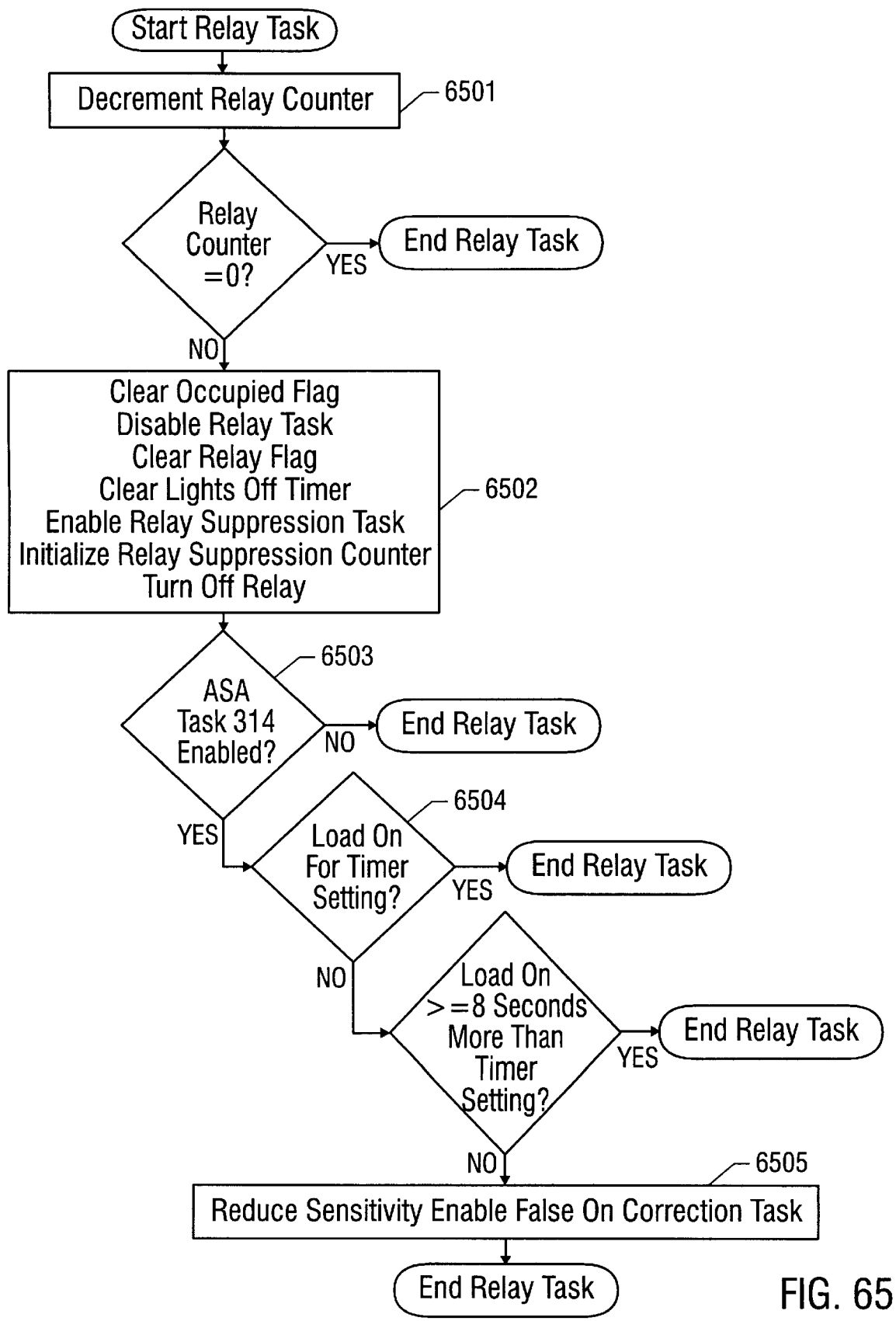
FIG. 65 is the relay task flowchart for the present invention.

The relay task decrements the sensor's relay counter. A flowchart of the relay task of the present invention is shown in FIG. 65.

After decrementing the sensor's relay counter (6501), the relay task turns off the sensor's relay if the relay counter has reached zero (6302). If the relay counter has not reached zero, the relay suppression task is ended. If the ASA task is enabled (6503), and the lights were previously on for about the same time as the sensor's timer delay setting (6504), the ultrasonic and PIR sensitivities are reduced and the false on correction task is enabled (6505).

The sensor's minute task is run once a minute. A flowchart of the minute task of the present invention is shown in FIG. 66. This task initially increments the minutes counter (6601).

If it is time to run the two minute status task (6602), the two minute status task enable flag is set (6603). Finally, the initialize I/O port data direction registers task is executed (6604).

Figure 67:
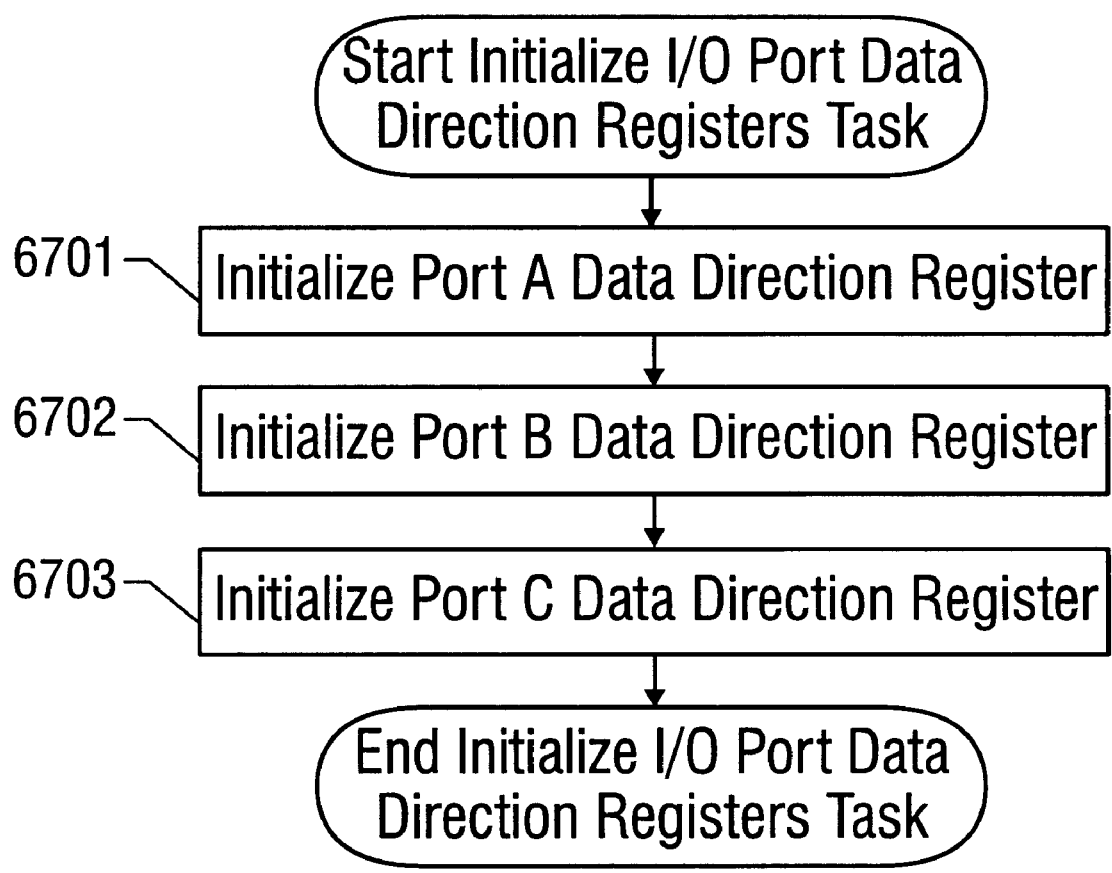
FIG. 67 is the initialize 110 port data direction registers task flowchart for the present invention.

The initialize I/O port data direction registers task periodically resets the I/O ports on the digital microcontroller 229 (FIG. 2). A flowchart of the initialize I/O port data direction registers task is shown in FIG. 67. The Port A (6701), Port B (6702), and Port C (6703) data direction reregisters are periodically reset to ensure proper operation.

The sensor's interrogate task is used to command the sensor into a special mode of operation (for example, a status reporting mode) by using the motion sensing capabilities of the sensor and without the need for adding a mode selection switch. In the exemplary embodiment, is the special mode is invoked by the detection of five successive hand waves by the user. A flowchart of the interrogate task of the present invention is shown in FIG. 68. This task is implemented as an eighteen state machine. The state counter (NGATEstate) is monitored at a rate determined by the interrogation counter STATcnt reaches zero (6801). If the state counter ever reaches a value of eighteen, the interrogation has been successfully requested (6802), so the bit allowing the sensor status to be displayed is set and the state counter is set to zero (6803). If the state counter is less than eighteen, the state of the USSense is used to modify the state counter. The two's place bit of the state counter is XOR'ed with the USSense bit (6804) to determine if the state counter should be incremented to the next even state. If the USSense bit contains the desired value, the state is incremented twice and the STATcnt is set equal to FF (6805). If the USSense bit doesn't contain the desired value, the state is evaluated (6806). If NGATEstate is even it is incremented once, and the STATcnt is set equal to FF(6807). This branch of program flow creates all of the odd states. If NGATEstate is odd, NGATEstate is set to zero (6808) By this method, the sensor may be switched from normal mode to status reporting mode using the motion detecting functions of the sensor, and without the need for adding a status mode selection switch.

The sensor's EEPROM task reads and writes data to the sensor's EEPROM. A flowchart of the EEPROM task is shown in FIG. 69. If the EEPROM is not busy (6901), and an EEPROM write task is scheduled (6902), the EEPROM task writes the various sensor variables to the sensor's EEPROM (6903), and then clears the EEPROM write task flag. If the EEPROM is not busy (6901), an EEPROM write task is not scheduled (6902), and an EEPROM read task is scheduled (6904), the EEPROM task reads the various sensor variables from the sensor's EEPROM and then clears the EEPROM read task flag (6905).

Although the description above contains many specifics, these should not be construed as limiting the scope of the invention but as merely providing illustrations of some of the presently preferred embodiments of this invention. For example, the sensor might use one or more subsets of the various detection technologies described above. Similarly, the sensor might use a different digital microcontroller, a different ultrasonic transducer or a different ultrasonic transducer frequency from the exemplary embodiment. Thus the scope of this invention and the method of operating the same should be determined by the appended claims and their legal equivalents and should not be limited to the example embodiments described above.

Table 3 provides a correlation between the attached source code appendix, and the flowcharts of FIGS. 39–69. The source code appendix is written in the assembly language, and is an example of programming for the digital microcontroller used in the exemplary embodiment to practice the present invention. Other programs may be used without departing from the scope of the invention.

TABLE 3

Source Code Label References for Primary Sensor Tasks

| Figure Number | Description of Routine | Code Label |
|---|---|---|
| 39 | Main (Foreground) Routine | main |
| 40 | Hardware and Variable Initialization Task | 02init |
| 41 | Interrogation Status Report Task | statussend |
| 42 | Two Minute Status Report Task | twominstatus |
| 43 | False On Correction Task | fixfalson |
| 28 | False Off Correction Task | fixfalsoff |
| 45 | Interrupt (Background) Routine | inta |
| 47 | Ultrasonic DSP Task | ultrasonictask |
| 48 | Infrared DSP Task | runPIR |
| 52 | HIGH CONFIDENCE Task | dtdecidenorm |
| 53 | HIGH SENSITIVITY Task | dtHSscheme |
| 55 | Update Counters Task | cntrupdt |
| 56 | Adjust Timer to Minimize Energy Usage Task | reducetimer |
| 57 | MUX Task | runMUXT |
| 61 | LED Task | LEDTASK |
| 62 | LED Status Task | statusled |
| 63 | Relay Suppress Task | suppress |
| 64 | Second Task | SECONDtask |
| 65 | Relay Task | relaytask |
| 66 | Minute Task | mcnt |
| 67 | Initialize I/O Port Data Direction Registers | setTrisRegs |
| 68 | Interrogate | handleSTAT |
| 69 | EEPROM Task | eepromwait |

```
;
; o2dt32.asm
; COPYRIGHT (C) MYTECH CORP. 1996, 1997
;
carrier set    1
;-----------------------------------------------------------------
; The 32Khz carrier
;-----------------------------------------------------------------
timvala set    H'067'           ; 0x100-0x67=0x99
                                ; 999.837hz ->
                                ; (fosc/4)/(12 instr+0x98*16)
                                ; the factor of 16 comes from
                                ; the use of the prescaler tmr2val set    H'04a'           ; 75 decimal, this gives 32Khz carrier
                                ; 32.768Khz=(fosc/4)/75 include "o2dt.asm"
```

```
        LIST    C=160,N=80,F=INHX8M,P=16C74,R=HEX
        TITLE   "Omni II Dual Technology Sensor"
        SUBTITL "COPYRIGHT (C) MYTECH CORP. 1996, 1997"
;--------------------------------------------------------
; o2dt.asm                                              -
;                                                       -
; Source code for the Multi-Tech sensor (N=2)           -
; Copyright (C) MYTECH Corp. 1996, 1997                 -
; 7-25-96 JJF                                           -
;                                                       -
;--------------------------------------------------------
        include "c:\dev\mytech\pic16c74.inc"
        include "c:\dev\mytech\support.inc"

;
; FLOATOFFSET causes the threshold to be
; offset by 1/4 of the average PD output.
;
FLOATOFFSET     set     1
ADAPT           set     1
AutoTimerAdj    set     0
useGSB          set     1 useUS           set     1
useIR           set     1 carrier         set     1       ; 0:25Khz;1:32Khz;2:40Khz useLCD          set     0       ; includes the code for the lcd debug
useDA           set     0       ; includes the code for the da debug ;--------------------------------------------------------
        ;------------------------------------
        ; we begin page 0 allocations here -
        ;------------------------------------
        include "c:\dev\mytech\o2ctlreg.inc"
        include "c:\dev\mytech\o2dtregs.inc"
        include "c:\dev\eeprom\o2eeprom.inc"

CBLOCK
                FONREF          ; false-on correction wait counter

CHAR            ; used by LCD
        ENDC

;------------------------------------
        ; we begin page 1 allocations here -
        ;------------------------------------
        include "c:\dev\mytech\adaptreg.inc"

CBLOCK
                STATCNTL
                STATWORD
                usPot
                pirPot
                FONCNT
                FOFFCNT lcdcntr         ; used by lcd
        ENDC
```

-55-

```
;*****************************************
        if      useDA==1
        include "c:\dev\mytech\doutd.inc"
        endif org     0x1c0
        include "c:\dev\mathlib\mathlib.asm"
        include "filter.asm"
        include "c:\dev\mytech\ledtask.asm"     ; LED task
        include "c:\dev\mytech\relaytsk.asm"    ; relay countdown task
        include "c:\dev\eeprom\o2e2prom.asm"
        include "c:\dev\mytech\muxtask.asm"
        include "o2dtinit.asm"
        include "dtustask.asm"                  ; ultrasonic sensor task
        include "dtirtask.asm"                  ; pir sensor task
;       include "c:\dev\mytech\o2lodplr.asm"
        include "c:\dev\mytech\o2stat.asm"
        include "o2adapt.asm"
        include "o2sermon.asm"

if      useLCD==1
#define TEMP    MTEMP5
        include "c:\dev\lcd\omni2lcd.asm"
        endif
o2start
;*****************************************
; The hardware setup is done here. The
; timers are setup and started.
;*****************************************
        o2init
main movlw   high    noserrpt
        movwf   PCLATH
        btfss   CBITS1,7
        goto    noserrpt bcf     CBITS1,7
        movlw   high    serrpt
        movwf   PCLATH
        call    serrpt
noserrpt if      useLCD==1 movlw   high    nolcdreport
        movwf   PCLATH
        btfss   CBITS2,3
        goto    nolcdreport bcf     CBITS2,3

;       movlw   high    lcdreport
;       movwf   PCLATH
;       call    lcdreport
;       lcdreport
nolcdreport
        endif ;-----------------------------------------------
        ; send the interrogation status report if necessary -
        ;-----------------------------------------------
```

```
        movlw   high    noireport
        movwf   PCLATH btfss   ReportTaskEnable
        goto    noireport movlw   high    statussend
        movwf   PCLATH
        call    statussend ; to prevent the seldom, but possible, event
        ; of an interrogation and a 2 min report from
        ; occurring at the same time
        movlw   high    no2minreport
        movwf   PCLATH
        goto    no2minreport
noireport ;------------------------------------------------
        ; send the 2 minute status report if it is time -
        ;------------------------------------------------
        movlw   high    no2minreport
        movwf   PCLATH btfss   TwoMinStatTaskEnable
        goto    no2minreport movlw   high    twominstatus
        movwf   PCLATH
        call    twominstatus
no2minreport
        if      ADAPT==1
        ;------------------------------------------------
        ; run the false-on correction if necessary -
        ;------------------------------------------------
        movlw   high    nofalseon
        movwf   PCLATH
        btfss   SBITS,6
        goto    nofalseon movlw   high    fixfalseon
        movwf   PCLATH
        call    fixfalseon
        usePage1
        incf    FONCNT,F
        usePage0
nofalseon ;------------------------------------------------
        ; run the false-off correction if necessary -
        ;------------------------------------------------
        movlw   high    nofalseoff
        movwf   PCLATH
        btfss   SBITS,5
        goto    nofalseoff movlw   high    fixfalseoff
        movwf   PCLATH
        call    fixfalseoff
        usePage1
```

-57-

```
                incf    FOFFCNT,F
                usePage0
nofalseoff
                endif movlw   high    novarstore
                movwf   PCLATH
                btfss   SBITS,1         ; is it time to store var's?
                goto    novarstore      ; no bcf     SBITS,1         ; disable task
                StoreVarsE2             ; store the var's
novarstore mend
                clrwdt
                movlw   high    main
                movwf   PCLATH
                goto    main ;--------------------------------------------------------
                org     0
                movlw   high    o2start
                movwf   PCLATH
                goto    o2start         ; reset vector
;----Interrupt Routine (comes here at 1 KHz)
                org     4               ; interrupt vector location
inta
                movwf   TEMPW           ; save w in TEMPW
                swapf   STATUS,W        ; get status (swapf doesn't alter status bits)
                usePage0
                movwf   TEMPS           ; save status in TEMPS
                movf    PCLATH,W
                movwf   TMPPCH
                movf    FSR,W
                movwf   TMPFSR movlw   timvala         ; reset RTCC
                movwf   RTCC
                bcf     INTCON,T0IF     ; reset RTCC interrupt flag clrf    PCLATH          ; set up page ;--------------------------------------------------------
                ; check the drvrstat pin (PORTC 5) if currently occupied -
                ;--------------------------------------------------------
                movlw   high    drvrstatchkend
                movwf   PCLATH
                btfss   Occupied
                goto    drvrstatchkend
                btfsc   DriverStatus
                goto    drvrstatchkend  ; since drvrstat is high, then relay driver OK
                ; we have a problem
                bcf     PORTB,2         ; turn off the relay
                bsf     DriverFailure
                bcf     Occupied
drvrstatchkend ;--------------------------------------------------------
                ; run the sensor task if it is enabled    -
                ;--------------------------------------------------------
                btfss   SBITS,0
```

-58-

```
            goto    skipsnsr movlw   high    ultrasonictask
            movwf   PCLATH
            call    ultrasonictask
            clrf    PCLATH          ; reset page after call ;----------------------------------------
            ; do the pir routine every 32ms          -
            ;----------------------------------------
dopir
            movf    CCNT0,W
            addlw   1               ; time slice offset
            andlw   H'1f'
            btfss   STATUS,Z        ; pir sensor runs at 1Khz/32
            goto    dtdecision movlw   high    runPIR
            movwf   PCLATH
            call    runPIR
            clrf    PCLATH          ; reset page after call dtdecision
            ;----------------------------------------------
            ; This is where we do the composition of      -
            ; individual technologies to determine        -
            ; occupancy. We'll handle this differently    -
            ; depending on the state of the lights and    -
            ; feature select switches                     -
            ;----------------------------------------------
            btfsc   Occupied        ; if occupied use the normal decision algorithm
            goto    dtdecidenorm ; when not occupied for less than ~15sec, always use the HS algorithm
            movf    LOFFTIMEHI,W
            btfss   STATUS,Z        ; if lofftimehi!=0, then >15sec for sure.
            goto    dtdecidenorm
            movf    LOFFTIMELO,W
            andlw   H'f0'           ; if any of upper 4 bits, then >15sec for sure
            btfss   STATUS,Z
            goto    dtdecidenorm movlw   high    dtHSscheme
            movwf   PCLATH
            call    dtHSscheme
            clrf    PCLATH
            goto    enddtdecide dtdecidenorm
            bcf     DualTechSense btfsc   options,0
            goto    dtHSmotion movlw   high    dtHCscheme
            movwf   PCLATH
            call    dtHCscheme
            clrf    PCLATH
            goto    enddtdecide dtHSmotion
            movlw   high    dtHSscheme
```

```
            movwf   PCLATH
            call    dtHSscheme
            clrf    PCLATH          ; reset page
  enddtdecide
            ;----------------------------------------
            ; we need to compute an average of the   -
            ; time between motion occurences. This   -
            ; quantity is then used as a cue for the -
            ; ASA algorithm.                         -
            ;----------------------------------------
            btfss   DualTechSense
            goto    skipsnsr usePage1
            movf    timesincemothi,W
            iorwf   timesincemotlo,W
            usePage0
            btfsc   STATUS,Z        ; ignore this motion occurrence
            goto    cntrupdt        ; if it is less than 1sec since the
                                    ; previous one.
            ;----------------------------------------------------------
            ; we'll add code here for looking at the time since motion -
            ;----------------------------------------------------------
            usePage1
            movf    timesincemothi,W
            usePage0
            movwf   TEMP7
            usePage1
            movf    timesincemotlo,W
            subwf   maxtimesincemotlo,W
            usePage0
            movwf   TEMP6
            btfss   STATUS,C        ; borrow?
            incf    TEMP7,F         ; yes
            movf    TEMP7,W
            usePage1
            subwf   maxtimesincemothi,W
            btfsc   STATUS,C        ; borrow?
            goto    cntrupdt        ; no
            ;-----------------------------------------------------------
            ; the most recent timesincemot is greater than previous max-
            ; so we need to update the max and manipulate timeradj(?)  -
            ;-----------------------------------------------------------
            movf    timesincemothi,W
            movwf   maxtimesincemothi
            movf    timesincemotlo,W
            movwf   maxtimesincemotlo
            ; no timer manipulation for now
  skipsnsr
  cntrupdt
            usePage0
            ;-----Update Counters-----
            incf    CCNT0,F         ; increment counter low bits (1ms)
            btfss   STATUS,Z        ; zero?
            goto    t1klbl1         ; no...
            incf    CCNT1,F         ; increment counter low mid bits (every 256ms)
            btfss   STATUS,Z        ; zero?
            goto    t1klbl1         ; no...
            incf    CCNT2,F         ; increment counter high mid bits (every 65.536sec)
            btfss   STATUS,Z        ; zero?
            goto    t1klbl1         ; no...
```

-60-

```
            incf    CCNT3,F             ; yes, increment counter high bits (every 4.66hrs)
            btfsc   STATUS,Z            ; if CCNT3 rolls over,
            bsf     CntrRollOver        ; set the flag
;-------------------------------------------------------------
; here we add the hooks for manipulating the timer
;-------------------------------------------------------------
            movlw   high    reducetimer
            movwf   PCLATH
            call    reducetimer
            clrf    PCLATH
;-------------------------------------------------------------
; we also need to store the adaptation variables in EEPROM -
;-------------------------------------------------------------
            bsf     SBITS,1 t1klbl1     nop
            btfsc   FourMinOnBit
            goto    morethan4
            movlw   H'fc'               ; mask off upper 6 bits
            andwf   CCNT2,W
            btfss   STATUS,Z            ; if any of lower 2 bits set, then power on for
            bsf     FourMinOnBit        ; for more than 4min, set the appropriate bit
morethan4
            ;-----------------------------------------
            ; The muxtask gets called at a 16ms rate -
            ; The effective sample rate of the A/D   -
            ; readings coming through is 15hz.       -
            ;-----------------------------------------
            movf    CCNT0,W
            addlw   3                   ; time slice offset
            andlw   H'0f'
            btfss   STATUS,Z
            goto    nomux movlw   high    runMUXT
            movwf   PCLATH
            call    runMUXT
            clrf    PCLATH              ; reset the page
nomux
;           movlw   high    lowfdoppler
;           movwf   PCLATH
;           call    lowfdoppler
;           clrf    PCLATH movlw   99h                 ; 1001 1001  enable channel3 a/d again
            movwf   ADCON0              ; (This is the receiver a/d.)
                                        ; We switch it now so the mux will settle
                                        ; in time for the reading.

; We will clock the LED every 4ms
;           movlw   high    skipled
;           movwf   PCLATH              ; don't forget to setup the goto's!!!

btfss   SBITS,2             ; is LED scheduled to run?
            goto    skipled             ; no. so skip task.

movlw   high    LEDTASK
            movwf   PCLATH
            call    LEDTASK
            clrf    PCLATH
skipled
```

-61-

```
            btfss   CBITS3,7        ; is green LED scheduled to run?
            goto    skipgled        ; no. so skip task.

if useDA==0
            movlw   high    gLEDTASK
            movwf   PCLATH
            call    gLEDTASK
            clrf    PCLATH
            endif
skipgled btfss   Suppress
            goto    nosprs movlw   high    suppress
            movwf   PCLATH
            call    suppress
            clrf    PCLATH          ; reset page
nosprs SECONDtask
            movlw   high    endSECOND
            movwf   PCLATH movf    SECONDreflo,W
            subwf   CCNT0,W         ; CCNT0-SECONDreflo
            btfss   STATUS,Z
            goto    endSECOND
            movf    SECONDrefhi,W   ; movf only affects the Z bit
            btfss   STATUS,C        ; did the subtract borrow?
            incf    SECONDrefhi,W   ; yes.(SECONDrefhi borrows from CCNT1)
            subwf   CCNT1,W         ; CCNT1-SECONDrefhi
            btfss   STATUS,Z
            goto    endSECOND ; setup for the next second
            movlw   H'e8'
            addwf   SECONDreflo,F
            btfsc   STATUS,C
            incf    SECONDrefhi,F
            movlw   H'03'
            addwf   SECONDrefhi,F   ; 03e8h is 1000d incf    SECONDLO,F
            btfsc   STATUS,C
            incf    SECONDHI,F      ; SECONDHI:SECONDLO increments every 1.0s btfss   Occupied
            goto    secrelay usePage1
            incf    timesincemotlo,F
            btfsc   STATUS,Z
            incf    timesincemothi,F
            usePage0 secrelay
            movlw   high    relaytask
            movwf   PCLATH
            btfsc   SBITS,3         ; is the relay on?
            call    relaytask       ; yes, so service the countdown task.
            clrf    PCLATH
```

-62-

```
        ; read the option bits
        bcf     options,0
        btfss   DTSwitch         ; invert switch logic
        bsf     options,0 bcf     options,1
        btfss   LEDOverride      ; invert switch logic
        bsf     options,1 bcf     options,2
        btfss   AdaptReset       ; invert switch logic
        bsf     options,2

; determine if the options have been changed
        usePage1
        movf    lastoption,W
        andlw   H'7f'            ; mask off bit 7
        usePage0
        movwf   TEMPLO
        movlw   H'7f'            ; mask off bit 7
        andwf   options,W
        subwf   TEMPLO,W
        btfsc   STATUS,Z
        goto    no1secasareset ;--------------------------------------------------
        ; options changed, so reset the asa variables   -
        ; need to verify this feature                   -
        ;--------------------------------------------------
        clrf    usonadj
        clrf    usoffadj
        clrf    iroffadj
        clrf    timeradjlo
        clrf    timeradjhi
        clrf    CCNT3
        bcf     CntrRollOver
        ;!!!!!!!!!
        ; should we add code to reset e2prom var's????
        ;!!!!!!!!!
no1secasareset
        movf    options,W
        usePage1
        movwf   lastoption
        usePage0

;--------------------------------------------------
        ; when a driver failure has been declared, we should -
        ; periodically clear the bit, this prevents the     -
        ; sensor from having permanent failure.             -
        ;--------------------------------------------------
        movlw   high    secdrvrchkend
        movwf   PCLATH
        movlw   H'03'            ; check every 4sec
        andwf   SECONDLO,W
        btfss   STATUS,Z
        goto    secdrvrchkend
        btfsc   DriverFailure
        bcf     DriverFailure
secdrvrchkend

;--------------------------------------
```

-63-

```
            ; this is used for the lcd report    -
            ;-----------------------------------
            btfss   SECONDLO,0
            bsf     CBITS2,3

;-----------------------------------
            ; this is for the serial report     -
            ;-----------------------------------
            movlw   H'07'           ; every 8sec
            andwf   SECONDLO,W
            btfsc   STATUS,Z
            bsf     CBITS1,7 movlw   high    ltsoff
            movwf   PCLATH
            btfss   CBITS1,2        ; are the lights on?
            goto    ltsoff          ; no. goto lights off SECOND
ltson
            incf    LONTIMELO,F
            btfsc   STATUS,Z
            incf    LONTIMEHI,F movf    LONTIMELO,W     ; have the lights been on 8+sec?
            andlw   H'f8'           ; only if any of upper 5 bits set
            btfss   STATUS,Z
            bsf     CBITS2,6        ; yes, so set the 8sec lights on flag goto    endSECOND
ltsoff
            incf    LOFFTIMELO,F
            btfsc   STATUS,Z
            incf    LOFFTIMEHI,F if      useGSB==1
                movf    LOFFTIMELO,W
                andlw   H'e0'           ; if any of upper 3 bits set
                btfsc   STATUS,Z        ; then lights off > 30 sec
                goto    ltsoffnogsb
            ; when the gsb switch is turned on, we need
            ; to set usgain to the offgain value which
            ; is .75 of the ongain value corresponding
            ; to the square law mapped pot setting
                movf    usoffgain,W
                btfsc   GSBEnable       ; is gsb turned on?
                movwf   usgain          ; yes.
ltsoffnogsb
            endif
endSECOND mcnt        movlw   high    endmcnt
            movwf   PCLATH movf    mcntref,W
            subwf   SECONDLO,W
            btfss   STATUS,Z
            goto    endmcnt ; setup for the next minute
            movlw   D'60'
            addwf   mcntref,F incf    mcntlo,F        ; mcntlo increments once every minute
                            -64-
```

```
        btfsc   STATUS,C
        incf    mcnthi,F

;-----------------------------------------------------------
; no two minute status when the LED override switch is on  -
;-----------------------------------------------------------
        btfsc   NoLEDFlag
        goto    skip2minstatus
        btfss   mcntlo,0        ; do status every other minute
        bsf     TwoMinStatTaskEnable
skip2minstatus ;-----------------------------------------------------------
; Per Microchip advice, we need to periodically reset      -
; the TRIS registers                                       -
;-----------------------------------------------------------
        movlw   high    setTrisRegs
        movwf   PCLATH
        call    setTrisRegs
        clrf    PCLATH ;-----------------------------------------------------------
; When in installer test mode, we need to come out of      -
; it after an hour. Increment and Check ITMClk.            -
;-----------------------------------------------------------
        movlw   high    min_noitm
        movwf   PCLATH
        btfss   InstallerTestMode
        goto    min_noitm
        incf    ITMClk,F
        movlw   D'60'
        subwf   ITMClk,W        ; W = ITMClk - 60
        btfss   STATUS,C        ; if borrow, then <60 min in test mode
        goto    min_noitm       ; the subtract borrowed
        ; get out of test mode
        bcf     InstallerTestMode min_noitm
;-----------------------------------------------------------
; in order to get a better estimator of the ir noise       -
; level, we maintain a running max of the noise. Once      -
; every minute this running max is compared with the       -
; current ir noise estimate. The largest is the new        -
; noise estimate of the ir circuit.                        -
;-----------------------------------------------------------
        usePage1
        movf    irRecentMax,W
        usePage0
        movwf   TEMP8
        usePage1
        movf    irNoiseEst,W
        usePage0
        movwf   TEMP7
        movlw   high    max
        movwf   PCLATH
        call    max
        clrf    PCLATH
        usePage1
        movwf   irNoiseEst
        movlw   H'80'
        movwf   irRecentMax
        usePage0
```

-65-

```
endmcnt
        ;---------------------------------------------
        ; service the interrogate task if necessary -
        ;---------------------------------------------
        movlw   high    nostat
        movwf   PCLATH
        btfss   Interrogating
        goto    nostat
statcntr
        decfsz  NTRGATEcnt
        goto    nostat
dostat
        movlw   high    handleNTRGATE
        movwf   PCLATH
        call    handleNTRGATE
nostat ;-------------------------------------------------------------------
        ; The eeprom code is placed in the interrupt routine so            -
        ; that it will not be disturbed by interrupts, otherwise           -
        ; interrupts may have to be disabled during eeprom read/write.     -
        ;-------------------------------------------------------------------
        movlw   high    eepromwrite
        movwf   PCLATH
eepromwait
        btfss   E2FLAG,1
        goto    eepromwrite movlw   high    eepromdlyend
        movwf   PCLATH
        movf    CCNT0,W
        subwf   E2DLY,W
        btfsc   STATUS,Z        ; is it exactly 11ms?
        goto    eepromdlyend    ; yes
        btfss   STATUS,C        ; if not, did the subtract borrow (more than 11ms)
eepromdlyend
        bcf     E2FLAG,1        ; yes eepromwrite
        movlw   high    eepromread
        movwf   PCLATH
        btfss   EEPROMWTASK     ; is an eeprom write scheduled?
        goto    eepromread      ; no...

movlw   high    endeeprom
        movwf   PCLATH
        btfsc   E2FLAG,1        ; is the EEPROM still writing?
        goto    endeeprom       ; yes movlw   high    WRBYTE
        movwf   PCLATH
        call    WRBYTE bcf     EEPROMWTASK movlw   high    endeeprom
        movwf   PCLATH
        goto    endeeprom       ; if we have just written, then we can't
                                ; read for ~11ms so jump over read task
eepromread
        movlw   high    endeeprom
```

-66-

```
               movwf    PCLATH
               btfss    EEPROMRTASK
               goto     endeeprom btfsc    E2FLAG,1        ; is the EEPROM still writing?
               goto     endeeprom       ; yes movlw    high    RDBYTE
               movwf    PCLATH
               call     RDBYTE bcf      EEPROMRTASK
     endeeprom endi      clrwdt
               movf     TMPFSR,W
               movwf    FSR
               movf     TMPPCH,W
               movwf    PCLATH
               swapf    TEMPS,W
               movwf    STATUS          ; restore status
               swapf    TEMPW,F         ; swap value in TEMPW
               swapf    TEMPW,W         ; restore w register
     retfi     retfie                   ; return from interrupt dtHC      ;-----------------------------------------
               ; To do the high confidence operation, we   -
               ; use a modified bounded sum operator.      -
               ;-----------------------------------------
               movlw    high    dtHC0
               movwf    PCLATH
               movf     ustruth,W
               addwf    pirtruth,W
               movwf    TEMP6           ; TEMP6 = truth
               movlw    H'60'           ; 0x60 is the lower truth limit
               subwf    TEMP6,F
               btfss    STATUS,C        ; borrow?
               goto     dtHC0           ; yes, so no motion for sure
               movf     TEMP6,W
               btfsc    TEMP6,7
               movlw    H'7f'
               return
     dtHC0
               clrw
               return dtHS      movlw    high    dtHSmax
               movwf    PCLATH
               movf     ustruth,W
               addwf    pirtruth,W
               movwf    TEMP9
               btfsc    TEMP9,7
               goto     dtHSmax ; if overflow return 7fh
     ;         movlw    07fh
               return
     dtHSmax
               movlw    H'07f'
               return dtHCscheme
               btfsc    Occupied        ; are we currently occupied?
               goto     stilloccup      ; yes...see if lights on timer should be reset
```

```
            movlw   high    dtHC
            movwf   PCLATH
            call    dtHC            ; w = HC(ustruth,pirtruth)
            movwf   TEMP9
            ;---------------------------------------------
            ; We want the truth to be >= limit
            ;---------------------------------------------
amoccuptst
            movlw   high    amoccup_yes
            movwf   PCLATH
            movf    TEMP9,W
            sublw   H'040'          ; 40h - W
            btfsc   STATUS,Z        ; is the truth exactly what we want?
            goto    amoccup_yes     ; yes...space is occupied
            btfsc   STATUS,C        ; is the truth > limit
            return                  ; no...space not occupied
            ;---------------------------------------------
            ; We have determined that the lights should -
            ; be turned on.                              -
            ;---------------------------------------------
amoccup_yes
            movlw   high    turnOnLights
            movwf   PCLATH
            call    turnOnLights    ; turn on lights + bookkeeping
            clrf    PCLATH
            bsf     DualTechSense
            return
stilloccup
            ;---------------------------------------------
            ; Since we are currently occupied we use     -
            ; the high sensitivity operation             -
            ;---------------------------------------------
            movlw   high    dtHS
            movwf   PCLATH
            call    dtHS
            movwf   TEMP9
stilloccuptst
            ;---------------------------------------------
            ; We want the truth to be >= limit
            ;---------------------------------------------
            movlw   high    dtloccup_yes
            movwf   PCLATH
            movf    TEMP9,W
            sublw   H'07f'          ; limit - W
            btfsc   STATUS,Z        ; is the truth exactly what we want?
            goto    dtloccup_yes    ; yes...reset the relay
            btfsc   STATUS,C        ; is the truth > than limit
            return                  ; no...
            ;---------------------------------------------
            ; We have determined that the lights should -
            ; be kept on.                                -
            ;---------------------------------------------
dtloccup_yes
            movlw   high    setrelay
            movwf   PCLATH
            call    setrelay        ; this will simply reset the
                                    ; relay countdown timer
            bsf     DualTechSense
dtlend      return dtHSscheme
```

```
        movlw   high    dtHS
        movwf   PCLATH
        call    dtHS
        movwf   TEMP9
;----------------------------------------
; We want the truth to be >= limit
;----------------------------------------
        movlw   high    dt2occup_yes
        movwf   PCLATH
        movf    TEMP9,W
        sublw   H'07f'          ; limit - W
        btfsc   STATUS,Z        ; is the truth exactly what we want?
        goto    dt2occup_yes    ; yes...reset the relay
        btfsc   STATUS,C        ; is the truth > than limit
        return                  ; no...
;----------------------------------------
; We have determined that motion is present -
;----------------------------------------
dt2occup_yes
        btfsc   Occupied        ; are we currently occupied?
        goto    dt2stilloccup   ; yes...lights on timer should be reset
        movlw   high    turnOnLights
        movwf   PCLATH
        call    turnOnLights
        clrf    PCLATH
        bsf     DualTechSense
        return
dt2stilloccup
        movlw   high    setrelay
        movwf   PCLATH
        call    setrelay        ; this will simply reset the
                                ; relay countdown timer
        bsf     DualTechSense
dt2end  return

END
```

```
; pic16c74.inc
; COPYRIGHT (C) MYTECH CORP. 1996, 1997
;----- STATUS Bits ---------------------------------------------------

IRP     EQU     H'0007'
        RP1     EQU     H'0006'
        RP0     EQU     H'0005'
        NOT_TO  EQU     H'0004'
        NOT_PD  EQU     H'0003'
        Z       EQU     H'0002'
        DC      EQU     H'0001'
        C       EQU     H'0000'

W       EQU     H'0000'
        F       EQU     H'0001'

INDF    equ     00h
        RTCC    equ     01h
        PCL     equ     02h
        STATUS  equ     03h
        FSR     equ     04h
        PORTA   equ     05h
        PORTB   equ     06h
        PORTC   equ     07h
        PORTD   equ     08h
        PORTE   equ     09h
        TRISA   equ     05h
        TRISB   equ     06h
        TRISC   equ     07h
        TRISD   equ     08h
        TRISE   equ     09h PCLATH  equ     0ah ADCON0  equ     1fh
        ADCON1  equ     1fh             ; must be in page 1
        ADRES   equ     1eh
        INTCON  equ     0bh
        OPTREG  equ     01h             ; must be in page 1

PIR1    equ     0ch
        PIE1    equ     0ch             ; must be in page 1
        PIR2    equ     0dh
        PIE2    equ     0dh             ; must be in page 1
        TMR1L   equ     0eh
        PCON    equ     0eh             ; must be in page 1
        TMR1H   equ     0fh
        T1CON   equ     10h
        TMR2    equ     11h
        T2CON   equ     12h
        PR2     equ     12h             ; must be in page 1
        SSPBUF  equ     13h
        SSPADD  equ     13h             ; must be in page 1
        SSPCON  equ     14h
        SSPSTAT equ     14h             ; must be in page 1
        CCPR1L  equ     15h
        CCPR1H  equ     16h
        CCP1CON equ     17h
        RCSTA   equ     18h
        TXSTA   equ     18h             ; must be in page 1
        TXREG   equ     19h
        SPBRG   equ     19h             ; must be in page 1
```

```
RCREG      equ    1ah
CCPR2L     equ    1bh
CCPR2H     equ    1ch
CCP2CON    equ    1dh ;----- INTCON Bits (except ADC/Periph) -----------------------------------

GIE        EQU    H'0007'
PEIE       equ    H'06'
T0IE       EQU    H'0005'
INTE       EQU    H'0004'
RBIE       EQU    H'0003'
T0IF       EQU    H'0002'
INTF       EQU    H'0001'
RBIF       EQU    H'0000'

;----- OPTION Bits -------------------------------------------------------

NOT_RBPU          EQU    H'0007'
INTEDG     EQU    H'0006'
T0CS       EQU    H'0005'
T0SE       EQU    H'0004'
PSA        EQU    H'0003'
PS2        EQU    H'0002'
PS1        EQU    H'0001'
PS0        EQU    H'0000'

;----- ADCON0 Bits -------------------------------------------------------
ADCS1      EQU    H'0007'
ADCS0      EQU    H'0006'
CHS2       EQU    H'0005'
CHS1       EQU    H'0004'
CHS0       EQU    H'0003'
GO         EQU    H'0002'
GO_DONE    EQU    H'0002'
ADON       EQU    H'0000'

;----- ADCON1 Bits -------------------------------------------------------
PCFG2      EQU    H'0002'
PCFG1      EQU    H'0001'
PCFG0      EQU    H'0000'

;----- PIE1 and PIR1 ADC Bits --------------------------------------------
ADIE       EQU    H'0006'
ADIF       EQU    H'0006'
TXIF       EQU    H'04'
RCIF       EQU    H'05'

;----- I2C Bits for PIR1 and PIE1---------
SSPIE      equ    H'03'    ;PIE1
SSPIF      equ    H'03'    ;PIR1

^Z
```

```
; support.inc
; COPYRIGHT (C) MYTECH CORP. 1996, 1997
;
LSB             equ     0
#define _C      STATUS,C
;********************
; John's macro's
;********************
usePage0        macro
        bcf     STATUS,5        ; select page 0
        endm usePage1        macro
        bsf     STATUS,5        ; select page 1
        endm ; all uses of this macro depend on
; no changes to W
disableInts     macro
        bcf     INTCON,GIE      ; disable global interrupts
        endm ; all uses of this macro depend on
; no changes to W
enableInts      macro
        bsf     INTCON,GIE      ; enable global interrupts
        endm

;
;
;
;
;

; all uses of this macro depend on
; no changes to W
enterCritical   macro
        disableInts
        endm ; all uses of this macro depend on
; no changes to W
exitCritical    macro
        enableInts
        endm ; push - push the contents of W onto
; the stack and dec the stack pointer.
; Thw W register is not affected.
pushw   macro
        movwf   INDF
        decf    FSR,F
        endm ; pop - get the value pointed to by the
; stack and inc the stack pointer. The
; value is returned in W.
popw    macro
        movf    INDF,W
        incf    FSR,F
        endm
```

```
i16lsrw  macro   hireg,loreg
         rlf     hireg,W
         rrf     hireg,F
         rrf     loreg,W
         endm i16lsr   macro   hireg,loreg
         rlf     hireg,W
         rrf     hireg,F
         rrf     loreg,F
         endm i16lsl   macro   hireg,loreg
         bcf     STATUS,C
         rlf     loreg,F
         rlf     hireg,F
         endm chkof    macro
         btfsc   STATUS,C
         incf    overflow
         endm
chkuf    macro
         btfss   STATUS,C
         incf    underflow
         endm jmpl     macro   addr
         movlw   high    addr
         movwf   PCLATH
         goto    addr
         endm icall    macro   addr
         movwf   INDF
         movlw   high    addr
         movwf   PCLATH
         movf    INDF,W
         call    addr
         endm
```

-73-

```
;
; o2ctlreg.inc
; COPYRIGHT (C) MYTECH CORP. 1996, 1997
; control registers for the Omni II
;
; 7-22-96 JJF
;----------------------------------------------------------------

;----------------------------------------------------------------
        CBLOCK  0x20
                TEMPW           ; this exists at both 20h and a0h
                TEMPS
                TMPPCH
                TMPFSR
                CCNT0           ; 1ms ticks
                CCNT1           ; 256 ms ticks
                CCNT2           ; 65.536sec ticks
                CCNT3           ; 16777.216sec ticks
                                ; 279.62min=4.66hr ticks
                                ; max ctr is 1188hours(49.5days)
                CBITS1          ; bit 0: 1-US sense motion
                                ;     1: 1-PIR sense motion
                                ;     2: 1-occupied bit
                                ;     3: 1-US ON
                                ;     4: 1-PIR ON
                                ;     5: 1-power on for 60+ minutes
                                ;     6: 1-Installer Test Mode enable
                                ;     7: used with Serial Debug Report
                CBITS2          ; bit 0: 1-US dominant;0-IR dominant
                                ;     1: 1-lights off 1+sec flag
                                ;     2: 1-Counter has rolled over
                                ;     3: used with LCD Debug
                                ;     4: 1-GSB enable flag
                                ;     5: 1-False-Off Timer return state
                                ;     6: 1-False-Off timer return enabled
                                ;     7: 1-DRVRSTAT Failure!!!
                CBITS3          ; bit 0: 1-sensitivity too high
                                ;     1: 1-Two minute status report enabled
                                ;     2: 1-EEPROM write task enabled
                                ;     3: 1-EEPROM read task enabled
                                ;     4: 1-ASA reset signal
                                ;     5: 1-interrogate task enabled
                                ;     6: 1-interrogation report task enabled
                                ;     7: 1-Green LED task enabled SBITS           ; bit 0: 1-sensor task enabled
                                ;     1: 1-Store Vars task enabled
                                ;     2: 1-Red LED task enabled
                                ;     3: 1-lights-on countdown
                                ;     4: 1-relay suppress enable
                                ;     5: 1-false off correction
                                ;     6: 1-false on correction
                                ;     7: 1-periodic ASA TEMPLO          ; These temp registers are for use
                TEMPHI          ; in the interrupt routine ONLY!
                TEMP6           ;  ''
                TEMP7           ;  ''
                TEMP8           ;  ''
                TEMP9           ;  ''

MTEMP           ; These temp registers are for use
```

```
                MTEMP1              ; in the main loop ONLY!
                MTEMP2              ; ''
                MTEMP3              ; ''
                MTEMP4
                MTEMP5

TMRPOTHI            ; the lights on timer setting in seconds
                TMRPOTLO
                timeradjhi
                timeradjlo SECONDHI            ; this is the 1 second counter
                SECONDLO
                SECONDrefhi         ; the reference for the 1sec counter
                SECONDreflo         ; relative to the 1ms counter, when
                                    ; SECONDHI:SECONDLO increments, ie once/sec,
                                    ; SECONDrefhi:SECONDreflo is set to 1000 +
                                    ; CCNT1:CCNT0.(CCNT0 increments every ms)

relaylo             ; this is the relay task counter. it is
                relayhi             ; decremented once every second.

sprscnt             ; this is the relay suppress counter.

mcnthi              ; the minute counter
                mcntlo
                mcntref             ; the minute counter reference, relative
                                    ; to the second counter.

LOFFTIMEHI
                LOFFTIMELO
                LONTIMEHI
                LONTIMELO options             ; bits 0-2: dual tech mode
                                    ; bit 3: strong air compensation
                                    ; bit 4: ASA enable
                                    ; bit 5: ATA enable
                                    ; bit 6: GSB enable
                                    ; bit 7: dt motion sense NTRGATEcnt
                NTRGATEstate FCOUNT              ; generic lowpass corner freq. control ITMClk              ; installer test mode clock (minutes)
                lastTimer           ; for determining test mode entry/exit
        ENDC ;
; convenient macros for bit addresses
;
#define Occupied        CBITS1,2
#define RelayEnable     CBITS2,1
#define Relay           PORTB,2
#define DLCRelay        PORTA,2
#define USSense         CBITS1,0
define IRSense         CBITS1,1 define GreenLEDEnable  CBITS3,7    ; the task enable bit
define GreenLED        PORTA,4
```

```
#define TwoMinStatTaskEnable    CBITS3,1
#define EEPROMWTASK             CBITS3,2
#define EEPROMRTASK             CBITS3,3
#define Interrogating           CBITS3,5
#define ReportTaskEnable        CBITS3,6
define Suppress                SBITS,4 define StrongAirCompensate     options,3
define ASAEnable               options,4
#define ATAEnable               options,5
#define GSBEnable               options,6
#define NoLEDFlag               options,1
#define FourMinOnBit            CBITS1,5
#define InstallerTestMode       CBITS1,6
#define ASATimerReturn          CBITS2,6
#define ASATimerReturnState     CBITS2,5
define CntrRollOver            CBITS2,2 define DTSwitch                PORTB,0
;#define        DTSwitch2               PORTB,6
;#define DTSwitch3              PORTB,7
#define LEDOverride             PORTB,6
#define AdaptReset              PORTB,7
#define DriverStatus            PORTC,5
#define DriverFailure           CBITS2,7
```

```
;
; o2dtregs.inc
;
; register allocations for the dual tech sensor
; COPYRIGHT (C) MYTECH CORP. 1996, 1997 include "c:\dev\mytech\o2usregs.inc"
        include "c:\dev\mytech\o2irregs.inc"

CBLOCK
                pirtruth
                ustruth
                LightLevel              ; the photocell A/D reading
        ENDC define DualTechSense   options,7
```

```
;
; o2irregs.inc
; COPYRIGHT (C) MYTECH CORP. 1996, 1997
; register allocations for the Omni II PIR  Sensor
;
;------ globals ------
        CBLOCK
;               PIRadin         ; PIR
                PIRLPLO         ; PIR
                PIRLPHI         ; PIR
                PIRthresh
                iroffadj
                PIRAVGLO
                PIRAVGHI pirdecision
                irpscnt gLEDST          ; Green LED state
                gLEDSELECT      ; Green LED function select
                gLEDCNTR        ; Green LED TASK counter

ENDC
```

```
;
; o2usregs.inc
; COPYRIGHT (C) MYTECH CORP. 1996, 1997
; register allocations for the Omni II US sensor
;
        CBLOCK
                w2hi            ; filter state memory
                w2lo
                w1hi
                w1lo
                AD1LPLO
                AD1LPHI
;               lfdlplo
;               lfdlphi
;               lfdtemp usgain          ; the currently used gain setting,
                usongain
                usonadj
                usoffadj        ; the ASA algorithm alters this variable.
                                ; it is added to usoffgain.
                usoffgain       ; the gain when the lights are off decimlo
                decimhi
                RECTAVGlo
                RECTAVGhi integhi         ; the 16bit integrator output
                integlo usdecision
                uspscnt         ; pulse stretch cnt LEDST           ; Red LED state
                LEDSELECT       ; Red LED function select
                LEDCNTR         ; Red LED TASK counter ENDC
VC1hi   set     w1hi
VC1lo   set     w1lo
IL1hi   set     w2hi
IL1lo   set     w2lo
```

```
;
; o2asareg.inc
; COPYRIGHT (C) MYTECH CORP. 1996, 1997
; register allocations for the Omni II
; ASA algorithm.
;
        CBLOCK  0xb0
                usLearnCoef
                irLearnCoef
                timerLearnCoef
                irNoiseEst
                irRecentMax avgtimesincemot
                timesincemotlo
                timesincemothi
                maxtimesincemotlo
                maxtimesincemothi lastoption
                dominantTech uspulsecnt0
                uspulsecnt1
                uspulsemax
                usminpulse
                usminpw0
                usminpw1

ENDC
```

-80-

```
            CBLOCK
                    E2FLAG   ; Common flag bits register
                    E2BUF    ; Bit buffer
                    E2ERR    ; Error code (to indicate bus status)
                    E2ADDR   ; Address register
                    DATAI    ; Stored data input register
                    DATAO    ; Stored data output register
                    E2WBUF   ; Write buffer
                    E2RBUF   ; Read buffer
                    E2CNT    ; Bit counter
                    E2DLY    ; Delay variable
;                   SLAVE
            ENDC
FLAG     set     E2FLAG
EEPROM   set     E2BUF
ERCODE   set     E2ERR
ADDR     set     E2ADDR
TXBUF    set     E2WBUF
RXBUF    set     E2RBUF
COUNT    set     E2CNT ;#define         SLAVE   B'10101110'           ; eeprom address in I2C space
;#define         SLAVE   B'10100000'

;********************************************************
; Convenient Stuff for addressing bits
;********************************************************
;
; FLAG Bits
;
ERRORFLG EQU     0                     ; Error flag
;
; EEPROM Bits
;
DI       EQU     7                     ; EEPROM input
DO       EQU     6                     ; EEPROM output ;***********************************************
; PIC I2C Pin Assignments
;***********************************************
SDA      EQU     4                     ; RC4, data in/out
SCL      EQU     3                     ; RC3, serial clock
;SDA     EQU     6
;SCL     EQU     7
```

```
;
; mathlib.asm
; COPYRIGHT (C) MYTECH CORP. 1996, 1997
; 10-3-96 JJF
;

;--------------------------------------------
; Bin2BCD - This routine converts the 8bit  -
; binary value in W to a 3 digit BCD value  -
; in the registers MTEMP3:MTEMP2:MTEMP1.    -
; MTEMP1 is the least significant digit.    -
;--------------------------------------------
Bin2BCD
        clrf    MTEMP2
        clrf    MTEMP3
        movwf   MTEMP1
bin2bcdlbl1
        movlw   D'10'
        subwf   MTEMP1,W        ; MTEMP1 - 10
        btfss   STATUS,C
        goto    bin2bcdlbl2
        movwf   MTEMP1
        incf    MTEMP2
        goto    bin2bcdlbl1
bin2bcdlbl2
        movlw   D'10'
        subwf   MTEMP2,W        ; MTEMP2 - 10
        btfss   STATUS,C
        goto    bin2bcdlbl3
        movwf   MTEMP2
        incf    MTEMP3
        goto    bin2bcdlbl2
bin2bcdlbl3
        retlw   0
```

```
;----------------------------------------
; filter.asm -
; COPYRIGHT (C) MYTECH CORP. 1996, 1997
;----------------------------------------
;----------------------------------------
; genlp - generic lowpass filter
; Inputs: FSR - points to low byte of
;               filter state
;         FCOUNT - divide count which
;                  sets the corner freq
;                  values are 1-7.
;         TEMP9:TEMP7 - 16bit input sample
;
; corner frequency is approximately:
;         (fs/2pi)*ln(2^FCOUNT/(2^FCOUNT-1))
;----------------------------------------
genlp
        movf    INDF,W
        movwf   TEMPLO
        incf    FSR,F           ; point to high byte
        movf    INDF,W
        decf    FSR,F           ; return pointer to low byte
        movwf   TEMPHI
        comf    TEMPLO,F
        incf    TEMPLO,F
        btfsc   STATUS,Z
        decf    TEMPHI,F
        comf    TEMPHI,F        ; -lpstate
        movf    TEMP7,W
        addwf   TEMPLO,F
        btfsc   STATUS,C
        incf    TEMPHI,F
        movf    TEMP9,W
        addwf   TEMPHI,F        ; TEMPHI:TEMPLO has input - lpstate movlw   high    genlploop
        movwf   PCLATH
genlploop
        rlf     TEMPHI,W
        rrf     TEMPHI,F
        rrf     TEMPLO,F decfsz  FCOUNT,F
        goto    genlploop movf    TEMPLO,W
        addwf   INDF,F
        incf    FSR,F           ; point to high byte
        btfsc   STATUS,C
        incf    INDF,F
        movf    TEMPHI,W
        addwf   INDF,F          ; lpstate is updated to
                                ; lps[n] = x[n] + (x[n] - lps[n-1]/(FCOUNT+1))

return

;----------------------------------------
; highpass -                            -
; Input: ADVAL - 8bit input sample      -
; Output: TEMPHI:TEMPLO 16 output       -
;----------------------------------------
; This filter is implemented by first   -
```

-83-

```
; computing the lowpass of the input    -
; sample and then computing the output -
; via input-lowpass(input)              -
; we remove the dither term as well     -
;----------------------------------------
highpass        macro
        ; TEMP9 already contains the raw us doppler signal
        ; just place the dither term in TEMP7
        movlw   H'a0'
        movwf   TEMP7 movlw   high    genlp
        movwf   PCLATH
        movf    FSR,W
        movwf   TMPFSR
        movlw   2
        movwf   FCOUNT
        movlw   AD1LPLO
        movwf   FSR
        call    genlp           ; lowpass(ADVAL) in AD1LPHI:AD1LPLO
        movf    TMPFSR,W
        movwf   FSR ;----------------------------------------
        ; calculate ADVAL - lowpass(ADVAL)   -
        ;----------------------------------------
        movf    AD1LPHI,W
        movwf   TEMPHI
        movf    AD1LPLO,W
        movwf   TEMPLO
        comf    TEMPLO,F        ; negate ad1lp
        incf    TEMPLO,F
        btfsc   STATUS,Z        ; zero bit
        decf    TEMPHI,F
        comf    TEMPHI,F        ; -ad1lp in TEMPHI, TEMPLO
        movf    TEMP9,W
        addwf   TEMPHI,F        ; ad1-ad1lp in TEMPHI, TEMPLO endm
;       return ;--------------------------------------------------
; bpf - the appropriate filter is chosen based -
; on the value of the 'carrier' flag, which is -
; set at compile time.                         -
;                                              -
; Inputs: TEMP8:TEMP6 - 16bit input sample     -
; Outputs: TEMPHI:TEMPLO - 16bit output sample -
;--------------------------------------------------
        if carrier==0
;--------------------------------------
; fc ~ 100                            -
; Direct Form II Implementation       -
;--------------------------------------
bpf
        rlf     TEMP8,W
        rrf     TEMP8,F
        rrf     TEMP6,F rlf     TEMP8,W
        rrf     TEMP8,F
        rrf     TEMP6,F
```

-84-

```
rlf     TEMP8,W
rrf     TEMP8,F
rrf     TEMP6,F comf    w2hi,F
comf    w2lo,F
incf    w2lo,F
btfsc   STATUS,Z
incf    w2hi,F          ; -w(n-2)

movf    w2lo,W
movwf   TEMPLO
movf    w2hi,W
movwf   TEMPHI          ; -w(n-2) in TEMP i16lsr  w2hi,w2lo       ; 1/2
movf    w2lo,W
movwf   TEMP7
movf    w2hi,W
movwf   TEMP9           ; T9-7 = -1/2w(n-2)

i16lsr  w2hi,w2lo       ; 1/4
i16lsr  w2hi,w2lo       ; 1/8
movf    w2lo,W
addwf   TEMP7,F
btfsc   STATUS,C
incf    TEMP9,F
movf    w2hi,W
addwf   TEMP9,F         ; T9-7 = -w(n-2)(1/2+1/8)

i16lsr  w2hi,w2lo       ; 1/16
movf    w2lo,W
addwf   TEMP7,F
btfsc   STATUS,C
incf    TEMP9,F
movf    w2hi,W
addwf   TEMP9,F         ; T9-7 = -w(n-2)(1/2+1/8+1/16)

movf    w1hi,W          ; shift state memory
movwf   w2hi
movf    w1lo,W
movwf   w2lo movf    w1lo,W
addwf   TEMP7,F
btfsc   STATUS,C
incf    TEMP9,F
movf    w1hi,W
addwf   TEMP9,F         ; T9-7 = (1)w(n-1)-w(n-2)(1/2+1/8+1/16)

i16lsr  w1hi,w1lo       ; 1/2w(n-1)
i16lsr  w1hi,w1lo       ; 1/4
movf    w1lo,W
addwf   TEMP7,F
btfsc   STATUS,C
incf    TEMP9,F
movf    w1hi,W
addwf   TEMP9,F         ; w(n-1)(1+1/4)-w(n-2)(...)
i16lsr  w1hi,w1lo       ; 1/8
movf    w1lo,W
addwf   TEMP7,F
```

-85-

```
        btfsc   STATUS,C
        incf    TEMP9,F
        movf    w1hi,W
        addwf   TEMP9,F         ; w(n-1)(1+1/4+1/8)-w(n-2)(...)

movf    TEMP6,W
        addwf   TEMP7,F
        btfsc   STATUS,C
        incf    TEMP9,F
        movf    TEMP8,W
        addwf   TEMP9,W         ; w(n)=x(n)+w(n-1)(...)-w(n-2)(...)
        movwf   w1hi
        movf    TEMP7,W
        movwf   w1lo movf    w1lo,W
        addwf   TEMPLO,F
        btfsc   STATUS,C
        incf    TEMPHI,F
        movf    w1hi,W
        addwf   TEMPHI,F        ; TEMP bcf     STATUS,C
        rlf     TEMPLO,F
        rlf     TEMPHI,F return
        endif                   ;25Khz bpf if carrier==1
;--------------------------------
; fc ~ 128                      -
; Direct Form II Implementation -
;--------------------------------
bpf
        rlf     TEMP8,W
        rrf     TEMP8,F
        rrf     TEMP6,F rlf     TEMP8,W
        rrf     TEMP8,F
        rrf     TEMP6,F rlf     TEMP8,W
        rrf     TEMP8,F
        rrf     TEMP6,F comf    w2hi,F
        comf    w2lo,F
        incf    w2lo,F
        btfsc   STATUS,Z
        incf    w2hi,F          ; -w(n-2)

movf    w2lo,W
        movwf   TEMPLO
        movf    w2hi,W
        movwf   TEMPHI          ; -w(n-2) in TEMP i16lsr  w2hi,w2lo       ; 1/2
        movf    w2lo,W
        movwf   TEMP7
        movf    w2hi,W
```

```
    movwf   TEMP9           ; T9-7 = -1/2w(n-2)

i16lsr  w2hi,w2lo       ; 1/4
    i16lsr  w2hi,w2lo       ; 1/8
    i16lsr  w2hi,w2lo       ; 1/16
    i16lsr  w2hi,w2lo       ; 1/32
    movf    w2lo,W
    addwf   TEMP7,F
    btfsc   STATUS,C
    incf    TEMP9,F
    movf    w2hi,W
    addwf   TEMP9,F         ; T9-7 = -w(n-2)(1/2+1/32)

i16lsr  w2hi,w2lo       ; 1/64
    movf    w2lo,W
    addwf   TEMP7,F
    btfsc   STATUS,C
    incf    TEMP9,F
    movf    w2hi,W
    addwf   TEMP9,F         ; T9-7 = -w(n-2)(1/2+1/32+1/64)

movf    w1hi,W          ; shift state memory
    movwf   w2hi
    movf    w1lo,W
    movwf   w2lo movf    w1lo,W
    addwf   TEMP7,F
    btfsc   STATUS,C
    incf    TEMP9,F
    movf    w1hi,W
    addwf   TEMP9,F         ; T9-7 = (1)w(n-1)-w(n-2)(1/2+1/32+1/64)

i16lsr  w1hi,w1lo       ; 1/2w(n-1)
    movf    w1lo,W
    addwf   TEMPLO,F
    btfsc   STATUS,C
    incf    TEMPHI,F
    movf    w1hi,W
    addwf   TEMPHI,F        ; TEMP = w(n-1)(1/2)-w(n-2)

i16lsr  w1hi,w1lo       ; 1/4
    i16lsr  w1hi,w1lo       ; 1/8
    movf    w1lo,W
    addwf   TEMP7,F
    btfsc   STATUS,C
    incf    TEMP9,F
    movf    w1hi,W
    addwf   TEMP9,F         ; w(n-1)(1+1/8)-w(n-2)(1/2+1/32+1/64)

movf    TEMP6,W
    addwf   TEMP7,F
    btfsc   STATUS,C
    incf    TEMP9,F
    movf    TEMP8,W
    addwf   TEMP9,W         ; w(n)=x(n)+w(n-1)(1+1/8)-w(n-2)(1/2+1/32+1/64)
    movwf   w1hi
    movwf   TEMP9
    movf    TEMP7,W
    movwf   w1lo i16lsr  TEMP9,TEMP7     ; w(n)(1/2)
```

-87-

```
        movf    TEMP7,W
        addwf   TEMPLO,F
        btfsc   STATUS,C
        incf    TEMPHI,F
        movf    TEMP9,W
        addwf   TEMPHI,F        ; TEMP = w(n)(1/2)+w(n-1)(1/2)-w(n-2)

bcf     STATUS,C
        rlf     TEMPLO,F
        rlf     TEMPHI,F return
        endif                   ; 32Khz bpf if carrier==2
;--------------------------------
; fc ~ 160                       -
; Direct Form II Implementation -
;--------------------------------
bpf
        rlf     TEMP8,W
        rrf     TEMP8,F
        rrf     TEMP6,F rlf     TEMP8,W
        rrf     TEMP8,F
        rrf     TEMP6,F rlf     TEMP8,W
        rrf     TEMP8,F
        rrf     TEMP6,F comf    w2hi,F
        comf    w2lo,F
        incf    w2lo,F
        btfsc   STATUS,Z
        incf    w2hi,F           ; -w(n-2)

movf    w2lo,W
        movwf   TEMPLO
        movf    w2hi,W
        movwf   TEMPHI           ; -w(n-2) in TEMP i16lsr  w2hi,w2lo        ; 1/2
        movf    w2lo,W
        movwf   TEMP7
        movf    w2hi,W
        movwf   TEMP9            ; T9-7 = -1/2w(n-2)

i16lsr  w2hi,w2lo        ; 1/4
        movf    w2lo,W
        addwf   TEMP7,F
        btfsc   STATUS,C
        incf    TEMP9,F
        movf    w2hi,W
        addwf   TEMP9,F          ; T9-7 = -w(n-2)(1/2+1/4)

i16lsr  w2hi,w2lo        ; 1/8
        i16lsr  w2hi,w2lo        ; 1/16
        movf    w2lo,W
        addwf   TEMP7,F
        btfsc   STATUS,C
```

```
        incf    TEMP9,F
        movf    w2hi,W
        addwf   TEMP9,F         ; T9-7 = -w(n-2)(1/2+1/4+1/16)

movf    w1hi,W          ; shift state memory
        movwf   w2hi
        movf    w1lo,W
        movwf   w2lo movf    w1lo,W
        addwf   TEMP7,F
        btfsc   STATUS,C
        incf    TEMP9,F
        movf    w1hi,W
        addwf   TEMP9,F         ; T9-7 = (1)w(n-1)-w(n-2)(1/2+1/4+1/16)

i16lsr  w1hi,w1lo       ; 1/2w(n-1)
        movf    w1lo,W
        addwf   TEMPLO,F
        btfsc   STATUS,C
        incf    TEMPHI,F
        movf    w1hi,W
        addwf   TEMPHI,F        ; TEMP = w(n-1)(1/2)-w(n-2)

movf    TEMP6,W
        addwf   TEMP7,F
        btfsc   STATUS,C
        incf    TEMP9,F
        movf    TEMP8,W
        addwf   TEMP9,W         ; w(n)=x(n)+w(n-1)(1)-w(n-2)(1/2+1/4+1/16)
        movwf   w1hi
        movwf   TEMP9
        movf    TEMP7,W
        movwf   w1lo i16lsr  TEMP9,TEMP7     ; w(n)(1/2)
        movf    TEMP7,W
        addwf   TEMPLO,F
        btfsc   STATUS,C
        incf    TEMPHI,F
        movf    TEMP9,W
        addwf   TEMPHI,F        ; TEMP = w(n)(1/2)+w(n-1)(1/2)-w(n-2)

bcf     STATUS,C
        rlf     TEMPLO,F
        rlf     TEMPHI,F return
        endif                   ; 40Khz bpf
```

```
;
; ledtask.asm
; Copyright(C) 1996, 1997 Mytech
;
; the omni2 led task and flasher routines
; orig: jjf if useUS
; When the counter hits 0
; LEDTBL is "call'ed". LEDTBL uses the LEDST 4-7
; register to determine which led function to
; jump to. LEDST 0-3 are used by the led functions
; as state information.
LEDTASK
        movlw   high    endled
        movwf   PCLATH
        movf    CCNT0,W
        andlw   H'03'
        btfss   STATUS,Z            ; every 4ms
        goto    endled
        decf    LEDCNTR,F
        btfss   STATUS,Z            ; has task counter reached zero?
        goto    endled              ; no, skip the rest.
        movlw   high    LEDTBL
        movwf   PCLATH
        call    LEDTBL
endled
        return
LEDTBL
        ; bits 0-3 of LEDSELECT are LED 'function ptr'
        movlw   high    LEDTBLJMP
        movwf   PCLATH
        movlw   003h
        andwf   LEDSELECT,W
        movwf   TEMPLO
        bcf     STATUS,C
        rlf     TEMPLO,F
        bcf     STATUS,C
        rlf     TEMPLO,W
        addlw   low     LEDTBLJMP
        btfsc   STATUS,C
        incf    PCLATH,F
        movwf   PCL
LEDTBLJMP
        movlw   high    sglflash
        movwf   PCLATH
        goto    sglflash
        nop
        movlw   high    nullflash
        movwf   PCLATH
        goto    nullflash
        nop
        movlw   high    statusled
        movwf   PCLATH
        goto    statusled
        nop
;       movlw   high    contflash1
;       movwf   PCLATH
;       goto    contflash1
;       nop
        retlw   0ffh
initnullflash
```

```
        movlw   H'40'
        movwf   LEDCNTR
        movlw   H'01'
        movwf   LEDSELECT
        clrf    LEDST
        bsf     SBITS,2         ; schedule LED task
        bcf     PORTB,1         ; turn LED off
        return
nullflash
        clrf    LEDST
        clrf    LEDSELECT
        clrf    LEDCNTR
        bcf     SBITS,2
        bcf     PORTB,1
        return
sglflash
; the state of the single flash led is held in bit 0 of LEDST.
; 0: initial dead spot for relay
; 1: on
        btfsc   LEDST,0         ; what state are we in?
        goto    sgfstop         ; just finished state 1, so stop
        movlw   080h            ; just finished state 0, need to
        movwf   LEDCNTR         ; set 'on' time
        bsf     PORTB,1         ; turn LED on
        bsf     LEDST,0
        return
sgfstop
        bcf     SBITS,2         ; unschedule LED task
        clrf    LEDST
        clrf    LEDCNTR
        clrf    LEDSELECT
        bcf     PORTB,1         ; turn LED off
        return
initsgf
        btfsc   SBITS,2         ; if led is already running just return
        return
        movlw   H'00'           ; set LED task to state 0(off)
        movwf   LEDST
        clrf    LEDSELECT       ; set function 0 (single flash)
        movlw   32h             ; set initial 100ms dead time
        movwf   LEDCNTR
        bsf     SBITS,2         ; schedule LED task
        bcf     PORTB,1         ; turn LED off
        return if 0 contflash1
; continuous on-off using 512ms ticks
; 0: led off
; 1: led on
        btfsc   LEDST,0         ; what state are we in?
        goto    cf1down         ; just finished state 1, so back to 0
        movlw   0ffh            ; just finished state 0, need to
        movwf   LEDCNTR         ; set 'on' time
        bsf     PORTB,1         ; turn LED on
        bsf     LEDST,0         ; set state to '1'
        return
cf1down
        movlw   0ffh            ;
        movwf   LEDCNTR
        bcf     PORTB,1         ; turn LED off
```

-91-

```
           clrf    LEDST           ; set state to '0'
           return
initcf1
           movlw   0ffh            ; set initial time
           movwf   LEDCNTR
           bsf     SBITS,2         ; schedule LED task
           bcf     PORTB,1         ; turn LED off
           movlw   H'00'           ; set LED task to state 0(off)
           movwf   LEDST
           movlw   H'03'
           movwf   LEDSELECT       ; set 'func ptr': 1 (continuous 512ms flash)
           return endif statusled
           movlw   high    statusledjmp
           movwf   PCLATH
           movlw   H'03'
           andwf   LEDST,W
           movwf   TEMP6
           bcf     STATUS,C
           rlf     TEMP6,F
           bcf     STATUS,C
           rlf     TEMP6,W
           addlw   statusledjmp
           btfsc   STATUS,C
           incf    PCLATH,F
           movwf   PCL
statusledjmp
           movlw   high    statusled0
           movwf   PCLATH
           goto    statusled0
           nop
           movlw   high    statusled1
           movwf   PCLATH
           goto    statusled1
           nop
           movlw   high    statusled2
           movwf   PCLATH
           goto    statusled2
           nop
           movlw   high    statusled3
           movwf   PCLATH
           goto    statusled3
statusled0
           bsf     PORTB,1         ; turn on led
           bsf     LEDST,0         ; set state to 1
           movlw   H'80'           ; load the led task
           usePage1
           btfss   STATWORD,0      ; counter based on
           movlw   H'20'           ; the value of the bit
           usePage0
           movwf   LEDCNTR         ; being displayed
           return
statusled1
           bcf     PORTB,1         ; turn off led
           bcf     LEDST,0
           bsf     LEDST,1         ; set state to 2
           movlw   H'40'
           movwf   LEDCNTR         ; load cntr with postamble time
           return
```

-92-

```
statusled2
        ;
        usePage1
        movlw   H'07';          ; mask off upper 5 bits
        andwf   STATCNTL,W      ; to see if more bits
        usePage0
        movwf   TEMP6
        movlw   high    statusledmore
        movwf   PCLATH
        decfsz  TEMP6           ; did we reach zero
        goto    statusledmore   ; no
        ; we reached zero,
        usePage0
        clrf    LEDST
        clrf    LEDCNTR
        clrf    LEDSELECT
        bcf     SBITS,2
        bcf     PORTB,1
        usePage1
        bcf     STATCNTL,7
        usePage0
        return
statusled3
        ; this is a dummy state, we'll handle large digit count msg's here
        usePage0
        bsf     LEDST,0         ; set state to 3
        return
statusledmore
        usePage1
        movlw   H'f8'           ; mask off low 3 bits
        andwf   STATCNTL,F
        usePage0
        movlw   H'7'            ; don't forget to put updated count in cntl reg
        andwf   TEMP6,W
        usePage1
        iorwf   STATCNTL,F      ; 'or' in the cnt...preserve upper 5 bits
        usePage0
        bcf     STATUS,C
        usePage1
        rrf     STATWORD,F      ; roll the new bit
        usePage0
statusledinit
        movlw   H'80'
        movwf   LEDCNTR         ; load cntr with preamble time
        bcf     PORTB,1
        bsf     SBITS,2
        clrf    LEDST           ; set state to 0
        movlw   H'02'
        movwf   LEDSELECT
        usePage1
        bsf     STATCNTL,7      ; set status-in-process flag
        usePage0
        return
        #endif if     useIR
gLEDTASK
        usePage0
        movlw   high    endgled
        movwf   PCLATH
        movf    CCNT0,W
        addlw   2               ; time slice offset
```

-93-

```
                andlw   H'03'
                btfss   STATUS,Z        ; every 4ms
                goto    endgled decf    gLEDCNTR,F
                btfss   STATUS,Z        ; has task counter reached zero?
                goto    endgled         ; no, skip the rest.
                movlw   high    gLEDTBL
                movwf   PCLATH
                call    gLEDTBL
        endgled
                return
        gLEDTBL
                ; bits 0-3 of gLEDSELECT are LED 'function ptr'
                movlw   00fh
                andwf   gLEDSELECT,W
                addwf   PCL
                goto    gmfflash
        ;       goto    contflash1
        ;       goto    pflash1
        ;       goto    pflash2
        gmfflash
        ; the state of the single flash led is held in bit 0 of LEDST.
        ; 0: initial dead spot for relay
        ; 1: on
                btfsc   gLEDST,0        ; what state are we in?
                goto    gmfstop         ; just finished state 1, so stop
                movlw   0ffh            ; just finished state 0, need to
                movwf   gLEDCNTR        ; set 'on' time
                movlw   H'0ef'
                andwf   PORTA,F
        ;       bsf     PORTA,4         ; turn LED on
                bsf     gLEDST,0
                return
        gmfstop
                bcf     CBITS3,7        ; unschedule LED task
                clrf    gLEDST
                clrf    gLEDCNTR
                clrf    gLEDSELECT
                movlw   H'010'
                iorwf   PORTA,F
        ;       bcf     PORTA,4         ; turn LED off
                return
        initgmf
                btfsc   CBITS3,7        ; if led is already running just return
                return
                movlw   H'00'           ; set LED task to state 0(off)
                movwf   gLEDST
                clrf    gLEDSELECT      ; set function 0 (single flash)
                movlw   02h             ; set initial 100ms dead time
                movwf   gLEDCNTR
                bsf     CBITS3,7        ; schedule LED task
                movlw   H'010'
                iorwf   PORTA,F
        ;       bcf     PORTA,4         ; turn LED off
                return
                #endif
```

-94-

```
;
; relaytsk.asm
; COPYRIGHT (C) MYTECH CORP. 1996, 1997

; relaytask -
; This task is called once every second. It handles
; the countdown timer for the relay.
relaytask
          movlw    high     endrelay
          movwf    PCLATH movlw    01
          subwf    relaylo,F
          btfss    STATUS,C
          decf     relayhi,F
          movf     relaylo,W
          iorwf    relayhi,W       ; if relayhi&relaylo are both zero
          btfss    STATUS,Z        ; then the counter has just timed out.
          goto     endrelay
          ; The relay counter has just reached zero
          ; turn off the lights and set appropriate flags.
reloff    bcf      Occupied        ; occupied bits off
          bcf      RelayEnable     ; lights off for less than x sec
          bcf      SBITS,3         ; disable this task clrf     LOFFTIMELO
          clrf     LOFFTIMEHI bsf      Suppress        ; enable suppress task
          ; we need a mechanism to switch between 2 values
          movlw    H'08'           ; this gives ~3/8 sec US blindspot
          ;movlw   H'17'           ; this gives ~3sec IR blindspot
          movwf    sprscnt bcf      Relay           ; relay off
          bcf      DLCRelay        ; dlc relay off if ADAPT==1
          movlw    high     endrelay
          movwf    PCLATH
          btfss    ASAEnable
          goto     endrelay movlw    high     endrelayfalseon
          movwf    PCLATH
          ; check to see if lights were only on for around the amount
          ; of time the pot is set for. by definition, LONTIME>=TMRPOT
          movf     LONTIMELO,W
          movwf    TEMP7
          movf     LONTIMEHI,W
          movwf    TEMP9
          movf     TMRPOTLO,W
          subwf    TEMP7,F         ; lobyte[LONTIMELO - TMRPOTLO]
          btfss    STATUS,C        ; did the subtract borrow?
          decf     TEMP9,F         ; yes
          movf     TMRPOTHI,W
          subwf    TEMP9,F         ; hibyte[LONTIMEHI [- 1] - TMRPOTHI]
          btfss    STATUS,Z        ; if the high byte isn't zero
          goto     endrelayfalseon ; then LONTIME>TMRPOT+8 for sure.
          movlw    H'f8'
          andwf    TEMP7,W         ; is the difference>=8?
          btfss    STATUS,Z
```

```
        goto    endrelayfalseon ; yes?
        ; The lights were on for less than 8 seconds more than the
        ; timer pot setting. This is very likely indicative of a
        ; false trip. The sensitivity should be reduced.
        btfsc   InstallerTestMode       ; if in test mode, no false-on
        goto    endrelayfalseon
        movf    mcntlo,W
        addlw   2
        movwf   FONREF
        bsf     SBITS,6         ; schedule false trip correction
        movlw   high    endrelay
        movwf   PCLATH
        goto    endrelay
endrelayfalseon
        ;----------------------------------------------------------
        ; this was not a false on, so we need to look at the min  -
        ; motion pulse while the lights were on. If it was        -
        ; sufficiently large we can back off the sensitivity.     -
        ;----------------------------------------------------------
        usePage1
        movlw   high    endrelay
        movwf   PCLATH
        btfss   usminpulse,6    ; is it greater than 40h?
        goto    endrelay        ; no, so don't adjust.
        usePage0
        decf    usonadj,F       ; just down by 1 for now.
        endif
endrelay
        usePage0
        movf    usoffgain,W
        movwf   usgain
        return turnOnLights
        btfss   RelayEnable     ; is the relay enabled?
        return                  ; nope...

movlw   high    setrelay
        movwf   PCLATH
        call    setrelay        ; note that if the lights are already
                                ; on, this will simply reset the timer.

bsf     Occupied        ; set occupied bit clrf    LONTIMELO
        clrf    LONTIMEHI
        clrf    timesincemotlo
        clrf    timesincemothi if ADAPT==1
                ; we need to determine which technology was most
                ; dominant on the motion hit. in a tie, choose
                ; us since it is naturally dominant. One or both
                ; of irdecision and usdecision will be >0.
                bsf     CBITS2,0        ; choose us dominant
                btfsc   pirdecision,7   ; is irdecision >0?
                goto    turnonlbl1      ; no, so it must be us
                bcf     CBITS2,0        ; choose ir dominant
                btfsc   usdecision,7    ; is usdecision>0?
                goto    turnonlbl1      ; no, so it must be ir
                ; they're both>0 so compare to find greatest
                movf    usdecision,W
```

```
                    subwf   pirdecision,W    ; ir - us
                    btfsc   STATUS,Z         ; are they equal?
                    goto    turnonlbl1       ; yes.
                    btfss   STATUS,C         ; is us>ir
                    bsf     CBITS2,0         ; yes.
turnonlbl1
                    ; now save the appropriate quantity from the
                    ; dominant technology sensor
                    movf    usdecision,W
                    btfss   CBITS2,0
                    movf    pirdecision,W
                    usePage1
                    movwf   dominantTech
                    usePage0

; do the check for a possible false-off
                    movlw   high    fshut
                    movwf   PCLATH btfss   ASAEnable
                    goto    fshut movlw   high    nofshut
                    movwf   PCLATH
                    movf    LOFFTIMEHI,F     ; the high byte must be zero
                    btfss   STATUS,Z
                    goto    nofshut
                    movlw   H'0f'            ; 15sec
                    subwf   LOFFTIMELO,W     ; w = lofftimelo - 15s
                    btfsc   STATUS,C         ; if borrow, run false shut-off correction
                    goto    nofshut          ; no borrow.
                    ; we now need to handle the situation of the
                    ; lights going out and false-on correction getting
                    ; scheduled, then the lights being turned on
                    ; immediately and false-off correction being scheduled
                    ; To handle this, false-on correction is delayed for
                    ; up to 2 minutes. If a false-off is detected AND
                    ; false-on correction is currently scheduled, false-off
                    ; correction wins the contradiction.
                    movlw   high    fshut
                    movwf   PCLATH
                    btfsc   InstallerTestMode     ; if in test mode, no false-off
                    goto    fshut
                    bsf     SBITS,5
                    btfss   SBITS,6          ; is false-on correction scheduled?
                    goto    fshut            ; no
                    ; false-on correction is scheduled...unschedule it.
                    clrf    FONREF
                    bcf     SBITS,6
                    goto    fshut
nofshut
                    ;--------------------------------------------------
                    ; false shut-off correction is not necessary. We   -
                    ; need to determine if an adjustment to the ir     -
                    ; threshold is necessary. We look at the ir noise  -
                    ; estimate. If it is sufficiently small then we can -
                    ; lower the threshold(increase sensitivity).       -
                    ;--------------------------------------------------
                    movlw   high    fshut
                    movwf   PCLATH
                    usePage1
                    comf    irNoiseEst,W
```

-97-

```
                addlw    1              ; -noise estimate in W
                andlw    H'f0'          ; is it greater than 15 below threshold?
                btfsc    STATUS,Z       ; if 'and' is 0, then noise is too large
                goto     fshut          ; noise estimate too large!
                usePage0
                decf     iroffadj,F     ; reduce threshold=increase sensitivity
fshut
        endif
        usePage1
        movlw    H'7f'
        movwf    usminpulse     ; init to max value
        usePage0 return
;
; setrelay will set the relay task counter to count
; down from the proper number of 1s ticks. The
; counter is derived from secondcnt which increments
; every 1s (CCNT0 increments every 1ms).
setrelay
        btfss    RelayEnable    ; if the relay is enabled, turn on lights
        return                  ; otherwise forget about it.
srdoit  ; (re)load the relay countdown timer
        ; If less than 4 minutes since power on, timeout
        ; is 2 minutes, unless the timer pot is set at
        ; min in which case the timeout is 8 seconds
        ; for 1hr OR until the pot is moved away from min.
        ; Otherwise the min timeout is 8 minutes.
        ; When 8 second min timeout is being used, no timer
        ; adjustment is applied. This setting is usually
        ; indicative of some kind of test mode.
        btfss    InstallerTestMode
        goto     srnotitm
        ; we are in installer test mode, use 8 sec timeout
sruse8secmin
        movlw    H'08'          ; 8 second min timeout
        movwf    relaylo
        clrf     relayhi
        movlw    high    setrelaylbl2
        movwf    PCLATH
        goto     setrelaylbl2
srnotitm
        btfsc    FourMinOnBit
        goto     sruse8minutemin ; use normal 8 minute timeout
        movlw    H'78'          ; setup for 2 min timeout
        movwf    relaylo
        clrf     relayhi
        movlw    high    sraddadj
        movwf    PCLATH
        goto     sraddadj
sruse8minutemin
        movlw    H'e0'          ; 8 minute min timeout
        movwf    relaylo
        movlw    H'01'
        movwf    relayhi
sraddadj
        movf     timeradjlo,W   ; add any timer adjustment
        addwf    relaylo,F
        btfsc    STATUS,C
        incf     relayhi,F
        movf     timeradjhi,W
        addwf    relayhi,F
```

-98-

```
setrelaylbl2
        ; turn on the relay if it isn't already on
        btfss   Relay
        bsf     Relay ; we need to add the check for daylight control
        ; should check LightLevel
        btfss   DLCRelay
        bsf     DLCRelay movf    usongain,W
        movwf   usgain ; if the lights are just being turned on, then
        ; there is some bookkeeping we want to do
        btfsc   Occupied        ; are lights already on?
        return                  ; yes, so skip the rest bsf     Occupied
        bsf     SBITS,3         ; enable the relay countdown task return if 0
;
; setrelay will set the relay task counter to count
; down from the proper number of 1s ticks. The
; counter is derived from secondcnt which increments
; every 1s (CCNT0 increments every 1ms).
setrelay
        btfss   RelayEnable     ; if the relay is enabled, turn on lights
        return                  ; otherwise forget about it.
srdoit
        ; (re)load the relay countdown timer
        ; if less than 60 minutes since power on, timeout
        ; is 2 minutes, unless the timer pot is set at min in
        ; which case the min timeout is 8 seconds; otherwise
        ; the min timeout is 8 minutes.
        ; When 8 second min timeout is being used, no timer
        ; adjustment is applied. This setting is usually
        ; indicative of some kind of test mode.
        btfsc   SixtyMinOnBit
        goto    sruse8minutemin ; use normal 8 minute timeout
        movf    TMRPOTHI,W
        iorwf   TMRPOTLO,W
        btfsc   STATUS,Z        ; if both zero, then 'or' is zero
        goto    sruse8secmin
        movlw   H'78'           ; setup for 2 min timeout
        movwf   relaylo
        clrf    relayhi
        movlw   high    sraddadj
        movwf   PCLATH
        goto    sraddadj
sruse8secmin
        movlw   H'08'           ; 8 second min timeout
        movwf   relaylo
        clrf    relayhi
        movlw   high    setrelaylbl2
        movwf   PCLATH
        goto    setrelaylbl2
```

```
sruse8minutemin
        movlw   H'e0'           ; 8 minute min timeout
        movwf   relaylo
        movlw   H'01'
        movwf   relayhi
sraddadj
        movf    timeradjlo,W    ; add any timer adjustment
        addwf   relaylo,F
        btfsc   STATUS,C
        incf    relayhi,F
        movf    timeradjhi,W
        addwf   relayhi,F
setrelaylbl2
        ; turn on the relay if it isn't already on
        btfss   PORTB,2
        bsf     PORTB,2 movf    usongain,W
        movwf   usgain

; if the lights are just being turned on, then
        ; there is some bookkeeping we want to do
        btfsc   Occupied        ; are lights already on?
        return                  ; yes, so skip the rest bsf     Occupied
        bsf     SBITS,3         ; enable the relay countdown task return endif ; suppress -
; This task is called at a 1ms rate. It handles the timed
; process of disabling the relay for a given period. When
; the timer reaches zero, the relay is enabled once again.
suppress
        movlw   high    endsuppress
        movwf   PCLATH movf    CCNT0,W
        andlw   H'7f'           ; do it every 128ms
        btfss   STATUS,Z
        goto    endsuppress decfsz  sprscnt,F
        goto    endsuppress
        bsf     RelayEnable     ; un-suppress relay
        bcf     Suppress        ; disable this task endsuppress
        return
```

```
;**********************************************************
; o2eeprom.asm
;
; Omni II E2BUF routines
;
; 8-16-96 JJF
;
; Portions from Microchip Example code
;**********************************************************
;**********************************************************
; in our application the slave address is always the same
; so we can save that register.
#define SLAVE   B'10100000'
;**********************************************************
E2Init   macro clrf    E2FLAG
         clrf    E2ERR
         movlw   B'00111011'    ; I2C master mode enabled
         movwf   SSPCON usePage1
         movf    PIE1,W
         andlw   B'11000111'    ; disable SSP interrupt & SPI INT's
         movwf   PIE1
         usePage0 movf    PORTC,W
         andlw   B'11100111'
;        andlw   B'00111111'
         movwf   PORTC          ; Set SCL & SDA to low when not tri-stated usePage1
         movf    TRISC,W
         iorlw   B'11011000'
;        iorlw   B'11000000'    ; tristate the SCL and SDA
         movwf   TRISC
         usePage0 endm

E2WriteValue    macro   address,value
         movlw   address
         movwf   E2ADDR
         movlw   value
         movwf   DATAO
         clrf    E2ERR
         bsf     EEPROMWTASK
         btfsc   EEPROMWTASK
         goto    $ - 1
         endm E2WriteReg macro         addr,reg
         movlw   addr
         movwf   E2ADDR
         movf    reg,W
         movwf   DATAO
         clrf    E2ERR
         bsf     EEPROMWTASK
         btfsc   EEPROMWTASK
         goto    $ - 1
         endm
```

```
E2WriteRegIndirect macro        addrreg,reg
        movf    addrreg,W
        movwf   E2ADDR
        movf    reg,W
        movwf   DATAO
        clrf    E2ERR
        bsf     EEPROMWTASK
        btfsc   EEPROMWTASK
        goto    $ - 1
        endm E2Read  macro   address
        movlw   address
        movwf   E2ADDR
        clrf    E2ERR
        bsf     EEPROMRTASK
        btfsc   EEPROMRTASK
        goto    $ - 1
        endm
E2ReadIndirect macro    address
        movf    address,W
        movwf   E2ADDR
        clrf    E2ERR
        bsf     EEPROMRTASK
        btfsc   EEPROMRTASK
        goto    $ - 1
        endm StoreVarsE2     macro
        usePage0

E2WriteReg      1,usonadj
        E2WriteReg      2,usoffadj
        E2WriteReg      3,iroffadj
        E2WriteReg      4,CCNT3
        clrw
        btfsc   CntrRollOver
        iorlw   H'01'                   ; bit 0 is cntrrollover bit
        btfsc   ASATimerReturn
        iorlw   H'02'                   ; bit 1 is asatimerreturn enable bit
        btfsc   ASATimerReturnState
        iorlw   H'04'                   ; bit 2 is asatimerreturnstate bit
        movwf   MTEMP
        E2WriteReg      5,MTEMP
        E2WriteReg      6,timeradjlo
        E2WriteReg      7,timeradjhi
        usePage1
        movf    timerLearnCoef,W
        usePage0
        movwf   MTEMP
        E2WriteReg      8,MTEMP endm ;-------------------------------------------------------------------------------
;       BYTE-WRITE, write one byte to EEPROM device
;-------------------------------------------------------------------------------
;       Input   :       DATAO   = data to be written
;                       ADDR    = EEPROM data address
;                       SLAVE   = device address (1010xxx0)
;       Output  :       Data written to EEPROM device
;-------------------------------------------------------------------------------
```

```
WRBYTE
        bcf      STATUS,RP0
;       movf     SLAVE,W          ; Put SLAVE address
        movlw    SLAVE
        movwf    TXBUF            ;  in xmit buffer
        call     BSTART           ; Generate START bit
        call     TX               ; Output SLAVE address
        bcf      STATUS,RP0
        movf     ADDR,W           ; Put WORD address
        movwf    TXBUF            ;  in xmit buffer
        call     TX               ; Output WORD address
        bcf      STATUS,RP0
        movf     DATAO,W          ; Move DATA
        movwf    TXBUF            ; into buffer
        call     TX               ; Output DATA and detect acknowledgement
        call     BSTOP            ; Generate STOP bit
        usePage0
        movlw    D'11'            ; setup 11ms delay after write
        addwf    CCNT0,W
        movwf    E2DLY
        bsf      E2FLAG,1         ; enable eeprom wait task
        return ;--------------------------------------------------------------------------
;       TRANSMIT 8 data bits subroutine
;--------------------------------------------------------------------------
;       Input    :       TXBUF
;       Output   :       Data transmitted to EEPROM device
;--------------------------------------------------------------------------
TX
        bcf      STATUS,RP0
        movlw    .8               ; Set counter for eight bits
        movwf    COUNT
TXLP
        bcf      EEPROM,DO        ; Default 0 bit out
        btfsc    TXBUF,7          ; If shifted bit = 0, data bit = 0
        bsf      EEPROM,DO        ;  otherwise data bit = 1
        movlw    high    BITOUT
        movwf    PCLATH
        call     BITOUT           ; Send bit
        bcf      STATUS,RP0
        rlf      TXBUF            ; Rotate TXBUF left
        skpc                      ; f(6) ---> f(7)
        bcf      TXBUF,0          ; f(7) ---> carry
        skpnc                     ; carry ---> f(0)
        bsf      TXBUF,0
        movlw    high    TXLP
        movwf    PCLATH
        decfsz   COUNT            ; 8 bits done?
        goto     TXLP             ; No.
        movlw    high    BITIN
        movwf    PCLATH
        call     BITIN            ; Read acknowledge bit
        bcf      STATUS,RP0
        movlw    high    ERR
        movwf    PCLATH
        movlw    3
        btfsc    EEPROM,DI        ; Check for acknowledgement
        call     ERR              ; No acknowledge from device
        bcf      STATUS,RP0
        retlw    0
```

```
;----------------------------------------------------------------
;       Single bit data transmit from PIC to serial EEPROM
;----------------------------------------------------------------
;       Input   :       EEPROM register, bit DO
;       Output  :       Bit transmitted over I2C
;                       Error bits set as necessary
;----------------------------------------------------------------
BITOUT
        movlw   high    BIT0
        movwf   PCLATH
        btfss   EEPROM,DO
        goto    BIT0
        bsf     STATUS,RP0
        bsf     TRISC,SDA       ; Output bit 0
        movlw   high    CLK1
        movwf   PCLATH
        movlw   2
        bcf     STATUS,RP0
        btfsc   PORTC,SDA       ; Check for error code 2
        goto    CLK1
        movlw   high    ERR
        movwf   PCLATH
        call    ERR
        movlw   high    CLK1
        movwf   PCLATH
        goto    CLK1            ; SDA locked low by device
BIT0
        bsf     STATUS,RP0
        bcf     TRISC,SDA       ; Output bit 0
        nop                     ; Delay
        nop
        nop
CLK1
        bsf     STATUS,RP0
        bsf     TRISC,SCL       ; Attempt to set SCL high
        movlw   high    BIT2
        movwf   PCLATH
        movlw   1               ; Error code 1
        bcf     STATUS,RP0
        btfsc   PORTC,SCL       ; SCL locked low?
        goto    BIT2            ; No.
        movlw   high    ERR
        movwf   PCLATH
        call    ERR             ; Yes, set error
BIT2
        nop                     ; Timing delay
        nop
        nop
        nop
        bsf     STATUS,RP0
        bcf     TRISC,SCL       ; Return SCL to low
        bcf     STATUS,RP0
        retlw   0

;----------------------------------------------------------------
;       BYTE-READ, read one byte from serial EEPROM device
;----------------------------------------------------------------
;       Input   :       ADDR    = source address
;                       SLAVE   = device address (1010xxx0)
;       Output  :       DATAI   = data read from serial EEPROM
```

```
;-----------------------------------------------------------------------
RDBYTE
        bcf     STATUS,RP0
;       movf    SLAVE,W         ; Move SLAVE address
        movlw   high    BSTART
        movwf   PCLATH
        movlw   SLAVE
        movwf   TXBUF           ;   into xmit buffer (R/W = 0)
        call    BSTART          ; Generate START bit
        movlw   high    TX
        movwf   PCLATH
        call    TX              ; Output SLAVE address. Check ACK.
        bcf     STATUS,RP0
        movf    ADDR,W          ; Move WORD address
        movwf   TXBUF           ;   into xmit buffer
        movlw   high    TX
        movwf   PCLATH
        call    TX              ; Output WORD address. Check ACK.
        movlw   high    BSTART
        movwf   PCLATH
        call    BSTART          ; START READ (if only one device is
        bcf     STATUS,RP0      ; connected to the I2C bus)
;       movf    SLAVE,W
        movlw   SLAVE
        movwf   TXBUF
        bsf     TXBUF,0         ; Specify READ mode (R/W = 1)
        movlw   high    TX
        movwf   PCLATH
        call    TX              ; Output SLAVE address
        movlw   high    RX
        movwf   PCLATH
        call    RX              ; READ in data and acknowledge
        movlw   high    BSTOP
        movwf   PCLATH
        call    BSTOP           ; Generate STOP bit
        bcf     STATUS,RP0
        movf    RXBUF,W         ; Save data from buffer
        movwf   DATAI           ; to DATAI file register.
        return ;-----------------------------------------------------------------------
;       RECEIVE eight data bits subroutine
;-----------------------------------------------------------------------
;       Input   :       None
;       Output  :       RXBUF = 8-bit data received
;-----------------------------------------------------------------------
RX
        bcf     STATUS,RP0
        movlw   .8              ; 8 bits of data
        movwf   COUNT
        clrf    RXBUF
;
RXLP
        rlf     RXBUF           ; Shift data to buffer
        skpc
        bcf     RXBUF,0         ; carry ---> f(0)
        skpnc
        bsf     RXBUF,0
        call    BITIN
        bcf     STATUS,RP0
        btfsc   EEPROM,DI
        bsf     RXBUF,0         ; Input bit =1
```

```
        decfsz  COUNT           ; 8 bits?
        goto    RXLP
        bsf     EEPROM,DO       ; Set acknowledge bit = 1
        call    BITOUT          ; to STOP further input
        retlw   0

;-------------------------------------------------------------------------------
;       Single bit receive from serial EEPROM to PIC
;-------------------------------------------------------------------------------
;       Input   :       None
;       Output  :       Data bit received
;-------------------------------------------------------------------------------
BITIN
        bsf     STATUS,RP0
        bsf     TRISC,SDA       ; Set SDA for input
        bcf     STATUS,RP0
        bcf     EEPROM,DI
        bsf     STATUS,RP0
        bsf     TRISC,SCL       ; Clock high
        movlw   high    BIT1
        movwf   PCLATH
        movlw   1
        bcf     STATUS,RP0
        btfsc   PORTC,SCL       ; Skip if SCL is high
        goto    BIT1
        movlw   high    ERR
        movwf   PCLATH
        call    ERR
BIT1
        movlw   high    ACKOK
        movwf   PCLATH
        bcf     STATUS,RP0
        btfss   PORTC,SDA       ; Read SDA pin, for ACK low
        goto    ACKOK
        bsf     EEPROM,DI       ; DI = 1
ACKOK
        bsf     STATUS,RP0
        nop                     ; Delay
        nop
        nop
        bcf     TRISC,SCL       ; Return SCL to low
        bcf     STATUS,RP0
        retlw   0

;-------------------------------------------------------------------------------
;       DELAY, Provide a 10.78mS delay
;-------------------------------------------------------------------------------
;       Input   :       None
;       Output  :       None
;-------------------------------------------------------------------------------
Delay
        bcf     STATUS,RP0
        movlw   7
        movwf   TEMP6
        clrf    TEMP7           ;clear last location
dly1
        nop
        movlw   high    dly1
        movwf   PCLATH
        decfsz  TEMP7           ;reduce count
        goto    dly1            ;Inner loop time = 1.54mS
        decfsz  TEMP6
```

```
        goto    dly1            ;Total time = 10.78mS
        retlw   0

;***********************************************************
;       DELAY, Provide a 10.78mS delay...11ms
;***********************************************************
E2Delay10ms
        movlw   D'11'
        addwf   CCNT0,W
        movwf   E2DLY
e2dly1
        movf    CCNT0,W
        subwf   E2DLY,W
        btfsc   STATUS,Z        ; is it exactly 11ms?
        goto    e2dlyend        ; yes
        btfsc   STATUS,C        ; did the subtract borrow (more than 11ms)
        goto    e2dly1          ; no...wait longer
e2dlyend
        return ;---------------------------------------------------------------
;       START bit generation routine
;---------------------------------------------------------------
;       input   : none
;       output  : initialize bus communication
;---------------------------------------------------------------
;
;Generate START bit (SCL is high while SDA goes from high to low transition)
;and check status of the serial clock.
BSTART
        bsf     STATUS,RP0
        bsf     TRISC,SDA       ; Make sure SDA is high
        bsf     TRISC,SCL       ; Set clock high
        movlw   1               ; Ready error status code 1
        bcf     STATUS,RP0
        btfss   PORTC,SCL       ; Locked?
        call    ERR             ; SCL locked low by device, flag error
        bsf     STATUS,RP0
        bcf     TRISC,SDA       ; SDA goes low during SCL high
        nop                     ; Timing adjustment, 1uS @4MHz
        nop
        nop
        bcf     TRISC,SCL       ; Start clock train
        bcf     STATUS,RP0
        RETLW   0

;---------------------------------------------------------------
;       STOP bit generation routine
;---------------------------------------------------------------
;       Input   :       None
;       Output  :       Bus communication, STOP condition
;---------------------------------------------------------------
;
;Generate STOP bit (SDA goes from low to high during SCL high state)
;and check bus conditions.
BSTOP
        bsf     STATUS,RP0
        bcf     TRISC,SDA       ; Return SDA to low
        bsf     TRISC,SCL       ; Set SCL high
        nop
        nop
        nop
```

-107-

```
        movlw   high    ERR
        movwf   PCLATH
        movlw   1                   ; Ready error code 1
        bcf     STATUS,RP0
        btfss   PORTC,SCL           ; High?
        call    ERR                 ; No, SCL locked low by device
        bsf     STATUS,RP0
        bsf     TRISC,SDA           ; SDA goes from low to high during SCL high
        movlw   high    ERR
        movwf   PCLATH
        movlw   4                   ; Ready error code 4
        btfss   TRISC,SDA           ; High?
        call    ERR                 ; No, SDA bus not release for STOP
        bcf     STATUS,RP0
        retlw   0

;-----------------------------------------------------------------------
;       Two wire/I2C - CPU communication error status table and subroutine
;-----------------------------------------------------------------------
; input  :       W-reg    = error code
; output :       ERCODE   = error code
;                FLAG(ERROR) = 1
;
;       code            error status mode
;       ----            -----------------
;         1     :       SCL locked low by device (bus is still busy)
;         2     :       SDA locked low by device (bus is still busy)
;         3     :       No acknowledge from device (no handshake)
;         4     :       SDA bus not released for master to generate STOP bit
;-----------------------------------------------------------------------
;
;Subroutine to identify the status of the serial clock (SCL) and serial data
;(SDA) condition according to the error status table. Codes generated are
;useful for bus/device diagnosis.
ERR
        bcf     STATUS,RP0
        btfss   FLAG,ERRORFLG       ; If not first error, do not change code
        movwf   ERCODE              ; Save error code
        bsf     FLAG,ERRORFLG       ; Set error flag
        retlw   0
```

```
;
; MUXtsk.asm
; Copyright(C) 1996, 1997 Mytech
;
; test code for the external mux
; modified by:jdw
;
;reads the PORTB latch and uses RB3 and RB4 to select
;a location to record an a/d conversion from RA1
;and a bit read from RC0
;RB4 \ RB3 \ a/d loc. \ bit loc.
; 0   \ 0   \ MUXpot0  \ MUXdip,0
; 0   \ 1   \ MUXpot1  \ MUXdip,1
; 1   \ 0   \ MUXpot2  \ MUXdip,2
; 1   \ 1   \ MUXpot3  \ MUXdip,3
; remember that the switches are electrically negative logic.
; we'll invert the logic when we read the switches.

runMUXT movlw   H'09'           ;Fosc(1/32)
        movwf   ADCON0          ;next reading will be RA1 clrf    TEMP8
        movf    PORTB,0         ;get RB3 and RB4
        andlw   H'18'
        movwf   TEMP8
        bcf     STATUS,C
        rrf     TEMP8,f
        bcf     STATUS,C
        rrf     TEMP8,f         ;look at current
        bcf     STATUS,C
        rrf     TEMP8,f         ;state of PortB latch convM   bsf     ADCON0,2        ;start A/D conversion
        movlw   high    waitM
        movf    PCLATH
waitM   btfsc   ADCON0,2
        goto    waitM           ; wait on GO/DONE bit
adM     movf    ADRES,W
        addlw   H'80'
        movwf   TEMP6 movlw   high    muxtblstart
        movwf   PCLATH bcf     STATUS,C
        rlf     TEMP8,F
        bcf     STATUS,C
        rlf     TEMP8,W         ; shift MUXclk up to jump 4 lines worth
        addlw   low     muxtblstart
        btfsc   STATUS,C
        incf    PCLATH,F
        movwf   PCL muxtblstart
        movlw   high    mux00
        movwf   PCLATH
        goto    mux00
        nop movlw   high    mux01
        movwf   PCLATH
        goto    mux01
```

```
              nop movlw    high     mux10
              movwf    PCLATH
              goto     mux10
              nop movlw    high     mux11
              movwf    PCLATH
              goto     mux11
              nop
MUXend
mux00
              movf     TEMP6,W       ; record case 0 info.
              movwf    TEMP7         ; us sensivity pot
              bcf      ASAEnable
              btfss    PORTC,0       ; invert switch logic
              bsf      ASAEnable
              bsf      PORTB,3       ; set input 01 on MUX
              bcf      PORTB,4

; we need to apply the square law adjustment
              ; to the us sensitivity setting.
              movlw    high     gainlookup
              movwf    PCLATH
              movlw    H'80'
              addwf    TEMP7,F       ; make pot reading unipolar
              bcf      STATUS,C
              rrf      TEMP7,F
              bcf      STATUS,C
              rrf      TEMP7,F
              bcf      STATUS,C
              rrf      TEMP7,F
              bcf      STATUS,C
              rrf      TEMP7,W
              movwf    usongain
              usePage1
              movwf    usPot
              usePage0
              call     gainlookup
              movwf    usongain
              btfsc    Occupied
              movwf    usgain if       useGSB==0
              movwf    usoffgain
              endif
              if       useGSB==1
              movlw    high     muxnogsb
              movwf    PCLATH
              btfss    GSBEnable     ; if gsb switch is turned off,
              goto     muxnogsb      ; then just set offgain to ongain ;------------------------------------------------
              ; otherwise we set offgain to .75 of ongain
              ; the motivation is to prevent hallway falsing
              ;------------------------------------------------
              bcf      STATUS,C
              rrf      usongain,W    ; 1/2 usongain in W
              movwf    usoffgain     ; 1/2 usongain in usoffgain
              bcf      STATUS,C
              rrf      usoffgain,W   ; 1/4 usongain in W
```

-110-

```
                    addwf    usoffgain,F      ; 3/4 usongain in usoffgain
                    movlw    high    muxgsbend
                    movwf    PCLATH
                    goto     muxgsbend
muxnogsb
                    ; gsb is disabled
                    movf     usongain,W
                    movwf    usoffgain
muxgsbend
                    ; be sure to set usgain properly
                    movf     usongain,W
                    btfsc    Occupied
                    movwf    usgain
                    movf     usoffgain,W
                    btfss    Occupied
                    movwf    usgain
            endif return mux01
            movf     TEMP6,W         ; record case 1 info.
            movwf    TEMP7           ; ir sensitivity pot
            bcf      ATAEnable
            btfss    PORTC,0         ; invert switch logic
            bsf      ATAEnable
            bcf      PORTB,3         ; set input 10 on MUX
            bsf      PORTB,4

; turn the pir sensitivity setting into
            ; a threshold.
            movlw    H'80'
            addwf    TEMP7,F         ; make pot reading unipolar
            movf     TEMP7,W
            usePage1
            movwf    pirPot
            rrf      pirPot,F
            rrf      pirPot,F
            rrf      pirPot,F
            rrf      pirPot,W
            andlw    H'0f'           ; mask off bits shifted in
            movwf    pirPot
            usePage0

;@@@@@ temp for pll testing
            ;        movf     TEMP7,W
            ;        movwf    lfdtemp
            ;@@@@@ comf     TEMP7,F         ; since the pot is a sensitivity
                                     ; setting, it is intuitive for a
                                     ; large setting to give greater
                                     ; range. However, a greater range
                                     ; is more consistent with a smaller
                                     ; threshold, so we use the complement
                                     ; of the pot setting as the threshold.
            bcf      STATUS,C
            rrf      TEMP7,W         ; /2
            movwf    PIRthresh
            movwf    TEMP7
            bcf      STATUS,C
            rrf      TEMP7,F         ; /4
```

-111-

```
            bcf         STATUS,C
            rrf         TEMP7,F         ; /8
            bcf         STATUS,C
            rrf         TEMP7,W         ; /16
            subwf       PIRthresh,F movlw       H'0f'           ; we add an offset to the threshold
            addwf       PIRthresh,F     ; to get past the noise floor.
            return
mux10
            movf        TEMP6,W         ; record case 2 info.
            movwf       TEMP7           ; timer pot
            bcf         GSBEnable
            btfss       PORTC,0         ; invert switch logic
            bsf         GSBEnable
            bsf         PORTB,3         ; set input 11 on MUX
            bsf         PORTB,4
            ; we need to scale the timer pot reading to
            ; 1 sec units. The raw reading is in 8sec units
            ; so shifting by 3 will be necessary.
            movlw       H'80'
            addwf       TEMP7,F         ; make pot reading unipolar
            movf        TEMP7,W
            movwf       TMRPOTLO
            clrf        TMRPOTHI
            bcf         STATUS,C
            rlf         TMRPOTLO,F
            rlf         TMRPOTHI,F
            bcf         STATUS,C
            rlf         TMRPOTLO,F
            rlf         TMRPOTHI,F
            bcf         STATUS,C
            rlf         TMRPOTLO,F
            rlf         TMRPOTHI,F
;           movlw       H'E0'           ; 8 minute(480 sec.) min.
;           addwf       TMRPOTLO,F
;           btfsc       STATUS,C
;           incf        TMRPOTHI,F
;           movlw       H'01'
;           addwf       TMRPOTHI,F
            ;----------------------------------------------
            ; This is where we determine test mode entry  -
            ; via timer pot setting.                      -
            ;----------------------------------------------
            movlw       high    tmrmux_notitm
            movwf       PCLATH
            btfss       InstallerTestMode   ; are we in installer test mode?
            goto        tmrmux_notitm       ; no
            ; we are in installer test mode
            movlw       H'fe'
            andwf       TEMP7,W         ; is new pot reading > 1?
            btfsc       STATUS,Z        ; not if 'and' is zero
            return
            ; the timer pot has been increased to > 1
            bcf         InstallerTestMode
            clrf        ITMClk
tmrmux_notitm
            ; we are not in installer test mode, should we be
            movlw       high    tmrmuxend
            movwf       PCLATH
            movlw       H'fe'
```

```
            andwf    lastTimer,W        ; is last timer > 1?
            btfsc    STATUS,Z           ; not if 'and' = 0
            goto     tmrmuxend          ; lastTimer <= 1
            movlw    H'fe'
            andwf    TEMP7,W            ; is new timer < 2
            btfss    STATUS,Z           ; yes if 'and' = 0
            goto     tmrmuxend          ; new timer >= 2
            bsf      InstallerTestMode
            clrf     ITMClk
tmrmuxend
            movf     TEMP7,W            ; new timer
            movwf    lastTimer
            return mux11
            movf     TEMP6,W            ; record case 3 info.
            movwf    LightLevel         ; muxpot3
            bcf      StrongAirCompensate
            btfss    PORTC,0            ; invert switch logic
            bsf      StrongAirCompensate
            bcf      PORTB,3            ; set input 00 on MUX
            bcf      PORTB,4
            return
```

```
; o2dtinit.asm
; COPYRIGHT (C) MYTECH CORP. 1996, 1997
; initialization and setup code for Omni II
setTrisRegs
        usePage1
        movlw   B'11111001'
        movwf   PORTC           ; set C1 & C2 to outputs; C3, C4, C1, C5,
                                ; C6 & C7 are set as inputs, setting C6 & 7 to output
s
                                ; causes USART to screw up on transmission movlw   0ebh            ; per mfg instructions, reset PORTA to all
        movwf   TRISA movlw   B'11000001'
        movwf   TRISB
        usePage0
        return o2init  macro
        usePage1
        bsf     H'8e',0         ; reset power on reset bit
        bsf     H'8e',1         ; reset brown out reset bit
        usePage0 clrf    INTCON
        bcf     INTCON,GIE      ; disable global interrupts clrf    PORTA           ; clear ports prior to setting direction
        clrf    PORTB
        clrf    PORTC usePage1
        clrf    OPTREG          ; clear OPTION register, tmr0src=fosc/4
        ; The prescaler has to be set according to the divisor needed
        ; to get the 1Khz sample rate.
        ; all carrier versions use a prescale of 16
        bsf     OPTREG,0        ; prescale set to 1:16
        bsf     OPTREG,1 bcf     OPTREG,3        ; assign prescaler to RTCC
        bsf     OPTREG,7        ; enable the weak pullups
        clrf    TRISB           ; clear register prior to setting direction
        clrf    TRISC
        clrf    TRISA movlw   high    setTrisRegs
        movwf   PCLATH
        call    setTrisRegs usePage0
        clrf    INTCON movlw   timvala         ; initialize RTCC
        movwf   RTCC movlw   99h             ; 1001 1001    enable ain3 a/d
        movwf   ADCON0 usePage1
        movlw   02h             ; 0000 0000    set ra0-ra3 analog, vref=VDD
```

-114-

```
            movwf   ADCON1 usePage0
            bcf     INTCON,GIE      ; disable global interrupts usePage1
            clrf    PIE1            ; disable peripheral interrupts
            clrf    PIE2            ; disable peripheral interrupts ; CCP setup
            usePage0
            movlw   H'04'
            movwf   T2CON usePage1
            movlw   tmr2val
            movwf   PR2 usePage0
            movlw   H'0c'
            movwf   CCP1CON
            movlw   tmr2val
            movwf   TEMPLO
            bcf     STATUS,C
            rrf     TEMPLO,W
            movwf   CCPR1L
            clrf    CCPR1H movlw   H'0c'
            movwf   CCP2CON
;           movlw   H'02'           ; this is the falling edge of the
            movlw   H'15'
            movwf   CCPR2L          ; sample pulse. (was 02h for omni 1)
            clrf    CCPR2H          ; 0x37 was determined by experimentation ;-------------------
            E2Init                  ; eeprom init
;           #if     0
            usePage1
            ; serial port setup stuff
;           movlw   H'3f'           ; 9600 baud @9.8304Mhz
            movlw   H'0f'
            movwf   SPBRG
;           movlw   b'10100100'     ;Async, High baud rate
            movlw   B'10100000'
            movwf   TXSTA
            usePage0
            movlw   b'10000000'     ;Enable serial port
            movwf   RCSTA
            ; end serial port setup
;           endif ;stck
;           movlw   0ffh            ; initialize FSR to end of page 1 SRAM
;           movwf   FSR             ; This will be our stack. Stay above B0h.

;           usePage0
;           movlw   H'5f'
;           movwf   H'7f'
            movlw   H'20'
            movwf   FSR
```

-115-

```
                movlw   high    initloop
                movwf   PCLATH
        initloop
                clrf    INDF
                incf    FSR,F
                btfss   FSR,7
                goto    initloop movlw   01h
                movwf   PORTB movlw   80h
                movwf   ADRES movlw   0ffh
                movwf   usgain
                movwf   usongain
                movwf   usoffgain
        ;       clrf    usoffadj
        ;       clrf    usonadj
        ;       clrf    iroffadj
        ;       clrf    uspscnt
        ;       clrf    irpscnt ;       clrf    LONTIMEHI
        ;       clrf    LONTIMELO
        ;       clrf    LOFFTIMEHI
        ;       clrf    LOFFTIMELO movlw   H'03'
                movwf   SECONDrefhi
                movlw   H'e8'
                movwf   SECONDreflo     ; 3e8h is 1000 movlw   D'60'
                movwf   mcntref
        ;       clrf    mcntlo
        ;       clrf    mcnthi ;       clrf    SBITS
        ;       bcf     SBITS,2         ; disable LED (for test/debug)
        ;       bcf     SBITS,4
        ;       bcf     SBITS,5
        ;       bcf     SBITS,6

;       clrf    CCNT0
        ;       clrf    CCNT1
        ;       clrf    CCNT2
        ;       clrf    CCNT3

;       clrf    CBITS1
        ;       clrf    CBITS2
        ;       clrf    CBITS3
        ;       bsf     CBITS2,7        ; high gain mode
                bsf     CBITS2,0        ; set US dominant by default ;       clrf    avgturnon
        ;       movlw   H'd0' usePage1
        ;       movlw   H'ff'
        ;       movwf   avgtimesincemot ; this inits the avgtime to over 4min
```

-116-

```
;       clrf    timesincemotlo
;       clrf    timesincemothi
        clrf    FONCNT
        clrf    FOFFCNT
        clrf    uspulsecnt0
        clrf    uspulsecnt1
        clrf    uspulsemax
        movlw   H'7f'
        movwf   usminpulse      ; max value
        usePage0 movlw   H'f0'           ; 1sec ticks pwr-on timeout - 4min
        movwf   TMRPOTLO
;       clrf    TMRPOTHI
;       clrf    timeradjlo
;       clrf    timeradjhi ;       movlw   H'0'
;       movwf   options bsf     RelayEnable
        movlw   high    setrelay
        movwf   PCLATH
        call    setrelay
        bsf     Occupied movlw   high    initsgf ; initialize the LED
        movwf   PCLATH
        call    initsgf if useDA==0
        movlw   high    initgmf ; initialize the LED
        movwf   PCLATH
        call    initgmf
        endif usePage1
        clrf    STATCNTL
        clrf    STATWORD
        usePage0
        clrf    NTRGATEstate
;       bcf     Interrogating ;       movlw   H'0a2'
;       movwf   FSR enableInts
        bsf     INTCON,5        ; enable RTCC interrupt ;****************************************************
; for development only
;****************************************************
if      useDA==1
        doutd_s
endif
if      useLCD==1
        movlw   high    LCDInit
        movwf   PCLATH
        call    LCDInit
endif
;****************************************************
```

-117-

```
;********************************************************
; This initial delay is for the EEPROM to initialize    *
;********************************************************
        movlw   D'11'
        addwf   CCNT0,W
        movwf   MTEMP
initdly1
        movf    CCNT0,W
        subwf   MTEMP,W
        movlw   high    initdlyend
        movwf   PCLATH
        btfsc   STATUS,Z        ; is it exactly 11ms?
        goto    initdlyend      ; yes
        movlw   high    initdly1
        movwf   PCLATH
        btfsc   STATUS,C        ; did the subtract borrow (more than 11ms)
        goto    initdly1        ; no...wait longer
initdlyend ; remember the sensor task is disabled until now
        movlw   high    eepromnotinit
        movwf   PCLATH E2Read  0               ; read eeprom address 0
        movf    DATAI,W
        movwf   MTEMP
        sublw   H'5a'
        btfss   STATUS,Z
        goto    eepromnotinit ; we read the eeprom here and initialize the variables
        E2Read  1               ; read eeprom address 1
        movf    DATAI,W
        movwf   usonadj
        E2Read  2               ; read eeprom address 2
        movf    DATAI,W
        movwf   usoffadj
        E2Read  3               ; read eeprom address 3
        movf    DATAI,W
        movwf   iroffadj
        E2Read  4               ; read eeprom address 4
        movf    DATAI,W
        movwf   CCNT3
        E2Read  5               ; read eeprom address 5
        bcf     CntrRollOver
        btfsc   DATAI,0         ; the stored cntrrollover bit just read
        bsf     CntrRollOver
        bcf     ASATimerReturn
        btfsc   DATAI,1
        bsf     ASATimerReturn  ; store ASATimerReturn enable bit
        bcf     ASATimerReturnState
        btfsc   DATAI,2
        bsf     ASATimerReturnState     ; store ASATimerReturnState bit
        E2Read  6               ; read eeprom address 6
        movf    DATAI,W
        movwf   timeradjlo
        E2Read  7               ; read eeprom address 7
        movf    DATAI,W
        movwf   timeradjhi
        E2Read  8               ; read eeprom address 8
        movf    DATAI,W
        usePage1
```

-118-

```
        movwf   timerLearnCoef
        usePage0 movlw   high    endeeprominit
        movwf   PCLATH
        goto    endeeprominit eepromnotinit
        E2WriteValue    0,H'5a'
        E2WriteValue    1,0     ; usonadj
        E2WriteValue    2,0     ; usoffadj
        E2WriteValue    3,0     ; iroffadj
        E2WriteValue    4,0     ; CCNT3
        E2WriteValue    5,0     ; bit fields, bit 0: cntrrollover
        E2WriteValue    6,0     ; timeradjlo
        E2WriteValue    7,0     ; timeradjhi
        E2WriteValue    8,0     ; timerLearnCoef endeeprominit
        bsf     SBITS,0         ; enable sensor task ;       return
        endm
```

```
;
; ustask.asm
; source code for the ultrasonic sensor task
; COPYRIGHT (C) MYTECH CORP. 1996, 1997
; JJF ultrasonictask                          ; level 1 on the pic stack
        bsf     ADCON0,2                ; start A/D bcf     USSense                 ; clear the us sense bit bsf     PORTB,5
        btfss   CCNT0,0
        bcf     PORTB,5                 ; external dither movlw   high    snsrad1
        movwf   PCLATH
snsrad1 btfsc   ADCON0,2                ; wait til conversion complete
        goto    snsrad1 movf    ADRES,0                 ; get a/d input
        addlw   80h
        movwf   TEMP9                   ; save first a/d input ;       if      useDA==1
;       movf    TEMP9,W
;       addlw   H'80'
;       doutd   0                       ; 000
;       endif highpass ;       if      useDA==1
;       movf    TEMPHI,W
;       addlw   H'80'
;       doutd   1                       ; 001
;       endif movf    TEMPHI,W
        movwf   TEMP8
        movf    TEMPLO,W
        movwf   TEMP6 cfilt   movlw   high    bpf
        movwf   PCLATH
        call    bpf snsrlbl3
        movlw   high    snsrlbl3
        movwf   PCLATH ;       if useDA==1
        ;@@@@@@
;       movf    TEMPHI,W
;       addlw   H'80'
;       doutd   2                       ; 010
        ;@@@@@@
;       endif abs     btfss   TEMPHI,7                ; is it negative?
        goto    abspos                  ; no
absneg  comf    TEMPHI,F
```

-120-

```
                comf    TEMPLO,W
                addlw   1
                btfsc   STATUS,C
                incf    TEMPHI,F
                movwf   TEMPLO
 abspos         nop                             ; abs(BPF) in TEMPHI:TEMPLO xgain          ;--------------------------------------------
                ; Gain stage: this is an 8 by 16 mult       -
                ; We'll only use the hi 16 bits of the      -
                ; result.                                   -
                ; 8 by 16 mult: (abcd) * (ef)               -
                ; ab*ef*256 + cd*ef                         -
                ; We'll throw away the low byte of cd*ef    -
                ;--------------------------------------------
                if      ADAPT==1
                movlw   high    usnogainasa
                movwf   PCLATH
                btfss   ASAEnable
                goto    usnogainasa movlw   high    gainadjust
                movwf   PCLATH
                call    gainadjust      ; adjusted gain in W
                movwf   TEMP7
                movlw   high    usgainasaend
                movwf   PCLATH
                goto    usgainasaend
 usnogainasa
                movf    usoffgain,W
                btfsc   Occupied
                movf    usongain,W
                movwf   TEMP7
 usgainasaend
                else
                movf    usoffgain,W
                btfsc   Occupied
                movf    usongain,W
                movwf   TEMP7
                endif movlw   high    mult8x8
                movwf   PCLATH movf    TEMPHI,W
                movwf   TEMP8           ; store hi byte of |BPF|
                movf    TEMPLO,W
                movwf   TEMP9           ; lo byte of |BPF| in TEMP9
                movf    TEMP7,W         ; we now have the gain term in W
                call    mult8x8         ; TEMPHI:TEMPLO = W * LO(|BPF|)
                movf    TEMPHI,W        ; we only want the hi byte of this mult,
                movwf   TEMP6           ; since we are doing an 8x16 and taking
                                        ; only the hi 16 bits of the result.

movf    TEMP8,W
                movwf   TEMP9           ; hi byte of |BPF| in TEMP9
                movf    TEMP7,W         ; we now have the gain term in W
                call    mult8x8         ; TEMPHI:TEMPLO = W * HI(|BPF|)

movf    TEMP6,W
                addwf   TEMPLO,F
```

```
        btfsc   STATUS,C
        incf    TEMPHI,F bcf     STATUS,C
        rlf     TEMPLO,F
        rlf     TEMPHI,F bcf     STATUS,C
        rlf     TEMPLO,F
        rlf     TEMPHI,F bcf     STATUS,C
        rlf     TEMPLO,F
        rlf     TEMPHI,F movlw   high    nogainsat
        movwf   PCLATH
        btfss   TEMPHI,7
        goto    nogainsat movlw   H'7f'
        movwf   TEMPHI
        movlw   H'ff'
        movwf   TEMPLO
nogainsat
;       if useDA==1
;@@@@@@
;       movf    TEMPHI,W
;       addlw   H'80'
;       doutd   3               ; 011
;@@@@@@
;       endif movf    TEMPHI,W
        movwf   TEMP9
        movf    TEMPLO,W
        movwf   TEMP7           ; rect*gain in TEMP9:TEMP7

;----------------------------------
; do the decimation filter here  -
; This gives a cutoff of ~2.5hz  -
;----------------------------------
        movlw   high    genlp
        movwf   PCLATH
        movf    FSR,W
        movwf   TMPFSR
        movlw   6
        movwf   FCOUNT
        movlw   decimlo
        movwf   FSR
        call    genlp
        movf    TMPFSR,W
        movwf   FSR ;----------------------------------
; do the decimation here, we will -
; subsample by 64 which gives a   -
; new fs of ~16hz.                -
;----------------------------------
        movlw   H'3f'
        andwf   CCNT0,W
```

-122-

```
                btfss   STATUS,Z        ; if zero, then sample
                goto    nodecim movf    decimlo,W
                movwf   TEMP7
                movf    decimhi,W
                movwf   TEMP9
                movf    FSR,W
                movwf   TMPFSR
                movlw   high    genlp
                movwf   PCLATH
                movlw   4
                movwf   FCOUNT
                movlw   RECTAVGlo
                movwf   FSR
                call    genlp
                movf    TMPFSR,W
                movwf   FSR nodecim
;               if useDA==1
;               ;@@@@@@
;               movf    RECTAVGhi,W
;               addlw   H'80'
;               doutd   4
;               ;@@@@@@
;               endif ;----------------------------------------------
                ; compute the new threshold
                ; rectavg + offset + fudgefactor(=f(rectavg))
                ;----------------------------------------------
                movf    RECTAVGhi,W
                movwf   TEMPHI
                movf    RECTAVGlo,W
                movwf   TEMPLO rlf     TEMPHI,W
                rrf     TEMPHI,F
                rrf     TEMPLO,F        ; 1/2 movf    TEMPLO,W
                movwf   TEMP6
                movf    TEMPHI,W
                movwf   TEMP8 btfsc   StrongAirCompensate   ; if strong air compensation is enabled,
                goto    strongaircomp         ; then add 1*avg instead of .75*avg rlf     TEMPHI,W
                rrf     TEMPHI,F
                rrf     TEMPLO,F        ; 1/4 strongaircomp
                movf    TEMPLO,W
                addwf   TEMP6,F
                btfsc   STATUS,C
                incf    TEMP8,F
                movf    TEMPHI,W
                addwf   TEMP8,F ;               rlf     TEMPHI,W
```

-123-

```
;       rrf     TEMPHI,F
;       rrf     TEMPLO,F        ; 1/8

;       rlf     TEMPHI,W
;       rrf     TEMPHI,F
;       rrf     TEMPLO,F        ; 1/16

;       rlf     TEMPHI,W
;       rrf     TEMPHI,F
;       rrf     TEMPLO,F        ; 1/32 rectavg in TEMPHI:TEMPLO loioff  set     H'40'
hiioff  set     H'01' movlw   loioff
        addwf   TEMP6,F
        btfsc   STATUS,C
        incf    TEMP8,F
        movlw   hiioff
        addwf   TEMP8,F         ; 3/4rectavg + H'0140' in TEMPHI:TEMPLO movf    TEMP6,W
        movwf   TEMPLO
        movf    TEMP8,W
        movwf   TEMPHI movf    RECTAVGlo,W
        addwf   TEMPLO,F
        btfsc   STATUS,C
        incf    TEMPHI,F
        movf    RECTAVGhi,W
        addwf   TEMPHI,F        ; 1.75rectavg + H'0140' in TEMPHI:TEMPLO btfss   TEMPHI,7
        goto    nothreshsat movlw   H'7f'
        movwf   TEMPHI
        movlw   H'ff'
        movwf   TEMPLO
nothreshsat
;       if useDA==1
        ;@@@@@@
;       movf    TEMPHI,W
;       addlw   H'80'
;       doutd   5
        ;@@@@@@
;       endif integ   ;--------------------------------
        ; the integ update algorithm    -
        ;--------------------------------
lointegup       set     H'00'
hiintegup       set     H'02'
lointegdn       set     H'80'
hiintegdn       set     H'00' movlw   high    integdown
        movwf   PCLATH
        movf    TEMPLO,W
        subwf   TEMP7,F
        btfss   STATUS,C        ; borrow?
```

```
        decf    TEMP9,F         ; yes
        movf    TEMPHI,W
        subwf   TEMP9,F         ; TEMP7:TEMP9 = rect*gain - thresh
        btfss   STATUS,C        ; borrow?
        goto    integdown       ; yes
        btfsc   TEMP9,7         ; result negative?
        goto    integdown       ; yes movlw   high    integmax
        movwf   PCLATH
        movlw   lointegup
        addwf   integlo,F
        btfsc   STATUS,C        ; carry?
        incf    integhi,F       ; yes
        btfsc   integhi,7       ; overflow?
        goto    integmax        ; yes
        movlw   hiintegup
        addwf   integhi,F
        btfsc   STATUS,C        ; carry?
        goto    integmax        ; yes
        movlw   high    endinteg
        movwf   PCLATH
        btfss   integhi,7       ; overflow?
        goto    endinteg        ; no
integmax
        movlw   H'7f'           ; saturate at 0x7fff
        movwf   integhi
        movlw   H'ff'
        movwf   integlo
        movlw   high    endinteg
        movwf   PCLATH
        goto    endinteg
integdown
        movlw   high    integmin
        movwf   PCLATH
        movlw   lointegdn
        subwf   integlo,F
        btfss   STATUS,C        ; borrow?
        decf    integhi,F       ; yes
        btfsc   integhi,7       ; negative?
        goto    integmin        ; yes
        movlw   hiintegdn
        subwf   integhi,F
        btfss   STATUS,C        ; borrow?
        goto    integmin        ; yes
        movlw   high    endinteg
        movwf   PCLATH
        btfss   integhi,7       ; negative?
        goto    endinteg        ; no
integmin
        clrf    integhi         ; saturate at 0x0000
        clrf    integlo
endinteg
        nop
;       if useDA==1
;@@@@@@
;       movf    integhi,W
;       addlw   H'80'
;       doutd   6
;@@@@@@
;       endif
```

-125-

```
                movlw   high    uszerotrth
                movwf   PCLATH
                movf    usgain,0
                andlw   0feh
                btfsc   STATUS,Z        ; zero bit set?
                goto    uszerotrth      ; don't sense if sens gain pot <==1

; ------Comparator---------------
lothresh        set     H'00'
hithresh        set     H'30' comp            movf    integlo,W
                movwf   TEMP7
                movf    integhi,W
                movwf   TEMP9 movlw   lothresh
                subwf   TEMP7,F
                btfss   STATUS,C        ; borrow?
                decf    TEMP9,F         ; yes
                movlw   hithresh
                subwf   TEMP9,F         ; TEMP9:TEMP7 = integ - thresh
                movf    TEMP9,W
                movwf   usdecision
;               if      useDA==1
;               movf    usdecision,W
;               addlw   H'80'
;               doutd   7               ; 111
;               endif ustlu           ;-------------------------------------------
                ; do the lookup for the us decision here    -
                ;-------------------------------------------
                ; first check to see if the decision is >=0, ie -
                ; the sensor has detected motion.          -
                ;-------------------------------------------
                movlw   high    suremotion
                movwf   PCLATH
                comf    usdecision,W    ; if decision is positive, then negating
                addlw   1               ; will make it <0,
                movwf   TEMP9
                btfsc   STATUS,C        ; if -decision=0, then motion for sure.
                goto    suremotion
                btfsc   TEMP9,7         ; if -decision<0, then motion for sure.
                goto    suremotion ;-------------------------------------------
                ; the decision value is below the motion threshold
                ; TEMP9 now holds -(integ - thresh), if
                ; greater than 16 then no motion for sure.
                ;-------------------------------------------
                movlw   high    uszerotrth
                movwf   PCLATH
                movf    TEMP9,W
                andlw   H'f0'           ; if any hi bit set, then -decision>16
                btfss   STATUS,Z        ; if zero, then motion is marginal
                goto    uszerotrth      ; no movement...

;-------------------------------------------
                ; The motion is marginal, do the truth lookup  -
                ;-------------------------------------------
```

-126-

```
            movlw   high    ustruthlookup
            movwf   PCLATH
            movf    usdecision,W
            addlw   H'10'           ; limit to 0-15, should be anyway...
            andlw   H'0f'
            call    ustruthlookup
            movwf   TEMP8 movlw   high    occup
            movwf   PCLATH
            goto    occup suremotion
            movlw   high    occup
            movwf   PCLATH
            ; just saw motion
            movlw   H'07f'
            movwf   TEMP8
            bsf     USSense         ; set us sense bit, for us only mode ;----------------------------------------------------------------
; we enable interrogation when the we know we have definately   -
; seen motion and we are not currently interrogating.           -
;----------------------------------------------------------------
            btfsc   Interrogating   ; if interrogation already enabled,
            goto    occup           ; skip over enable step ;----------------------------------------------------------------
; no interrogation when the LED override switch is on           -
;----------------------------------------------------------------
            btfsc   NoLEDFlag
            goto    occup bsf     Interrogating   ; otherwise enable it and
            movlw   H'02'           ; set up next step of interrogations
            movwf   NTRGATEstate
            movlw   H'ff'
            movwf   NTRGATEcnt occup
            ; this is where we do the pulse stretching
            ; we only do pulse stretching for valid motion(truth level)
            movlw   high    endusstretch
            movwf   PCLATH
            decf    uspscnt,F       ; reduce stretch count
            btfsc   STATUS,Z        ; did count reach zero?
            clrf    ustruth         ; yes
            movf    ustruth,W
            subwf   TEMP8,W         ; newtruth - oldtruth
            btfss   STATUS,C        ; did it borrow?
            goto    endusstretch    ; yes, so keep old
            movf    TEMP8,W
            movwf   ustruth
            movlw   H'5f'
            movwf   uspscnt endusstretch ; Turn on LED
;----------------------------------------------------------------
; if we are currently reporting status with the                 -
; LED's then don't send any indication of motion                -
```

```
        ;------------------------------------------
        movlw   high    aro1
        movwf   PCLATH
usePage1
        btfsc   STATCNTL,7
        goto    aro1

;------------------------------------------
        ; if LED is currently in use, then leave it alone -
        ;------------------------------------------
usePage0
        btfsc   SBITS,2         ; if led task on, then skip
        goto    aro1

;------------------------------------------
        ; if led override switch is on, leave LED alone -
        ;------------------------------------------
        btfsc   NoLEDFlag       ; is led override switch turned on
        goto    aro1            ; yes, so don't turn on LED ;------------------------------------------
        ; we now need to determine if the LED should be -
        ; turned on based on the dual tech mode and the -
        ; 'truth' of our motion signal.                 -
        ;------------------------------------------
        movlw   high    usHSLED
        movwf   PCLATH
        btfsc   options,0       ; which dual tech mode
        goto    usHSLED         ; we are in HS mode ;------------------------------------------
        ; we are in HC mode, so we need to find the    -
        ; line 'a+b-60h=40h' (the 'and' equation). We  -
        ; choose the point where a=b, which is 50h.    -
        ;------------------------------------------
        movlw   high    usHCLED
        movwf   PCLATH movlw   H'50'
        subwf   ustruth,W       ; ustruth - 50h
        btfsc   STATUS,Z
        goto    usHCLED         ; ustruth = 50h
        movlw   high    aro1
        movwf   PCLATH
        btfss   STATUS,C        ; status is still from subwf
        goto    aro1            ; ustruth < 50h usHCLED
        bsf     PORTB,1 movlw   high    aro1
        movwf   PCLATH
        goto    aro1 usHSLED movlw   H'7f'
        subwf   ustruth,W       ; ustruth - 7fh
        btfsc   STATUS,Z        ; are they equal?
        bsf     PORTB,1         ; yes, so turn on led movlw   high    aro1
        movwf   PCLATH
        goto    aro1
```

```
uszerotrth
        ; there's no motion, unless we are currently stretching
        ; a previous pulse
        movlw   high    uszeroyes
        movwf   PCLATH
        movf    uspscnt,W
        btfsc   STATUS,Z
        goto    uszeroyes
        ; we are stretching a previous pulse
        decf    uspscnt,F
        movlw   high    aro1
        movwf   PCLATH
        goto    aro1
uszeroyes
        clrf    ustruth ; leave led alone if it is in use
        movlw   high    aro1
        movwf   PCLATH
        btfsc   SBITS,2
        goto    aro1

; make sure led is off
        btfsc   PORTB,1
        bcf     PORTB,1
aro1
snsrend
        usePage0
;       bcf     PORTB,7         ; how much compute left?
;       if useDA==1
;@@@@@@
;       movf    ustruth,W
;       addlw   H'80'
;       doutd   6               ; 110
;@@@@@@
;       endif ; this is where we determine the characteristics of any
        ; motion currently happening. the objective is to find
        ; the smallest motion pulse while the lights are on.
        ; this will give a measure of how much the lights-on
        ; sensitivity can be lowered.
        btfss   Occupied
        return ; if currently not inside a pulse, check for the
        ; beginning of a pulse, otherwise check for the
        ; end of the pulse.
        movlw   high    usfindpulse
        movwf   PCLATH
        usePage1
        movf    uspulsecnt1,W
        iorwf   uspulsecnt0,W   ; if both are 0, the 'or' is 0
        btfsc   STATUS,Z        ; if 0, then not in pulse
        goto    usfindpulse     ; not inside pulse, find one
        usePage0

; inside pulse
        movlw   high    usendpulse
        movwf   PCLATH
        btfsc   usdecision,7    ; is usdecision negative?
```

```
             goto     usendpulse       ; yes, so end of pulse. is it the smallest?

; not at end of pulse, see if level is max of the pulse
             usePage1
             incf     uspulsecnt0,F
             btfsc    STATUS,Z
             incf     uspulsecnt1,F    ; increment pulse width
             usePage0 movf     usdecision,W
             usePage1
             subwf    uspulsemax,W     ; max - decision
             usePage0
             btfsc    STATUS,C         ; did it borrow?
             return                    ; no, so decision not max of pulse
             ; save the new max of the pulse
             movf     usdecision,W
             usePage1
             movwf    uspulsemax
             usePage0
             return
usendpulse
             ; we are at the end of the pulse, check to see if the
             ; recent pulse is the smallest so far.
             movlw    high     usendpulseend
             movwf    PCLATH
             usePage1
             movf     uspulsemax,W
             subwf    usminpulse,W     ; min pulse - pulse max
             btfss    STATUS,C         ; did it borrow?
             goto     usendpulseend    ; yes, so pulse is not smallest
             usePage1
             movf     uspulsemax,W
             movwf    usminpulse
             movf     uspulsecnt0,W
             movwf    usminpw0
             movf     uspulsecnt1,W
             movwf    usminpw1
usendpulseend
             usePage1
             clrf     uspulsecnt0      ; clear pulse count
             clrf     uspulsecnt1
             usePage0
             return
usfindpulse
             ; we are not currently looking at a pulse, so we
             ; need to look for a new one
             usePage0
             btfsc    usdecision,7
             return                    ; not a new pulse
             ; we have found a new pulse
             movf     usdecision,W
             usePage1
             movwf    uspulsemax
             movlw    1
             movwf    uspulsecnt0
             clrf     uspulsecnt1
             usePage0
             return                    ; end sensor task ustruthlookup
             ; W has the motion level [0,15]
```

-130-

```
        movwf   TEMP7
        movlw   high    ustrthlu
        movwf   PCLATH
        movf    TEMP7,W
        addlw   low     ustrthlu
        btfsc   STATUS,C
        incf    PCLATH,F
        movwf   PCL
ustrthlu
        retlw   0x0     ;0
        retlw   0x02    ;1
        retlw   0x04    ;2
        retlw   0x08    ;3
        retlw   0x0c    ;4
        retlw   0x10    ;5
        retlw   0x18    ;6
        retlw   0x28    ;7
        retlw   0x40    ;8
        retlw   0x58    ;9
        retlw   0x68    ;10
        retlw   0x6f    ;11
        retlw   0x74    ;12
        retlw   0x78    ;13
        retlw   0x7c    ;14
        retlw   0x7f    ;15

;----------------------------------------
; mult8x8                                -
; 8 by 8 multiply                        -
; Inputs:                                -
;       W, TEMP9                         -
; Outputs:                               -
;       16bit result in TEMPHI:TEMPLO    -
;----------------------------------------
mult8x8
        usePage0
        clrf    TEMPHI
        clrf    TEMPLO bcf     STATUS,C        ; clear carry bit btfsc   TEMP9,0
        addwf   TEMPHI,1
        rrf     TEMPHI,1
        rrf     TEMPLO,1 btfsc   TEMP9,1
        addwf   TEMPHI,1
        rrf     TEMPHI,1
        rrf     TEMPLO,1 btfsc   TEMP9,2
        addwf   TEMPHI,1
        rrf     TEMPHI,1
        rrf     TEMPLO,1 btfsc   TEMP9,3
        addwf   TEMPHI,1
        rrf     TEMPHI,1
        rrf     TEMPLO,1
```

```
        btfsc   TEMP9,4
        addwf   TEMPHI,1
        rrf     TEMPHI,1
        rrf     TEMPLO,1 btfsc   TEMP9,5
        addwf   TEMPHI,1
        rrf     TEMPHI,1
        rrf     TEMPLO,1 btfsc   TEMP9,6
        addwf   TEMPHI,1
        rrf     TEMPHI,1
        rrf     TEMPLO,1 btfsc   TEMP9,7
        addwf   TEMPHI,1
        rrf     TEMPHI,1
        rrf     TEMPLO,1 return

;----------------------------------------------
; gainadjust -                                 -
;   the adjustment is a two's complement num   -
;   the gain is an unsigned number.            -
;   The adjustment should be bounded well within -
;   +/-127.                                    -
;   return the adjusted gain in W register     -
;----------------------------------------------
gainadjust
        movlw   high    gainaddpos
        movwf   PCLATH
        movf    usoffgain,W
        btfsc   Occupied
        movf    usongain,W
        movwf   TEMP7 movf    usoffadj,W
        btfsc   Occupied
        movf    usonadj,W
        movwf   TEMP8
        btfss   TEMP8,7         ; is it negative or positive?
        goto    gainaddpos
        ; adjust term is negative, so check for negative overflow
        addwf   TEMP7,W
        btfss   STATUS,C
        movlw   H'1'            ; minimal
        return
gainaddpos
        ; adjust term is positive, so check for overflow
        addwf   TEMP7,W
        btfsc   STATUS,C
        movlw   H'ff'           ; max
        return gainlookup
        usePage0
        andlw   H'0f'           ; limit to 16
        movwf   TEMP7
        movlw   high    gainlustart
        movwf   PCLATH
```

```
        movf    TEMP7,W
        addlw   low     gainlustart
        btfsc   STATUS,C
        incf    PCLATH,F
        movwf   PCL
gainlustart
        retlw   D'1'
        retlw   D'4'
        retlw   D'9'
        retlw   D'16'
        retlw   D'25'
        retlw   D'36'
        retlw   D'49'
        retlw   D'64'
        retlw   D'81'
        retlw   D'100'
        retlw   D'121'
        retlw   D'144'
        retlw   D'169'
        retlw   D'196'
        retlw   D'225'
        retlw   D'255'
```

```
;
; PIRtask.asm
; COPYRIGHT (C) MYTECH CORP. 1996, 1997
;
; the PIR task
; orig: erw
;        composition mechanism 8-15-96 JJF
;        tighter filters 8-20-96 JJF
;

irtruthlookup
        movwf   TEMP9
        movlw   high    pirlu
        movwf   PCLATH
        movf    TEMP9,W
        addlw   low     pirlu
        btfsc   STATUS,C
        incf    PCLATH,F
        movwf   PCL
pirlu   retlw   0x0         ;0
        retlw   0x2         ;1
        retlw   0x4         ;2
        retlw   0x8         ;3
        retlw   0x0c        ;4
        retlw   0x10        ;5
        retlw   0x18        ;6
        retlw   0x28        ;7
        retlw   0x40        ;8
        retlw   0x58        ;9
        retlw   0x68        ;10
        retlw   0x70        ;11
        retlw   0x74        ;12
        retlw   0x78        ;13
        retlw   0x7c        ;14
        retlw   0x7f        ;15

PIRhpfilt       macro
        ; --- first calculate pir low pass -------
        ; TEMP9 already contains raw pir signal
        clrf    TEMP7 movlw   high    genlp
        movwf   PCLATH
        movf    FSR,W
        movwf   TMPFSR
        movlw   6
        movwf   FCOUNT
        movlw   PIRLPLO
        movwf   FSR
        call    genlp           ; lowpass(PIR) in PIRLPHI:PIRLPLO
        movf    TMPFSR,W
        movwf   FSR ;---- calculate pir high pass ---------
        ; yhp(n) = x(n) - ylp(n)
        ;----------------------------------------
        comf    PIRLPHI,W
        movwf   TEMP8
        comf    PIRLPLO,W       ; negate
        addlw   1
        btfsc   STATUS,C        ; carry bit
        incf    TEMP8,F
```

```
            movwf    TEMP6           ; -pirlp in TEMP8, TEMP6 movf     TEMP9,W
            addwf    TEMP8,F         ; TEMP8:TEMP6 = pir - pirlp endm
;           return PIRavgfilt  macro
            movf     TEMP8,W
            movwf    TEMP9
            movf     TEMP6,W
            movwf    TEMP7 movlw    high    genlp
            movwf    PCLATH
            movf     FSR,W
            movwf    TMPFSR
            movlw    8
            movwf    FCOUNT
            movlw    PIRAVGLO
            movwf    FSR
            call     genlp           ; avg(PIR) in PIRAVGLO:PIRAVGLO
            movf     TMPFSR,W
            movwf    FSR endm
;           return ;
; max routine
; returns the max of registers TEMP7 and TEMP8 in W
;
max         movlw    high    max2
            movwf    PCLATH
            movf     TEMP8,W
            subwf    TEMP7,W ; TEMP7-TEMP8, if borrow, TEMP8>TEMP7
            btfsc    STATUS,C
            goto     max2
            movf     TEMP8,W
            return
max2        movf     TEMP7,W
            return runPIR      nop movlw    0a1h            ; 1010 0001 enable an4 a/d
            movwf    ADCON0          ; next reading will be PIR input (ch4 pin 7)

bcf      IRSense         ; clear the pir sense bit.

movlw    high    pirwait1
            movwf    PCLATH movlw    D'24'
            movwf    TEMP6
pirwait1
            decfsz   TEMP6,F
            goto     pirwait1 conv7       bsf      ADCON0,2        ; start a/d conversion
            movlw    high    waitPIR
```

-135-

```
            movwf   PCLATH
    waitPIR btfsc   ADCON0,2        ; wait til conversion complete
            goto    waitPIR         ; skip if conversion is complete adPIR   movf    ADRES,0         ; get a/d input
            addlw   080h            ; center a/d output around 0
            movwf   TEMP9           ; save PIR input ;       if      useDA==1
    ;       movf    TEMP9,W
    ;       addlw   H'80'
    ;       doutd   0               ; 000
    ;       endif PIRhpfilt ;       if      useDA==1
    ;       movf    TEMP8,W
    ;       addlw   H'80'
    ;       doutd   1               ; 001
    ;       endif PIRavgfilt ;       if      useDA==1
    ;       movf    PIRAVGHI,W
    ;       addlw   H'80'
    ;       doutd   2               ; 010
    ;       endif ;------PIR Window Comparator---------------
    pirwind
            movf    PIRAVGLO,W
            subwf   TEMP6,F         ; lobyte(hp-avghp)
            btfss   STATUS,C        ; borrow?
            decf    TEMP8,F         ; yes
            movf    PIRAVGHI,W
            subwf   TEMP8,F         ; hibyte(hp-avghp)

movlw   high    PIRpos
            movwf   PCLATH
            btfss   TEMP8,7         ; skip next if sign is 1
            goto    PIRpos
    PIRneg  comf    TEMP8,F         ; get neg of (hp-avghp)
            comf    TEMP6,F
            incf    TEMP6,F
            btfsc   STATUS,Z
            incf    TEMP8,F
    PIRpos  nop                     ; abs(PIRavg-TEMP8) in TEMP7

;       if      useDA==1
    ;       movf    TEMP8,W
    ;       addlw   H'80'
    ;       doutd   3               ; 011
    ;       endif movlw   high    PIRnomotion
            movwf   PCLATH
            movlw   H'7f'           ; 127
            subwf   PIRthresh,W
            btfsc   STATUS,Z        ; if PIRthresh is 127 (max.) then
            goto    PIRnomotion     ; do not try to sense motion
```

```
PIRcomp  ; Compare abs(hp-hpavg) to threshold
         movlw   high    irnoadjust
         movwf   PCLATH
         movf    PIRthresh,W
         btfss   ASAEnable        ; apply adjustment only if asa enabled
         goto    irnoadjust
         movf    iroffadj,F
         btfsc   STATUS,Z         ; no adjustment present
         goto    irnoadjust
         movlw   high    iradjpos
         movwf   PCLATH
         movf    PIRthresh,W
         btfss   iroffadj,7       ; is adjustment negative?
         goto    iradjpos
         addwf   iroffadj,W
         btfss   STATUS,C
         movlw   H'16'            ; min thresh
         movwf   TEMP7
         movlw   high    irnoadjust
         movwf   PCLATH
         movf    TEMP7,W
         goto    irnoadjust
iradjpos
         addwf   iroffadj,W
         btfsc   STATUS,C         ; make sure adjustment did not rollover
         movlw   H'7f'            ; if it did, saturate at most positive #
irnoadjust
         movwf   TEMP9
         subwf   TEMP8,W          ; |(hp-hpavg)| - threshold
         movwf   pirdecision if      useDA==1
         movf    pirdecision,W
         addlw   H'80'
         doutd   7                ; 100
         endif ;        if      useDA==1
;        movf    TEMP9,W
;        addlw   H'80'
;        doutd   7                ; 110
;        endif movlw   high    pirlbl3
         movwf   PCLATH
         btfss   pirdecision,7    ; if motion detected, forget noise estimate
         goto    pirlbl3 btfsc   Occupied         ; if occupied, forget noise estimate
         goto    pirlbl3

;------------------------------------------
; compute an estimate of the ir noise floor  -
; when the space is not occupied.            -
;------------------------------------------
         movf    pirdecision,W
         movwf   TEMP8
         usePage1
         movf    irRecentMax,W
         usePage0
         movwf   TEMP7
```

```
                movlw   high    max
                movwf   PCLATH
                call    max
                usePage1
                movwf   irRecentMax
                usePage0 pirlbl3
                movlw   high    pirlbl2
                movwf   PCLATH

; here we do the lookup of the
                ; truth of the pir sensor value.
                btfsc   pirdecision,7   ; is result positive?
                goto    pirlbl2         ; No. motion, if any, is marginal.

pirltruth
                movlw   H'7f'           ; Compare was positive, definite motion.
        ;       movwf   pirtruth        ; the truth is 0x7f for sure.
                movwf   TEMP8
                bsf     IRSense         ; set ir sense bit for ir only mode movlw   high    pirmotion
                movwf   PCLATH
                goto    pirmotion pirlbl2
                comf    pirdecision,W
                addlw   1
                btfsc   STATUS,C        ; if add carried, then motion for sure
                goto    pirltruth
                movwf   TEMP7           ; TEMP7 = -pirdecision andlw   H'f0'
                btfss   STATUS,Z        ; if any high bits, then pirdecision was
                goto    PIRnomotion     ; large negative, so no motion.

movlw   high    irtruthlookup
                movwf   PCLATH
                movf    TEMP7,W         ; remember TEMP7=-(|PIRHPHI-PIRHPAVG|-threshold)
                andlw   H'0f'           ; limit to 0-15 range
                sublw   H'0f'           ; reverse the limit
                call    irtruthlookup
        ;       movwf   pirtruth
                movwf   TEMP8 pirlbl1
                movlw   high    PIRnomotion
                movwf   PCLATH movf    pirtruth,F
                btfsc   STATUS,Z        ; is pirtruth = 0?
                goto    PIRnomotion     ; yes, so no motion sensed ;pirmotionled
        pirmotion
                ; this is where we do the pulse stretching
                ; we only do pulse stretching for valid motion(truth level)
                movlw   high    endirstretch
                movwf   PCLATH
                decf    irpscnt,F       ; reduce stretch count
                btfsc   STATUS,Z        ; did count reach zero?
```

-138-

```
            clrf     pirtruth         ; yes
            movf     pirtruth,W
            subwf    TEMP8,W          ; newtruth - oldtruth
            btfss    STATUS,C         ; did it borrow?
            goto     endirstretch     ; yes, so keep old
            movf     TEMP8,W
            movwf    pirtruth
            movlw    H'04'
            movwf    irpscnt
endirstretch ;------------------------
            ; we have motion         -
            ;------------------------
            movlw    high     PIRend
            movwf    PCLATH
            btfsc    NoLEDFlag        ; is led override switch turned on
            goto     PIRend ;---------------------------------------------------
            ; we now need to determine if the LED should be    -
            ; turned on based on the dual tech mode and the    -
            ; 'truth' of our motion signal.                    -
            ;---------------------------------------------------
            movlw    high     irHSLED
            movwf    PCLATH
            btfsc    options,0        ; which dual tech mode
            goto     irHSLED          ; we are in HS mode ;---------------------------------------------------
            ; we are in HC mode, so we need to find the        -
            ; line 'a+b-60h=40h' (the HC equation). We         -
            ; choose the point where a=b, which is 50h.        -
            ;---------------------------------------------------
            movlw    high     irHCLED
            movwf    PCLATH movlw    H'50'
            subwf    pirtruth,W       ; pirtruth - 50h
            btfsc    STATUS,Z
            goto     irHCLED          ; pirtruth=50h
            movlw    high     PIRend
            movwf    PCLATH
            btfss    STATUS,C         ; STATUS is still result of subwf
            goto     PIRend           ; pirtruth<50h irHCLED
            bcf      GreenLED ;           if useDA==0
;               movlw    high     initgmf
;               movwf    PCLATH
;               call     initgmf     ; turn on the LED, remember this
;                                    ; will delay for 100ms.
;           endif movlw    high     PIRend
            movwf    PCLATH
            goto     PIRend irHSLED
            movlw    high     PIRend
```

```
                movwf   PCLATH movlw   H'7f'
                subwf   pirtruth,W      ; pirtruth - 7fh
                btfss   STATUS,Z        ; are they equal?
                goto    PIRend          ; no, so don't turn on led bcf     GreenLED
;               if useDA==0
;               movlw   high    initgmf
;               movwf   PCLATH
;               call    initgmf         ; turn on the LED, remember this
;                                       ; will delay for 100ms.
;               endif movlw   high    PIRend
                movwf   PCLATH
                goto    PIRend PIRnomotion
                ; there's no motion unless we are stretching
                ; a previous pulse
                movlw   high    irzeroyes
                movwf   PCLATH
                movf    irpscnt,W
                btfsc   STATUS,Z
                goto    irzeroyes
                ; we are stretching a previous pulse
                decf    irpscnt,F
                movlw   high    PIRend
                movwf   PCLATH
                goto    PIRend
irzeroyes
                clrf    pirtruth
                bsf     GreenLED
PIRend
;               if      useDA==1
;               movf    pirtruth,W
;               addlw   H'80'
;               doutd   5
;               endif return
```

```
;
; o2sermon.asm
; COPYRIGHT (C) MYTECH CORP. 1996, 1997
; jjf serrpt
; start by sending the header: preamble, version,
; # of data bytes, and checksum.
; [5ah][1-0-A-0-5][numbytes][checksum]
          usePage0
          movlw     high      serw1
          movwf     PCLATH
serw1     btfss     PIR1,TXIF
          goto      serw1
          movlw     H'5a'               ; preamble char
          movwf     TXREG
          movwf     MTEMP1              ; start checksum
          movlw     high      serw2
          movwf     PCLATH
serw2     btfss     PIR1,TXIF
          goto      serw2
          movlw     H'31'               ; ascii '1'
          movwf     TXREG
          addwf     MTEMP1              ; add to checksum
          movlw     high      serw3
          movwf     PCLATH
serw3     btfss     PIR1,TXIF
          goto      serw3
          movlw     H'30'               ; ascii '0'
          movwf     TXREG
          addwf     MTEMP1              ; add to checksum
          movlw     high      serw4
          movwf     PCLATH
serw4     btfss     PIR1,TXIF
          goto      serw4
          movlw     H'41'               ; ascii 'A'
          movwf     TXREG
          addwf     MTEMP1              ; add to checksum
          movlw     high      serw5
          movwf     PCLATH
serw5     btfss     PIR1,TXIF
          goto      serw5
          movlw     H'30'               ; ascii '0'
          movwf     TXREG
          addwf     MTEMP1              ; add to checksum
          movlw     high      serw6
          movwf     PCLATH
serw6     btfss     PIR1,TXIF
          goto      serw6
          movlw     H'36'               ; ascii '6'
          movwf     TXREG
          addwf     MTEMP1              ; add to checksum
          movlw     high      serw7
          movwf     PCLATH
serw7     btfss     PIR1,TXIF
          goto      serw7
          movlw     H'c0'               ; number of data words
          movwf     TXREG
          addwf     MTEMP1              ; add to checksum
          movlw     high      serw8
          movwf     PCLATH
serw8     btfss     PIR1,TXIF
```

-141-

```
            goto    serw8
            movf    MTEMP1,W        ; now send the checksum
            movwf   TXREG movlw   H'20'
            movwf   FSR
            movlw   high    serw9
            movwf   PCLATH
    serw9   btfss   PIR1,TXIF
            goto    serw9
            movf    INDF,W
            movwf   TXREG
            incf    FSR,F
            btfss   FSR,7           ; overflow
            goto    serw9 movlw   H'a0'
            movwf   FSR
            movlw   high    serw10
            movwf   PCLATH
    serw10  btfss   PIR1,TXIF
            goto    serw10
            movf    INDF,W
            movwf   TXREG
            incf    FSR,F
            btfsc   FSR,7           ; overflow
            goto    serw10 return
```

What is claimed is:

1. An occupancy based load controller, comprising:
   a plurality of occupancy sensors for producing a respective plurality of occupancy estimator signals, each occupancy estimator signal existing at more than two signal levels that are related to a level of motion within a space detected by the respective occupancy sensor;
   a programmable microprocessor connected to said plurality of occupancy sensors, for calculating a composite occupancy estimator from said plurality of occupancy estimator signals, and for comparing said composite occupancy estimator to a composite activation threshold; and
   a controllable load energizing device responsive to said microprocessor, operable to automatically energize an electrical load when said microprocessor determines that said composite occupancy estimator is greater than said composite activation threshold.

2. The load controller of claim 1, wherein said plurality of occupancy estimator signals are digital representations based on signal levels detected at said plurality of occupancy sensors.

3. The load controller of claim 1, said plurality of occupancy sensors including an ultrasonic transmitter and sensor.

4. The load controller of claim 1, said plurality of occupancy sensors including a passive infrared detector.

5. The load controller of claim 1, said plurality of occupancy sensors including a passive audio acoustic detector.

6. The load controller of claim 1, said plurality of occupancy sensors including a microwave transmitter and sensor.

7. The load controller of claim 1, said plurality of occupancy sensors including an ultrasonic transmitter and sensor, and a passive infrared detector.

8. The load controller of claim 1, said plurality of occupancy sensors including an ultrasonic transmitter and sensor, a passive infrared detector, and a microwave transmitter and sensor.

9. The load controller of claim 1, said plurality of occupancy sensors including an ultrasonic transmitter and sensor, a passive infrared detector, and a passive audio acoustic detector.

10. The load controller of claim 1, said plurality of occupancy sensors including an ultrasonic transmitter and sensor, a passive infrared detector, a microwave transmitter and sensor, and a passive audio acoustic detector.

11. The load controller of claim 1, said plurality of occupancy sensors including a passive infrared detector, and a microwave transmitter and sensor.

12. The load controller of claim 1, said plurality of occupancy sensors including, a passive infrared detector, and a passive audio acoustic detector.

13. The load controller of claim 1, said plurality of occupancy sensors including a passive infrared detector, a microwave transmitter and sensor, and a passive audio acoustic detector.

14. The load controller of claim 1, said plurality of occupancy sensors including a microwave transmitter and sensor, and a passive audio acoustic detector.

15. The load controller of claim 1, said programmable microprocessor being operable to calculate said composite occupancy estimator by calculating an arithmetic sum of said plurality of occupancy estimator signals.

16. The load controller of claim 1, said programmable microprocessor being operable to calculate said composite occupancy estimator by calculating a weighted arithmetic sum of said plurality of occupancy estimator signals.

17. The load controller of claim 1, said programmable microprocessor being operable to calculate said composite occupancy estimator by calculating a Yager Union function of said plurality of occupancy estimator signals.

18. The load controller of claim 1, said programmable microprocessor being operable to calculate said composite occupancy estimator by performing a table look-up based on said plurality of occupancy estimator signals.

19. The load controller of claim 1, said composite activation threshold being programmable.

20. The load controller of claim 1, said programmable microprocessor being operable to adaptively adjust a sensitivity of at least one of said plurality of occupancy sensors.

21. The load controller of claim 20, said sensitivity of said at least one of said plurality of occupancy sensors being adjusted based on an historical usage patterns of said space.

22. The load controller of claim 20, said sensitivity of said at least one of said plurality of occupancy sensors being adjusted based on detection of false-on events.

23. The load controller of claim 20, said sensitivity of said at least one of said plurality of occupancy sensors being adjusted based on e detection of false-off events.

24. The load controller of claim 1, further comprising an environmental sensor, connected to said microprocessor, for sensing an environmental condition of said space.

25. The load controller of claim 24, said environmental sensor comprising an ambient temperature sensor.

26. The load controller of claim 24, said environmental sensor comprising an ambient light sensor.

27. The load controller of claim 1, further comprising:
   means for storing a status of said load controller; and
   status reporting means for visually indicating said status of said load controller.

28. The load controller of claim 27, said status reporting means being operable to visually indicate said status of said load controller at pre-determined time intervals.

29. The load controller of claim 27, said status reporting means being operable to visually indicate said status of said load controller upon user interrogation.

30. The load controller of claim 27, said status reporting means being operable to visually indicate said status of said load controller upon detecting a predetermined motion pattern.

31. The load controller of claim 3,
   said ultrasonic transmitter transmitting continuous wave ultrasonic signals; and
   said ultrasonic sensor comprising, an ultrasonic signal receiver, and a controllable gain preamplifier circuit having an input connected to receive a Doppler-shifted ultrasonic signal produced by said ultrasonic receiver, and an output providing a Doppler-shifted ultrasonic signal with controllable amplitude.

32. The load controller of claim 31, said ultrasonic sensor further comprising:
   a zero crossing phase lock loop sampling point circuit having an input connected to receive a sampling point control signal; and an output providing a sample of said Doppler-shifted ultrasonic signal near a zero crossing point of said Doppler shifted ultrasonic signal.

33. The load controller of claim 1, said programmable microprocessor further comparing said composite occupancy estimator to a composite maintenance threshold, and said controllable load energizing device being operable to continue energizing said electrical load when said microprocessor determines that said composite occupancy estimator is greater than said composite maintenance threshold.

34. The load controller of claim 33, wherein said plurality of occupancy estimator signals are digital representations based on signal levels detected at said plurality of occupancy sensors.

35. The load controller of claim 33, said plurality of occupancy sensors including an ultrasonic transmitter and sensor.

36. The load controller of claim 33, said plurality of occupancy sensors including a passive infrared detector.

37. The load controller of claim 33, said plurality of occupancy sensors including a passive audio acoustic detector.

38. The load controller of claim 33, said plurality of occupancy sensors including a microwave transmitter and sensor.

39. The load controller of claim 33, said plurality of occupancy sensors including an ultrasonic transmitter and sensor, and a passive infrared detector.

40. The load controller of claim 33, said plurality of occupancy sensors including an ultrasonic transmitter and sensor, a passive infrared detector, and a microwave transmitter and sensor.

41. The load controller of claim 33, said plurality of occupancy sensors including an ultrasonic transmitter and sensor, a passive infrared detector, and a passive audio acoustic detector.

42. The load controller of claim 33, said plurality of occupancy sensors including an ultrasonic transmitter and sensor, a passive infrared detector, a microwave transmitter and sensor, and a passive audio acoustic detector.

43. The load controller of claim 33, said plurality of occupancy sensors including a passive infrared detector, and a microwave transmitter and sensor.

44. The load controller of claim 33, said plurality of occupancy sensors including, a passive infrared detector, and a passive audio acoustic detector.

45. The load controller of claim 33, said plurality of occupancy sensors including a passive infrared detector, a microwave transmitter and sensor, and a passive audio acoustic detector.

46. The load controller of claim 33, said plurality of occupancy sensors including a microwave transmitter and sensor, and a passive audio acoustic detector.

47. The load controller of claim 33, said programmable microprocessor being operable to calculate said composite occupancy estimator by calculating an arithmetic sum of said plurality of occupancy estimator signals.

48. The load controller of claim 33, said programmable microprocessor being operable to calculate said composite occupancy estimator by calculating a weighted arithmetic sum of said plurality of occupancy estimator signals.

49. The load controller of claim 33, said programmable microprocessor being operable to calculate said composite occupancy estimator by calculating a Yager Union function of said plurality of occupancy estimator signals.

50. The load controller of claim 33, said programmable microprocessor being operable to calculate said composite occupancy estimator by performing a table look-up based on said plurality of occupancy estimator signals.

51. The load controller of claim 33, said composite activation threshold being programmable.

52. The load controller of claim 33, said composite maintenance threshold being programmable.

53. the load controller of claim 33, said composite activation threshold and said composite maintenance threshold both being programmable.

54. The load controller of claim 33, said programmable microprocessor being operable to adaptively adjust a sensitivity of at least one of said plurality of occupancy sensors.

55. The load controller of claim 54, said sensitivity of said at least one of said plurality of occupancy sensors being adjusted based on an historical usage patterns of said space.

56. The load controller of claim 54, said sensitivity of said at least one of said plurality of occupancy sensors being adjusted based on detection of false-on events.

57. The load controller of claim 54, said sensitivity of said at least one of said plurality of occupancy sensors being adjusted based on e detection of false-off events.

58. The load controller of claim 33, firer comprising an environmental sensor, connected to said microprocessor, for sensing an environmental condition of said space.

59. The load controller of claim 58, said environmental sensor comprising an ambient temperature sensor.

60. The load controller of claim 58, said environmental sensor comprising an ambient light sensor.

61. The load controller of claim 33, further comprising:
means for storing a status of said load controller; and
status reporting means for visually indicating aid status of said load controller.

62. The load controller of claim 61, said status reporting means being operable to visually indicate said status of said load controller at pre-determined time intervals.

63. The load controller of claim 61, said status reporting means being operable to visually indicate said status of said load controller upon user interrogation.

64. The load controller of claim 61, said status reporting means being operable to visually indicate said status of said load controller upon detecting a pre-determined motion pattern.

65. The load controller of claim 35,
said ultrasonic transmitter transmitting continuous wave ultrasonic signals; and
said ultrasonic sensor comprising, an ultrasonic signal receiver, and a controllable gain preamplifier circuit having an input connected to receive a Doppler-shifted ultrasonic signal produced by said ultrasonic receiver, and an output providing a Doppler-shifted ultrasonic signal with controllable amplitude.

66. The load controller of claim 65, said ultrasonic sensor further comprising:
a zero crossing phase lock loop sampling point circuit having an input connected to receive a sampling point control signal; and an output providing a sample of said Doppler-shifted ultrasonic signal near a zero crossing point of said Doppler shifted ultrasonic signal.

67. A method for controlling an electrical load as a function of occupancy of a space, comprising:
generating a plurality of occupancy estimator signals, each occupancy estimator signal existing at more than two signal levels that are related to a level of motion within a space;
calculating a composite occupancy estimator from said plurality of occupancy estimator signals;
comparing said composite occupancy estimator to a composite activation threshold; and
energizing the electrical load when said composite occupancy estimator is greater than said composite activation threshold.

68. The method of claim 67, further comprising:
comparing said composite occupancy estimator to a composite maintenance threshold; and
continuing to energize an electrical load when said composite occupancy estimator is greater than said composite maintenance threshold.

69. The method of claim 67, said calculating step further comprising:
calculating said composite occupancy estimator by performing an arithmetic sum of said plurality of occupancy estimator signals.

70. The method of claim 67, said calculating step further comprising:

calculating said composite occupancy estimator by performing a weighted arithmetic sum of said plurality of occupancy estimator signals.

71. The method of claim 67, said calculating step further comprising:

calculating said composite occupancy estimator by performing a Yager Union function of said plurality of occupancy estimator signals.

72. The method of claim 67, said calculating step further comprising:

calculating said composite occupancy estimator by performing a table look-up based on said plurality of occupancy estimator signals.

73. The method of claim 67, further comprising:

programmably adjusting the composite activation threshold.

74. The method of claim 68, said calculating step further comprising:

calculating said composite occupancy estimator by performing an arithmetic sum of said plurality of occupancy estimator signals.

75. The method of claim 68, said calculating step further comprising:

calculating said composite occupancy estimator by performing a weighted arithmetic sum of said plurality of occupancy estimator signals.

76. The method of claim 68, said calculating step further comprising:

calculating said composite occupancy estimator by performing a Yager Union function of said plurality of occupancy estimator signals.

77. The method of claim 68, said calculating step further comprising:

calculating said composite occupancy estimator by performing a table look-up based on said plurality of occupancy estimator signals.

78. The method of claim 68, further comprising:

programmably adjusting the composite activation threshold.

79. The method of claim 68, further comprising:

programmably adjusting the composite maintenance threshold.

80. The method of claim 68, further comprising:

programmably adjusting the composite activation threshold and the composite maintenance threshold.

81. A method for controlling an electrical load as a function of occupancy of a space, comprising:

transmitting continuous wave ultrasonic signals into said space;

receiving a Doppler-shifted ultrasonic signal reflected from said space;

sampling said Doppler shifted ultrasonic signal near a zero crossing point of said Doppler shifted ultrasonic signal to provide a sampled Doppler-shifted ultrasonic signal;

detecting occupancy of said space as a function of said sampled Doppler-shifted ultrasonic signal; and energizing the electrical load when said sampled Doppler-shifted ultrasonic signal indicates that said space is occupied.

82. The method of claim 81, said sampling step comprising, sampling said Doppler-shifted ultrasonic signal as a function of continuous wave ultrasonic signals transmitted into said space.

83. A method of operating a occupancy based load controller, including: at least one occupancy sensor for producing at least one occupancy estimator signal indicative of motion within a space, a programmable microprocessor, connected to said at least one occupancy sensor, for comparing said occupancy estimator signal to a predetermined threshold; and a controllable load energizing device responsive to said programmable microprocessor, operable to automatically energize an electrical load when said microprocessor determines that said occupancy estimator signal is greater than said predetermined threshold; said method comprising:

maintaining a status of said occupancy based load controller;

detecting a predetermined status-reporting motion pattern, distinct from a normal motion pattern, within said space; and reporting said status upon detection of said predetermined status-reporting motion pattern.

* * * * *

UNITED STATES PATENT AND TRADEMARK OFFICE
CERTIFICATE OF CORRECTION

PATENT NO. : 5,986,357
DATED : November 16, 1999
INVENTOR(S) : Myron et al.

It is certified that error appears in the above-identified patent and that said Letters Patent is hereby corrected as shown below:

On the title page, item [52], delete "307/116", and insert the following therefor: --307/032--.

In claim 23, column 218, line 19, after the word "on", delete the letter --e--.

In claim 53, column 219, line 59, delete the word "the", and insert the word --The-- therefor.

In claim 57, column 220, line 6, after the word "on", delete the letter --e--.

In claim 58, column 220, line 7, delete the word "firer", and insert the word --further-- therefor.

In claim 61, column 220, line 16, delete the word "aid", and insert the word --said-- therefor.

Signed and Sealed this

Third Day of April, 2001

*Attest:*

NICHOLAS P. GODICI

*Attesting Officer*         *Acting Director of the United States Patent and Trademark Office*